(12) United States Patent
Miyazaki et al.

(10) Patent No.: US 7,420,284 B2
(45) Date of Patent: Sep. 2, 2008

(54) SEMICONDUCTOR DEVICE AND MANUFACTURING METHOD THEREOF

(75) Inventors: Chuichi Miyazaki, Akishima (JP); Yukiharu Akiyama, Kodaira (JP); Masnori Shibamoto, Saitama (JP); Tomoaki Kudaishi, Komoro (JP); Ichiro Anjoh, Koganei (JP); Kunihiko Nishi, Kokubunji (JP); Asao Nishimura, Koganei (JP); Hideki Tanaka, Sagamihara (JP); Ryosuke Kimoto, Hamura (JP); Kunihiro Tsubosaki, Hino (JP); Akio Hasebe, Hitachi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/492,165

(22) Filed: Jul. 25, 2006

(65) Prior Publication Data

US 2006/0261494 A1    Nov. 23, 2006

Related U.S. Application Data

(60) Continuation of application No. 11/116,308, filed on Apr. 28, 2005, now abandoned, which is a division of application No. 10/374,997, filed on Feb. 28, 2003, now abandoned, which is a continuation-in-part of application No. 09/768,288, filed on Jan. 25, 2001, now abandoned, and a continuation-in-part of application No. 09/771,985, filed on Jan. 30, 2001, now abandoned, and a continuation-in-part of application No. 09/983,286, filed on Oct. 23, 2001, now Pat. No. 6,639,323, said application No. 09/768,288 is a continuation of application No. 09/449,834, filed on Nov. 26, 1999, now Pat. No. 6,342,726, which is a continuation of application No. 08/822,933, filed on Mar. 21, 1997, now abandoned, said application No. 09/771,985 is a division of application No. 09/449,834, said application No. 09/983,286 is a continuation of application No. 09/113,500, filed on Jul. 10, 1998, now Pat. No. 6,307,269.

(30) Foreign Application Priority Data

| Mar. 22, 1996 | (JP) | ................................ 8-66637 |
| Jul. 11, 1997 | (JP) | ................................ 9-185621 |
| Aug. 27, 1997 | (JP) | ................................ 9-230906 |

(51) Int. Cl.
*H01L 23/52* (2006.01)
*H01L 23/48* (2006.01)
*H01L 29/40* (2006.01)

(52) U.S. Cl. ............... 257/781; 257/779; 257/780; 257/773; 257/774; 257/737

(58) Field of Classification Search ......... 257/779–781, 257/773–774, 737
See application file for complete search history.

(56) References Cited

U.S. PATENT DOCUMENTS

| 4,246,595 A | 1/1981 | Noyori et al. |
| 5,040,052 A | 8/1991 | McDavid |
| 5,107,325 A | 4/1992 | Nakayoshi |
| 5,148,265 A | 9/1992 | Khandros et al. |
| 5,148,266 A | 9/1992 | Khandros et al. |
| 5,191,404 A | 3/1993 | Wu et al. |
| 5,258,330 A | 11/1993 | Khandros et al. |
| 5,272,664 A | 12/1993 | Alexander et al. |
| 5,346,861 A | 9/1994 | Khandros et al. |
| 5,347,159 A | 9/1994 | Khandros et al. |
| 5,398,863 A | 3/1995 | Grube et al. |
| 5,409,865 A | 4/1995 | Karnezos |
| 5,448,114 A | 9/1995 | Kondoh et al. |
| 5,489,749 A | 2/1996 | Distefano et al. |
| 5,602,059 A | 2/1997 | Horiuchi et al. |
| 5,648,682 A | 7/1997 | Nakazawa et al. |
| 5,663,106 A | 9/1997 | Karavakis et al. |
| 5,668,405 A | 9/1997 | Yamashita |
| 5,679,977 A | 10/1997 | Khandros et al. |
| 5,682,061 A | 10/1997 | Khandros et al. |
| 5,685,885 A | 11/1997 | Khandros et al. |
| 5,686,757 A | 11/1997 | Urushima |
| 5,706,174 A | 1/1998 | Distefano et al. |
| 5,757,078 A | 5/1998 | Matsuda et al. |

| | | | |
|---|---|---|---|
| 5,760,465 A | 6/1998 | Alcoe et al. | |
| 5,763,939 A | 6/1998 | Yamashita | |
| 5,776,796 A | 7/1998 | Distefano et al. | |
| 5,777,387 A | 7/1998 | Yamashita et al. | |
| 5,777,391 A | 7/1998 | Nakamura et al. | |
| 5,789,820 A | 8/1998 | Yamashita | |
| 5,801,446 A | 9/1998 | Distefano et al. | |
| 5,834,339 A | 11/1998 | Distefano et al. | |
| 5,863,970 A | 1/1999 | Ghoshal et al. | |
| 5,886,399 A | 3/1999 | Ohsawa et al. | |
| 5,895,965 A | 4/1999 | Tanaka et al. | |
| 5,990,545 A | 11/1999 | Schueller et al. | |
| 5,994,222 A | 11/1999 | Smith et al. | |
| 6,078,097 A | 6/2000 | Ohsawa | |
| 6,107,678 A | 8/2000 | Shigeta et al. | |
| 6,114,192 A | 9/2000 | Tsunoda et al. | |
| 6,130,112 A | 10/2000 | Kitano et al. | |
| 6,133,639 A | 10/2000 | Kovac et al. | |

FOREIGN PATENT DOCUMENTS

| | | |
|---|---|---|
| EP | 0701278 A2 | 3/1996 |
| JP | 03-057248 | 3/1991 |
| JP | 6-181236 | 12/1992 |
| JP | 6-504408 | 5/1994 |
| JP | 7-321244 | 12/1995 |
| JP | 8-070062 | 3/1996 |
| JP | 8-070082 | 3/1996 |
| JP | 8-78574 | 3/1996 |
| JP | 8-236586 | 9/1996 |
| JP | 8-306745 | 11/1996 |
| JP | 9-172033 | 6/1997 |
| JP | 9-181209 | 7/1997 |
| JP | 9-246417 | 9/1997 |
| JP | 11-054534 | 2/1999 |

OTHER PUBLICATIONS

"Electronic Material", Apr. 1, 1995 (Heisei 7), Susumu Honda, pp. 22-28.
"Nikkei Microdevice", Feb. 1, 1995, by Nikkei BPCO, pp. 96-97.
"Nikkei Microdevice", May 1, 1994, pp. 98-102.
"Big Innovations in Mounting Technologies, Start of a Chip Size Package Era", Nikkei Microdevices, Apr. 1997.

*Primary Examiner*—Luan Thai
(74) *Attorney, Agent, or Firm*—Antonelli, Terry, Stout & Kraus, LLP.

(57) ABSTRACT

A semiconductor device includes a semiconductor chip formed with connection terminals, an elastic structure interposed between a main surface of the chip and a wiring substrate formed with wirings connected at first ends thereof to the connection terminals, and bump electrodes connected to the other ends of the wirings. The connection terminals may be at a center part or in peripheral part(s) of the chip main surface and both the elastic structure and wiring substrate are not provided at locations of connection terminals. A resin body seals at least the connection terminals and the exposed first ends of wirings (leads). In a scheme in which the connection terminals are located in a peripheral part of the chip main surface, the wiring substrate protrudes beyond the chip boundary where the connection terminals are arranged, and the resin body shape is restricted by the protruding part of the wiring substrate.

9 Claims, 110 Drawing Sheets

FIG. 53

| LEAD SIZE SYMBOL | L1 | L2 | b1 | b2 | h | α |
|---|---|---|---|---|---|---|
| MEANING OF SYMBOL | TAPER LENGTH | WIRING LENGTH | TAPER WIDTH | LEAD WIDTH | LEAD THICKNESS | BENDING STRESS RATIO |
| UNIT | μm | μm | μm | μm | μm | — |
| TECHNIQUE STUDIED ① | 100 | 280 | 60 | 38 | 18 | 1 |
| TECHNIQUE STUDIED ② | 80 | 280 | 60 | 38 | 18 | 1.02 |
| EMBODIMENT ① | 100 | 380 | 65 | 38 | 18 | 1.13 |
| EMBODIMENT ② | 80 | 380 | 60 | 38 | 18 | 1.26 |
| EMBODIMENT ③ | 100 | 380 | 65 | 38 | 18 | 1.25 |
| EMBODIMENT ④ | 100 | 430 | 65 | 38 | 18 | 1.26 |
| EMBODIMENT ⑤ | 100 | 480 | 70 | 38 | 18 | 1.31 |

FIG. 84(a)

| THIN FILM WIRING SUBSTRATE SPECIFICATION | | |
|---|---|---|
| TAPE MATERIAL | | POLYIMIDE RESIN |
| TAPE THICKNESS | | 25~75 μm |
| WIRING MATERIAL | | COPPER (ELECTROLYTIC COPPER FOIL) |
| WIRING MATERIAL THICKNESS | | 18~25 μm |
| WIRING PLATING SPECIFICATION | SPECIFICATION (1) | Au1.5 μm (BOTH SIDES) |
| | SPECIFICATION (2) | Au/Ni = 3.0/0.5 μm (CHIP SIDE), 0.3/0.5 μm (BUMP SIDE) |

FIG. 84(b)

| ELASTOMER SPECIFICATION | | | |
|---|---|---|---|
| TYPICAL ELASTOMER SPECIFICATIONS | | SPECIFICATION (1) | SPECIFICATION (2) |
| BASIC COMPOSITION | | 3-LAYER POROUS FILM | 3-LAYER POLYIMIDE FILM |
| INTERMEDIATE MATERIAL (SKELETAL LAYER) | | POROUS FLUORIDE RESIN | POLYIMIDE RESIN |
| UPPER/LOWER LAYER MATERIAL (ADHESIVE LAYER) | | EPOXY-IMPREGNATED POROUS FLUORIDE RESIN | ACRYL/EPOXY RESIN |
| ELASTOMER | CHIP LOWER PART | 80~230 μm | 80~250 μm |
| | CHIP OUTER PART | 100~250 μm | |
| INTERMEDIATE LAYER THICKNESS | CHIP LOWER PART | 40~200 μm | 60~230 μm |
| | CHIP OUTER PART | 60~220 μm | |
| UPPER LAYER THICKNESS (CHIP SURFACE) | | 10~80 μm | 10~80 μm |
| LOWER LAYER (CHIP SUBSTRATE SURFACE) | | 10~80 μm | 10~80 μm |
| LONGITUDINAL ELASTIC MODULUS | | 200~2000 MPa | 1000~8000 MPa |

FIG. 84(c)

| TYPICAL SEAL MATERIAL SPECIFICATION | SEAL MATERIAL SPECIFICATION | |
|---|---|---|
| | SPECIFICATION (1) | SPECIFICATION (2) |
| SUBSTRATE COMPOSITION | EPOXY NON-SOLVENT TYPE LIQUID RESIN | EPOXY SOLVENT TYPE LIQUID RESIN |
| NON-VOLATILE COMPONENTS | 100wt% | 60~95wt% |
| MAIN COMPONENTS | EPOXY AND SILICA | EPOXY AND SILICA |
| SILICA CONTENT (OF MAIN COMPONENT) | 0~80wt% (PREFERABLY 50~80wt%) | |
| CURING AGENT | IMIDAZOLE (0.1~10wt%) | PHENOL (10~45wt%) |
| CURING ENHANCER | | IMIDAZOLE (0.1~15wt%) |
| SOLVENT | | GAMMA-BUTYLLACTONE (5~40wt%) |
| VISCOSITY (IN APPLICATION) | 0.5~13Pa·s (PREFERABLY 1~8Pa·s) | |
| RESIN HEATING TEMPERATURE IN APPLICATION | AMBIENT TEMPERATURE~80°C | AMBIENT TEMPERATURE |

FIG. 84(d)

| | BUMP POLE SPECIFICATION |
|---|---|
| MATERIAL SPECIFICATION | SPECIFICATION (1): Sn63/Pb37 EUTECTIC SOLDER |
| | SPECIFICATION (2): OTHER HIGH FUSION POINT SOLDER |
| | SPECIFICATION (3): Au~68 PLATED Ni ALLOY |
| DIAMETER | 0.3mm~0.6mm |

FIG. 86

| ELASTOMER FIXING CONDITIONS | |  |
|---|---|---|
| TEMPERATURE | 110~170°C | |
| LOAD | 2~10kg/cm² | |
| TIME | 1~5s | |
| CHIP FIXING CONDITIONS | | |
| TEMPERATURE | 110~170°C | |
| LOAD | 5~20kg/cm² | |
| TIME | 5~20s | |
| CURE CONDITIONS AFTER CHIP FIXING | | |
| TEMPERATURE | 140~170°C | |
| TIME | 5~30 MIN | |
| INNER LEAD CONNECTION CONDITIONS | | |
|  | CONDITION (1) | CONDITION (2) |
| ULTRASONIC WAVE FREQUENCY | 60kHz | 120kHz |
| ULTRASONIC WAVE AMPLITUDE | 1.5~3.5 μm | 0.1~0.6 μm |
| JOINING TIME | 10~40ms | 10~40ms |
| JOINING LOAD | 30~90g | 30~90g |
| TEMPERATURE | 150~250°C | 150~250°C |
| CURE CONDITIONS AFTER SEALING | | |
| TEMPERATURE | 140~150°C | |
| TIME | 30 MIN~2 HOURS | |
| HUMP FORMING REFLOW CONDITIONS | | |
| TEMPERATURE | 230~240°C | |
| TIME | 5~10s | |

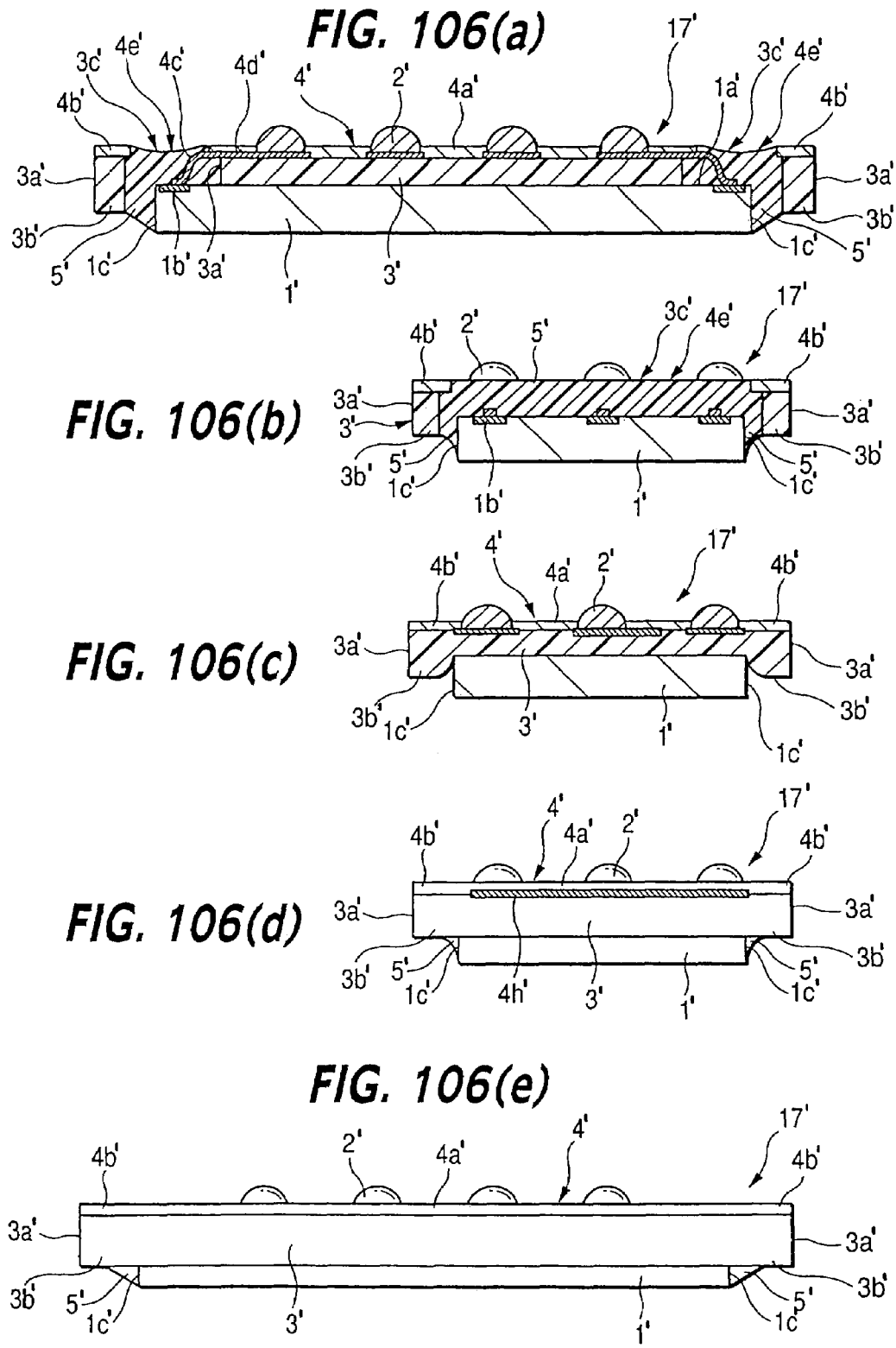

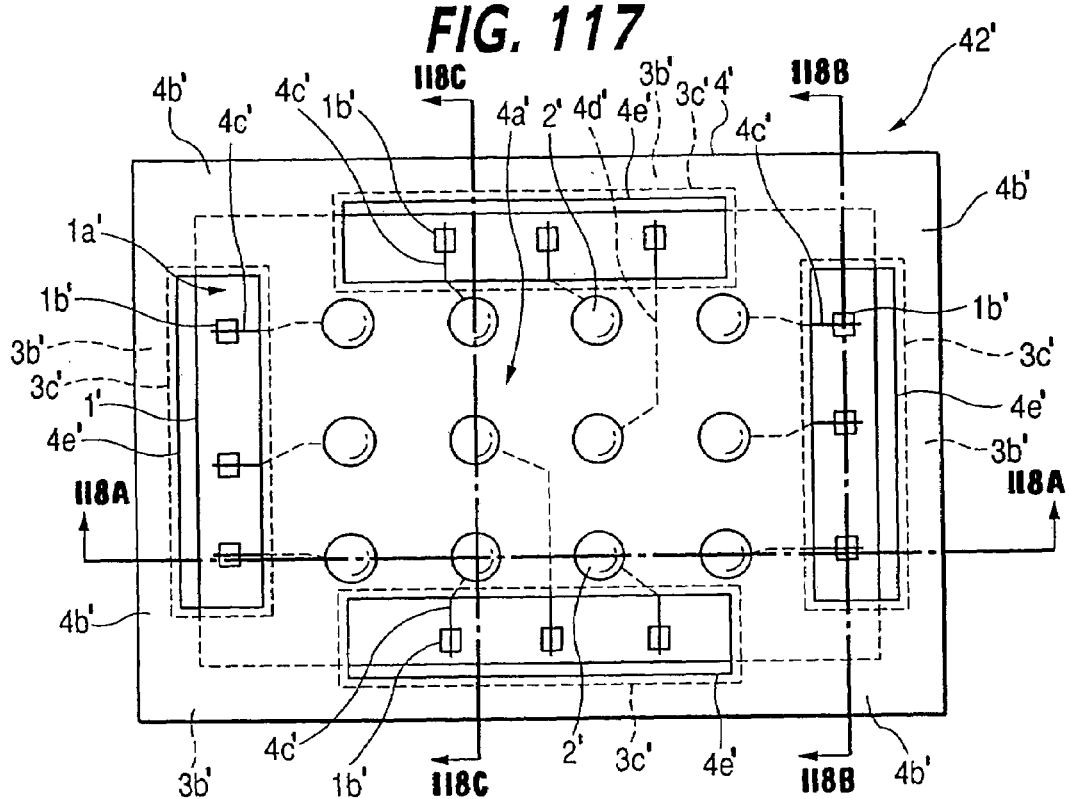
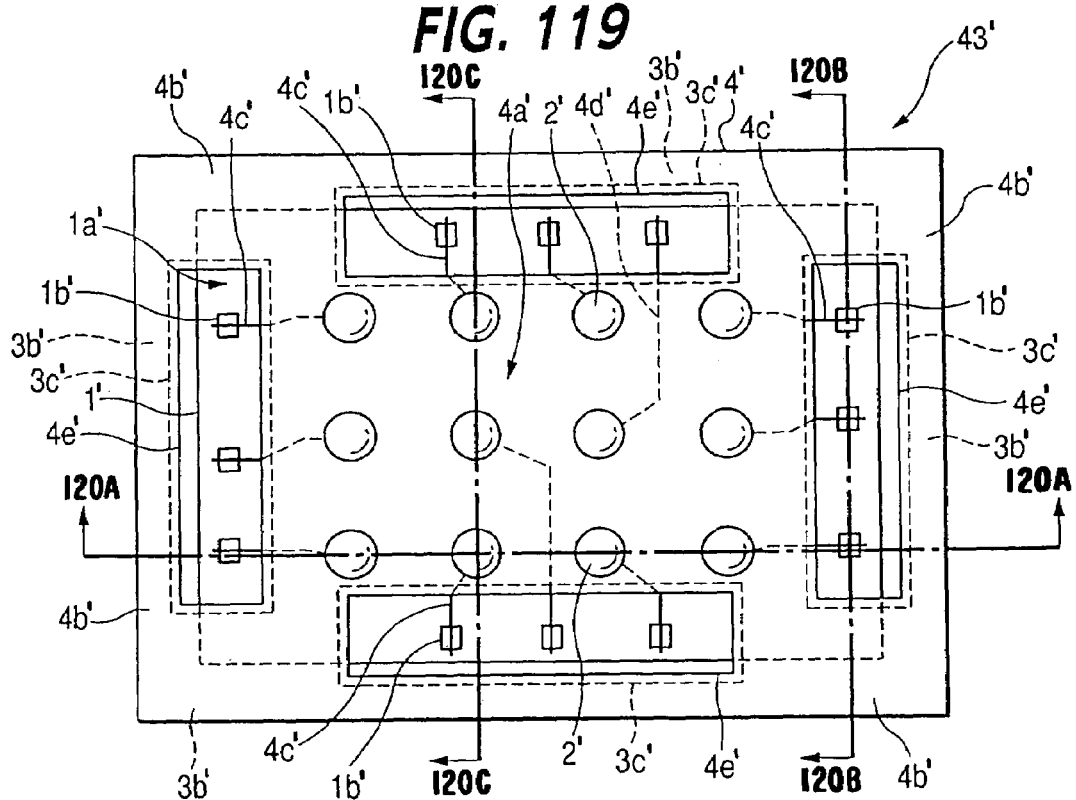

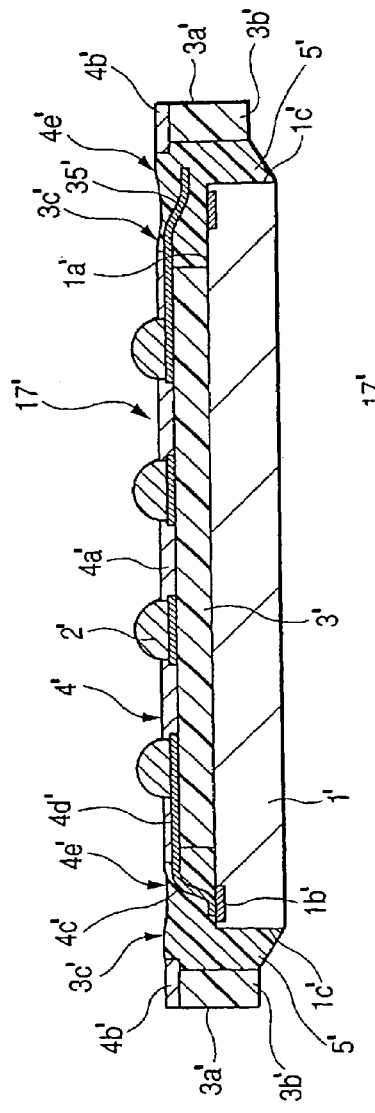
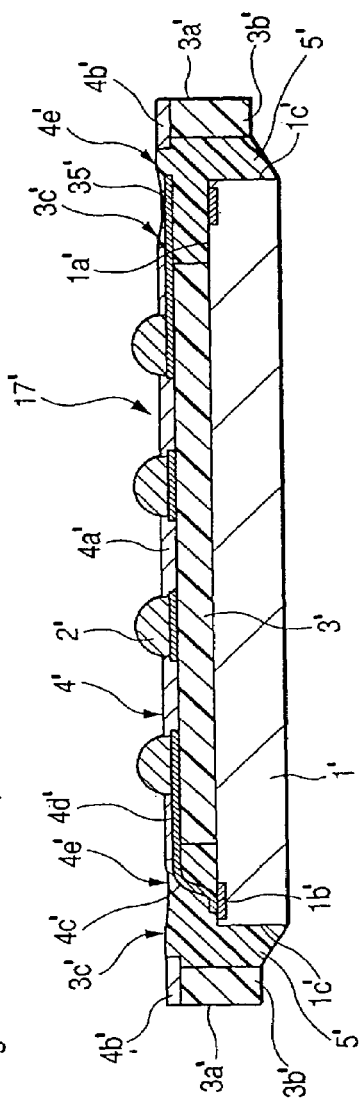
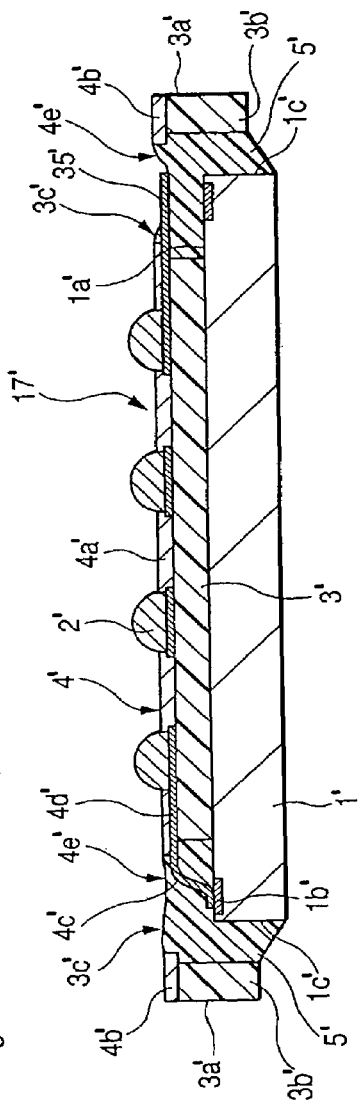
FIG. 121(a)
FIG. 121(b)
FIG. 121(c)

FIG. 127

| TYPICAL COLORING ELASTOMER SPECIFICATIONS | COLORING ELASTOMER SPECIFICATION (1) | COLORING ELASTOMER SPECIFICATION (2) |
|---|---|---|
| BASIC COMPOSITION | 3-LAYER POROUS FILM | 3-LAYER POLYIMIDE FILM |
| INTERMEDIATE MATERIAL (SKELETAL LAYER) | POROUS FLUORIDE RESIN | POLYIMIDE RESIN |
| UPPER/LOWER LAYER MATERIAL (ADESHIVE LAYER) | EPOXY-IMPREGNATED POROUS FLUORIDE RESIN WITH COLORANT | ALKYL/EPOXY RESIN WITH COLORANT |
| COLORANT | CARBON | |
| COLORANT COMPOSITION | TYPICAL SPECIFICATION: PARTICLE DIAMETER 0.1~30 μm (PREFERABLY 0.5~10 μm) | |
| | REASON: WHEN PARTICLE DIAMETER IS LESS THAN 0.1 μm, CARBON PARTICLES AGGLOMERATE AND DISPERSION IS NON-UNIFORM WHICH IS UNDESIRABLE. WHEN PARTICLE DIAMETER EXCEEDS 30 μm, CARBON PARTICLES DO NOT EASILY DISPERSE IN RESIN WHICH IS UNDESIRABLE | |
| COLORANT PROPORTION | TYPICAL SPECIFICATION: 0.1~3.0% (PREFERABLY 0.5~2.5%) | |
| | REASON: WHEN PROPORTION IS LESS THAN 0.1%, COLORATION IS INSUFFICIENT WHICH IS UNDESIRABLE. WHEN PROPORTION EXCEEDS 3.0%, MATERIAL HAS ELECTRICAL CONDUCTANCE DUE TO CARBON WHICH IS UNDESIRABLE | |

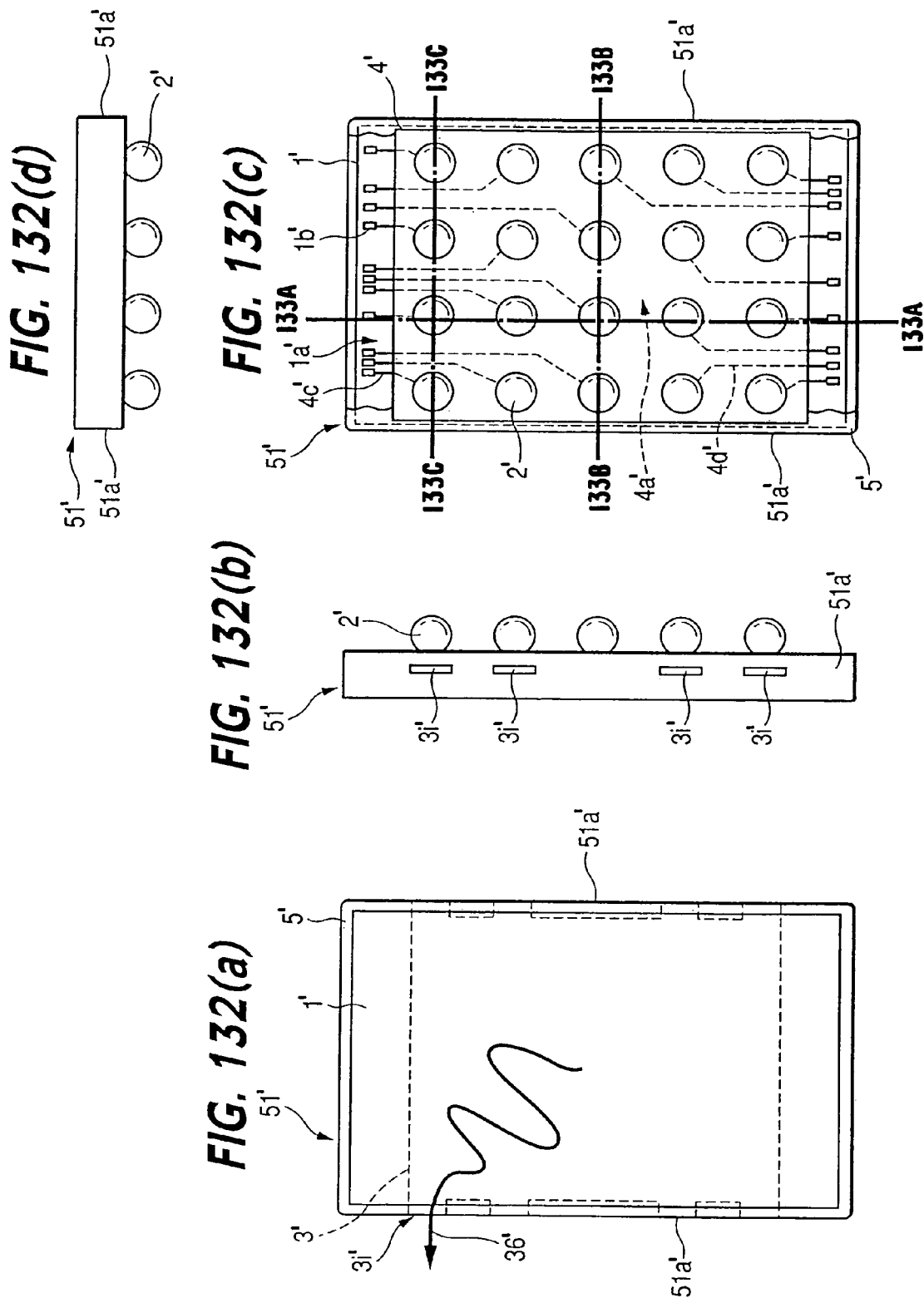

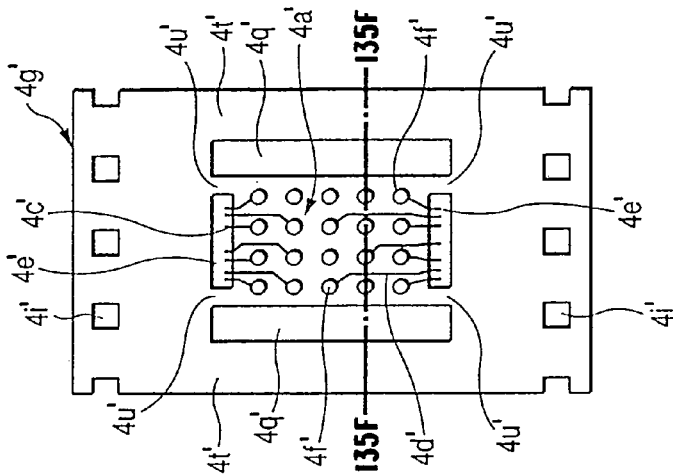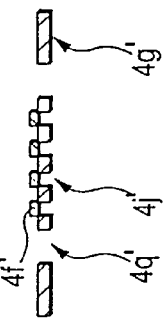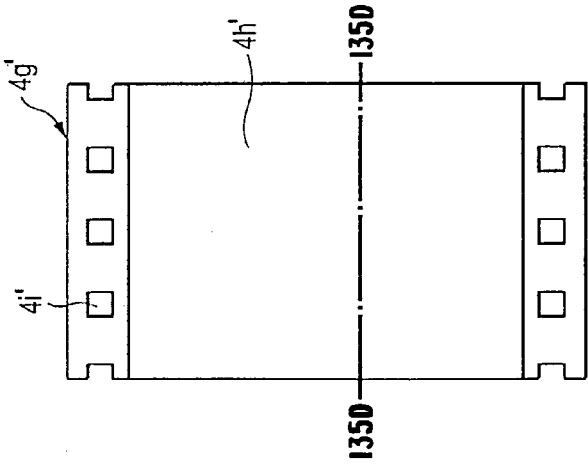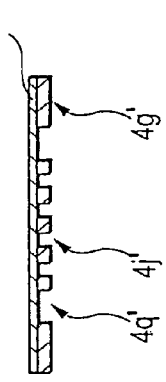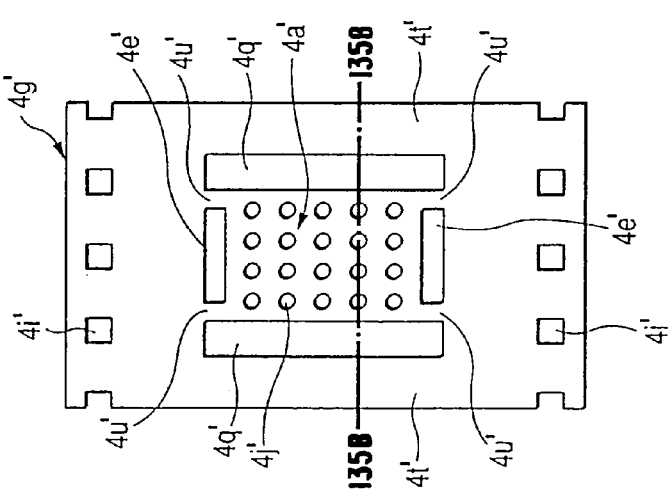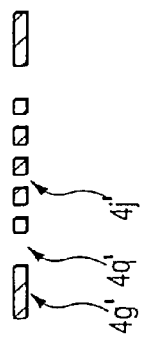

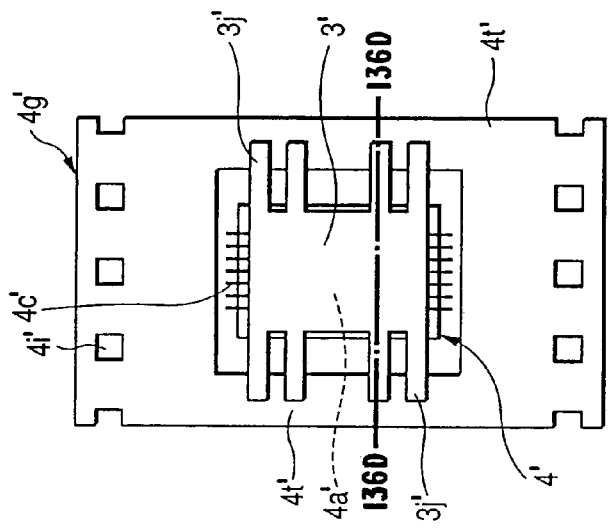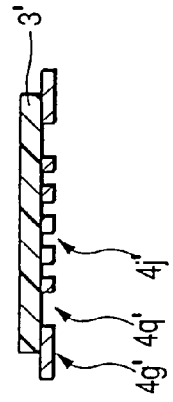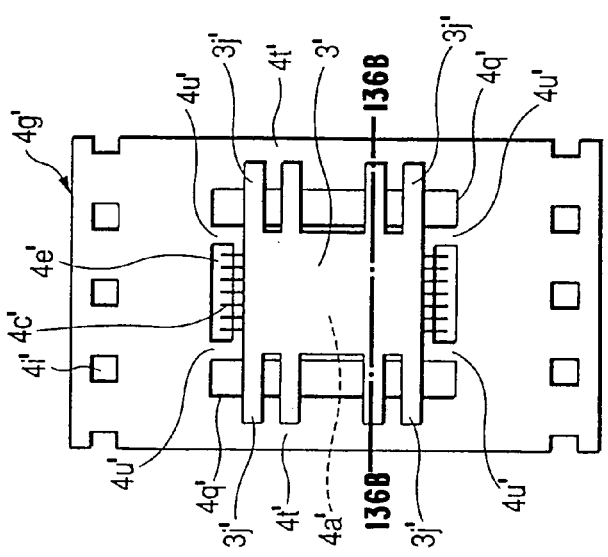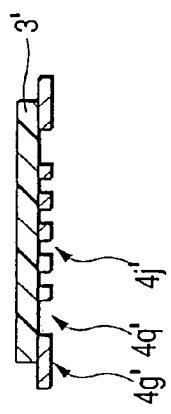

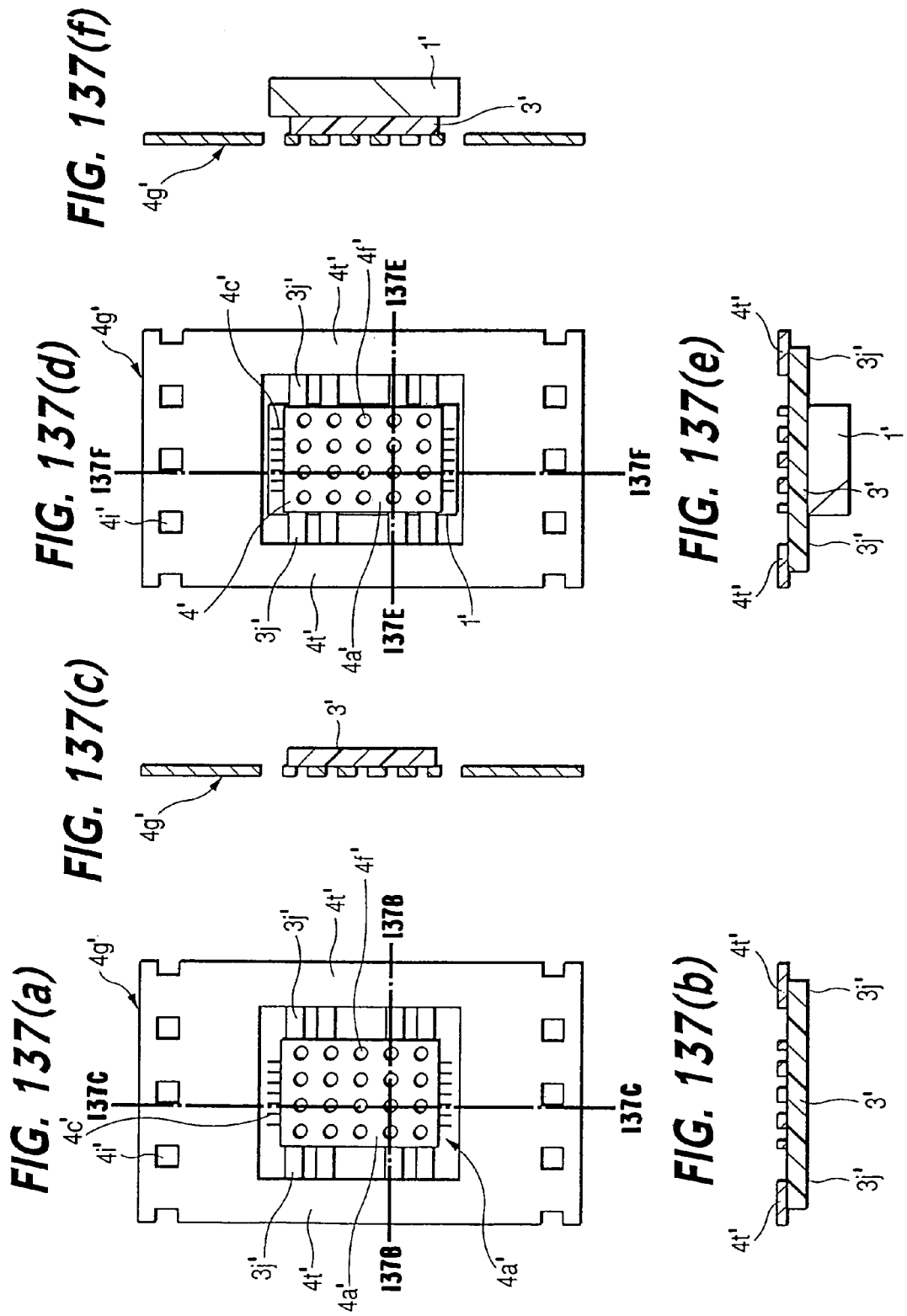

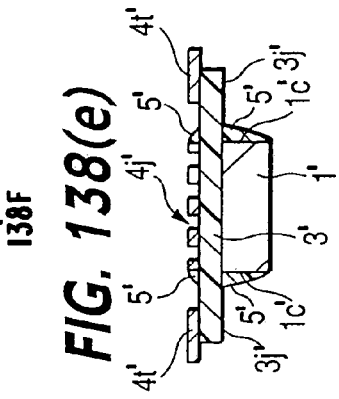
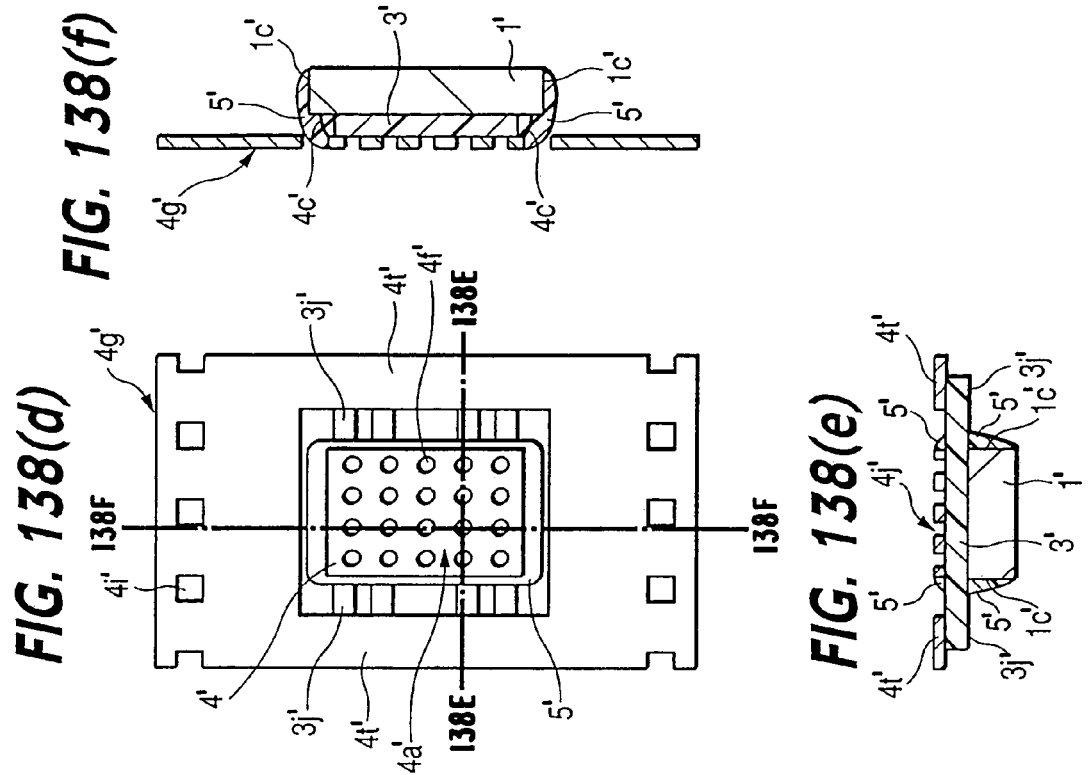
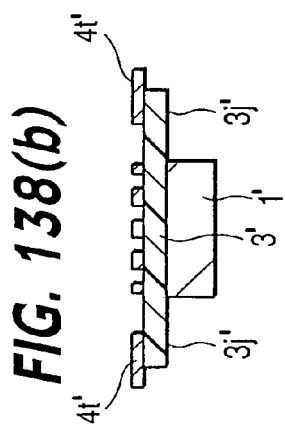
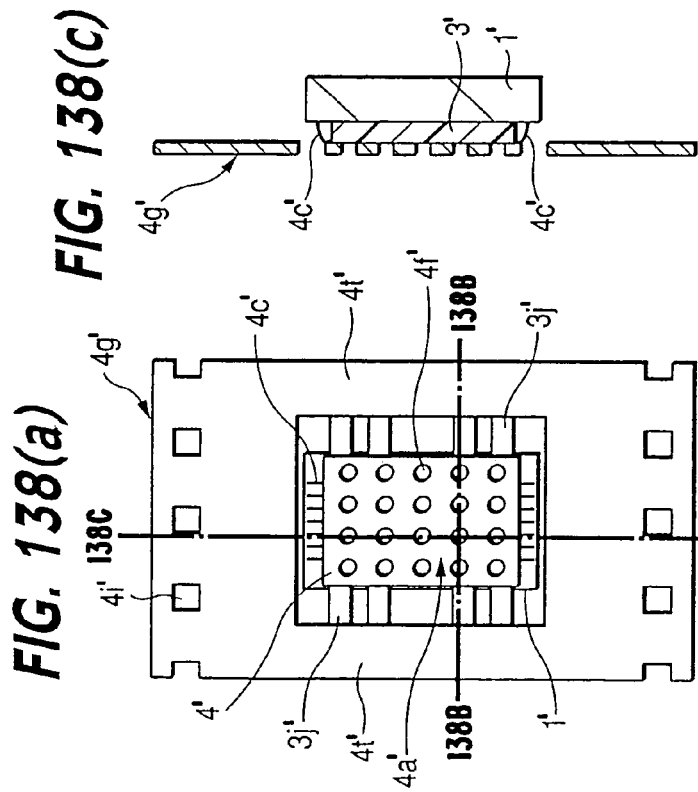
FIG. 138(a) FIG. 138(b) FIG. 138(c) FIG. 138(d) FIG. 138(e) FIG. 138(f)

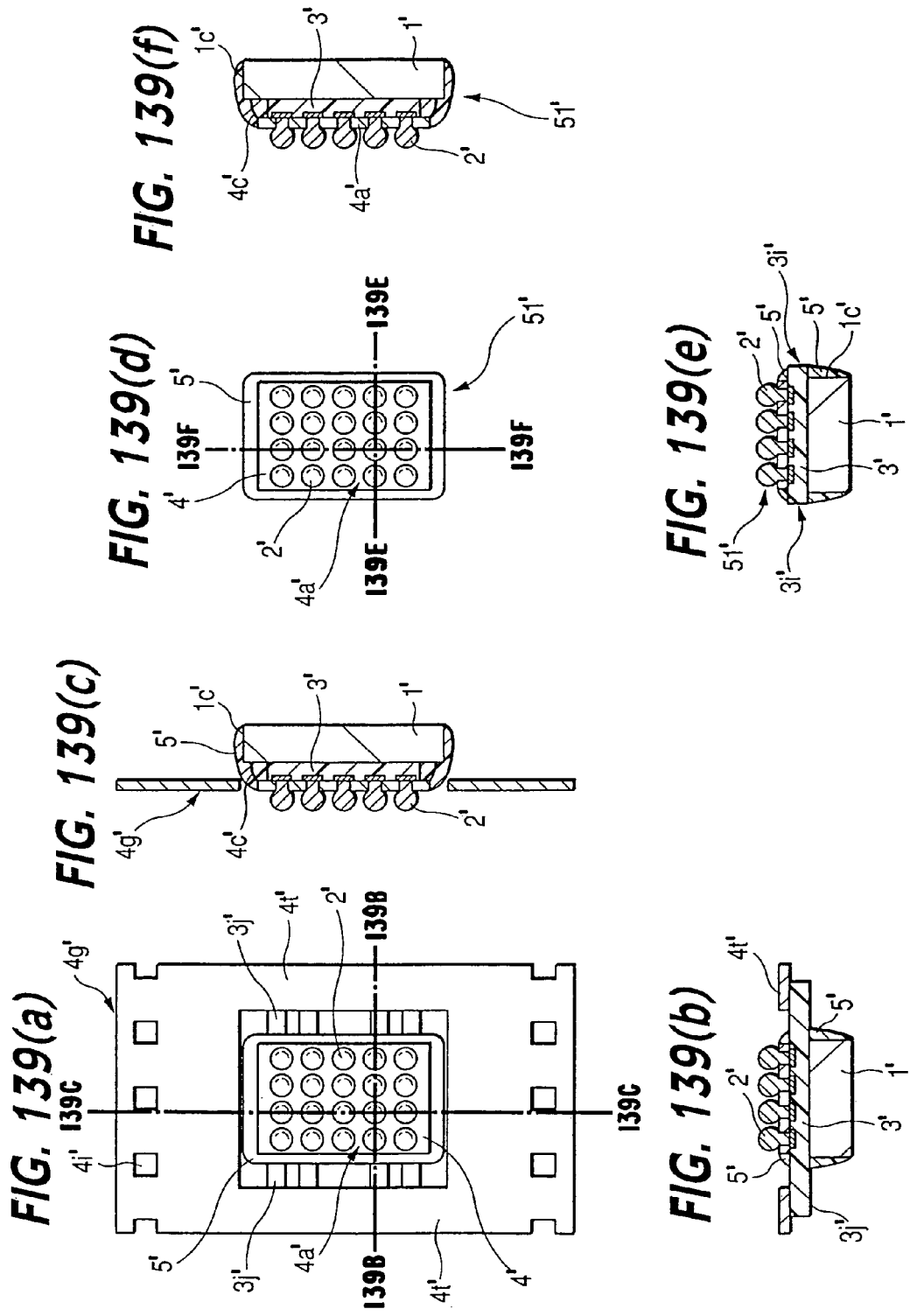

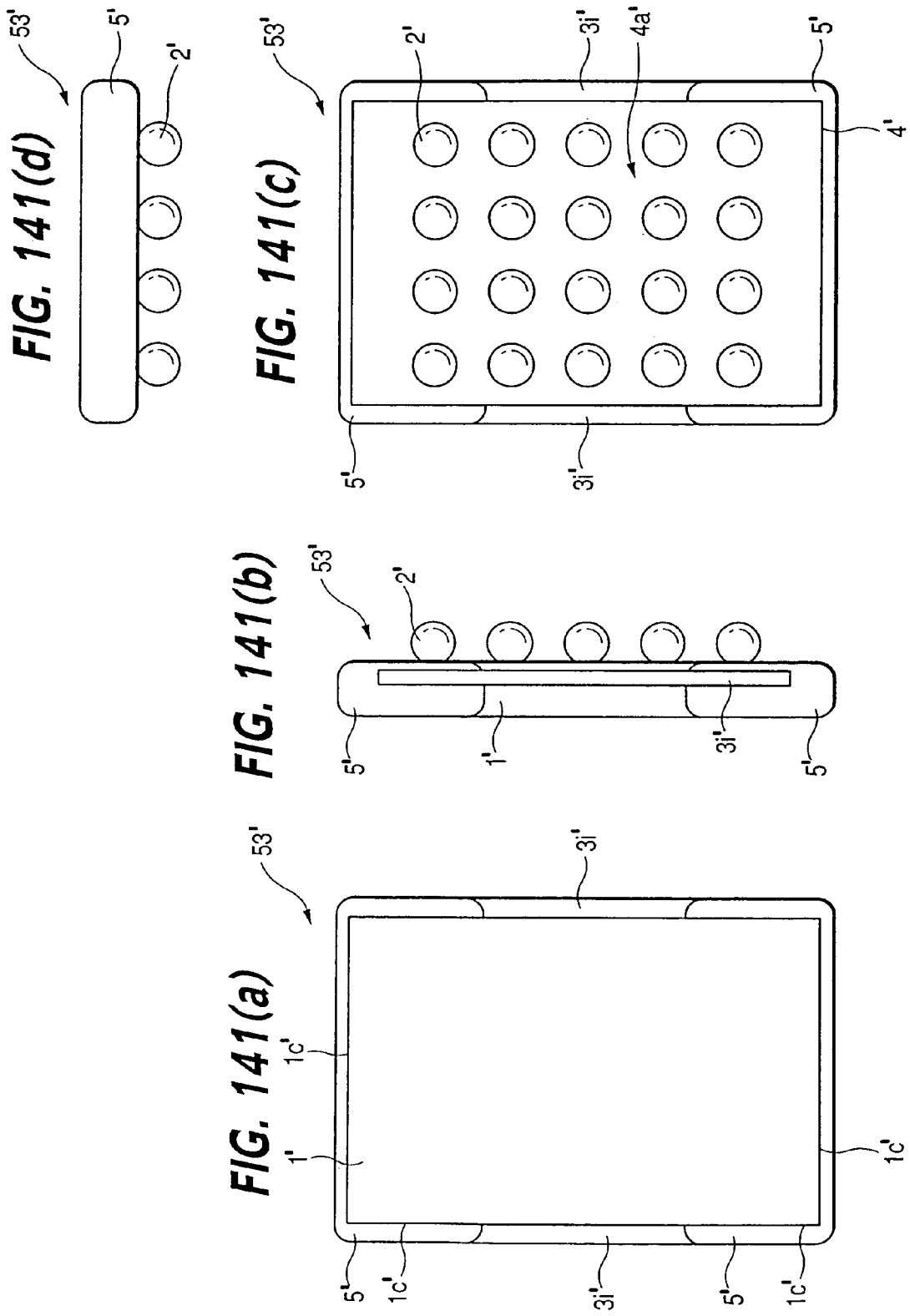

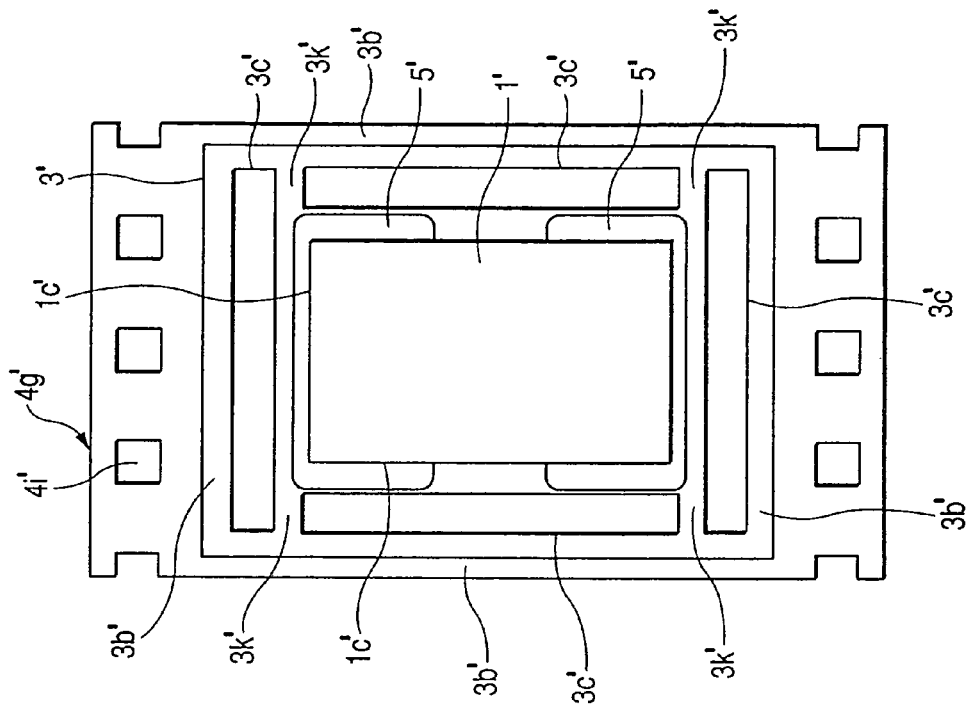
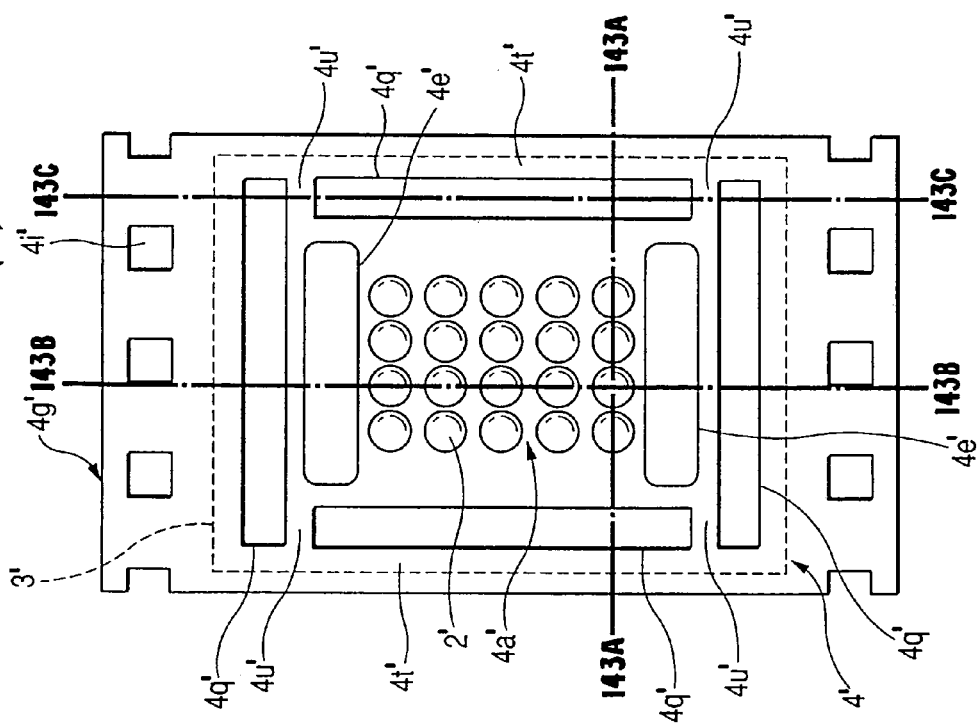

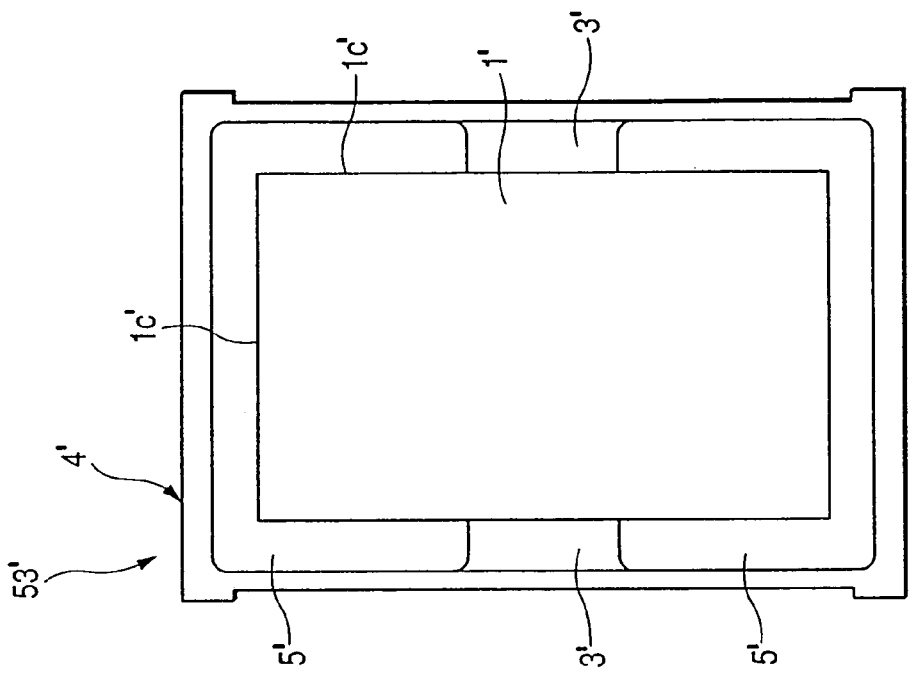
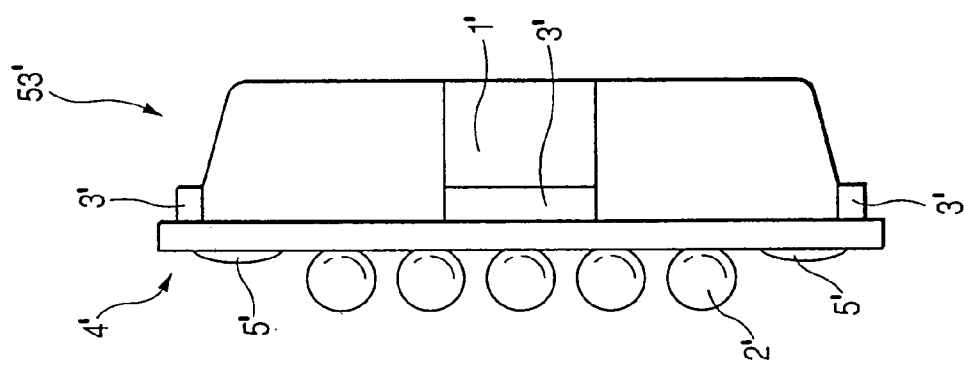
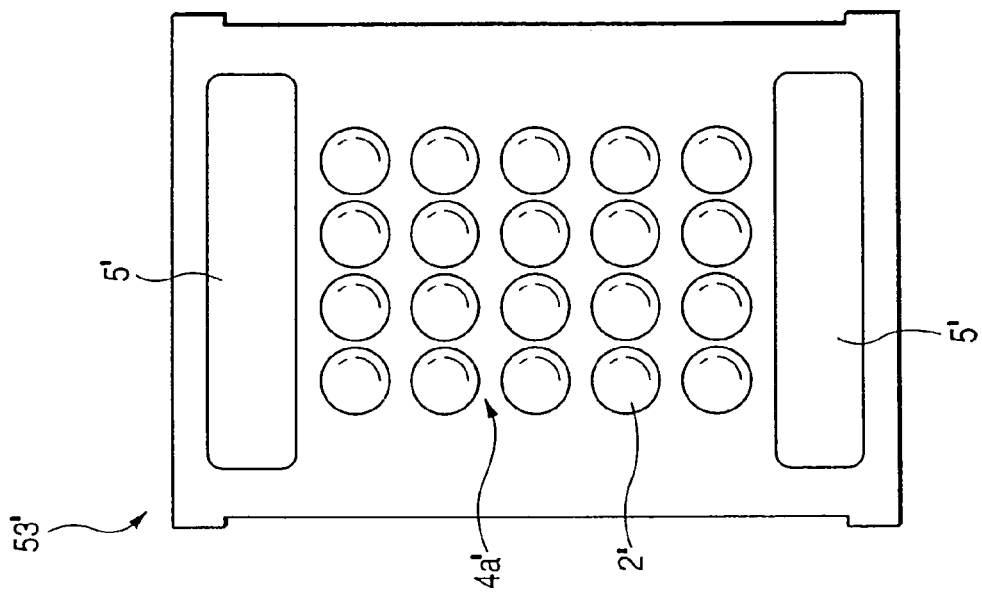
FIG. 144(a)
FIG. 144(b)
FIG. 144(c)

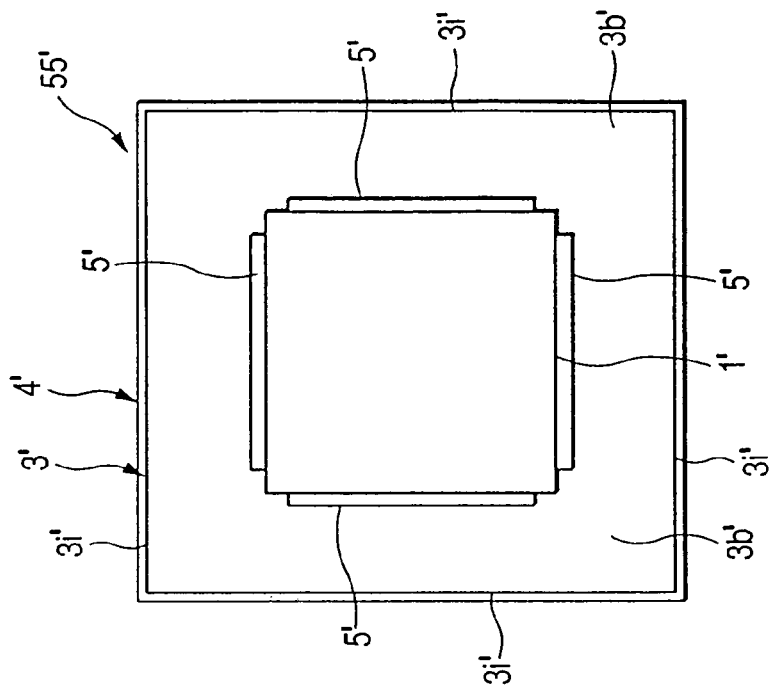
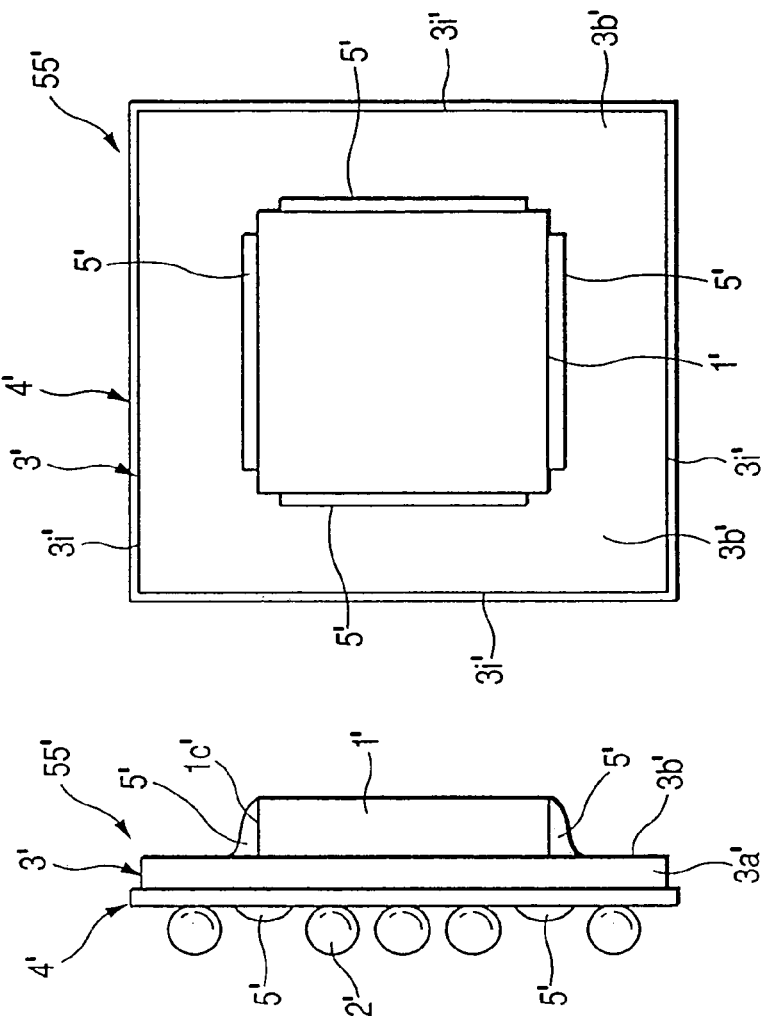
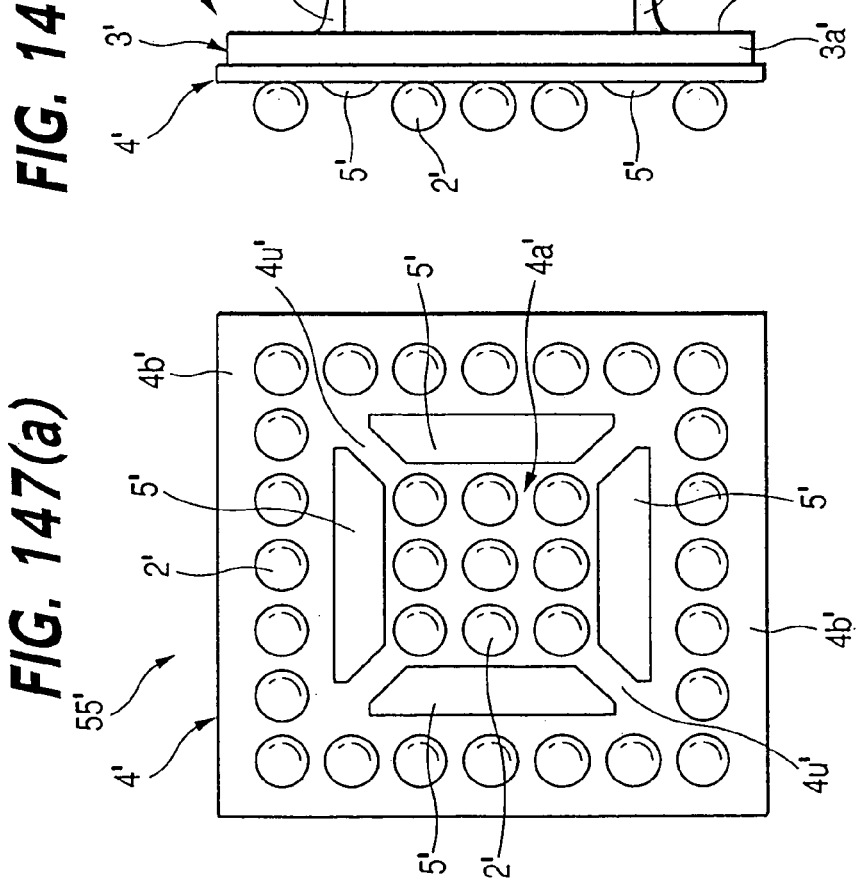
FIG. 147(a)
FIG. 147(b)
FIG. 147(c)

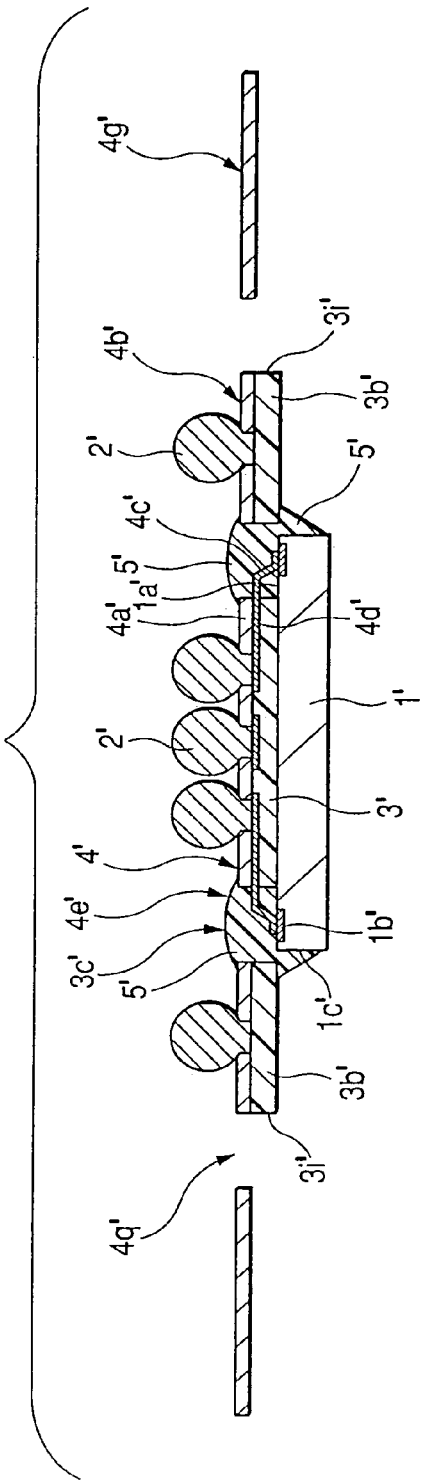
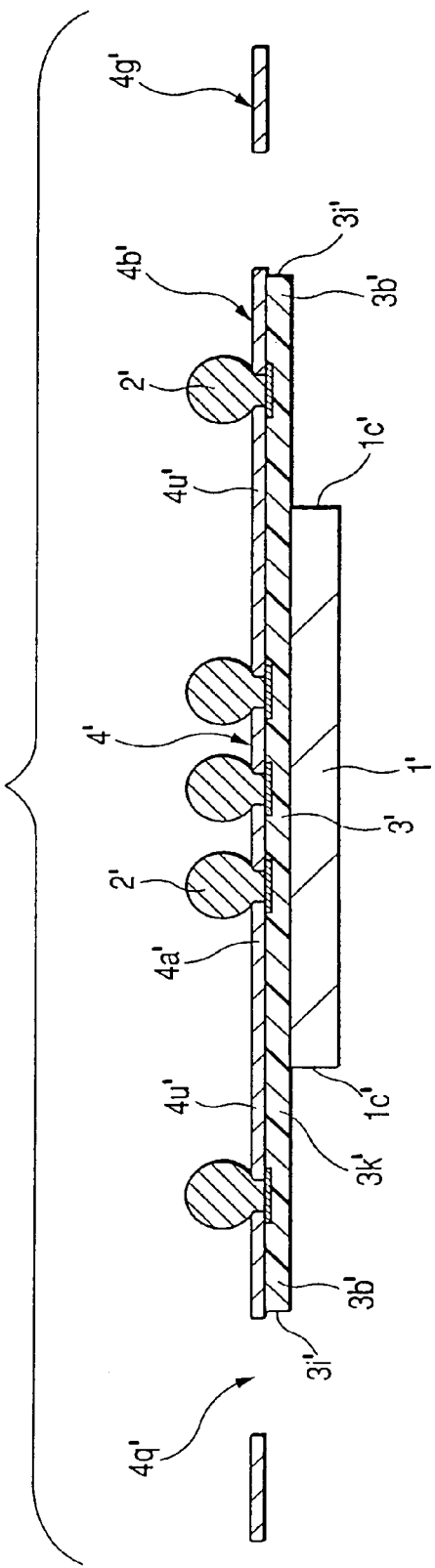
FIG. 149(a)
FIG. 149(b)

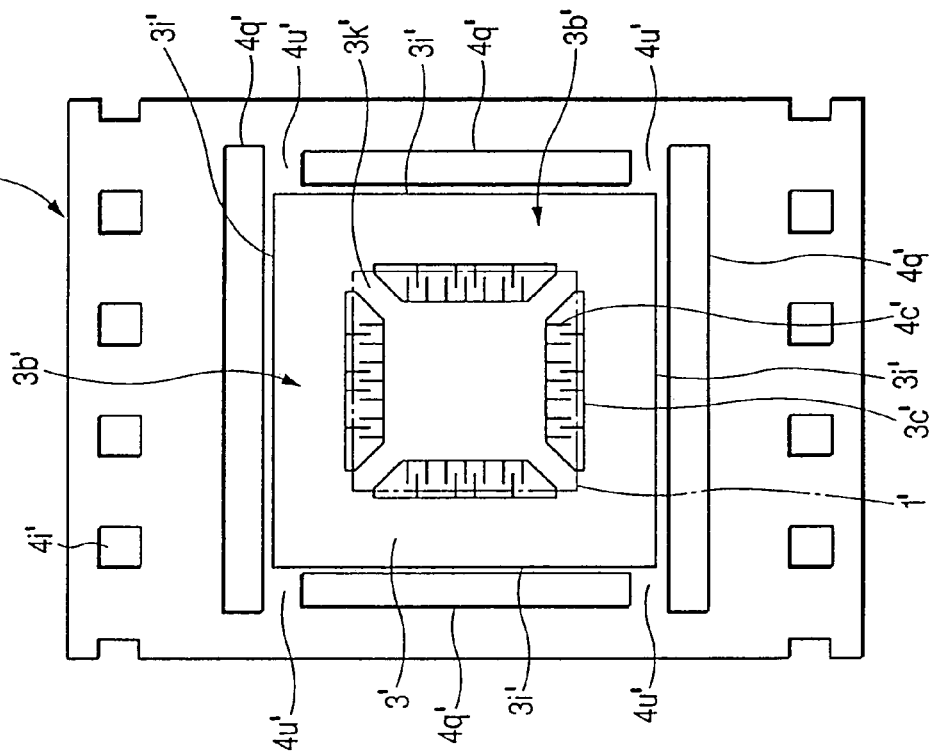
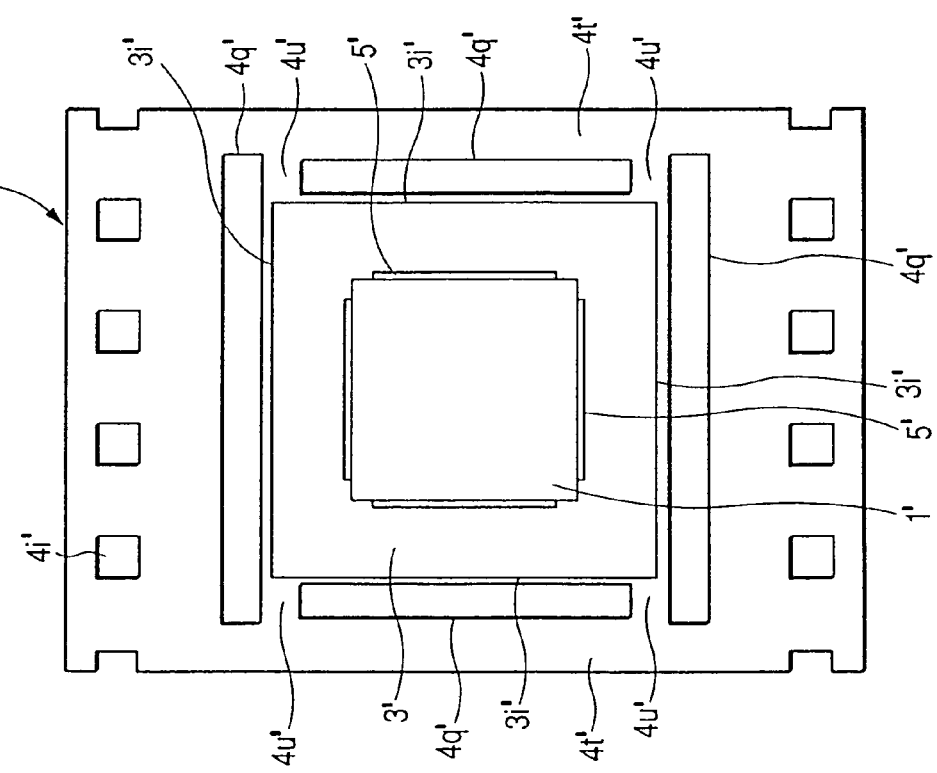
FIG. 150(a)
FIG. 150(b)

SEMICONDUCTOR DEVICE AND MANUFACTURING METHOD THEREOF

This application is a continuation of U.S. application Ser. No. 11/116,308, filed Apr. 28, 2005, now abandoned which, in turn, is a divisional application of U.S. application Ser. No. 10/374,997, filed Feb. 28, 2003, and now abandoned, which, in turn, is a CIP (Continuation-In-Part) of (i) U.S. application Ser. No. 09/768,288, filed Jan. 25, 2001, and now abandoned, of (ii) U.S. application Ser. No. 09/771,985, filed Jan. 30, 2001, and now abandoned, and of (iii) U.S. application Ser. No. 09/983,286, filed Oct. 23, 2001, and now U.S. Pat. No. 6,639,323, said U.S. application Ser. Nos. 09/768,288 and 09/771,985 are, in turn, a continuation application and a divisional application, respectively, of U.S. application Ser. No. 09/449,834, filed Nov. 26, 1999, and now U.S. Pat. No. 6,342,726, which, in turn, was filed as a continuation of U.S. application Ser. No. 08/822,933, filed Mar. 21, 1997, and now abandoned, and said U.S. application Ser. No. 09/983,286, is a continuation of U.S. application Ser. No. 09/113,500, filed Jul. 10, 1998, and now U.S. Pat. No. 6,307,269; and the entire disclosures of all of which are hereby incorporated by reference.

BACKGROUND OF THE INVENTION

The present invention relates, generally, to a semiconductor device technique such as for the manufacture of a semiconductor integrated circuit device and, in particular, relates to a technique useful in the manufacture of a semiconductor device such as a semiconductor integrated circuit device to be applied to portable equipment, such as portable telephones and handy type personal computers, for which there is a strong trend toward reducing the size, the weight and the thickness of the product and, also, to such technique which leads to the manufacture of a relatively low cost semiconductor device such as a low cost semiconductor integrated circuit device package with improved seal properties in the package such as a CSP (Chip Size Package), although not limited thereto.

1. Recently, a trend toward reducing the size, the weight and the thickness of the product has become vigorous for electronic equipment along with an improved function and performance. This is largely due to a rapid increase in the use of personal equipment, such as personal telephones or handy type personal computers in recent years. Further, man-machine interface functions have been increased in personally manipulated equipment, for which easy handlability and operability have been considered increasingly important. It is considered that the trend will become more and more conspicuous in expected regular multimedia areas.

Under such circumstances, development for increasing the density and the degree of integration of semiconductor chips has progressed continuously; however, in addition to the size and the number of electrodes of the semiconductor chips being increased, the size of the packages have also increased rapidly. Accordingly, narrowing of the pitch of terminal leads has been promoted for facilitating the size reduction of the packages, which makes mounting of the package more difficult.

In view of the above, it has been proposed in recent years to provide high density packages with super-multiple pins having the same area as that of the semiconductor chips, and such packaging techniques are mentioned, for example, in various publications, such as "Nikkei Microdevices" p 98-p 102, issued on May 1, 1994, "Nikkei Microdevices" p 96-p 97, issued on Feb. 1, 1995 by Nikkei BP Co. and "Electronic Material", p 22-p 28, issued on Apr. 1, 1995 (Heisei 7) by Kogyo Chosakai. One example of the structures produced with such packaging techniques, for example, as described in FIG. 6 of the "Electronic Material" publication, has a package structure in which a flexible wiring substrate is disposed by way of an elastomer (elastic material) on the surface of a semiconductor chip, leads on one end of wirings of the flexible wiring substrate are electrically connected with bonding pads on the surface of the semiconductor chip, and bump lands on the other end of the wirings of the flexible wiring substrate are electrically connected with the solder bumps.

The package structure has an outer size about equal to or greater than that of a semiconductor chip by the size of a protection frame optionally attached to the periphery of the chip, for which a flexible wiring substrate formed with solder bumps is used. The wiring pattern of the wiring substrate is made of a Cu foil having a Au plating on one side, the top ends of which to be connected with the pad of the chip constitute a lead pattern which is only composed of Au as a result of etching the Cu foil. In this structure, the flexible wiring substrate is bonded by an elastomer on the surface of the semiconductor chip and then the Au leads are connected with the bonding pads of the semiconductor chip.

2. A CSP, for example, which is a thin, compact semiconductor device of chip size, is often used in printed circuit boards built into portable electronic devices such as that referred-to above. The general structure of a CSP comprises a thin film wiring substrate on which are mounted bump electrodes which are external terminals, leads electrically connected to electrode pads of a semiconductor chip, an elastomer (elastic structure/elastic structural material) arranged between the semiconductor chip and the thin film wiring substrate and having approximately the same size as the thin film wiring substrate, and sealing parts which seal the electrode pads and the leads of the thin film wiring substrate connected to it.

Structures of CSPs studied by the inventors for comparison purposes, also, are described, for example, in "Nikkei Microdevices" Apr. 1, 1997, No. 142, pp. 44-53, published by Nikkei BP Co. on Apr. 1, 1997, and, in particular, the next generation CSP structure (comparison examples) described in FIG. 6, on page 48 thereof. This CSP comprises a semiconductor chip having electrode pads formed on its main surface, bump electrodes which are external terminals over the main surface of the semiconductor chip, and a contour ring outside the semiconductor chip.

SUMMARY OF THE INVENTION

In a study made by the present inventors of the package structure as described in part 1 above, a number of problems were recognized. For example, since the flexible wiring substrate in the package structure described above has a structure typically represented by a TCP (Tape Carrier Package) in which a Cu wiring pattern is formed on the surface of a polyimide tape, and an elastomer is formed to the wiring substrate on the side of the wiring surface, it is difficult to mount the elastomer uniformly and stably because of unevenness of the wiring pattern on the flexible wiring substrate. That is, there exist such problems that voids not filled with the elastomer are formed near both sides of the protrusions of the wiring pattern upon coating or appending the elastomer on the flexible wiring substrate, and the step of bonding the semiconductor chip can not be conducted stably since the size and the shape of the elastomer are not stable.

Further, bump electrodes are formed on the wiring substrate on the side of the tape. That is, a bump electrode is connected with the wirings by way of a through hole formed in the tape. Since the thickness of the tape is relatively large, for example, as much as 50 µm, if the pitch between the bump electrodes is smaller than the thickness of the tape, the aspect ratio of the through hole is increased to bring about a concern that the bump electrode and the wiring will not be connected. Accordingly, there is a concern that an increase in the number of pins of the package may be restricted.

In view of the above, an object of the present invention is to provide a semiconductor integrated circuit device capable of mounting an elastic structural material to a wiring substrate stably with a high accuracy and making the bonding step of a semiconductor chip stable, thereby enabling assembling with a high yield.

Another object of the present invention is to provide a technique for promoting an increase in the number of pins in a package.

An object of the present invention is to provide a semiconductor integrated circuit device capable of obtaining excellent electrical properties in view of noise resistance by the adoption of a multiple wiring layer structure.

An object of the present invention is to prevent wiring from becoming contaminated ingredients of an elastic structural material.

An object of the present invention is to prevent a semiconductor chip from being damaged, improve the reliability of the semiconductor chip, as well as prevent connection failure between an elastic structural material and the semiconductor chip, worsening of the flatness of the wiring substrate and lowering of reliability.

An object of the present invention is to eliminate a requirement for a soft-modified special wire bonder and to effect a shortening of the contact time upon bonding by further simplifying the trace of the bonding tool.

An object of the present invention is to solve a problem concerning disconnection of wirings.

An object of the present invention is to reduce any damage to a passivation layer or a semiconductor chip therebelow and further improve the bondability by preventing contamination of the wirings.

An object of the present invention is to increase the bonding strength between wirings and a substrate material and obtain a stable notch cutting performance.

An object of the present invention is to suppress warp of a wiring substrate and improve bondability with a bonding material, so as to achieve a package having excellent moisture proofness and reliability.

An object of the present invention is to improve the groove-fillage capability of an elastic structural material, capable of increasing the strength of a metal mask, by using a plurality of one side bridging portions, and further improving the groove-fillage capability by the formation of a stopping dam for sealant flow.

An object of the present invention is to improve the bondability and prevent damage to a semiconductor chip in an inner lead bonding technique.

An object of the present invention is to form a suitable S-shaped configuration with no return of a bonding tool but by merely driving the bonding tool vertically using a wiring design which takes into consideration a bending stress ratio.

An object of the present invention is to reduce the occurrence of cracks in wirings per se and moderate bonding damage to a semiconductor chip.

An object of the present invention is to suppress bleeding of low molecular weight ingredients of an elastic structural material and further avoid a disadvantage involving the creation of voids upon forming the elastic structural material by surface flattening.

An object of the present invention is to improve the fabrication accuracy for hole diameter for connection of a bump electrode in a method of manufacturing a semiconductor integrated circuit.

An object of the present invention is to provide a technique for forming a semiconductor package which is capable of bonding bump electrodes more satisfactorily, reducing the pitch of the bump electrodes and which provides output terminals at a higher density in a method of manufacturing a semiconductor integrated circuit device.

These and other objects, as well as novel features of the present invention will become apparent by consideration of the descriptions in the specification with reference to the accompanying drawings.

Among the featured aspects disclosed in the present application, a summary of typical examples thereof is given below.

That is, one of the semiconductor integrated circuit devices according to the present invention provides a package structure applied to a semiconductor integrated circuit device in which a wiring substrate is disposed by way of an elastic structural material on a main surface of a semiconductor chip, lead portions on one end of the wirings of the wiring substrate are electrically connected with external terminals on the main surface of the semiconductor chip, and land portions on the other end of the wirings of the wiring substrate are electrically connected with bump electrodes, wherein the wiring substrate has wirings formed on a first, main surface of a substrate base material (tape), and an elastic structural material is disposed on a second surface of the substrate base material, opposite the main surface thereof.

Further, the bump electrodes are formed on the side of the wirings.

Further, the bump electrodes are connected with the wirings each by way of a through hole disposed in an insulation film formed on the wirings and having a thickness smaller than that of the wiring base material.

Further, the external terminals of the semiconductor chip are disposed at a central portion or at an outer circumferential portion (i.e., at an outer periphery) of the semiconductor chip, and the bump electrodes connected to the external terminals of the semiconductor chip by way of the wirings of the wiring substrate are disposed to the inside, outside or in both regions inside and outside with respect to the outer circumference of the semiconductor chip.

Further, in a semiconductor integrated circuit device of the present invention, the size of the end of the elastic structural member of the semiconductor chip on the side of the external terminals and the end of the substrate base material of the wiring substrate are determined based on the ingredients of the elastic structural material.

Further, in a semiconductor integrated circuit device of the present invention, a distance M2 between the end of the substrate base material of the wiring substrate and the end of the elastic structural material on the outer circumferential side of the semiconductor integrated circuit device, and a distance M1 between the end of the semiconductor chip and the end of the substrate base material are determined within a range capable of satisfying the relationship:

$$M1 > M2 > 0.$$

Further, in a semiconductor integrated circuit device of the present invention, the wirings of the wiring substrate are formed to such a shape that a portion fixed with the substrate base material of the wiring substrate and a top end portion connected to the external terminals of the semiconductor chip are displaced at least by more than the width of the wirings.

Further, in a semiconductor integrated circuit device of the present invention, the wirings of the wiring substrate are formed as a cantilever structure fixed at one side to the substrate base material of the wiring substrate.

Further, in a semiconductor integrated circuit device of the present invention, the size of the end of an opening in a surface protection film on the semiconductor chip is determined within such a range that the wirings do not interfere with the surface protection film at least on the side thereof on which a bonding tool is driven down.

Further, in a semiconductor integrated circuit device of the present invention, the wirings of the wiring substrate are formed such that an effective area of a wiring portion of the wiring on the side of the notch terminal end is made larger. Particularly, the wiring portion on the side of the notch terminal end is connected with an opposed land portion of the wirings, or is extended longitudinally or laterally in a vacant region of the wirings, or adjacent wirings are connected with each other.

Further, in a semiconductor integrated circuit device of the present invention, the elastic structural material is formed within a range greater over the entire circumference at least by more than the width of a protrusion at the outer circumferential portion formed in the elastic structural material.

Further, in a semiconductor integrated circuit device of the present invention, when the elastic structural material is formed in two parts so as not to be bonded on the external terminals of the semiconductor chip, each of the ends of spaces to which the divided elastic structural materials are opposed is formed in a groove-shape. Particularly, a plurality of grooves are formed at each of the ends of the elastic structural material, or a stepping dam for sealant flow is formed beforehand during a sealing step.

Further, in a semiconductor integrated circuit device of the present invention, the connection structure between the external terminals of the semiconductor chip and the wirings of the wiring substrate are formed by pre-forming stud bumps on the external terminals of the semiconductor chip, and the external terminals of the semiconductor chip and the wirings of the wiring substrate are connected by way of the stud bumps.

Further, in a semiconductor integrated circuit device of the present invention, the connection structure between the external terminals of the semiconductor chip and the wiring substrate is formed by supplying solder beforehand so as to surround the wirings of the wiring substrate and the external terminals of the semiconductor chip, and the external terminals of the semiconductor chip are connected by way of the solder.

Further, in a semiconductor integrated circuit device of the present invention, the connection structure between the external terminals of the semiconductor chip and the wirings of the semiconductor substrate are formed by connecting the wirings of the wiring substrate and the external terminals of the semiconductor chip by way of stud bumps by using stud bumps of solder or Au ball so as to surround the wirings of the wiring substrate from above.

Further, in a semiconductor integrated circuit device of the present invention, the connection structure between the external terminals of the semiconductor chip and the wirings of the wiring substrate are formed by connecting the wirings of the wiring substrate and the external terminals of the semiconductor chip by using Al, solder or Au wire.

Further, in a semiconductor integrated circuit device of the present invention, the wiring structure of the wiring substrate is formed by narrowing the lateral size of the wirings from the end of the substrate base material of the wiring substrate to the top end of the wirings, such that the bending stress ratio $\alpha$ is represented by:

$$\alpha = \sigma1/\sigma0$$

where $\sigma0$ is bending strength caused at the end of the substrate base material and $\sigma1$ is maximum stress caused at an intermediate portion between the end of the substrate base material and the top end of the wirings, and wherein the lateral size is made constant particularly from a predetermined position, and the size and the shape of the wirings are determined such that the bending stress ratio $\alpha$ is from 1.2 to 1.5 in a case where the bending stress ratio $\alpha$ is represented by the following formula:

$$\alpha = b1 \times (L2-L1)/(b2 \times L2)$$

in which L1 is a taper length, L2 is a wiring length, b1 is a taper width and b2 is a wiring width.

Further, in a semiconductor integrated circuit device of the present invention, the wiring structure of the wiring substrate is formed by using an electroconductive material as a core material and applying Au plating on the surface.

Further, the wiring structure of the wiring substrate is formed by using Cu as a core material, applying Au plating on the surface and making at least one end connected with the external electrodes of the chip into an S-shaped configuration.

Further, in a semiconductor integrated circuit device of the present invention, a flattening insulation film is formed on the wiring substrate on the side of the wirings and an elastic structural material is disposed on the insulation film.

Further, a method of manufacturing a semiconductor integrated circuit device according to the present invention comprises a step of forming an elastic structural material on the rear face of a wiring substrate (tape side) in which wirings are formed on the substrate base material (tape), a step of bonding a semiconductor chip to the surface of the elastic structural material so as to oppose the wiring substrate, a step of connecting one end of the wirings to the external terminals of the semiconductor chip, a step of forming an insulation film thinner than the substrate base material on a main surface of the wirings, a step of forming openings to the insulation film each at a position corresponding to the other end of the wirings to be joined with the bump electrodes, and a step of forming the bump electrodes being joined to the other end of the wirings by way of the wirings.

Additionally, in a semiconductor device package structure like the CSP having the aforesaid general structure, discussed in part 2 above, problems due to resin flow of the package sealant arise. For example, a sealing resin easily flows onto the sides of the semiconductor chip. This impairs the precision of the contour size of the CSP so that, in some cases, it could not be inserted in its socket. In other words, a problem arises in that the contour shape of the CSP does not remain fixed.

If the amount of sealing resin is reduced in an attempt to solve such a problem in the case of the aforementioned CSP, the leads of the thin film wiring substrate may be exposed. This would adversely affect the sealing properties of the package. Namely, the sealing properties of the sealing parts would become inadequate, and humidity resistance would no longer be reliable.

In the comparison of CSP structures of the prior art, if the contour ring is made a separate structure, manufacturing costs increase.

In a CSP having the usual structure, during solder reflow in forming the bump electrodes, the internal pressure rises due to expansion of moisture and gas in the elastomer, and, as a result, the seal part is destroyed causing a "popcorn" phenomenon.

It is, therefore, also an object of this invention to provide a chip size semiconductor device of lower cost and improved sealing properties, and a method of manufacturing such a device.

It is a further object of this invention to provide a semiconductor device and manufacturing method which prevents occurrence of the aforementioned popcorn phenomenon.

These additional and other features of the invention are summarized below with regard to the description of further examples of the featured inventive aspects of the present application.

In a semiconductor device of this invention, a chip size package has its connection terminals provided on the outer periphery of its main surface. Such a package comprises an elastic structure arranged on the main surface of the semiconductor chip leaving the connection terminals exposed, a thin film wiring substrate comprising a substrate body having wirings whereof first ends thereof are electrically connected to the aforesaid terminals via leads and the other ends thereof are electrically connected to bump electrodes which are external terminals and comprising substrate protruding parts having openings which leave the connection terminals exposed and which protrude beyond the openings and the semiconductor chip, and sealing parts which seal the connection terminals of the semiconductor chip and seal the leads of the thin film wiring substrate, the substrate body and the substrate protruding parts of the thin film wiring substrate being formed in a one-piece construction.

As the substrate protruding parts are not separate from the substrate body but are formed together with it in a one-piece construction, the substrate protruding parts need not be formed from costly materials. As a result, the cost of manufacturing the semiconductor device is reduced.

Further, in a semiconductor device of this invention, a chip size structure has its connection terminals provided on the outer periphery of its main surface. Such a device comprises an elastic structure arranged on the main surface of the semiconductor chip comprising elastic protruding parts having openings which leave the connection terminals exposed, a thin film wiring substrate comprising a substrate body having wirings whereof first ends thereof are electrically connected to the aforesaid terminals via leads and the other ends thereof are electrically connected to bump electrodes which are external terminals, and comprising substrate protruding parts having openings which leave the connection-terminals exposed and which protrude beyond the openings and the semiconductor chip, and sealing parts which seal the connection terminals of the semiconductor chip and seal the leads of the thin film wiring substrate, the substrate body and the substrate protruding parts of the thin film wiring substrate being formed in a one-piece construction, and the thin film wiring substrate and the elastic structure having substantially the same size.

Still further, in a semiconductor device of this invention, a chip size structure has its connection terminals provided on the outer periphery of its main surface, comprising an elastic structure arranged on the main surface of the semiconductor chip having parts exposed to the outside for exposing the connection terminals, a thin film wiring substrate comprising a substrate main body having wirings whereof first ends thereof are electrically connected to the aforesaid connection terminals via leads and the other ends thereof are electrically connected to bump electrodes which are external terminals, and comprising openings so as to expose the aforesaid connection terminals, and sealing parts which seal the connection terminals of the semiconductor chip and seal the leads of the thin film wiring substrate.

A method of manufacturing a semiconductor device according to this invention comprises a step for preparing a thin film wiring substrate which is a chip size structure having connection terminals provided on the outer periphery of its main surface, comprising a substrate body with wiring, and comprising substrate protruding parts which protrude beyond openings in which leads are connected to this wiring and formed in a one-piece construction with the substrate body, a step for joining an elastic structure and the substrate body of the thin film wiring substrate, a step for joining the main surface of the semiconductor chip and the elastic structure so as to expose the connection terminals of the semiconductor chip in the openings of the thin film wiring substrate, a step for electrically connecting the connection terminals of the semiconductor chip and the corresponding leads of the thin film wiring substrate, a step for sealing the connection terminals of the semiconductor chip and the leads of the thin film wiring substrate using a sealing resin comprising a low silica material so as to form sealing parts, a step for electrically connecting the wiring of the substrate body so as to form bump electrodes, and a step for simultaneously cutting the substrate protruding parts and sealing parts formed therein to a desired contour size.

Further, a method of manufacturing a semiconductor device according to this invention comprises a step for preparing a thin film wiring substrate which is a chip size structure having connection terminals provided on the outer periphery of its main surface, comprising a substrate main body having wiring joined to an elastic structure and openings in which leads are connected to the wiring, wherein the substrate body is supported in a substrate frame by supporting parts of the elastic structure, a step for joining the main surface of the semiconductor chip and the elastic structure so as to leave the connection terminals of the semiconductor chip exposed in the openings of the thin film wiring substrate, a step for electrically connecting the connection terminals of the semiconductor chip and the corresponding leads of the thin film wiring substrate, a step for resin sealing the connection terminals of the semiconductor chip and the leads of the thin film wiring substrate so as to form sealing parts, a step for electrically connecting the wiring of the substrate body so as to form bump electrodes, a step for cutting the supporting part of the elastic structure so as to separate the substrate body from the substrate frame, and a step for exposing the exposed parts of the elastic structure.

The foregoing and a better understanding of the present invention will become apparent from the following detailed description of the illustrated embodiments and the claims when read in conjunction with the accompanying drawings, all forming a part of the invention. While the foregoing and following written and illustrated disclosure focuses on disclosing various example embodiments depicted as preferred embodiments of the invention, it should be clearly understood that the same is by way of illustration and example only and is not to be construed as being limited thereto. The spirit and scope of the present invention are limited only by the terms of the appended claims.

The following represents brief descriptions of the accompanying drawings.

BRIEF DESCRIPTION OF THE DRAWINGS

FIG. 53 is chart illustrating a relationship between a lead size and a bending stress ratio, of a semiconductor integrated circuit device in the Embodiment 1 according to the present invention;

FIGS. 83(a) to 83(c) are diagrams showing the structure of the semiconductor device shown in FIG. 82, in which FIG. 83(a) is a cross-sectional view through a line 83A-83A in FIG. 82, FIG. 83(b) is a cross-sectional view through a line 83B-83B in FIG. 82, and FIG. 83(c) is a cross-sectional view through a line 83C-83C in FIG. 82;

FIGS. 84(a), 84(b), 84(c) and 84(d) are specification tables showing example specifications of parts used in the semiconductor device shown in FIG. 82;

FIG. 86 is a chart showing typical processing conditions in each stage of the production process shown in FIG. 85;

FIGS. 90(a) and 90(b) are diagrams each showing a typical method of manufacturing the semiconductor device (CSP) according to the first embodiment of this invention, in which FIG. 90(a) is a partial plan view showing an elastomer attachment, and FIG. 90(b) is a partial plan view showing a semiconductor chip attachment;

FIGS. 96(a) to 96(c) are diagrams showing the structure of the semiconductor device shown in FIG. 95, in which FIG. 96(a) is a cross-sectional view through a line 96A-96A in FIG. 95, FIG. 96b) is a cross-sectional view through a line 96B-96B in FIG. 95, and FIG. 96(c) is a cross-sectional view through a line 96C-96C in FIG. 95;

FIGS. 98(a) to 98(c) are diagrams showing the structure of the semiconductor device shown in FIG. 97, in which FIG. 98(a) is a cross-sectional view through a line 98A-98A in FIG. 97, FIG. 98(b) is a cross-sectional view through a line 98B-98B in FIG. 97, and FIG. 98(c) is a cross-sectional view through a line 98C-98C in FIG. 97;

FIGS. 100(a) to 100(c) are diagrams showing the structure of the semiconductor device shown in FIG. 99, in which FIG. 100(a) is a cross-sectional view through a line 100A-100A in FIG. 99, FIG. 100(b) is a cross-sectional view through a line 10B-10B in FIG. 99, and FIG. 100(c) is a cross-sectional view through a line 100C-100C in FIG. 99;

FIGS. 102(a) to 102(c) are diagrams showing the structure of the semiconductor device shown in FIG. 101, in which FIG. 102(a) is a cross-sectional view through a line 102A-102A in FIG. 101, FIG. 102(b) is a cross-sectional view through a line 102B-102B in FIG. 101, and FIG. 102(c) is a cross-sectional view through a line 102C-102C in FIG. 101;

FIGS. 104(a) to 104(c) are diagrams showing the structure of the semiconductor device shown in FIG. 103, in which FIG. 104(a) is a cross-sectional view through a line 104A-104A in FIG. 103, FIG. 104(b) is a cross-sectional view through a line 104B-104B in FIG. 103, and FIG. 104(c) is a cross-sectional view through a line 104C-104C in FIG. 103;

FIGS. 106(a) to 106(c) are diagrams showing the structure of the semiconductor device shown in FIG. 105, in which FIG. 106(a) is a cross-sectional view through a line 106A-106A in FIG. 105, FIG. 106(b) is a cross-sectional view through a line 106B-106B in FIG. 105, and FIG. 106(c) is a cross-sectional view through a line 106C-106C in FIG. 105; FIG. 106(d) is the front view of the structure of the semiconductor device shown in FIG. 105; and FIG. 106(e) is the side view of the structure of the semiconductor device shown in FIG. 105;

FIGS. 110(a) to 110(c) are diagrams showing the structure of the semiconductor device shown in FIG. 109, in which FIG. 110(a) is a cross-sectional view through a line 110A-110A in FIG. 109, FIG. 110(b) is a cross-sectional view through a line 110B-110B in FIG. 109, and FIG. 110(c) is a cross-sectional view through a line 110C-110C in FIG. 109;

FIGS. 112(a) to 112(c) are diagrams showing the structure of the semiconductor device shown in FIG. 111, in which FIG. 112(a) is a cross-sectional view through a line 112A-112A in FIG. 111, FIG. 112(b) is a cross-sectional view through a line 112B-112B in FIG. 111, and FIG. 112(c) is a cross-sectional view through a line 112C-112C in FIG. 111.

FIGS. 114(a) to 114(c) are diagrams showing the structure of the semiconductor device shown in FIG. 113, in which FIG. 114(a) is a cross-sectional view through a line 114A-114A in FIG. 113, FIG. 114(b) is a cross-sectional view through a line 114B-114B in FIG. 113, and FIG. 114(c) is a cross-sectional view through a line 114C-114C in FIG. 113;

FIGS. 116(a) to 116(c) are diagrams showing the structure of the semiconductor device shown in FIG. 115, in which FIG. 116(a) is a cross-sectional view through a line 116A-116A in FIG. 115, FIG. 116(b) is a cross-sectional view through a line 116B-116B in FIG. 115, and FIG. 116(c) is a cross-sectional view through a line 116C-116C in FIG. 115;

FIG. 117 is a plan view showing an example of a structure of a semiconductor device (CSP) according to an Embodiment 17 of the present invention through the sealing parts;

FIGS. 118(a) to 118(c) are diagrams showing the structure of the semiconductor device shown in FIG. 117, in which FIG. 118(a) is a cross-sectional view through a line 118A-118A in FIG. 117, FIG. 118(b) is a cross-sectional view through a line 118B-118B in FIG. 117, and FIG. 118(c) is a cross-sectional view through a line 118C-118C in FIG. 117;

FIG. 119 is a plan view showing an example of a structure of a semiconductor device (CSP) according to an Embodiment 18 of the present invention through the sealing parts;

Figure 120A:
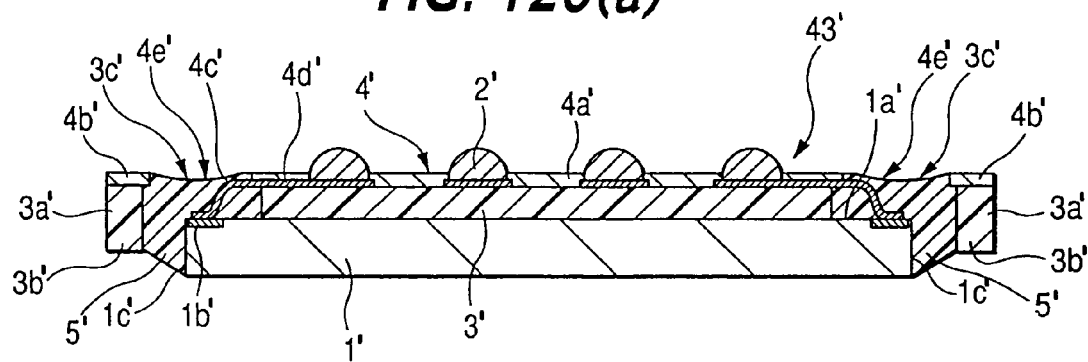
Figure 120B:
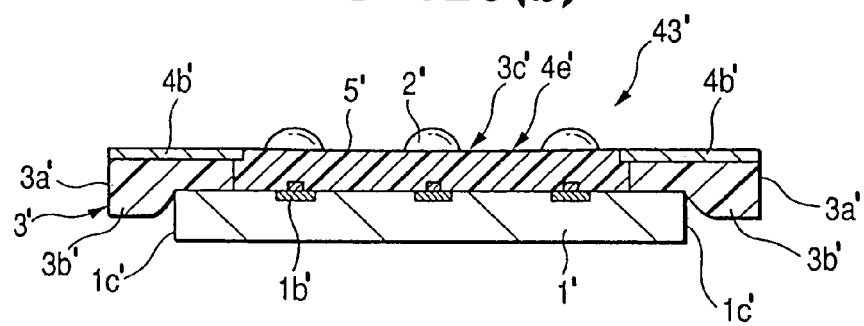
Figure 120C:
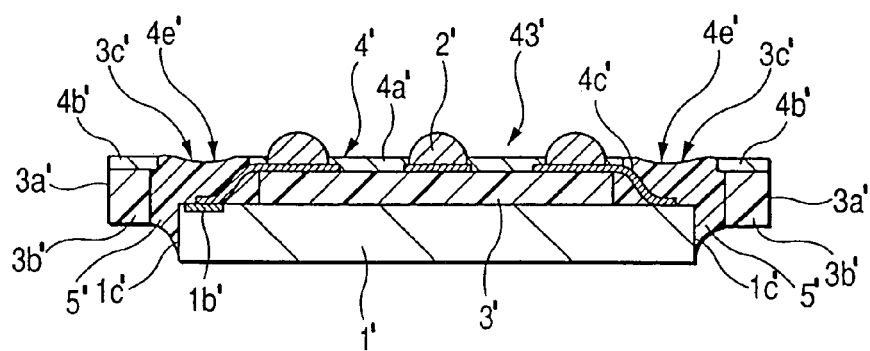
Figure 122A:
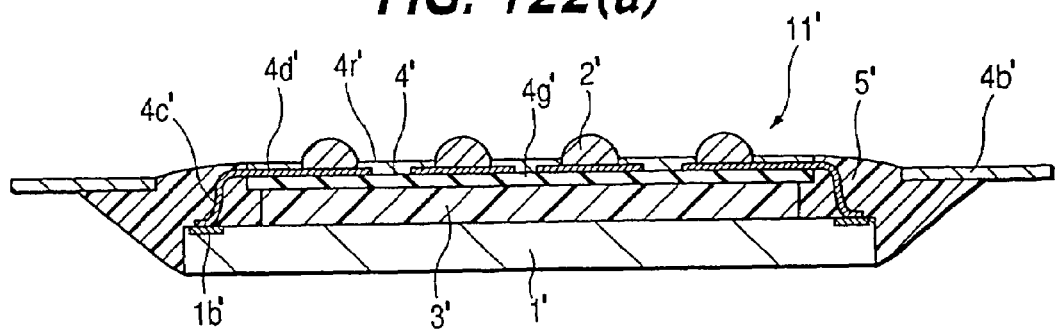
Figure 122B:
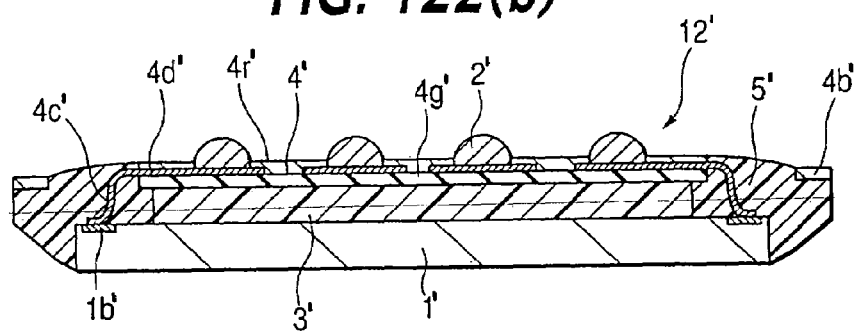
Figure 122C:
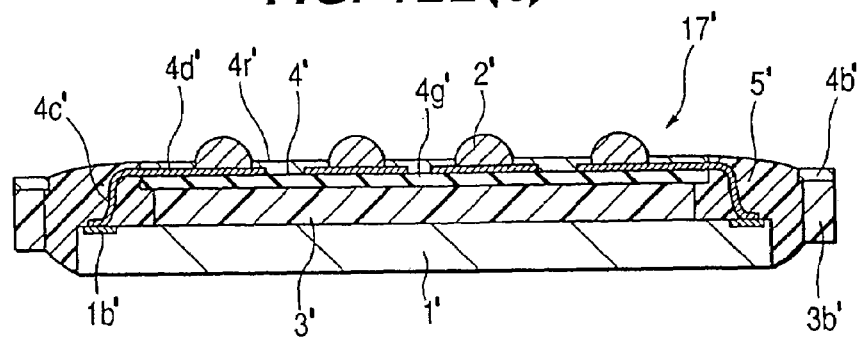
Figure 123A:
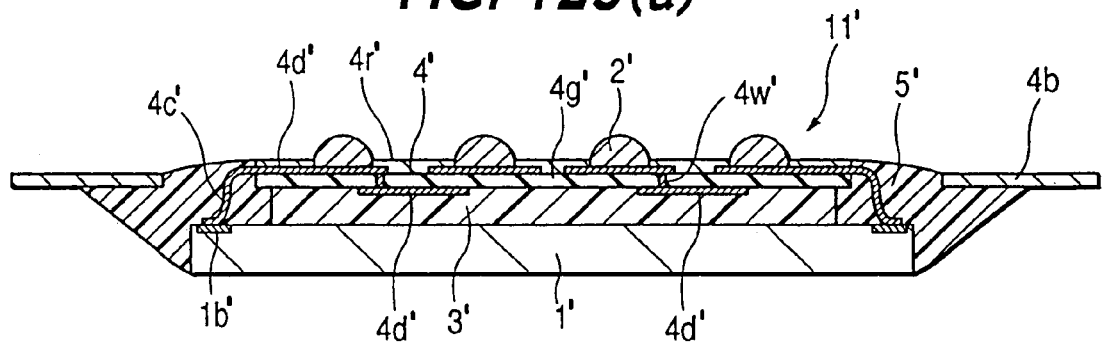
Figure 123B:
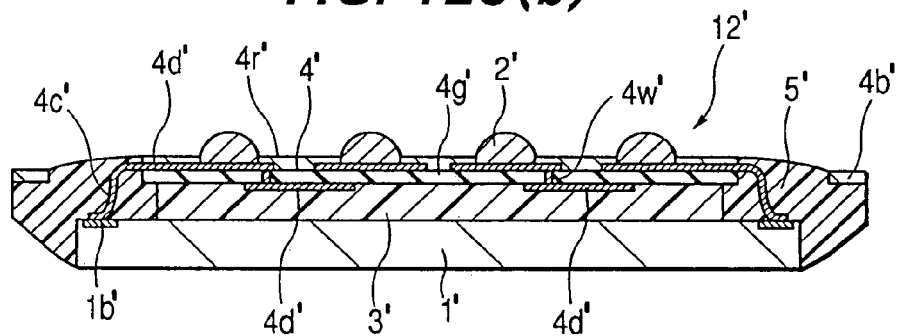
Figure 123C:
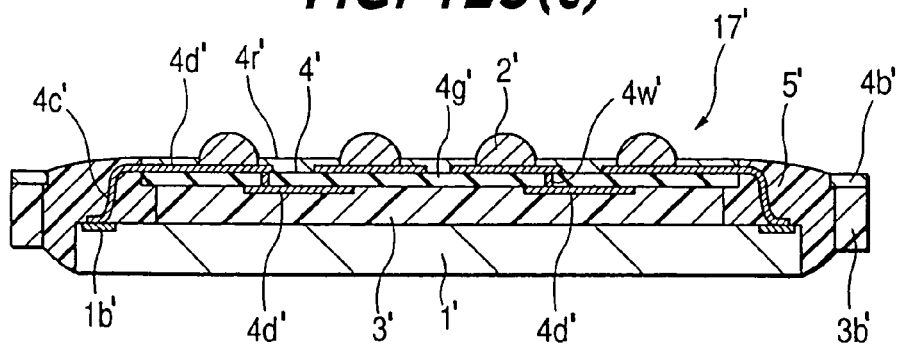
Figure 124A:
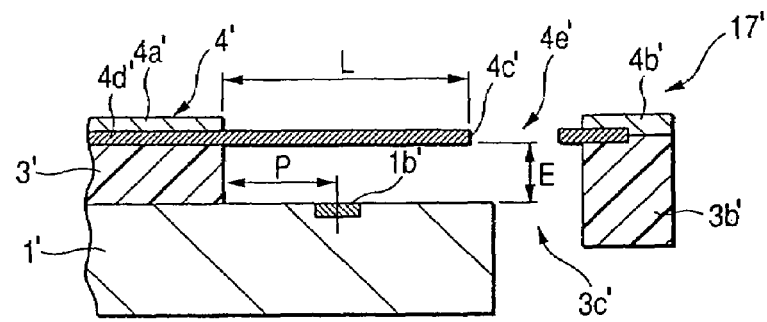
Figure 124B:
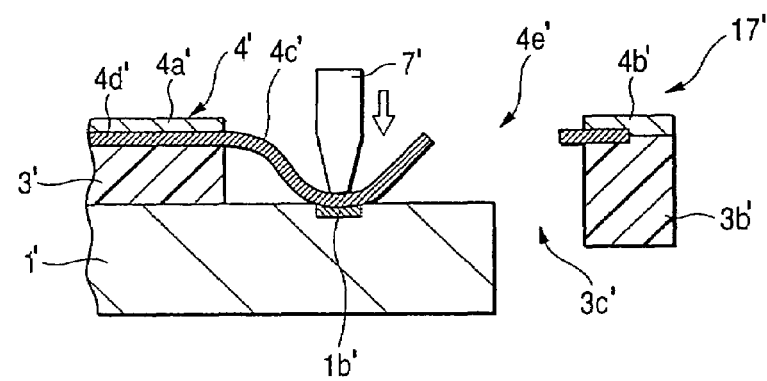
Figure 124C:
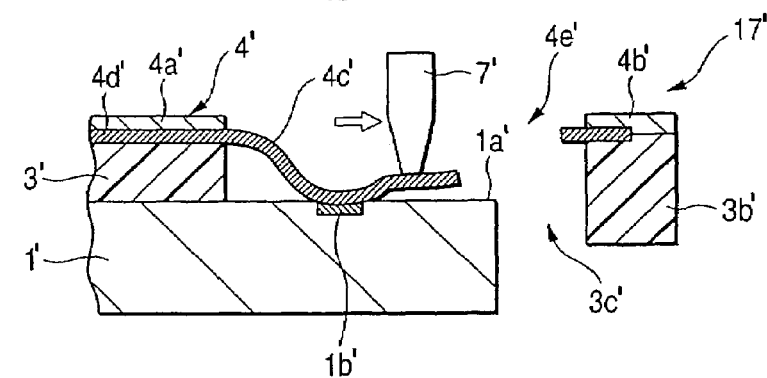
Figure 124D:
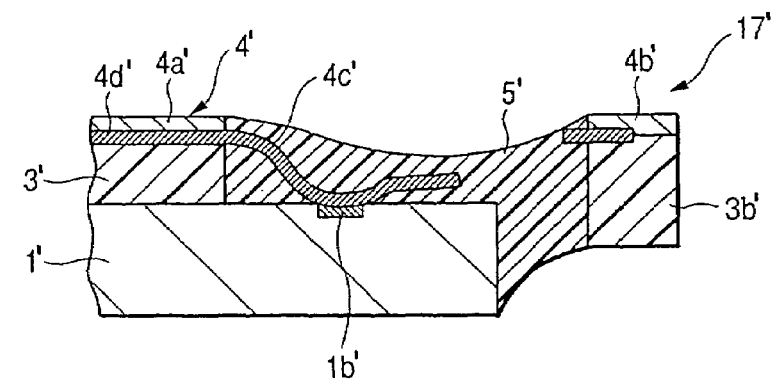
Figure 125A:
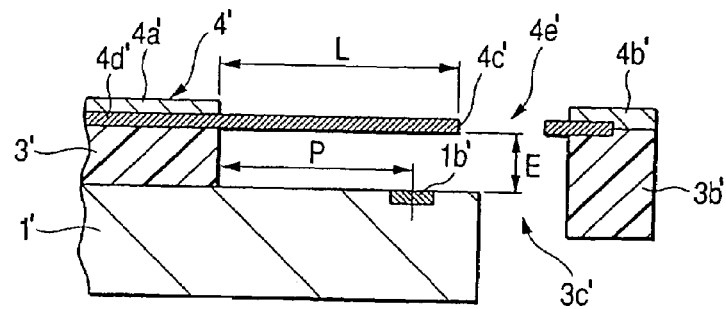
Figure 125B:
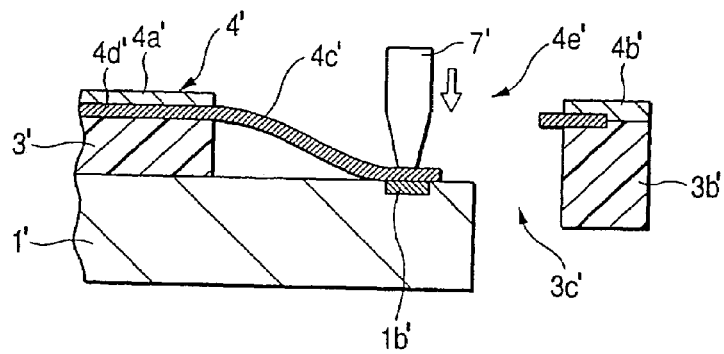
Figure 125C:
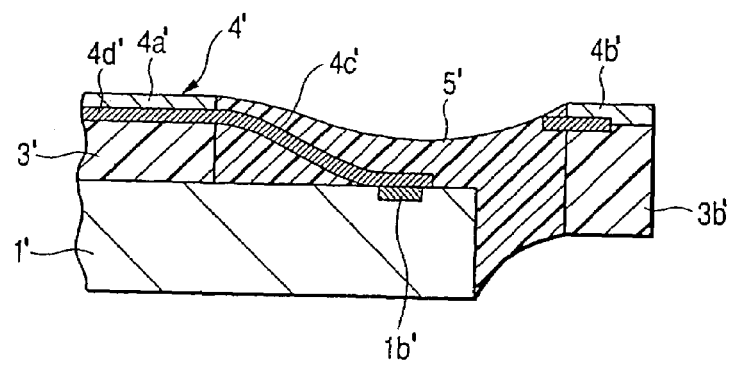
Figure 126A:
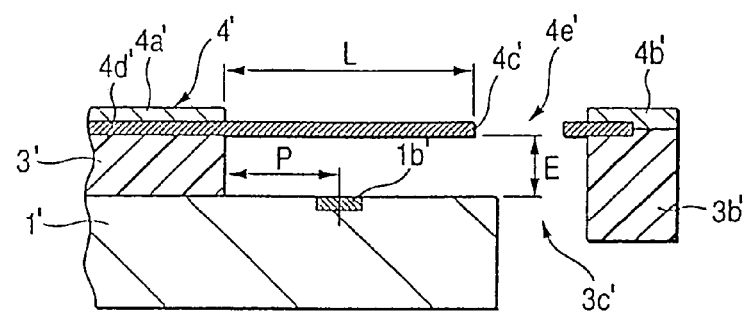
Figure 126B:
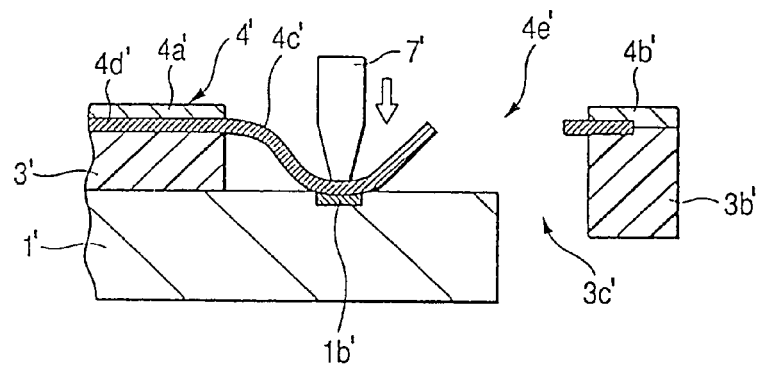
Figure 126C:
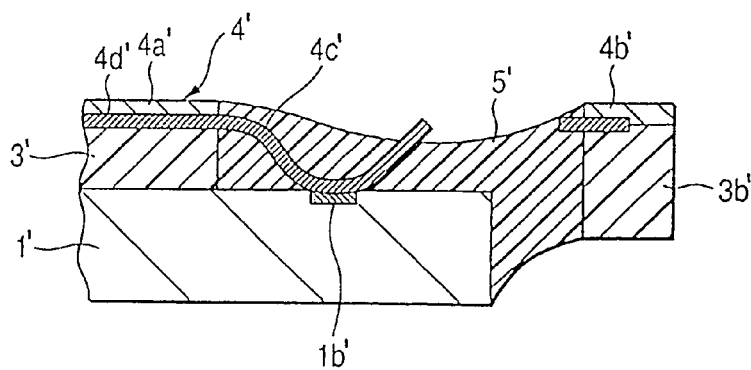
Figure 128A:
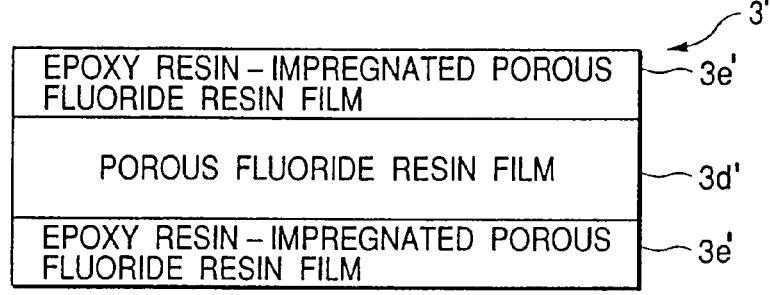
Figure 128B:
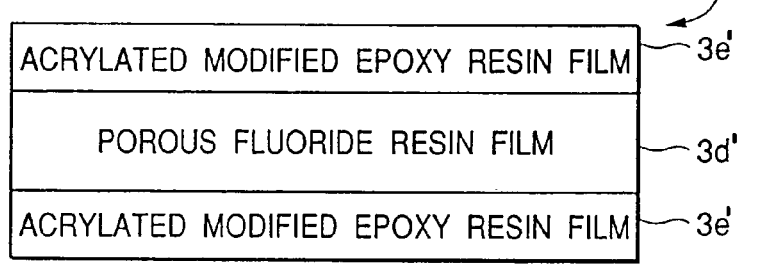
Figure 128C:
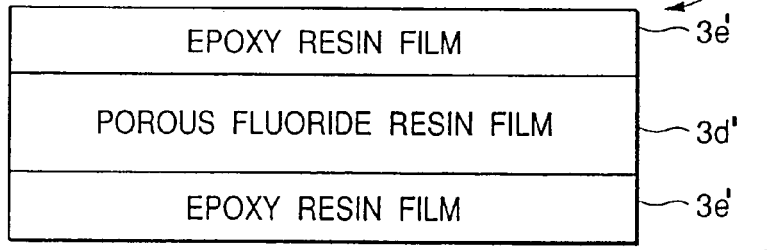
Figure 128D:
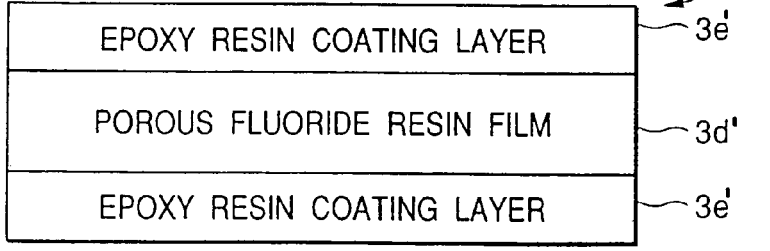
Figure 128E:
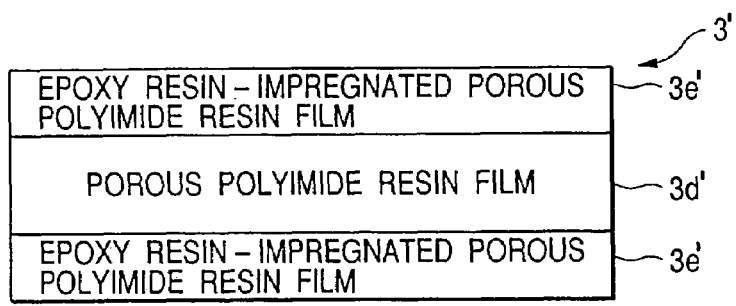
Figure 128F:
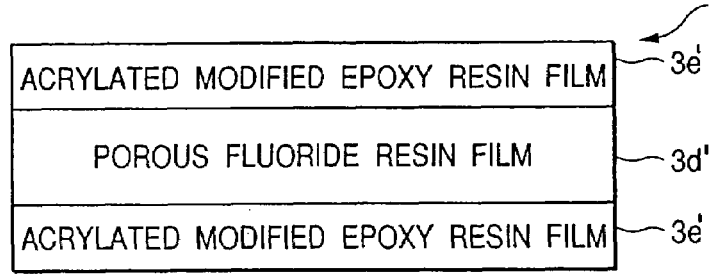
Figure 128G:
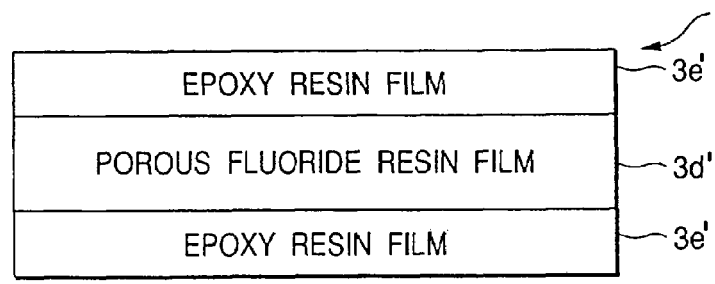
Figure 128H:
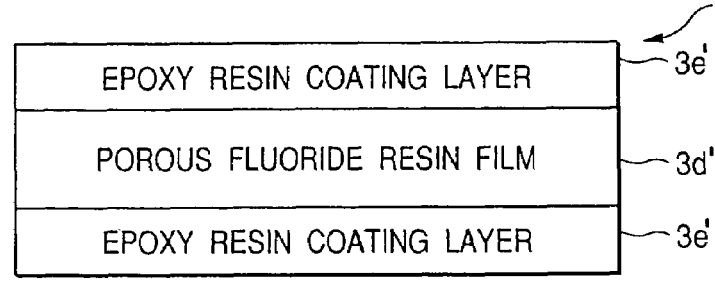
Figure 129A:
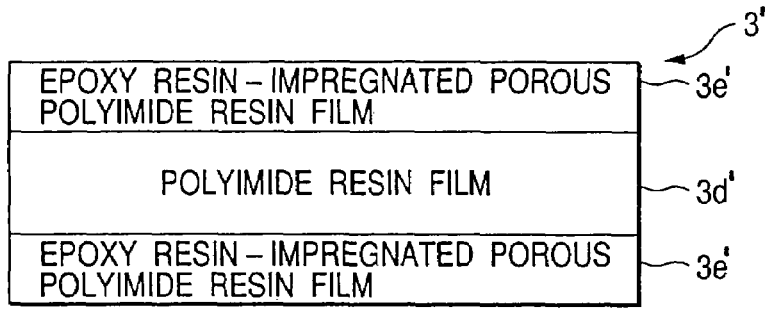
Figure 129B:
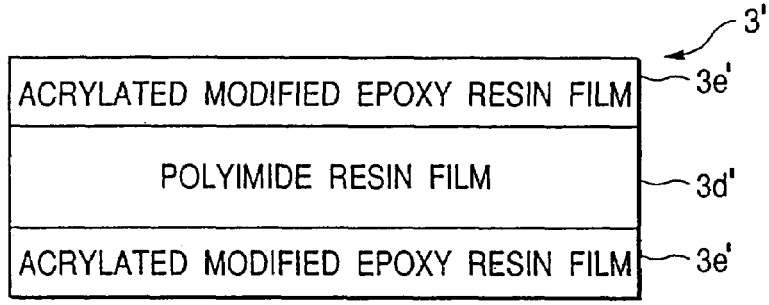
Figure 129C:
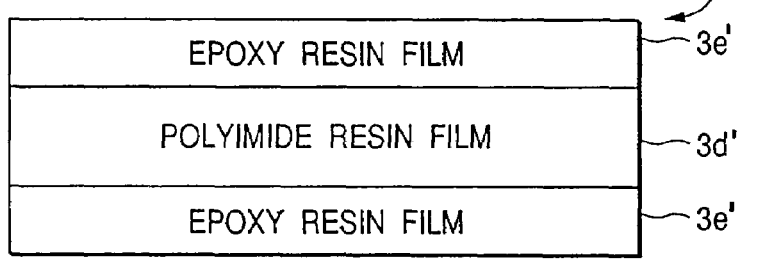
Figure 129D:
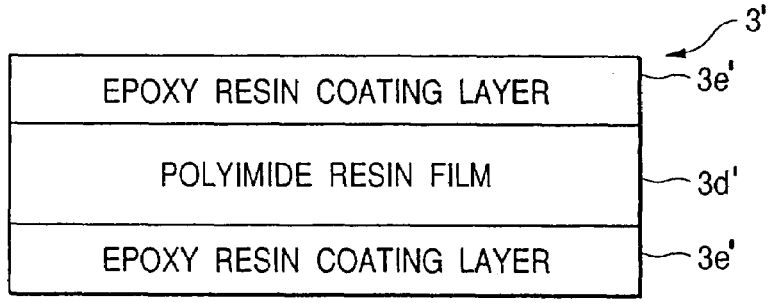
Figure 129E:
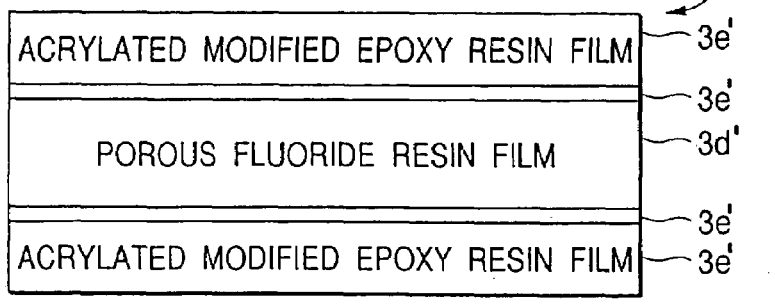
Figure 130A:
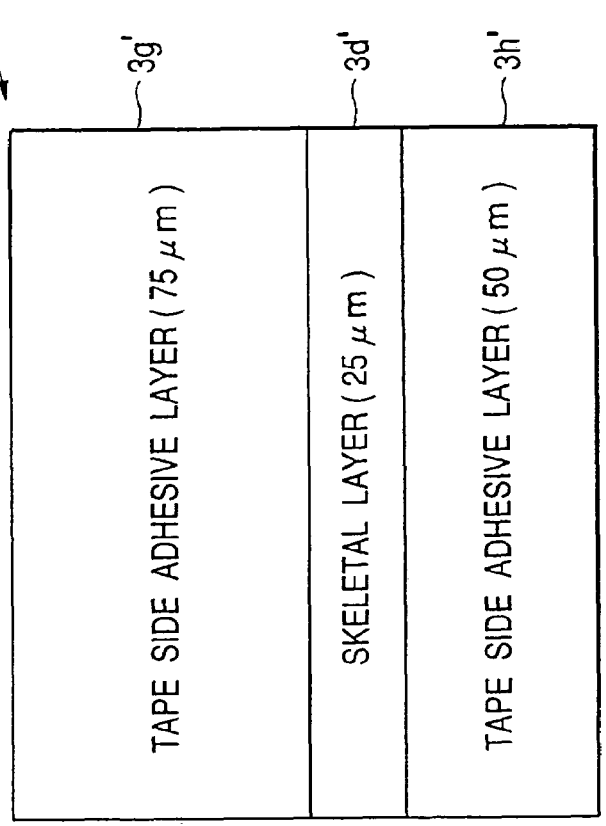
Figure 130B:
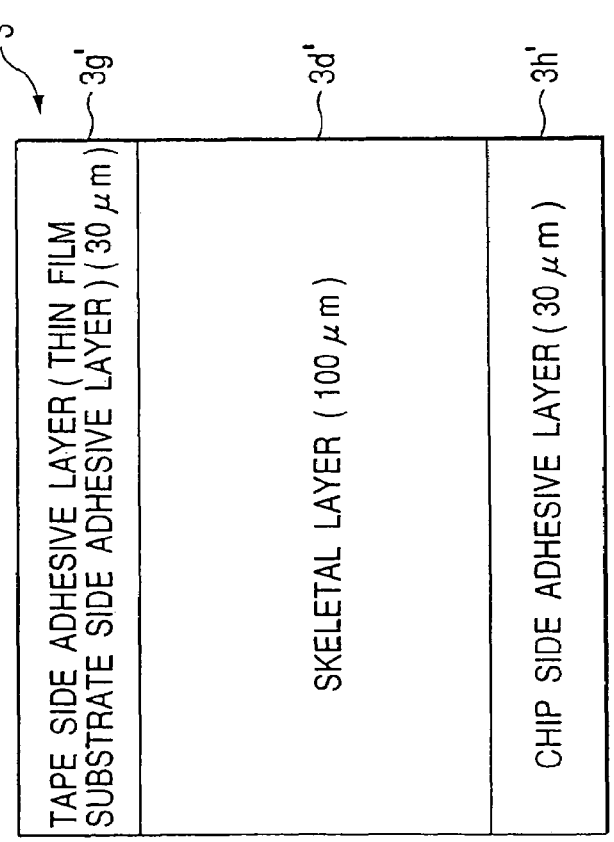
Figure 131:
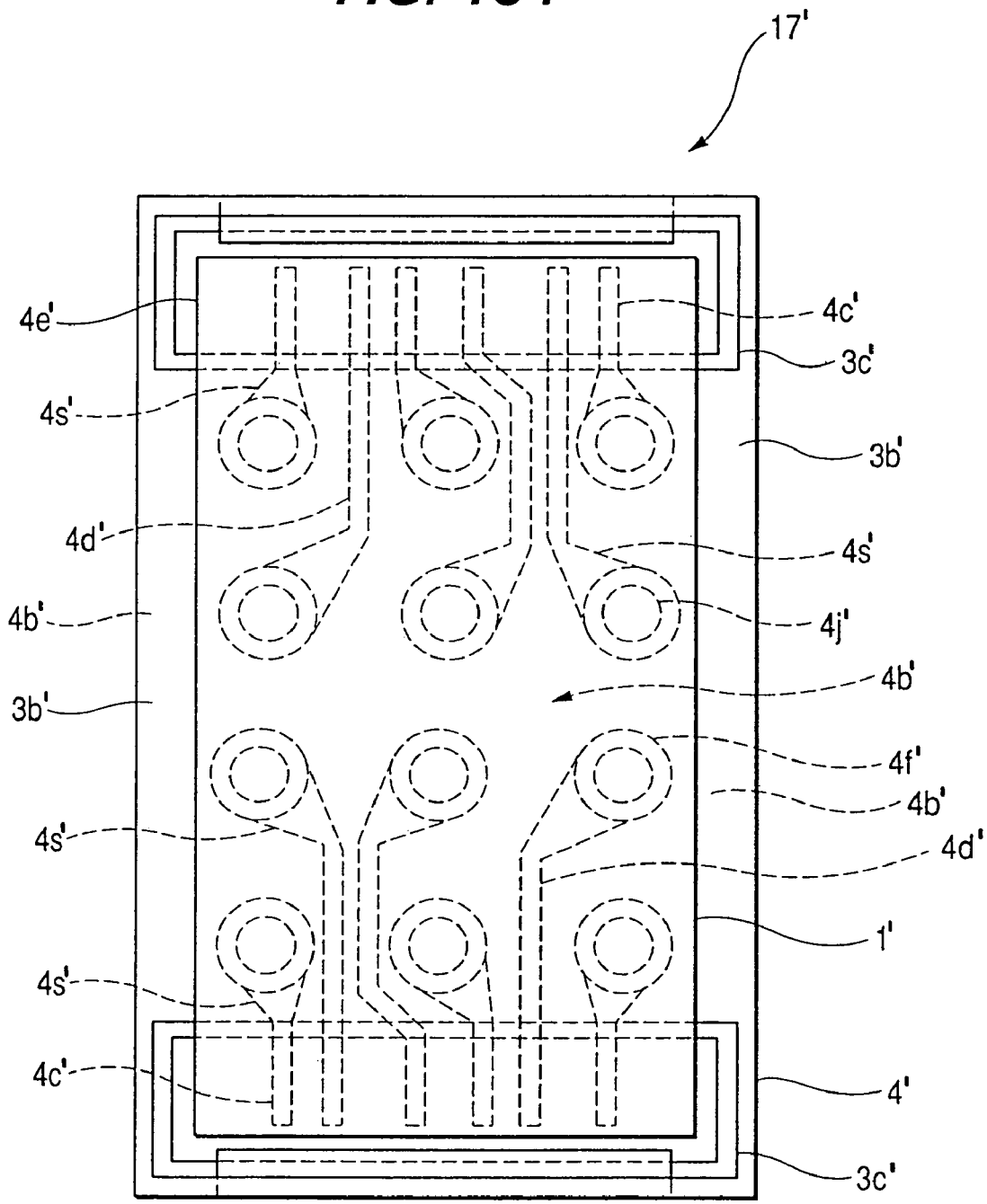

FIGS. 120(a) to 120(c) are diagrams showing the structure of the semiconductor device shown in FIG. 119, in which FIG. 120(a) is a cross-sectional view through a line 120A-120A in FIG. 119, FIG. 120(b) is a cross-sectional view through a line 120B-120B in FIG. 119, and FIG. 120(c) is a cross-sectional view through a line 120C-120C in FIG. 119;

FIGS. 121(a), 121(b), 121(c) are diagrams each showing an unconnected lead in the semiconductor device according to an Embodiment 19 of the present invention, in which FIG. 121(a) is a cross-sectional view when the unconnected lead is deformed, and FIGS. 121(b), 121(c) are cross-sectional views when the unconnected lead is not deformed;

FIGS. 122(a), 122(b), 122(c) are cross-sections each showing a typical structure using a single-layer surface-wired thin film wiring substrate in the semiconductor device according to an Embodiment 20 of the present invention;

FIGS. 123(a), 123(b), 123(c) are cross-sections each showing a typical structure using a two-layer thin film wiring substrate in the semiconductor device according to Embodiment 20 of the present invention;

FIGS. 124(a), 124(b), 124(c), 124(d) are enlarged partial cross-sections each showing an example of a lead tip processing sequence in a method of manufacturing a semiconductor device according to an Embodiment 21 of the present invention, in which FIG. 124(a) shows results before bonding, FIG. 124(b) shows results during bonding, FIG. 124(c) shows results after bonding, and FIG. 124(d) shows results after sealing;

FIGS. 125(a), 125(b), 125(c) are enlarged partial cross-sections showing another example of a lead tip processing sequence in a method of manufacturing a semiconductor device according to an Embodiment 21 of the present invention, for comparison with the lead tip processing sequence of FIG. 124, in which FIG. 125(a) shows results before bonding, FIG. 125(b) shows results during bonding, and FIG. 125(c) shows results after sealing;

FIGS. 126(a), 126(b), 126(c) are enlarged partial cross-sections showing another example of a lead tip processing sequence in a method of manufacturing a semiconductor device according to Embodiment 21 of this invention, for comparison with the lead tip processing sequence of FIG. 124, in which FIG. 126(a) shows results before bonding, FIG. 126(b) shows results during bonding, and FIG. 126(c) shows results after sealing;

FIG. 127 is an elastomer specification table showing examples of color specifications of an elastomer (elastic structure) used in a semiconductor device (CSP) according to an Embodiment 22 of the present invention;

FIGS. 128(a) to 128(h) are diagrams showing typical elastomer compositions in a semiconductor device according to an Embodiment 23 of the present invention;

FIGS. 129(a) to 129(e) are diagrams showing typical elastomer compositions in a semiconductor device according to Embodiment 23 of the present invention, in which FIG. 129(a) to 129(d) show a 3-layer structure, and FIG. 129(e) shows a 5-layer structure;

FIGS. 130(a) and 130(b) show example thicknesses of a skeleton layer and adhesive layers of an elastomer according to an Embodiment 24 of the present invention;

FIG. 131 is a view of a base surface showing the under surface of the semiconductor device (CSP) according to an Embodiment 25 of the present invention;

FIGS. 132(a), 132(b), 132(c), 132(d) are diagrams showing an example structure of a semiconductor device according to an Embodiment 26 of the present invention, in which FIG.

Figure 133A:
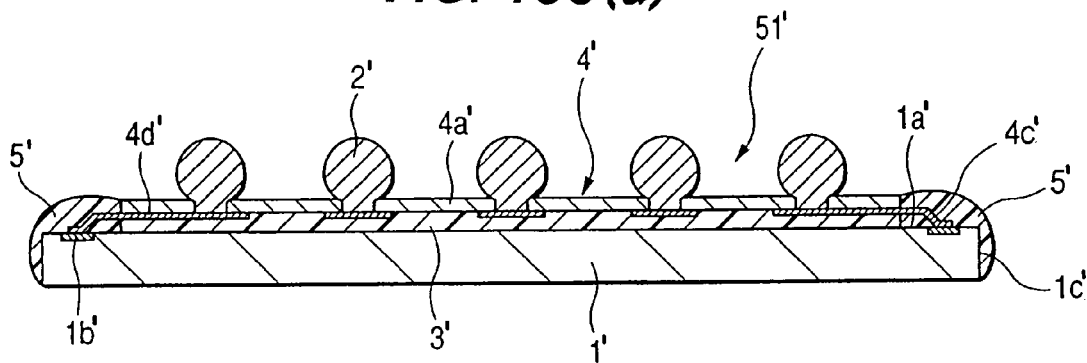
Figure 133B:
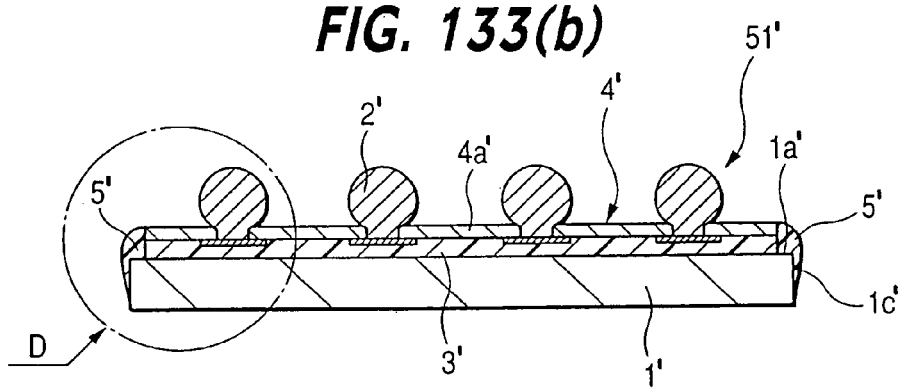
Figure 133C:
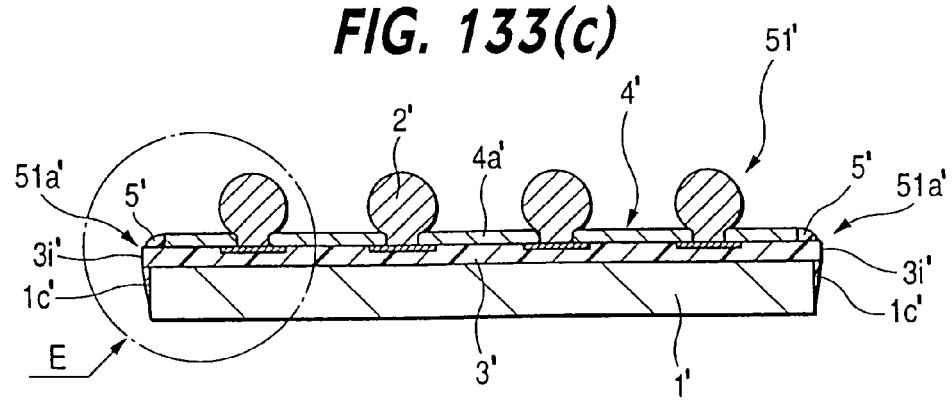
Figure 134A:
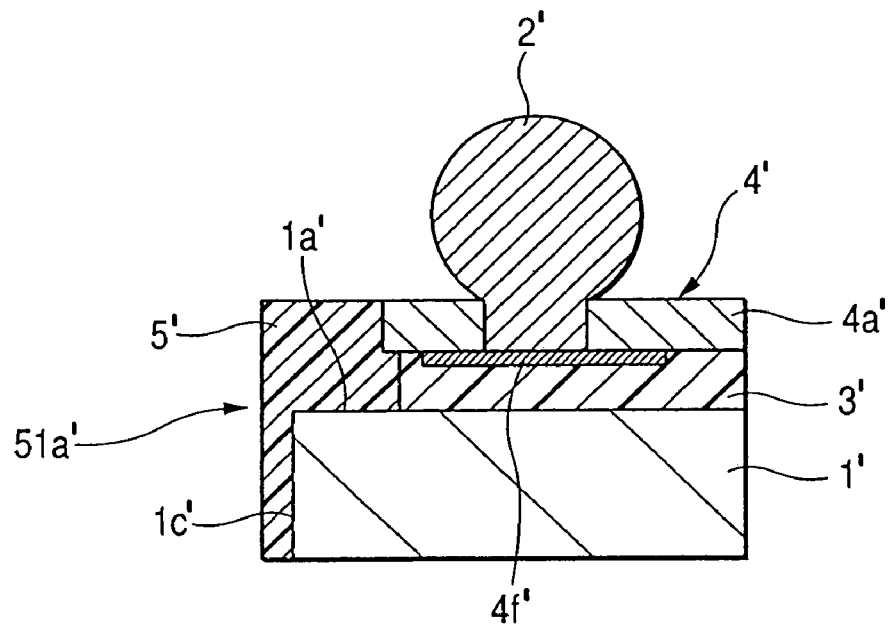
Figure 134B:
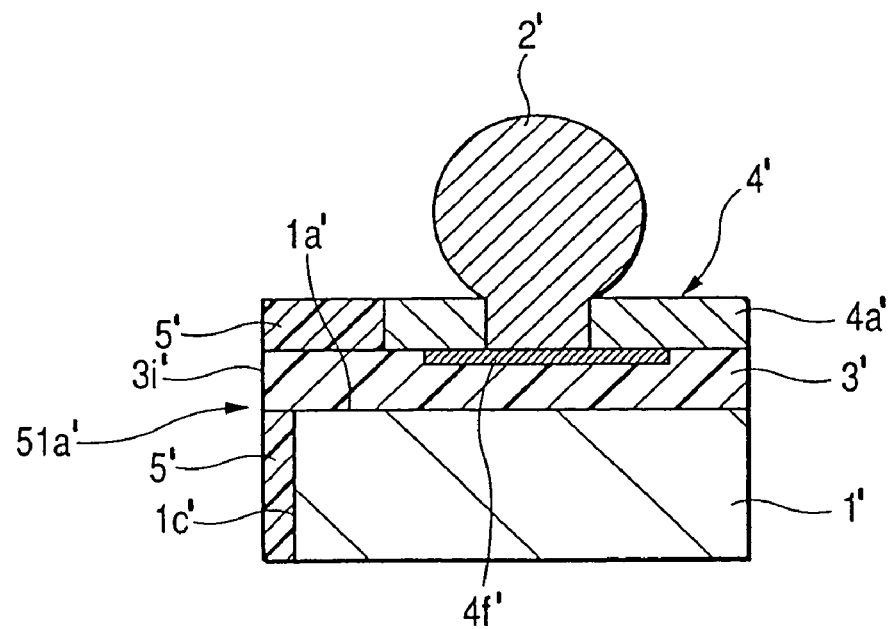
Figure 140A:
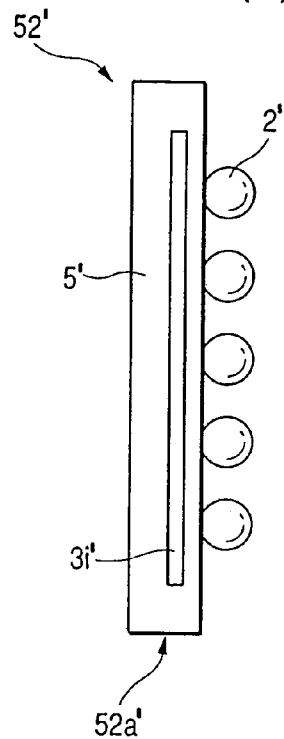
Figure 140B:
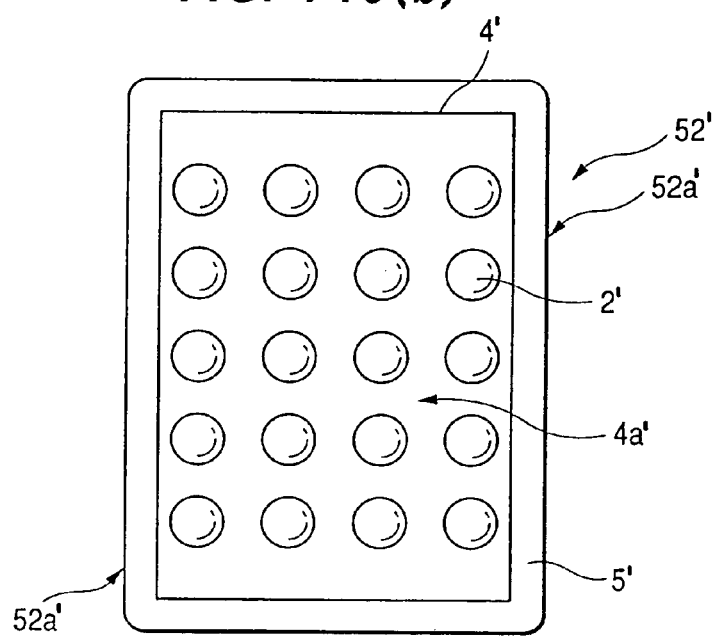
Figure 140C:
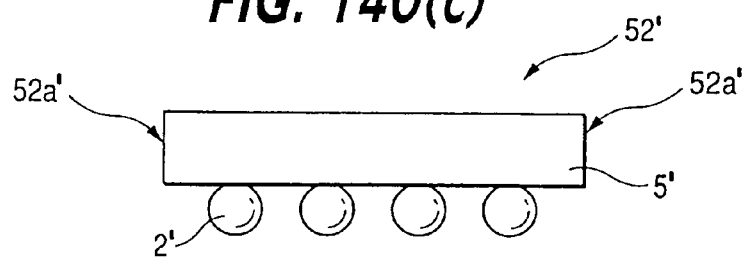
Figure 143A:
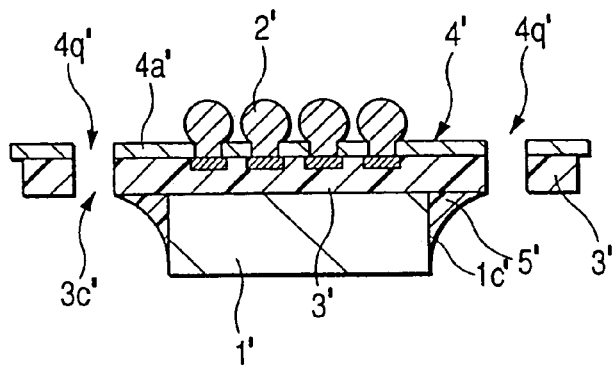
Figure 143B:
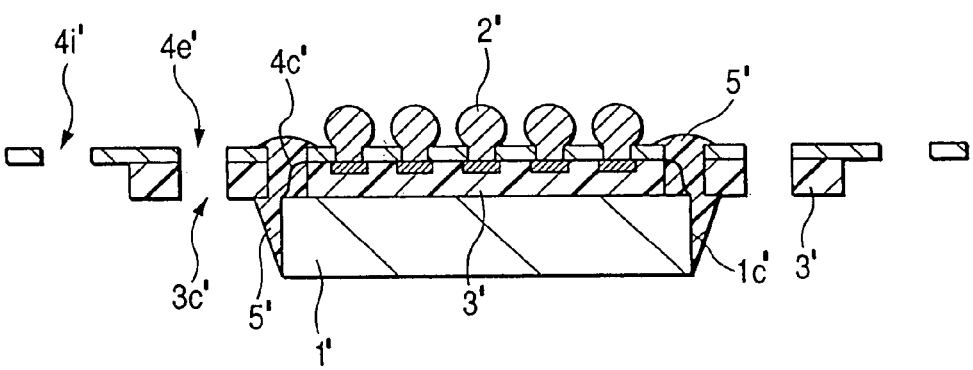
Figure 143C:
Figure 145:
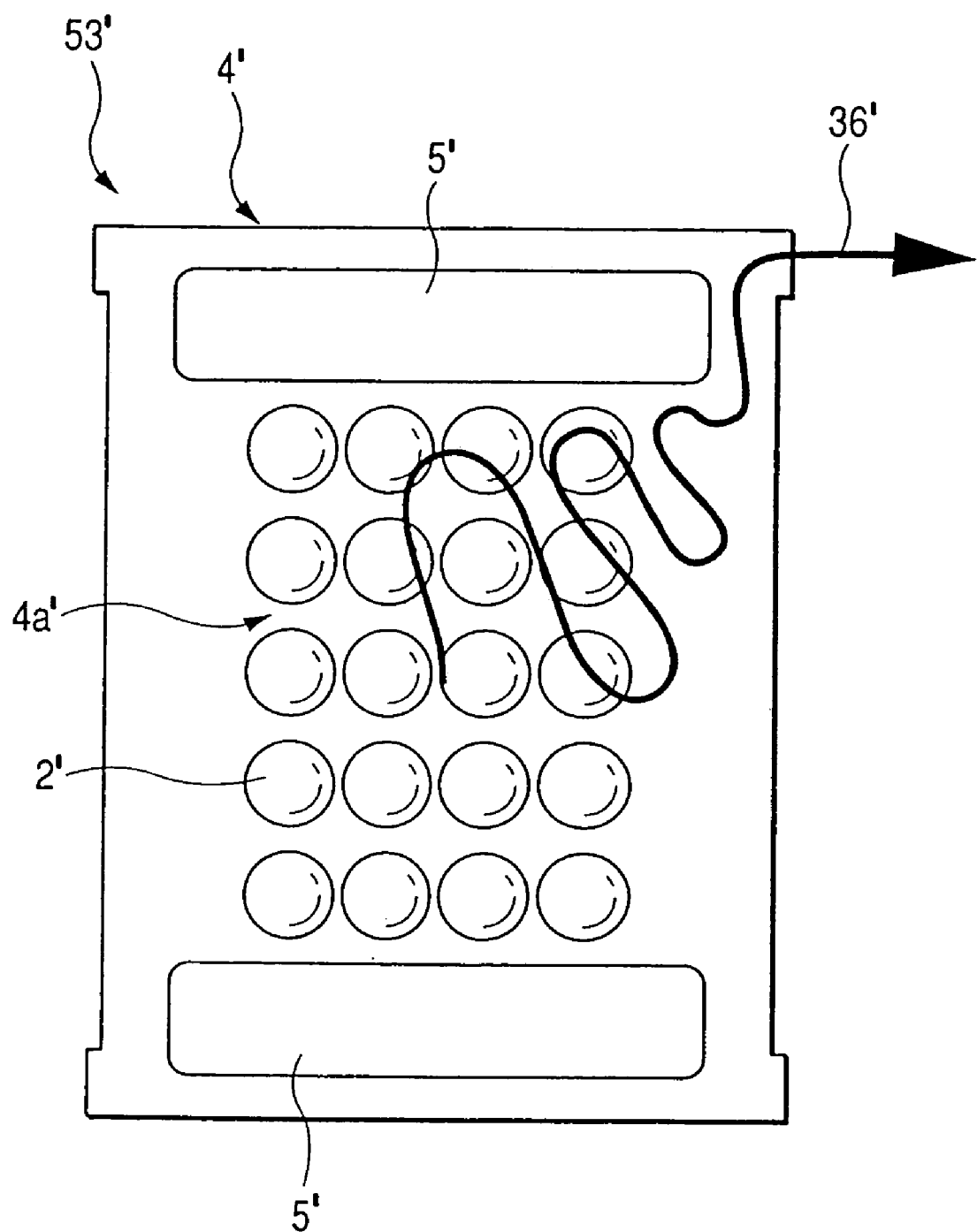
Figure 146A:
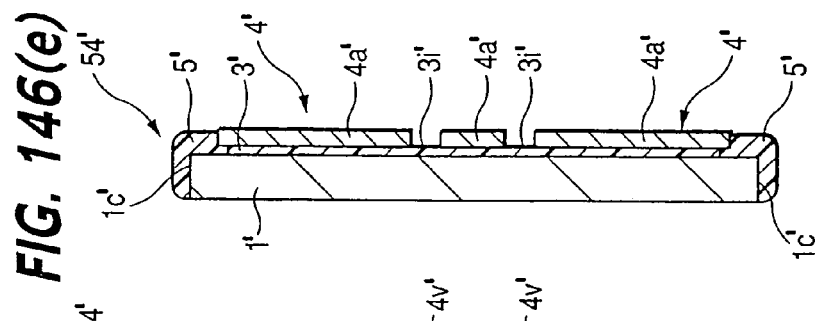
Figure 146B:
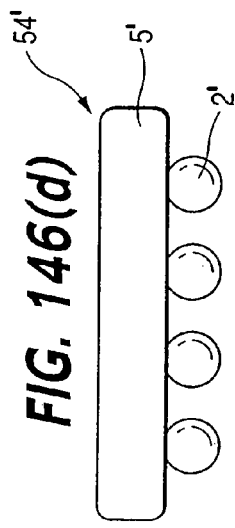
Figure 146C:
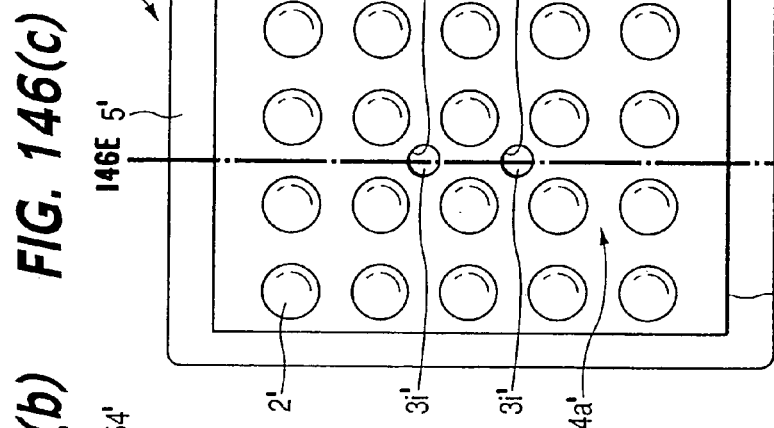
Figure 146D:
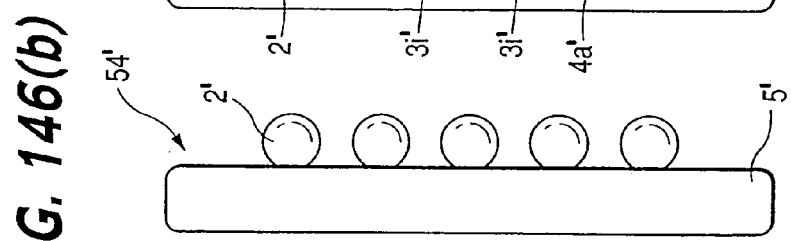
Figure 146E:
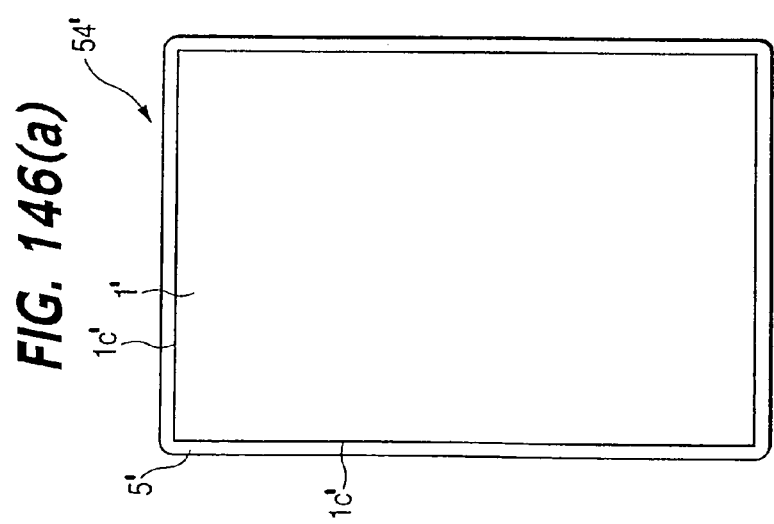
Figure 148:
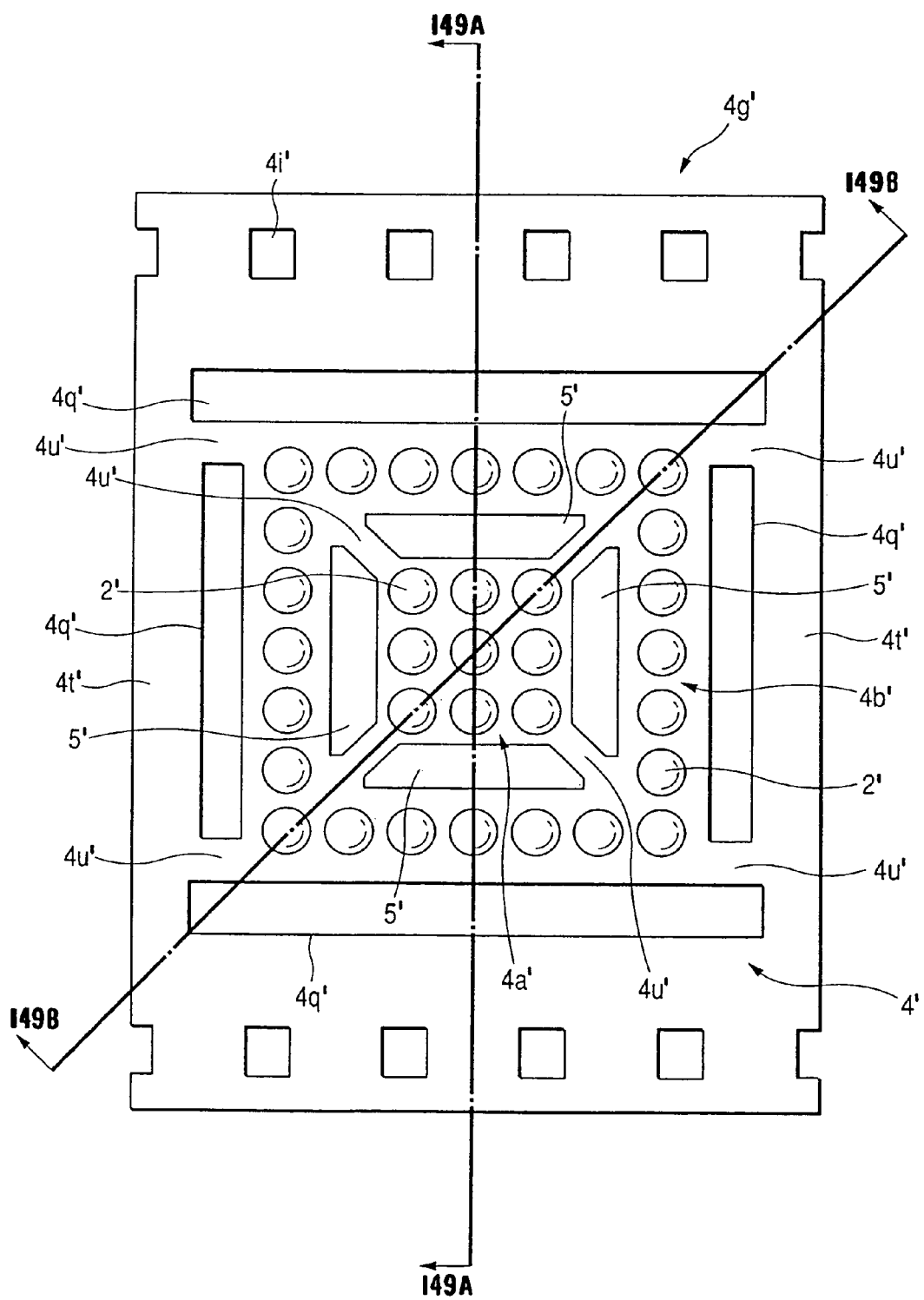
Figure 151:
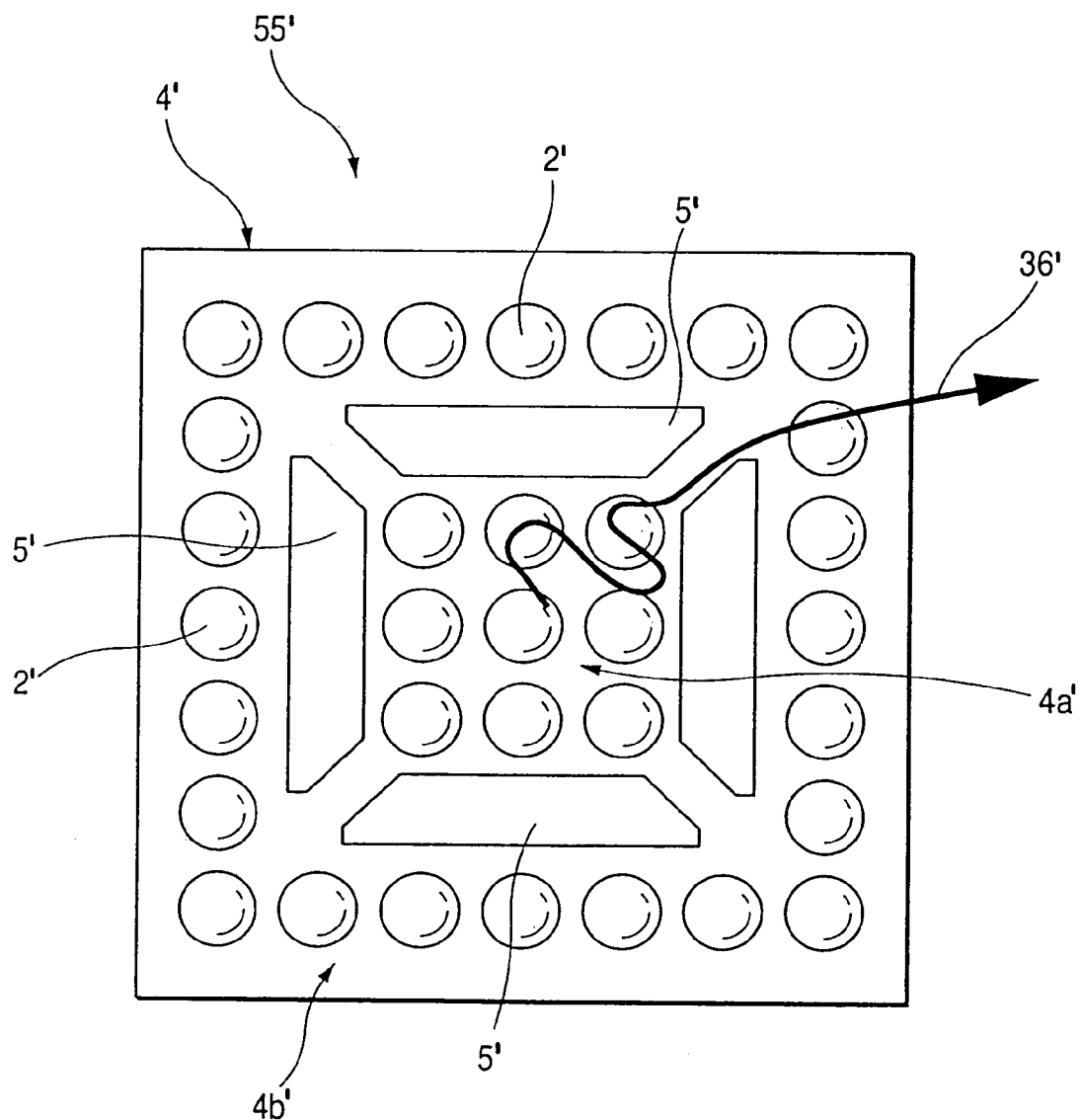

132(a) is a base view, FIG. 132(b) is a side view, FIG. 132(c) is a partial cut-away plan view, and FIG. 132(d) is a front view;

FIGS. 133(a), 133(b), 133(c) are diagrams showing the structure of the semiconductor device shown in FIG. 132, in which FIG. 133(a) is a cross-sectional view through a line 133A-133A in FIG. 132, FIG. 133(b) is a cross-sectional view through a line 133B-133B in FIG. 132, and FIG. 133(c) is a cross-sectional view through a line 133C-133C in FIG. 132;

FIGS. 134(a), 134(b) are enlarged partial cross-sections showing the structure of the semiconductor device shown in FIG. 133, in which FIG. 134(a) is a diagram showing a part D in FIG. 133(b), and FIG. 134(b) is a diagram showing a part E in FIG. 133(c);

FIGS. 135(a) to 135(f) are diagrams showing an example of a method of manufacturing a thin film wiring substrate used in the semiconductor device according to Embodiment 26 of the present invention, in which FIGS. 135(a), 135(c), 135(e) are partial plan views, and FIGS. 135(b), 135(d), 135(f) are respectively cross-sections through lines 135B-135B, 135D-135D and 135F-135F;

FIGS. 136(a) to 136(d) are diagrams showing an example of a method of manufacturing a thin film wiring substrate used in the semiconductor device according to Embodiment 26 of the present invention, in which FIGS. 136(a), 136(c) are partial plan views, and FIGS. 136(b), 136(d) are respectively cross-sections through lines 136B-136B and 136D-136D;

FIGS. 137(a) to 137(f) are diagrams showing an example of a method of manufacturing a thin film wiring substrate used in the semiconductor device according to Embodiment 26 of the present invention, in which FIGS. 137(a), 137(d) are partial plan views, FIGS. 137(b), 137(e) are respectively cross-sections through lines 137B-137B and 137E-137E, and FIGS. 137(c), 137(f) are respectively cross-sections through lines 137C-137C and 137F-137F;

FIGS. 138(a) to 138(f) are diagrams showing an example of a method of manufacturing a thin film wiring substrate used in the semiconductor device according to Embodiment 26 of the present invention, in which FIGS. 138(a), 138(d) are partial plan views, FIGS. 138(b), 138(e) are respectively cross-sections through lines 138B-138B and 138E-138E, and FIGS. 138(c), 138(f) are respectively cross-sections through lines 138C-138C and 138F-138F;

FIGS. 139(a) to 139(f) are diagrams showing an example of a method of manufacturing a thin film wiring substrate used in the semiconductor device according to Embodiment 26 of the present invention, in which FIGS. 139(a), 139(d) are partial plan views, FIGS. 139(b), 139(e) are respectively cross-sections through lines 139B-139B and 139E-139E, and FIGS. 139(c), 139(f) are respectively cross-sections through lines 139C-139C and 139F-139F;

FIGS. 140(a), 140(b), 140(c) are diagrams showing an example of a method of manufacturing a thin film wiring substrate used in the semiconductor device according to an Embodiment 27 of the present invention, in which FIG. 140(a) is a side view, FIG. 140(b) is a plan view, and FIG. 140(c) is a front view;

FIGS. 141(a), 141(b), 141(c), 141(d) are diagrams showing an example of the structure of a thin film wiring substrate according to an Embodiment 28 of the present invention, in which FIG. 141(a) is a base view, FIG. 141(b) is a side view, FIG. 141(c) is a plan view, and FIG. 141(d) is a front view;

FIGS. 142(a), 142(b) are diagrams showing an example of a state when sealing is complete in a manufacturing method according to Embodiment 28 of the present invention;

FIGS. 143(a), 143(b), 143(c) are diagrams showing cross-sections through the plan view shown in FIG. 143(a), in which FIG. 143(a) is a cross-section showing the plane 143A-143A, FIG. 143(b) is a cross-section showing the plane 143B-143B, and FIG. 143(c) is a cross-section showing the plane 143C-143C;

FIGS. 144(a), 144(b), 144(c) are diagrams showing an example of a state when sealing is complete in a manufacturing method according to Embodiment 28 of the present invention, in which FIG. 144(a) is a plan view, FIG. 144(b) is a side view, and FIG. 144(c) is a base view;

FIG. 145 is a schematic diagram of a state when gas is leaving in the semiconductor device according to Embodiment 28 of the present invention;

FIGS. 146(a) to 146(e) are diagrams each showing an example structure of a semiconductor device according to an Embodiment 29 of the present invention, in which 146(a) is a base view, FIG. 146(b) is a side view, FIG. 146(c) is a plan view, FIG. 146(d) is a front view, and FIG. 146(e) is a cross-section through a line 146E-146E in FIG. 146(c);

FIGS. 147(a), 147(b), 147(c) are diagrams showing an example structure of a semiconductor device according to an Embodiment 30 of the present invention, in which FIG. 147(a) is a plan view, FIG. 147(b) is a side view, and FIG. 147(c) is a base view;

FIG. 148 is a partial plan view showing an example of a sealing completion state in a method of manufacturing the semiconductor device according to Embodiment 30 of the present invention;

FIGS. 149(a), 149(b) are diagrams of cross-sections through line 149A-149A and line 149B-149B, respectively, of the partial plan view shown in FIG. 148;

FIGS. 150(a), 150(b) are diagrams each showing an example of a state when sealing is complete in a manufacturing method according to Embodiment 30 of the present invention, in which FIG. 150(a) is a base view, and FIG. 150(b) is a base view showing a semiconductor chip removed; and FIG. 151 is a schematic diagram of a state when gas is leaving in the semiconductor device according to Embodiment 30 of the present invention.

DESCRIPTION OF THE PREFERRED EMBODIMENTS

A detailed description of the embodiments with reference to the accompanying drawing illustrations follows:

Embodiment 1

Figure 1:
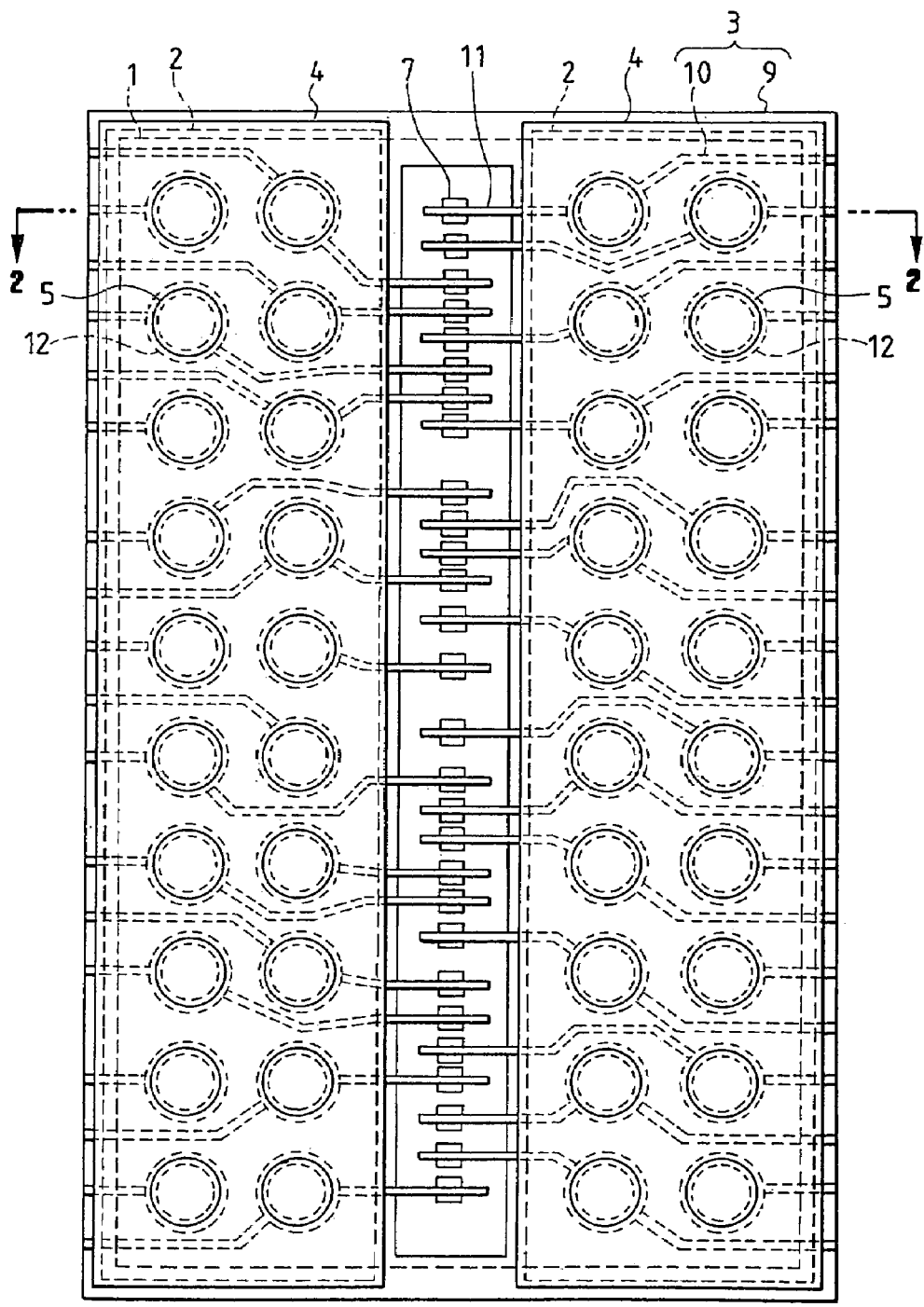
FIG. 1 is a plan view illustrating a semiconductor integrated circuit device which represents an Embodiment 1 of the present invention.
Figure 2:
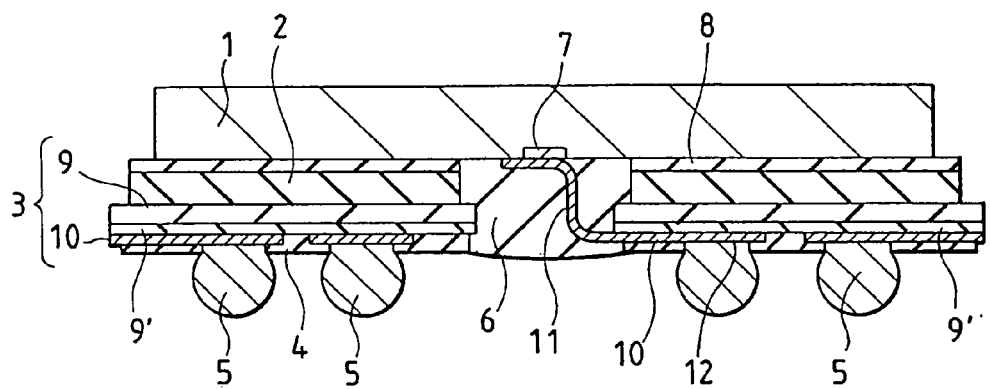
FIG. 2 is a cross sectional view taken along line 2-2 in FIG. 1 of the Embodiment 1 according to the present invention.
Figure 3:
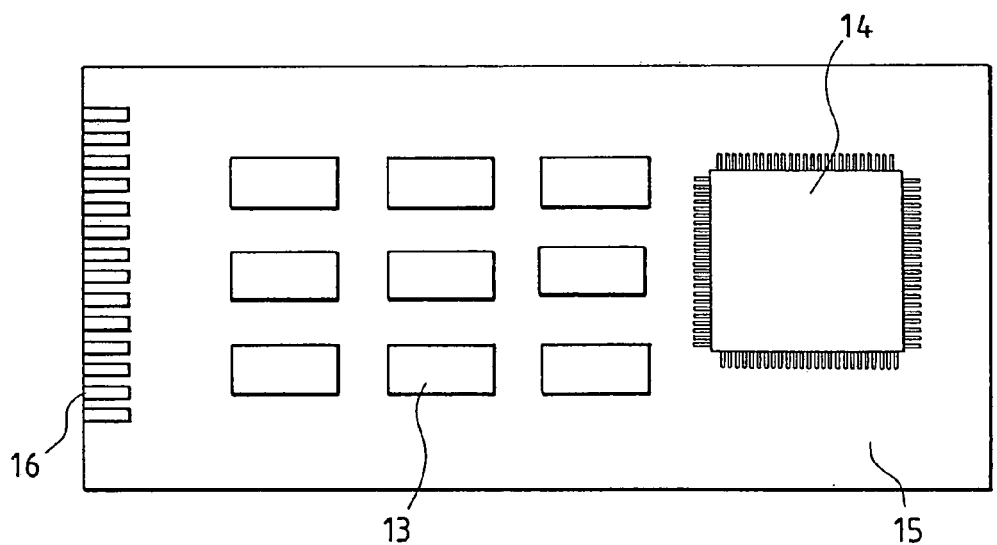
FIG. 3 is a plan view illustrating the state of mounting the semiconductor integrated circuit device in the Embodiment 1 according to the present invention to a mounting substrate.
Figure 4:
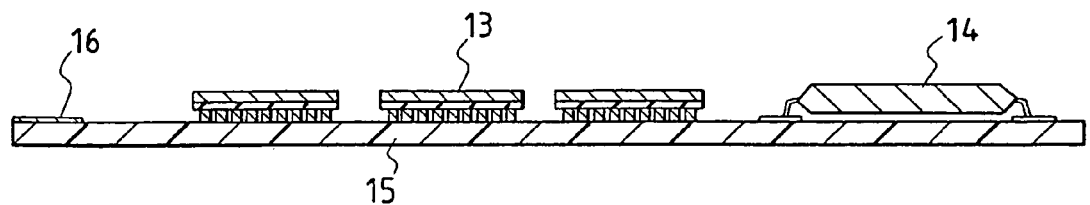
FIG. 4 is a cross sectional view illustrating the state of mounting the semiconductor integrated circuit device in the Embodiment 1 according to the present invention to a mounting substrate.
Figure 5:
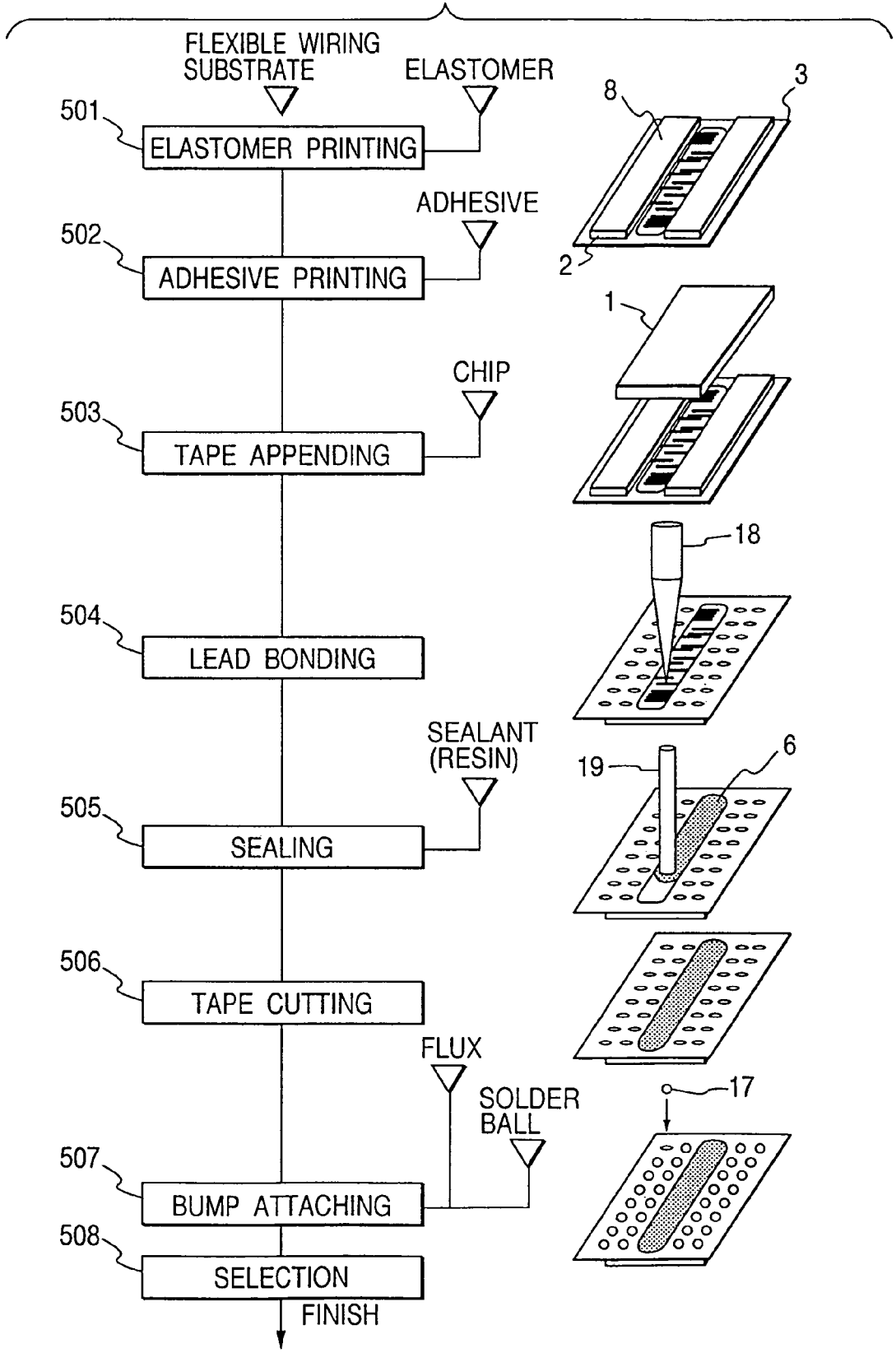
FIG. 5 is a flow chart illustrating the steps of assembling the semiconductor integrated circuit device in the Embodiment 1 according to the present invention.

FIG. 1 is a plan view illustrating a semiconductor integrated circuit device representing an Embodiment 1 according to the present invention, FIG. 2 is a cross sectional view taken along line 2-2 in FIG. 1, FIG. 3 and FIG. 4 are a plan view and a cross sectional view illustrating a state of mounting a semiconductor integrated circuit device to a mounting substrate, FIG. 5 is a flow chart illustrating the steps (process) of assembling a semiconductor integrated circuit device, and FIG. 6 to FIG. 58 and FIG. 76 to FIG. 81 are views for comparative explanation between the feature of the semiconductor integrated circuit device representing the Embodiment 1 of the present invention and a semiconductor integrated circuit device representing a comparative example studied by the present inventors. At first, an explanation will be given as to the constitution of a semiconductor integrated circuit device of an Embodiment 1 with reference to FIG. 1 and FIG. 2.

The semiconductor integrated circuit device representing Embodiment 1 of the present invention is in the form of a 40 pin ball grid array type semiconductor package, comprising a semiconductor chip 1 having a plurality of semiconductor elements and a plurality of bonding pads formed on a main surface, and an elastomer 2 (elastic structural material) bonded on the main surface of the semiconductor chip excepting for the portions forming the bonding pads, a flexible wiring substrate 3 (wiring substrate) formed with wirings connected at one end to the bonding pads of the semiconductor chip 1, a solder resist 4 (insulation film) formed on a main surface of the flexible wiring substrate 3, and bumps 5 (bump electrodes) formed on a main surface of the solder resist 4 and connected to the other end of the wirings by way of openings in the solder resist 4, to constitute a package structure in which the bonding portion of the semiconductor chip 1 is covered by a sealant 6, such as a resin.

The semiconductor chip 1 has, for example, a center pad structure as shown in FIG. 1 in which a plurality of bonding pads 7 (external terminals) are formed in one row at a central portion in the longitudinal direction, and the bonding pads are arranged at non-uniform intervals. Predetermined integrated circuits, such as memory circuits and logic circuits, are formed in the semiconductor chip 1, for example, on a semiconductor substrate, such as made of silicon, and the bonding pads 7 made of a material such as Al are disposed as the external terminals for such circuits.

The elastomer 2 is made of an elastic material, for example, a silicone resin, which is formed on the main surface of the semiconductor chip 1, being bisected longitudinally of the chip 1 to provide the portion formed with the bonding pads 7, and is bonded to the main surface of the chip 1 by way of the adhesive 8. The elastomer 2 is provided for moderating stress concentration on the soldering bumps 5 mainly caused by the difference in the heat expansion coefficients of the semiconductor chip 1 and the package mounting substrate.

The flexible wiring substrate 3 comprises, for example, as shown in FIG. 2, a tape 9 as a basic material of the flexible wiring substrate 3 (substrate base material) and wirings 10 bonded on the main surface of the tape 9 by an adhesive 9', in which leads 11 on one end of the wirings 10 are connected to the bonding pads 7 of the semiconductor chip 1, and bump lands 12 on the other end are connected with the soldering bumps 5. In the flexible wiring substrate 3, the rear face of the tape 9 (on the side opposite to the surface formed with the wirings 10) is bonded to the elastomer 2, and the solder resist 4 is formed on the main surface of the wirings 10.

The tape 9 constituting the flexible wiring substrate 3 is made of a material, for example, a polyimide resin, and a material such as Cu is used as the core material for the wiring 10. A portion of the lead 11 serving as one end of the wiring 10 is formed with an Ni plating layer so as to cover the surface of the core material, and an Au plating layer is formed further so as to cover the surface of the Ni plating layer.

The solder resist 4 is made of an insulation material, such as a light sensitive epoxy resin, and the solder bumps 5 are formed on the main surface of the wirings 10 of the flexible wiring substrate 3 by way of the openings in the solder resist 4 for a predetermined range of the wirings 10, except for the connection portion connected to the bump lands.

The soldering bumps 5 are made of a material, for example, a Pb(60%)-Sn(40%) solder or an alloyed solder mainly composed of Pb—Sn, and is connected to the bump lands 12 of the wirings 10 constituting the flexible wiring substrate 3. The solder bumps 5 are arranged in two rows in the regions on both side of the bonding pads 7 of the semiconductor chip 1.

The thus constituted semiconductor integrated circuit device is mounted, for example, as shown in FIG. 3 and FIG. 4, as a semiconductor integrated circuit device of a chip size package 13, for example, a DRAM, together with a semiconductor integrated circuit device of QFP type package 14, onto a mounting substrate 15, which is made, for example, of glass or epoxy, on a memory card and can be retractably mounted with respect to portable equipment, such as a portable telephone or a handy type personal computer by way of external connection terminals 16.

For the function of the Embodiment 1 of the present invention, an outline of the steps of assembling the semiconductor package will be explained on the basis of the process flow shown in FIG. 5.

At first, before assembling the semiconductor package, wirings 10 are formed on the tape 9, the flexible wiring substrates having the leads 11 formed by etching a portion of the wirings 10. Further, the elastomer 2, the semiconductor chip 1 formed with predetermined integrated circuits and provided with the bonding pads 7 as external terminals, the sealant 6, and flux and solder forming the solder balls 17 are provided.

The flexible wiring substrate 3 can be prepared, for example, as typically represented by the technique of a TAB (Tape Automatic Bonding) tape, by bonding a thin metal foil such as Cu on a tape 9 made of a polyimide resin by means of an adhesive, forming a required pattern by photoresist on the metal foil using a photographic technique, then forming a desired wiring pattern 10 by etching (including also leads 11) and, further, applying Ni—Au plating treatment to the surface thereof, for example, by an electric field plating method.

Then, for example, the elastomer 2 is formed by printing to a thickness of 50 to 150 μm on the tape 9 of the flexible wiring substrate 3, and a silicone type adhesive 8 is coated and printed on the surface of the elastomer 2 (steps 501, 502). The elastomer 2 is not always printed, but an elastomer previously formed into a film-shape may be cut into a predetermined shape and bonded to the rear face of the tape 9 by means of the adhesive 8.

Further, the leads 11 at one end of the wirings 10 of the flexible wiring substrate 3 and the bonding pads 7 of the semiconductor chip 1 are aligned such that their relative positions coincide with each other, and the semiconductor chip 1 is appended by adhesion to the elastomer 2 printed on the tape 19 of the flexible wiring substrate 3 (step 503).

Then, the semiconductor chip 1 and the tape 9 of the flexible wiring substrate 3 in a state appended by way of the elastomer 2 are turned upside down in the lead bonding step, the lead 11 is driven down on the bonding pad 7 of the semiconductor chip 1 while being deformed into a S-shaped configuration by a bonding tool 18, as shown by the cross section in FIG. 2, and the lead 11 and the bonding pad 7 are connected, for example, by a method of supersonic thermal press bonding (step 504).

Successively, in the sealing step, the lead bonding portion of the bonding pad 7 of the semiconductor chip 1 and the lead 11 of the flexible wiring substrate 3 are resin encapsulated, for example, by coating a sealant 6, such as an epoxy resin, from a dispenser 19 to thereby enhance the reliability at the junction portion between the semiconductor chip 1 and the flexible wiring substrate 3 (step 505).

Subsequently, in the cutting step for the flexible wiring substrate 3, the outer edge portion of the tape 9 is cut along a position somewhat outside the edge of the semiconductor chip 1, to form a package outer shape of CSP (Chip Size Package or Chip Scale Package) (step 506).

Then, in the bump attaching step of the solder bump 5, the bump 5 is formed by joining a solder ball 17 to the corresponding bump land 12 of the wirings 10 of the flexible wiring substrate 3 to form the bump 5 and, finally, by way of the selection and marking, the step of assembling the semiconductor package in the Embodiment 1 according to the present invention is finished (step 507, 508).

In the step of assembling the semiconductor package, the order of the tape cutting step (step 506) and the bump attaching step (step 507) may be reversed.

Thus, the Embodiment 1 has a semiconductor package structure in which bonding pads 7 are arranged concentrically in one row along a central portion of the semiconductor chip 1, and the solder bumps 5 are disposed at the inside of the outer circumference of the semiconductor chip 1 connected by way of the wirings 10 of the flexible wiring substrate from the bonding pads 7.

Now, the feature of the package structure for the semiconductor integrated circuit device of the Embodiment 1 will be explained by comparison with a package structure formed by a technique studied by the present inventors including the structure and the process with reference to FIG. 6 to FIG. 58 successively.

1. Surface Wiring Structure (a Structure in Which the Elastomer is Formed on the Wiring Substrate on the Side of the Tape and the Bump Electrodes are Formed on the Side of the Wirings)

Figure 6:
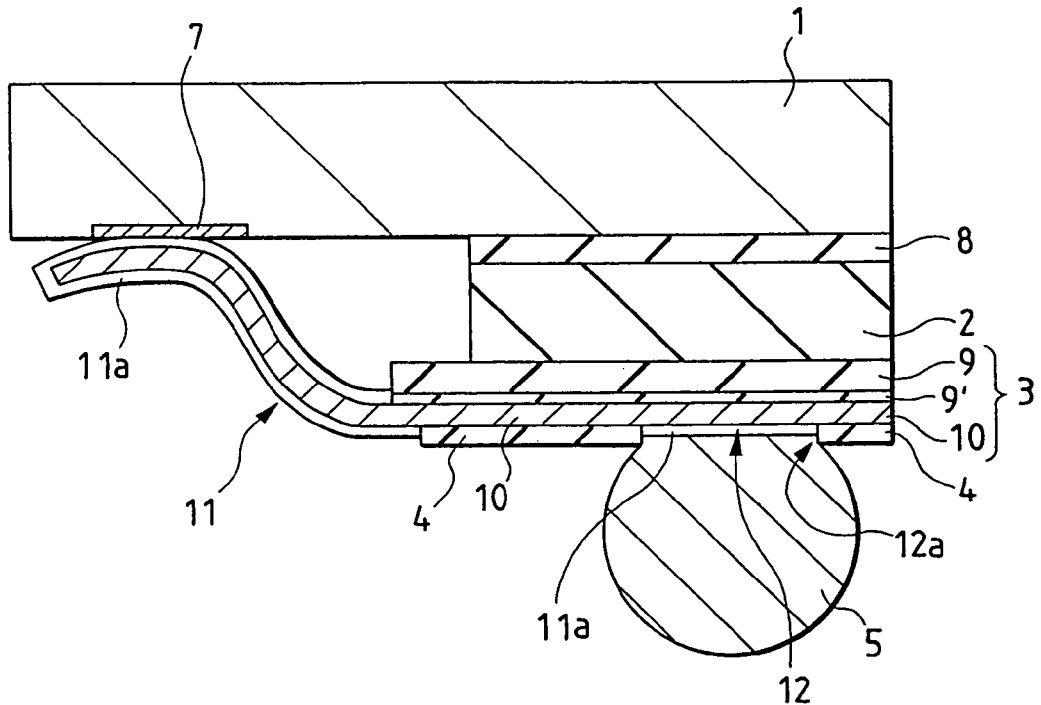
FIG. 6 is a cross sectional view of a main portion of the semiconductor integrated circuit device in the Embodiment 1 according to the present invention.
Figure 7:
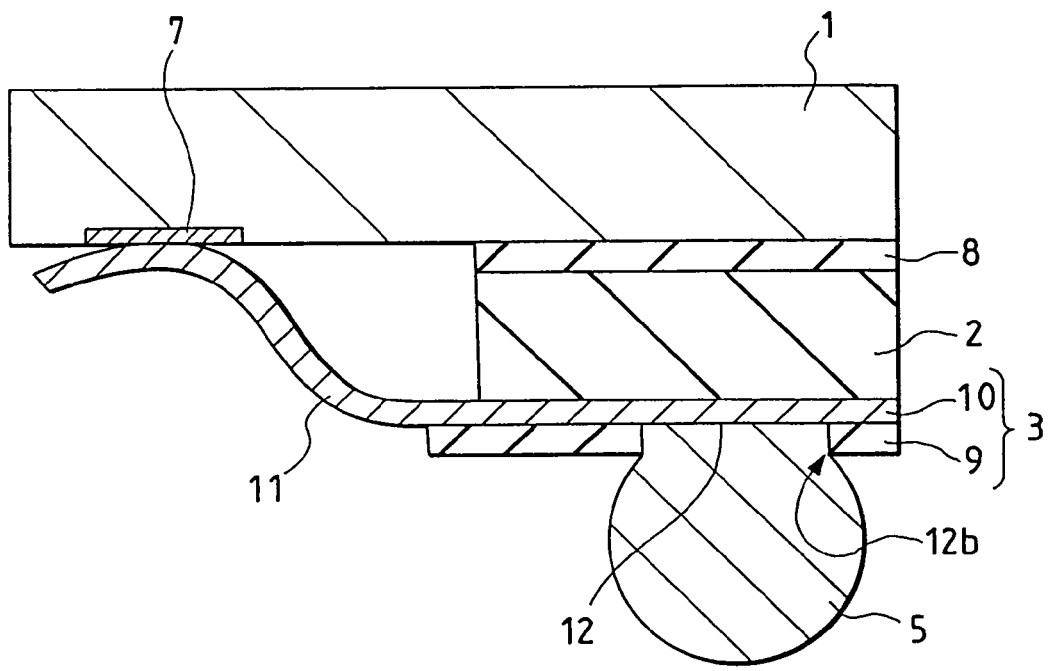
FIG. 7 is a cross sectional view of a main portion for comparative explanation of the semiconductor integrated circuit device of the Embodiment 1 according to the present invention and a semiconductor integrated circuit device studied by the present inventors.
Figure 8:
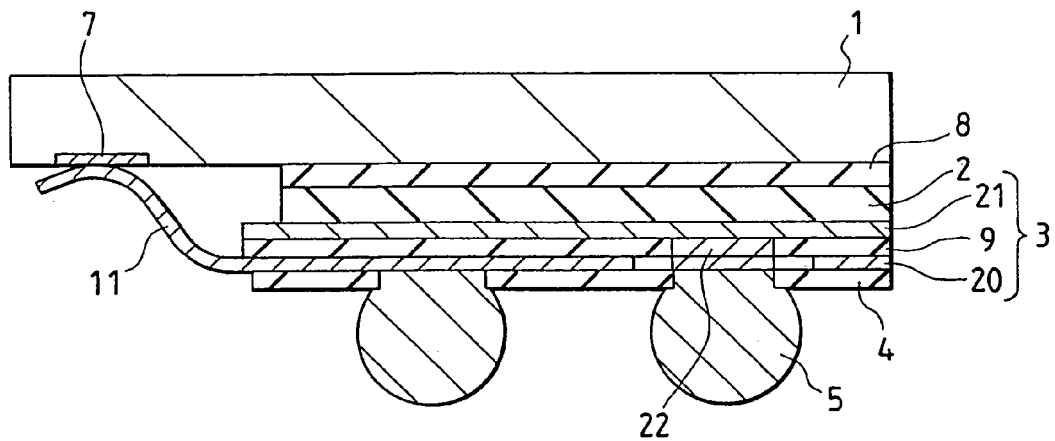
FIG. 8 is a cross sectional view of a main portion illustrating both face wirings as a modified embodiment of a semiconductor integrated circuit device in the Embodiment 1 according to the present invention.

To assist in providing technical explanation of the surface wiring structure, FIG. 6 is a cross sectional view of a main portion illustrating the surface wiring structure, FIG. 7 is a cross sectional view of a main portion illustrating the rear face wiring structure (a structure in which bump electrodes are formed to the wiring substrate on the side of the tape and the elastomer is formed on the side of the wirings) and FIG. 8 is a cross sectional view of a main portion illustrating wirings on both surfaces.

The package structure of the Embodiment 1 is a so-called "surface wiring structure" as shown in an enlarged scale in FIG. 6, in which an elastomer 2 is bonded to a flexible wiring substrate 3 on one side of a tape 9 (on the side facing the semiconductor chip 1) and a solder resist 4 and a bump electrode 5 are formed on the other side of the wirings 10. On the other hand, there is a technique studied by the present inventor which may be referred to as a so-called "rear face wiring structure", as shown in FIG. 7, in which an elastomer 2 is bonded on one side of the wiring 10 and a solder bump 5 is formed on the other side of the tape 9. In FIG. 6, an Au plating 11a is formed, for example, by an electric field plating on the surface of a lead 11 on one end and on the surface of a land 12 on the other end of the wiring 10.

In the rear face wiring structure described above with reference to FIG. 7, a through hole 12b for joining the bump 5 is formed, for example, by punching out an opening in the tape 9, which is made of a material such as a polyimide resin, whereas in the surface wiring structure of the Embodiment 1, as seen in FIG. 6, a solder resist 4 made of a material such as a light sensitive epoxy resin is coated on the main surface of the wiring 10, and a connection hole 12a of a desired size is formed at a desired position by a photographic process, such as exposure and development, so that the following advantages can be expected.

(1) Since the opening for the solder bump 5 is formed by exposure and development of the solder resist 4, the fabrication accuracy for the hole diameter can be improved compared with a case of puncturing an opening in the tape 9 of the flexible wiring substrate 3 in the rear face wiring structure by machining.

(2) While the minimum thickness of the tape 9, in practice, is about 50 μm, the solder resist 4 can be coated to a thickness of about 10 to 20 μm stably depending on the coating condition, so that a smaller solder ball 17 can be joined satisfactorily.

For example, in a case of forming a solder bump of about 30 μm diameter, which is less than the thickness of the tape 9, the aspect ratio of the through hole is excessively large in the rear face wiring structure, thereby possibly resulting in a connection failure. On the other hand, the aspect ratio can be lowered to cope with such a problem in the surface wiring structure.

(3) Since the pitch of the solder bumps 5 can be made smaller in the surface wiring structure as compared with the rear face wiring structure, a semiconductor package having output terminals for the solder bumps arranged with a higher density can be obtained.

(4) Since an elastomer 2 is disposed on the flat surface at the back of the tape 9, the elastomer 2 can be mounted (coated or appended) in a voidless manner stably with a high accuracy. Further, since the size and the shape of the elastomer 2 are stabilized, the step of bonding the semiconductor chip 1 is also stable, thereby making it possible to conduct assembling at a higher yield.

As described above, the technique of forming the rear face wiring structure results in problems, such as in the formation of the opening in the tape 9 of the flexible wiring substrate 3 and in the bondability between the wirings 10 of the flexible wiring substrate 3 and the elastomer 2, whereas such problems can be solved by adopting the surface wiring structure as provided in the Embodiment 1.

Further, in the wiring structure of the flexible wiring substrate 3, it is possible to use a flexible wiring substrate 3 having a double face wiring structure, for example, as shown in FIG. 8, that is, having layered wirings on both surfaces of the tape 9, in addition to the single face wiring structure as shown in FIG. 6, and it can be applied further to three or more layered wiring structures.

In the example of FIG. 8, a first wiring 20 is used as a signal wiring while the second wiring 21 is used as a ground plane, in which the second wiring 21 and the bump 5 or the first wiring 20 are electrically connected by way of a via hole 22. Such a structure has the advantage of obtaining an excellent electric characteristic, for example, from the point of view of noise resistance.

2. Optimization of Tape Edge Position Relative to Elastomer

Figure 9:
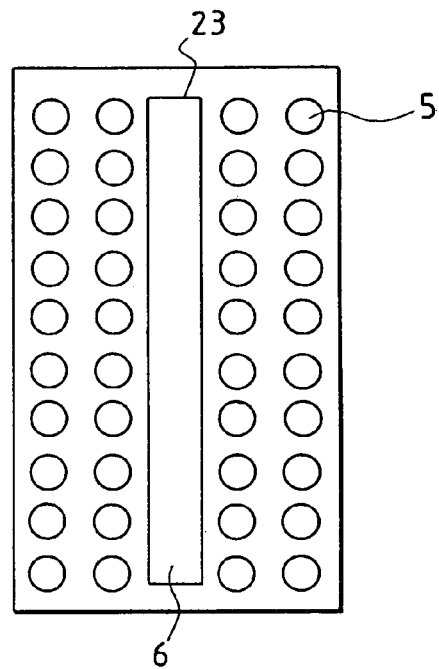
FIG. 9 is a plan view illustrating a window opening portion of a semiconductor integrated circuit device in the Embodiment 1 according to the present invention.
Figure 10:
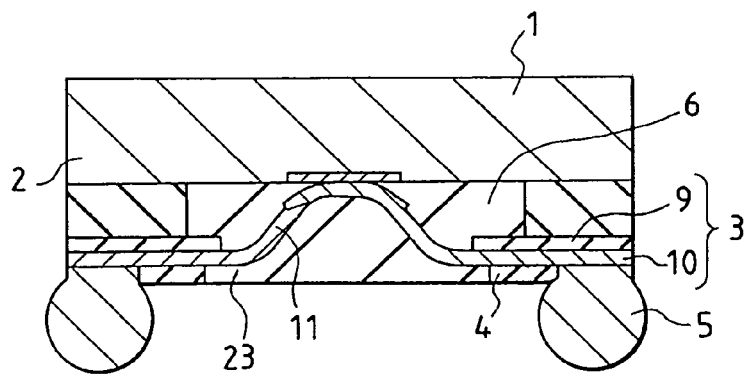
FIG. 10 is a cross sectional view corresponding to the window opening in FIG. 9.
Figure 11:
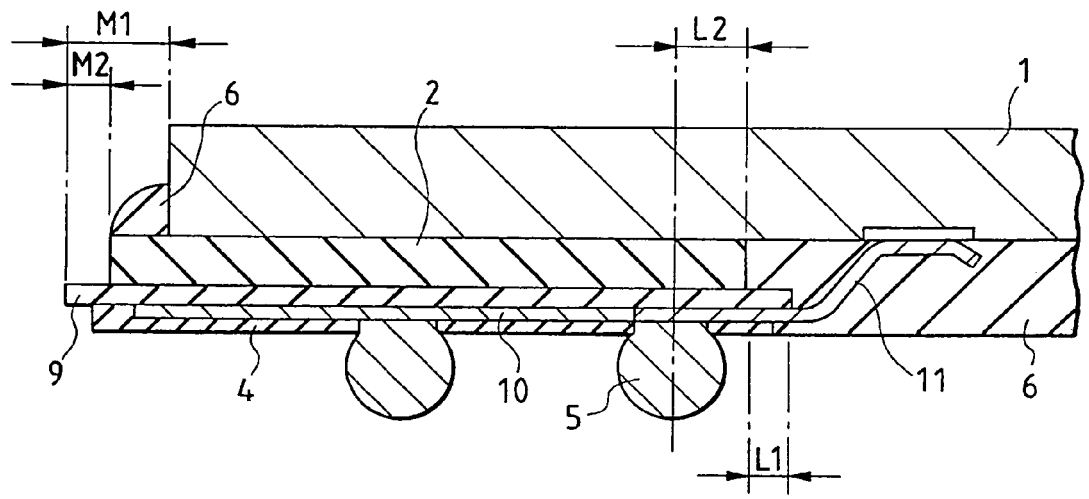
FIG. 11 is a cross sectional view for explaining the size of a window opening and an edge portion of the semiconductor chip in a semiconductor integrated circuit device in the Embodiment 1 according to the present invention.

To assist in providing a technical explanation of the optimization of tape edge position relative to the elastomer, FIG. 9 is a plane view illustrating window openings, FIG. 10 is a cross sectional view illustrating a window opening in FIG. 9 and FIG. 11 is a cross sectional view for assisting in the explanation of the size of the window opening portion and the edge portion of the semiconductor chip.

The package structure of the Embodiment 1, as shown in FIG. 9, has a BGA (Ball Grid Array) structure in which the solder bumps 5 are arranged in a matrix on the main surface of the flexible wiring substrate 3. In this example, as shown in FIG. 10, the semiconductor 1 has a center pad arrangement in which a window opening portion 23 is disposed longitudinally at a central portion, and the portion and the peripheral edge of the semiconductor chip 1 are resin capsulated by the sealant 6 to attain a structure of high moisture proofness and reliability in the final structure.

By the way, in the technique studied by the present inventor, when the end of the elastomer 2 (on the side of the window opening 23) is brought closer to the edge of the tape 9, that is, if the length L1 between the end of the elastomer 2 of the semiconductor chip 1 on the side of the bonding pad 7 and the end of the tape 9 is reduced, contamination to the lead 11 results due to a bleeding ingredient and volatile ingredient of the elastomer 2.

On the other hand, if the length L1 is made larger, that is, if the elastomer is excessively retracted (i.e., recessed) from the edge of the tape 9, the length L2 between the end of the elastomer 2 and the solder bump 5 is reduced, and since the elastomer 2 is not present below the innermost portion of the solder bump 5, this may possibly increase the variation in the height of the solder bump 5 or widen the encapsulation region for the window opening 23, making it difficult to fill in the sealant 6.

On the other hand, in the Embodiment 1, these problems can be solved simultaneously by selecting an appropriate length for L1 so as to set the end of the elastomer 2 at an optimal position between the end of the tape 9 and the solder bump 5.

That is, in order to eliminate the foregoing problems related to the window opening 23, the length L1 is defined as indicated below. For example, in this embodiment, the printing accuracy of the elastomer 2 is defined as about ±100 µm. Accordingly, if the length L1 is less than 100 µm, since it may extend outside of the tape 9 due to a printing deviation, it must be greater than the printing accuracy (100 µm) at the least.

Further, since there is no problem from contamination to the lead 11 by a bleeding ingredient or volatile ingredient of the elastomer 2 if it is actually spaced by about 300 µm from the actual edge, the length L2 is set, for example, at 300 µm as a minimum. However, a design with a minimum value of about 100 µm is possible if an elastomer 2 of less contamination and bleeding is used or a countermeasure, for example, cleaning of the contamination, is adopted.

As described above, contamination to the lead 11 caused by bleeding ingredients or volatile ingredients of the elastomer 2 can be prevented, the variation in the height of the solder bumps 5 can be made stable and the sealing region of the window opening 23 can be filled with ease by selecting an appropriate length L1 as provided in the Embodiment 1.

3. Optimization of the Outer Size of the Package

Figure 12:
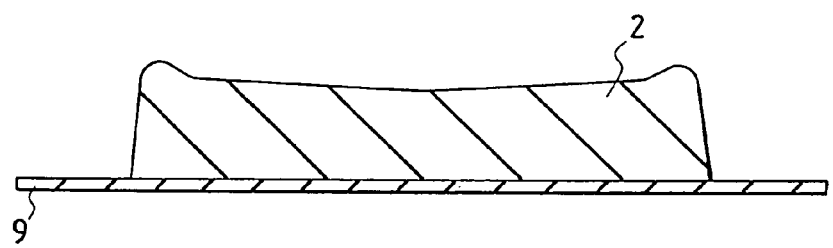
FIG. 12 is a cross sectional view illustrating a concave shape of an elastomer after printing of a semiconductor integrated circuit device in the Embodiment 1 according to the present invention.
Figure 13:
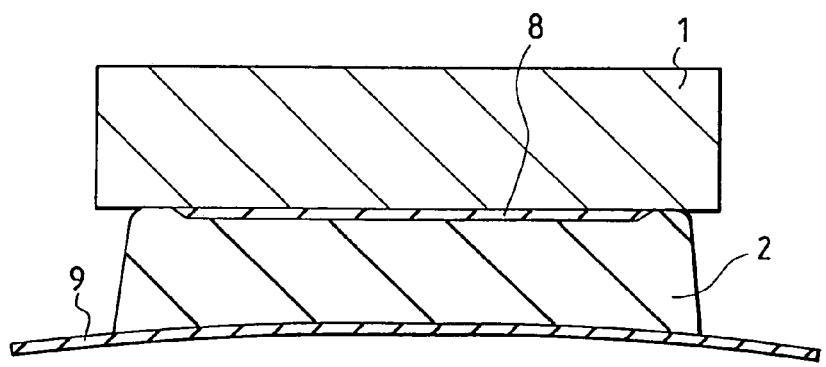
FIG. 13 is a cross sectional view illustrating a tape warping after appending a semiconductor chip in a semiconductor integrated circuit device of the Embodiment 1 according to the present invention.

To assist in providing a technical explanation of the optimization of the outer size of the package, FIG. 11 is a cross sectional view for explaining the size of the window opening and the edge portion of the semiconductor chip, FIG. 12 is a cross sectional view illustrating a concave portion of the elastomer after printing and FIG. 13 is a cross sectional view illustrating warp in the tape after appending a semiconductor chip.

For example, in the technique studied by the present inventor, looking to FIG. 11 and assuming that the distance between the end of the semiconductor chip 1 on the outer circumference of the package and the end of the tape 9 of the flexible wiring substrate 3 is M1 and the distance between the end of the elastomer 2 and the end of the tape 9 is M2, the following problems are present:

(1) If M1<0, since the outermost circumference of the package is represented by the wall of the semiconductor chip 1, there is a great possibility of inducing cracks in the semiconductor chip 1 during the assembling step, particularly upon insertion and withdrawal of the chip from a receptacle, during tray transportation and the like.

(2) If M1<0, M2>0, since the circuit surface of the semiconductor chip 1 will be exposed to the outside, a problem may be caused which affects the reliability and the sealing for preventing this, although this possibly leads to an increase of the fabrication steps.

(3) If M1−M2<0, peripheral protrusions of the elastomer 2 after printing, as shown in FIG. 12, interferes with the bonding portion of the semiconductor chip 1, as shown in FIG. 13, so as to cause bonding failure upon appending, reducing the flatness of the flexible wiring substrate 3 and causing a reduction of the reliability.

(4) If M2=0, it is necessary to cut the elastomer 2, which causes a problem due to the difficulty of the cutting.

On the other hand, in the Embodiment 1, the foregoing problems can be overcome by determining the relationship for the distance between the end of the semiconductor chip 1 or the end of the elastomer 2 and end of the tape 9 as: M1>M2>0. That is, in the explanatory view illustrating the edge portion of the package in FIG. 11, since the cutting error in the tape cutting step for determining the final outer shape is about 100 µm, it is desirable to ensure that M2 is more than 100 µm in order that the cutting jig does not reach the elastomer 2.

By the way, the cross sectional shape after forming the elastomer 2 by printing and hardening the same by baking is as shown in FIG. 12, which shows that a peripheral portion tends to be higher as a result of being pulled by the mask upon leaving the plate after printing in a case of a material having a thixotropic property which is higher to some extent. For example, if the semiconductor chip 1 is appended to the elastomer 2 under the condition that M1<M2 so that the end of the semiconductor chip extends past the end of the elastomer 2, a problem occurs in that the surface of the tape 9 warps to conform to the cross sectional shape of the elastomer 2, as shown in FIG. 13.

In order to prevent this, it is effective to eliminate the high peripheral portion of the elastomer 2 at the outside of the semiconductor chip 1 by setting M1>M2. For instance, since the width of the protrusion is about 200 µm, it is desirable for (M1−M2) to be 240 µm and the distance M1 to be about 360 µm in view of the distance M2=100 µm being provided for the cutting property.

Cutting the tape 9 at the outer circumference as described above provides advantages in that the outer shape error is reduced, and peripheral jigs such as a receptacle or a tray need not be changed to change the size to some extent of the semiconductor chip 1.

As described above, in the Embodiment 1, it is possible to avoid cracking and chipping of the semiconductor chip 1 to improve the cutting margin during the cutting step. Further, the circuit surface of the semiconductor chip 1 can be entirely disposed below the elastomer 2 to provide the advantage of improving the moisture proofness and eliminating the requirement for sealing the outer circumferential portion.

4. Planar S-Shaped Lead

Figure 14:
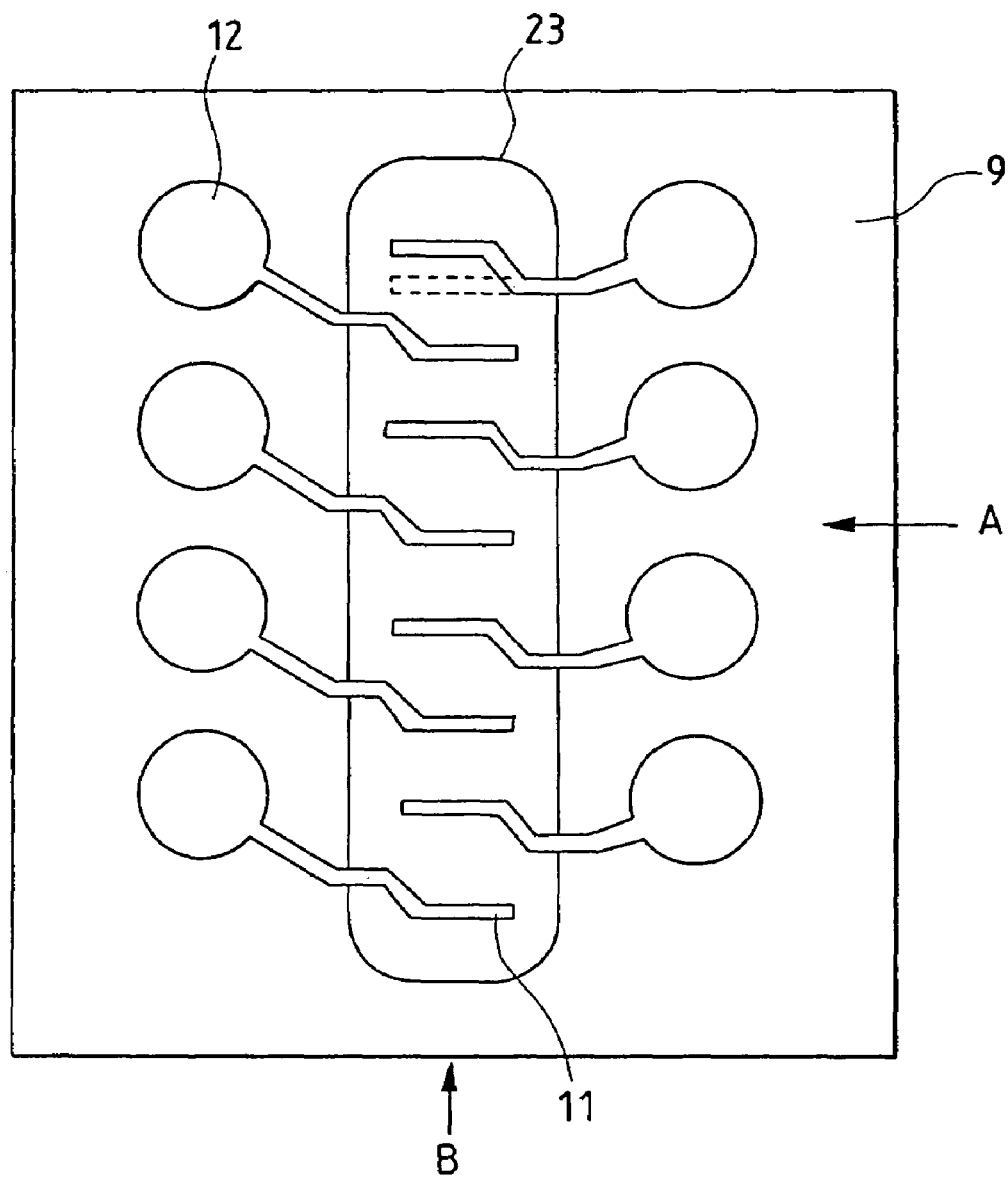
FIG. 14 is a plan view illustrating a planar S-shaped lead of a semiconductor integrated circuit device in the Embodiment 1 according to the present invention.
Figure 15:
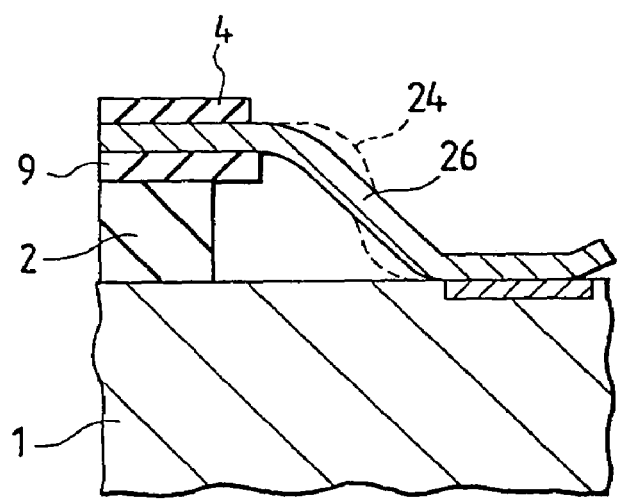
FIG. 15 is a cross sectional view as seen in the direction of arrow B in FIG. 14 of a semiconductor integrated circuit device in the Embodiment 1 according to the present invention.
Figure 16:
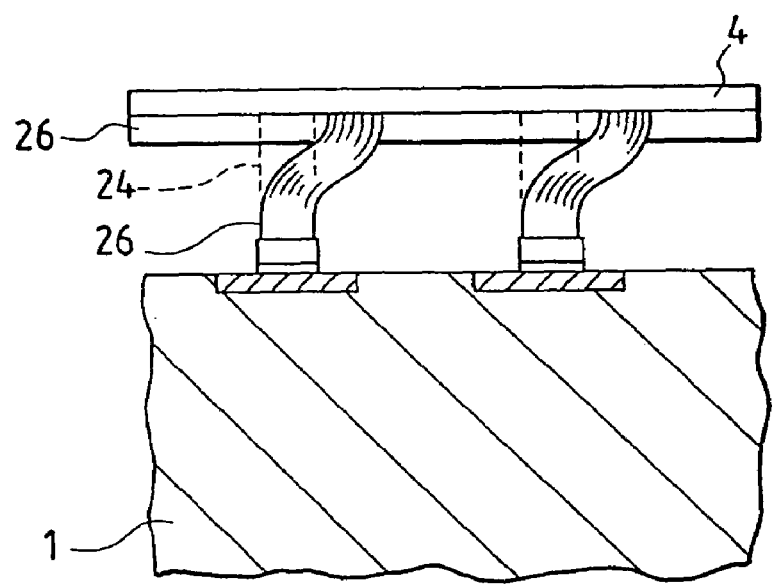
FIG. 16 is a cross sectional view as seen in the direction of arrow A in FIG. 14 in a semiconductor integrated circuit device in the Embodiment 1 according to the present invention.
Figure 17:
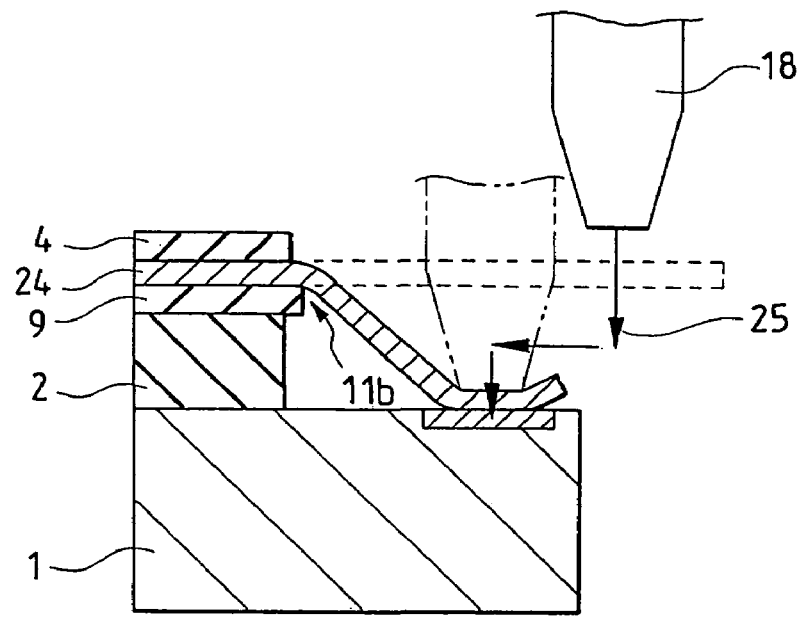
FIG. 17 is a cross sectional view illustrating a trace of a bonding tool upon forming a standard S-shaped lead in a semiconductor integrated circuit device in the Embodiment 1 according to the present invention.
Figure 18:
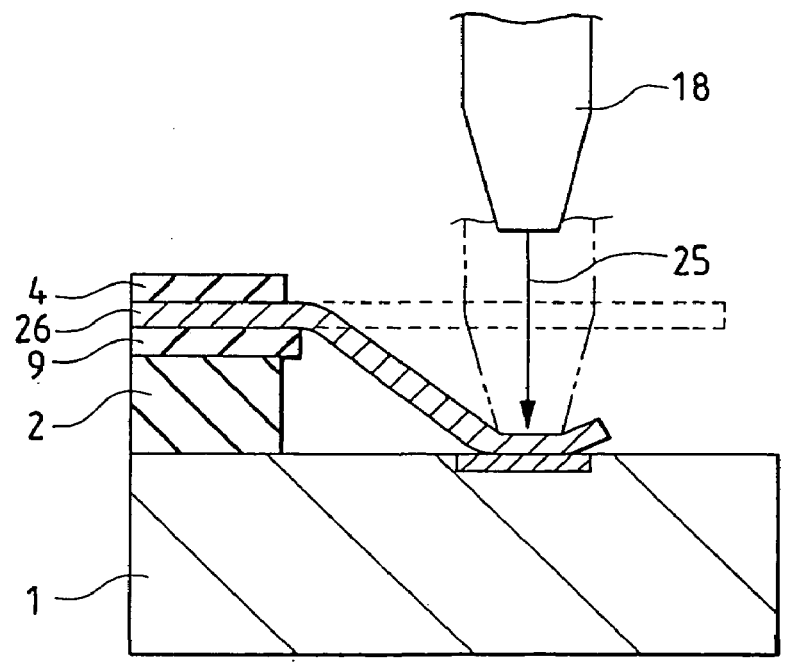
FIG. 18 is a cross sectional view illustrating a trace of a bonding tool upon forming a planar S-shaped lead in a semiconductor integrated circuit device in the Embodiment 1 according to the present invention.

To assist in providing a technical explanation of the planar S-shaped lead, FIG. 14 is a plan view illustrating a planar S-shaped lead, FIG. 15 is a cross sectional view as seen in the direction of arrow B in FIG. 14, FIG. 16 is a cross sectional view as seen in the direction of arrow A in FIG. 14, FIG. 17 is a cross sectional view illustrating the trace of a bonding tool upon forming a standard S-shaped lead and FIG. 18 is a cross sectional view illustrating the trace of a bonding tool upon forming a planar S-shaped lead.

The S-shaped configuration is such that the length of a lead 11 at one end of a wiring 10 is substantially longer than the linear distance between a pad 7 of a chip 1 and the edge portion 11b of the tape 9, so that stresses on the lead 11 can be reduced.

For example, in the technique of forming a standard S-shaped lead 24 as studied by the present inventor, the lead which is employed is a linear notch lead or a beam lead, as shown by the dotted line in FIG. 14, and in order to form a sag (S-shaped configuration) sufficient to withstand thermal deformation during bonding, as shown by a fine line in FIG. 15, it is necessary to employ a motion along a special bonding tool trace 25 which involves first driving down the lead 11 just above the semiconductor chip 1, then laterally displacing the lead and then again driving it down onto the bonding pad 7, which operation may require a special wire bonder.

On the other hand, in the Embodiment 1, the foregoing problem can be solved by preparing the lead 11 of the wiring 10 so that it does not have a linear shape, but is a planar lead 26 of a S-shaped configuration in which the base portion of the wiring 10 and the bonding portion at the top end are previously displaced at least by more than the width of the lead 11, as shown in FIG. 14, upon forming the wiring 10 on the tape 9 of the flexible wiring substrate 3.

As described above, by such forming of the planar S-shaped lead 26, a lead having a stable and suitable S-shaped configuration can be formed by a bonding tool trace 25 by simply driving down a typical wire bonder, as shown in FIG. 18, since a sag due to the original planar S-shaped configuration is formed as shown in FIG. 16, although a straightened shape as shown in FIG. 15 is formed.

Thus, a planar S-shaped lead 26 of stable S-shaped configuration can be found with no requirement for a soft-modified special wire bonder and, further, an effect for shortening the contact time upon bonding can also be expected since the bonding tool trace 25 can also be simplified.

5. Beam Lead

Figure 19:
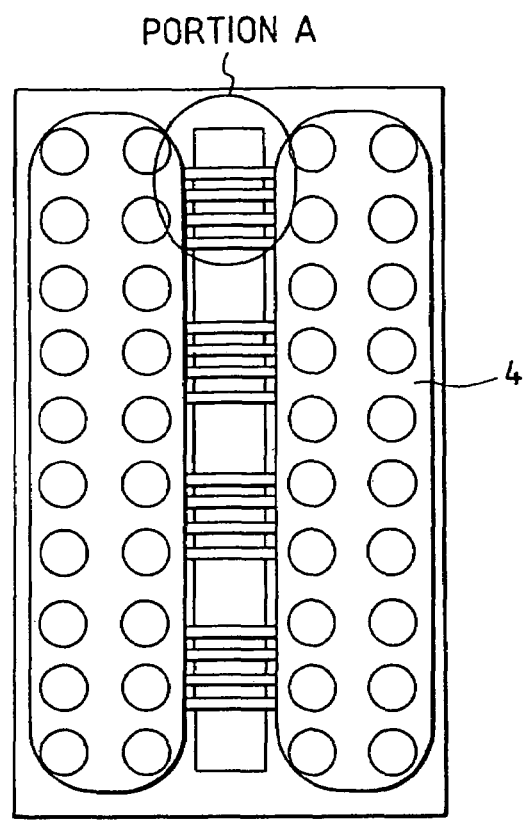
FIG. 19 is a plan view for explaining a notch lead and a beam lead of a semiconductor integrated circuit device in the Embodiment 1 according to the present invention.
Figure 20:
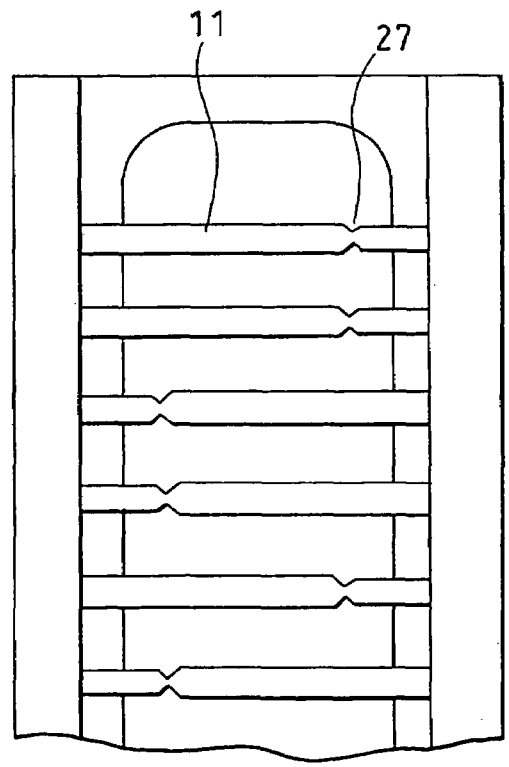
FIG. 20 is a plan view illustrating a notch lead at the portion A in FIG. 19 of a semiconductor integrated circuit device in the Embodiment 1 according to the present invention.
Figure 21:
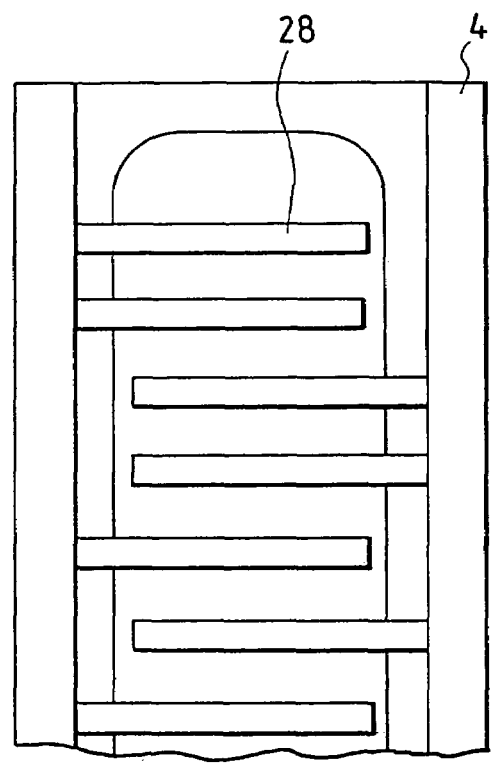
FIG. 21 is a plan view illustrating a beam lead of a semiconductor integrated circuit device in the Embodiment 1 according to the present invention.

To assist in providing a technical explanation of the beam lead, FIG. 19 is a plan view for explaining a notch lead and a beam lead, FIG. 20 is a plan view illustrating a notch lead in a portion A of FIG. 19 and FIG. 21 is a plan view illustrating a beam lead.

For example, in the technique studied by the present inventor, as shown in FIG. 20, which is an enlarged view of the lead 11 in FIG. 19, the lead 11 is formed with a notch 27, for example, of a V-shaped cut at a cutting portion. A portion slightly inside of the notch 27 is driven downwardly by a bonding tool 18 upon bonding, to cut the lead 11 at the portion of the notch 27. However, the width of the notch 27 changes due to varied etching for the wiring 10 in the manufacturing step for producing the flexible wiring substrate 3, leading to the possibility that the lead will not be cut upon bonding.

Further, even if it is cut, there still may be a problem in that the lead may be cut at a portion different from the desired notch 27, or the notch may be too narrow resulting in the lead being disconnected before the plating step of the flexible wiring substrate 3, so that the plating can not be accomplished.

On the other hand, in the Embodiment 1, as shown in FIG. 21, the problem upon cutting the lead 11 as described above can be overcome by forming the lead with a cantilever beam structure, namely, a so-called beam lead 28 in which one end is fixed to the tape 9 of the flexible wiring substrate 3 and the other end as the cutting side formed with the notch 27 is left open.

6. Passivation Size for the Periphery of the Bonding Pad

Figure 22:
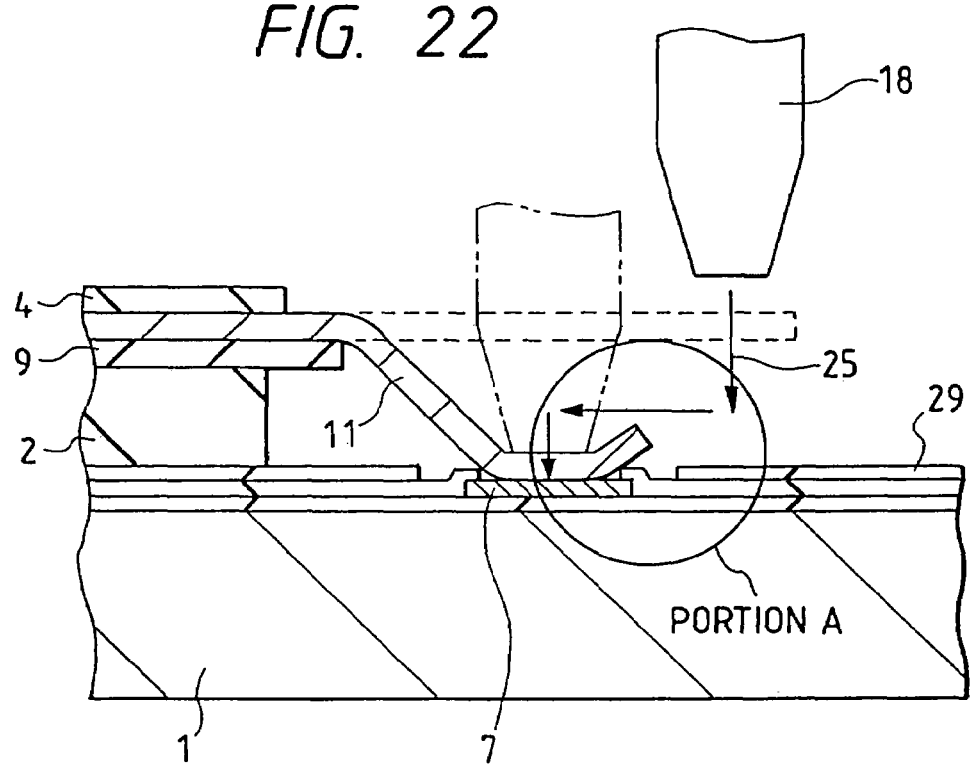
FIG. 22 is a cross sectional view illustrating a lead bonding portion of a semiconductor integrated circuit device in the Embodiment 1 according to the present invention.
Figure 23:
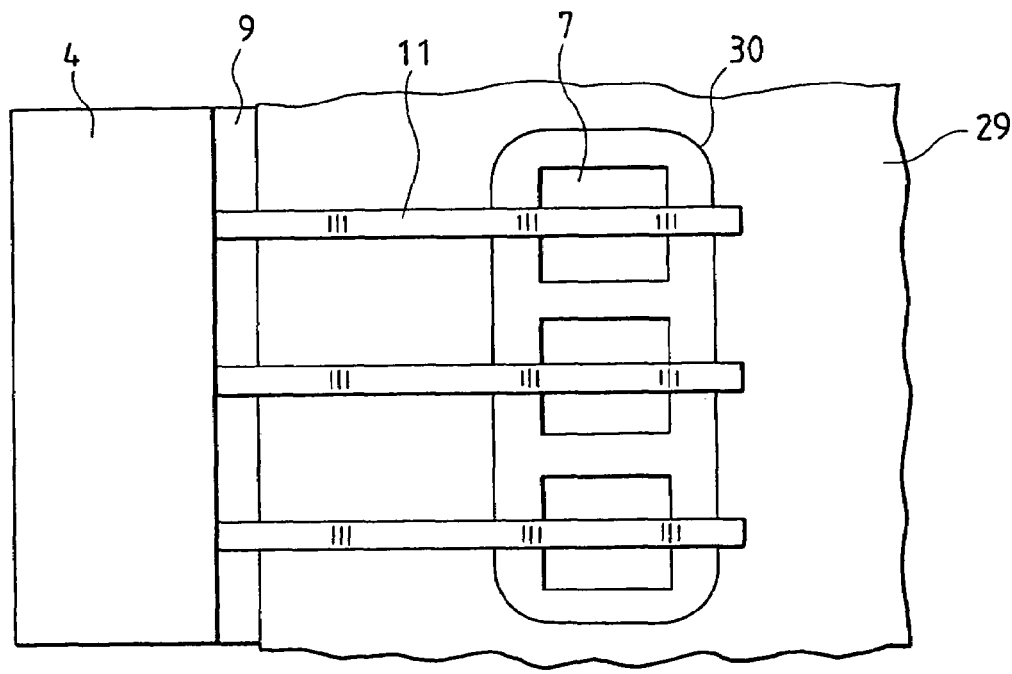
FIG. 23 is a plan view illustrating a lead bonding portion of a semiconductor integrated circuit device in the Embodiment 1 according to the present invention.
Figure 24:
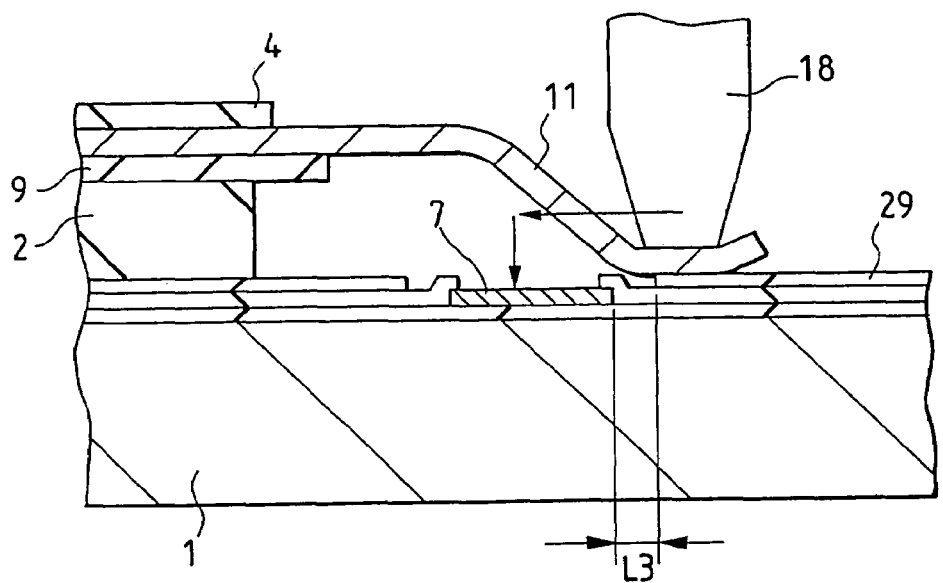
FIG. 24 is a cross sectional view illustrating, in an enlarged scale, a landing position of a tool in the portion A in FIG. 22, of a semiconductor integrated circuit device in the Embodiment 1 according to the present invention.
Figure 25:
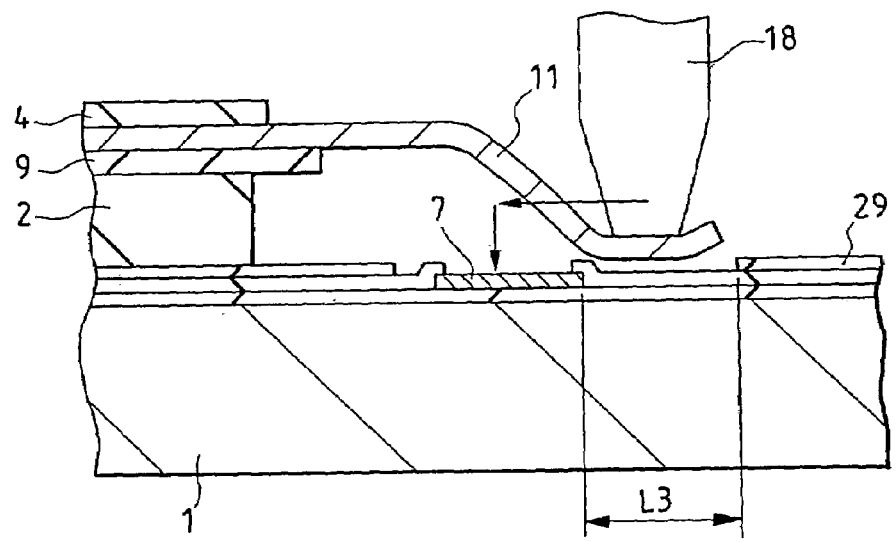
FIG. 25 is a cross sectional view illustrating a bonding portion improved for the size of a passivation opening, of a semiconductor integrated circuit device in the Embodiment 1 according to the present invention.
Figure 26:
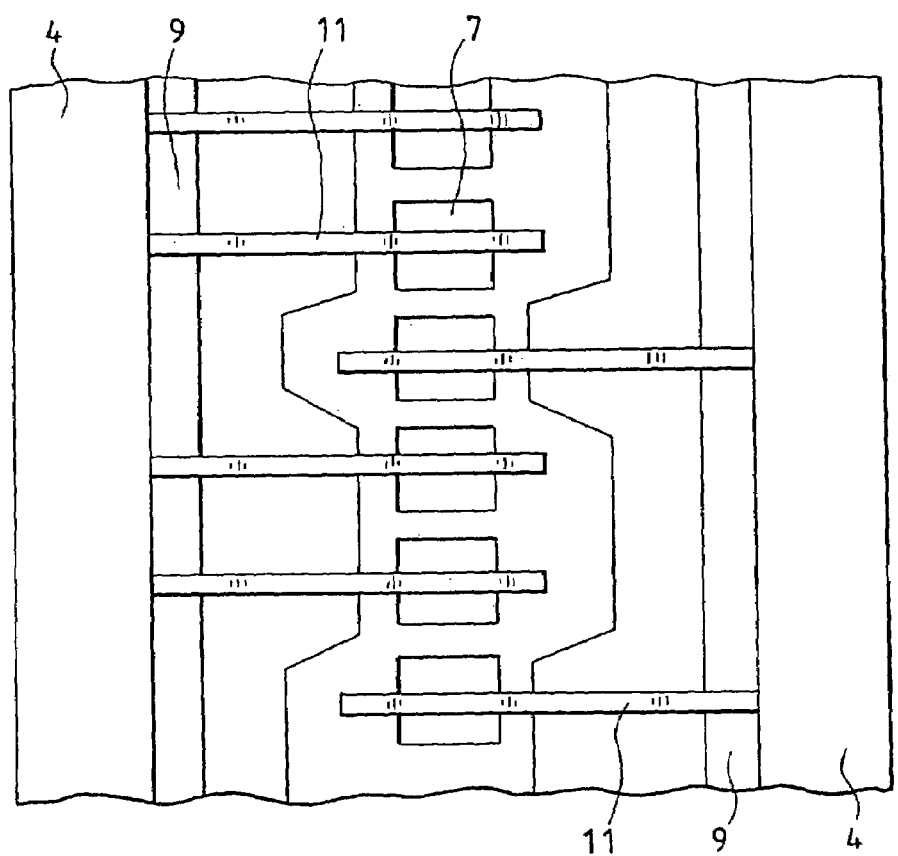
FIG. 26 is a plan view illustrating a bonding portion for leads extending in both directions of a semiconductor integrated circuit device in the Embodiment 1 according to the present invention.

To assist in providing a technical explanation of the size of the passivation film at the periphery of the bonding pad, FIG. 22 is a cross sectional view illustrating a lead bonding portion, FIG. 23 is a plan view illustrating a lead bonding portion, FIG. 24 is a cross sectional view illustrating a tool landing point at the portion in FIG. 22 in an enlarged scale, FIG. 25 is a cross sectional view illustrating a bonding portion improved for the size of the passivation opening and FIG. 26 is a plan view illustrating a bonding portion of a two way lead.

In a memory chip typically represented by a DRAM or the like, a passivation film 29 made of a polyimide type resin is formed on the chip for preventing soft errors caused by α-rays.

For example, in the technique studied by the present inventor, since the lead 11 is first driven downwardly just above the semiconductor chip 1, then displaced laterally and again driven downwardly on the bonding pad 7 of the semiconductor chip 1, as shown by the bonding tool trace 25 in the bonding sequence in FIG. 22, FIG. 23 and FIG. 24, there is the possibility of a problem in that the passivation film 29 on the semiconductor chip 1 or the semiconductor chip 1 therebelow may undergo damage during the first driving down operation, or ingredients of the passivation film 29 may be deposited to contaminate the bonding portion on the lower surface of the lead 11 to degrade the bondability.

On the other hand, in the Embodiment 1, the foregoing problems can be solved by setting the distance L3 from the edge of the bonding pad 7 to the edge of the passivation film 29 on the side of the bonding pad 7, as seen in FIG. 22, FIG. 23, and FIG. 24, such that the passivation opening 30 is extended and enlarged, whereby the lead 11 does not interfere with the passivation film 29 at least on the side thereof where the bonding tool 18 is driven down, resulting in an improvement, as shown in FIG. 25.

That is, in FIG. 24, the size L3 is about 25 µm in an example of a semiconductor chip 1, for example, a memory device. In this regard, since the size of the bonding pad 7 is 100 µm square and the size of the top end of the bonding tool 18 is equal to or less than that, the distance L3 of the passivation film 29 from the pad 7, as seen in FIG. 25, is desirably, for example, more than 125 µm.

As described above, a suitable bonding property can be attained without the risk of damage to the passivation film 29 on the semiconductor chip 1 or to the semiconductor chip 1 or without deposition of ingredients of the passivation film 29 onto the bonding portion at the lower surface of the lead 11 which could result in contamination.

Further, in a case where the leads 11 extend in both directions, the problem can also be coped with similarly by enlarging the distance from the opening edge of the bonding pad 7 to the edge of the passivation film 29 on the side of the bonding pad 7 at least on the side where the bonding tool is driven down. Enlargement of the space between the edges causes no problem even if applied to the opposite side to such an extent as to avoid exposing the circuit surface of the semiconductor chip 1.

7. Improvement of the Anchor Wiring

Figure 27:
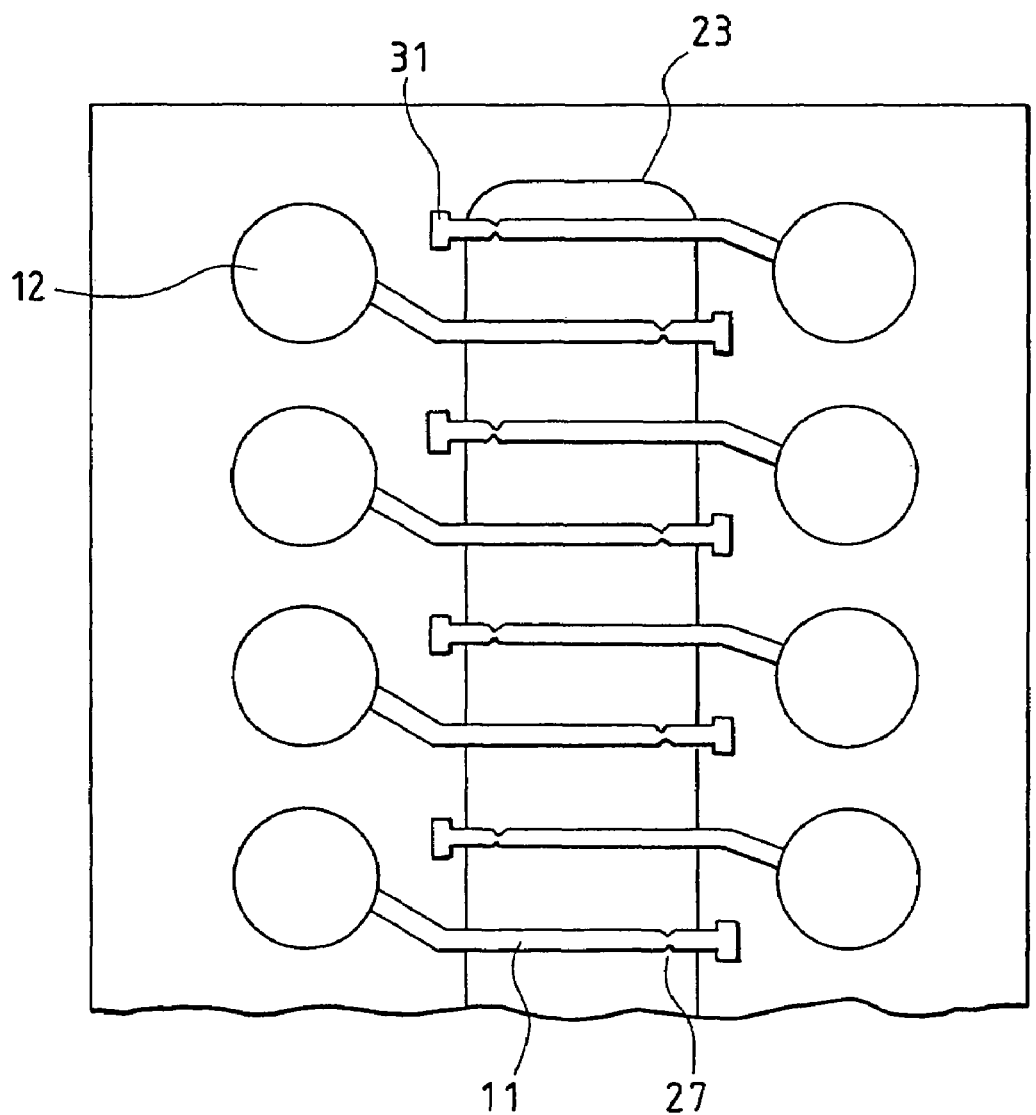
FIG. 27 is a plan view illustrating standard anchor wirings, of a semiconductor integrated circuit device in the Embodiment 1 according to the present invention.
Figure 28:
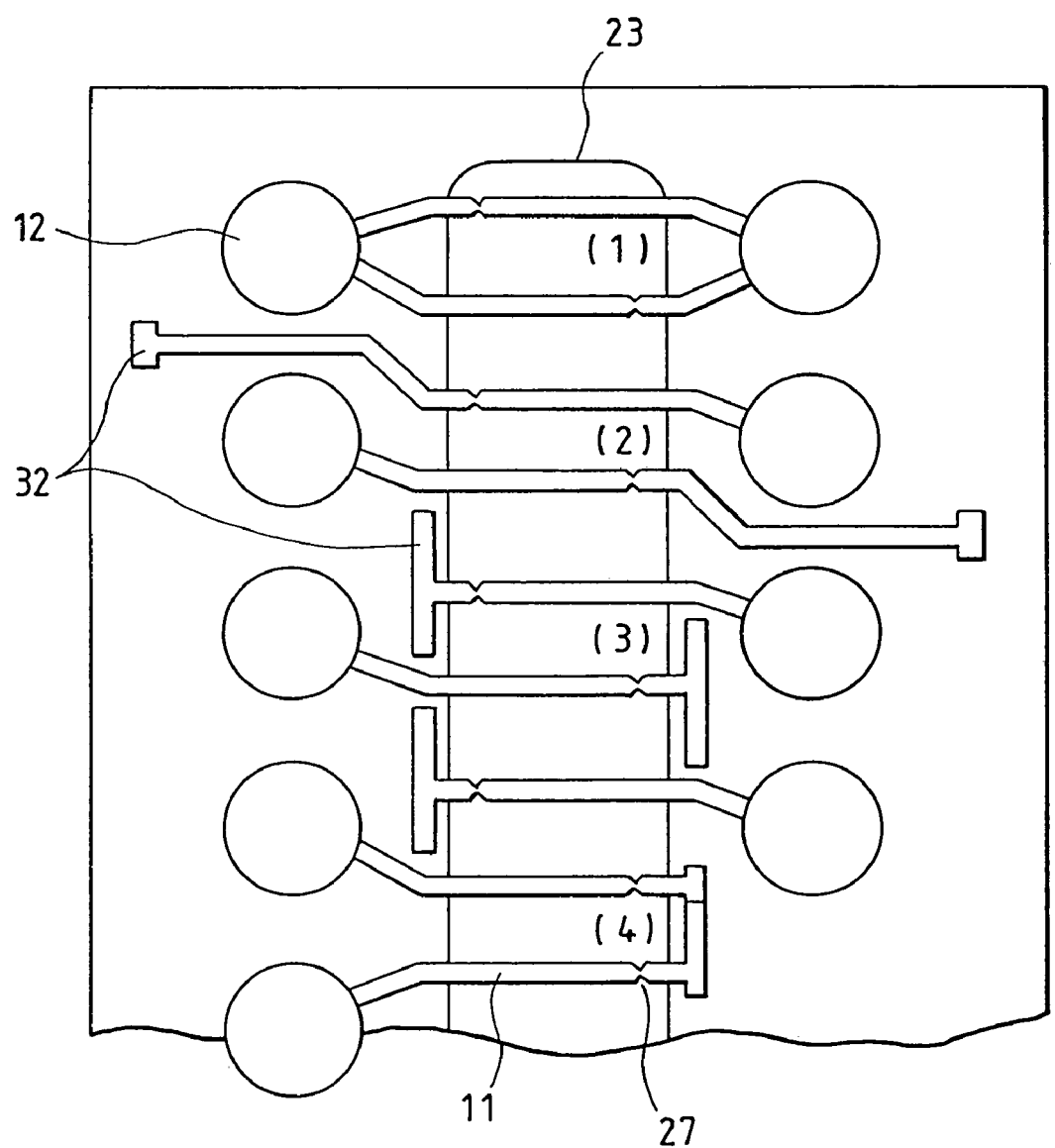
FIG. 28 is a plan view illustrating improved anchor wirings, of a semiconductor integrated circuit device in the Embodiment 1 according to the present invention.

To assist in providing a technical explanation of the improvement of the anchor wiring, FIG. 27 is a plan view illustrating a standard anchor wiring and FIG. 28 is a plan view illustrating an improved anchor wiring.

For example, in the technique studied by the present inventors, in a pattern of a standard anchor wiring 31 on the terminal end of a notch, as shown in FIG. 27, if the notch 27 is formed to be smaller than a designed value, there is a possibility that the lead will not be cut at the portion of the notch 27, but the bonding strength between the wiring 10 and the tape 9 ahead of the notch in the standard anchor wiring 31 may not be sufficient to prevent a portion of the standard anchor wiring 31 to be peeled from the tape 9.

On the other hand, in this Embodiment 1, the bonding strength between the wiring 10 and the tape 9 can be increased to obtain a stable cutting performance of the notch 27 by providing an enlarged anchor wiring 32 for enlarging the effective area in the portion for the anchor wiring at the terminal end as shown in FIG. 28.

That is, the following improved examples of enlarged anchor wirings 32 are shown in FIG. 28.

(1) An enlarged anchor wiring 32 is connected to a bump land 12 to an opposing wiring 11.

(2) Enlarged anchor wiring 32 is extended longitudinally in a vacant space in the wirings 11.

(3) Enlarged anchor wiring 32 is extended laterally in a vacant space in the wirings 11.

(4) Adjacent extended anchor wirings 32 are connected with each other. In each of the examples, the cutting performance of the notch 27 can be stabilized by the increase of the adhesion strength between the wiring 10 and the tape 9 by increasing the effective area of the portion of the enlarged anchor wirings 32.

8. Wide Elastomer Structure

Figure 29:
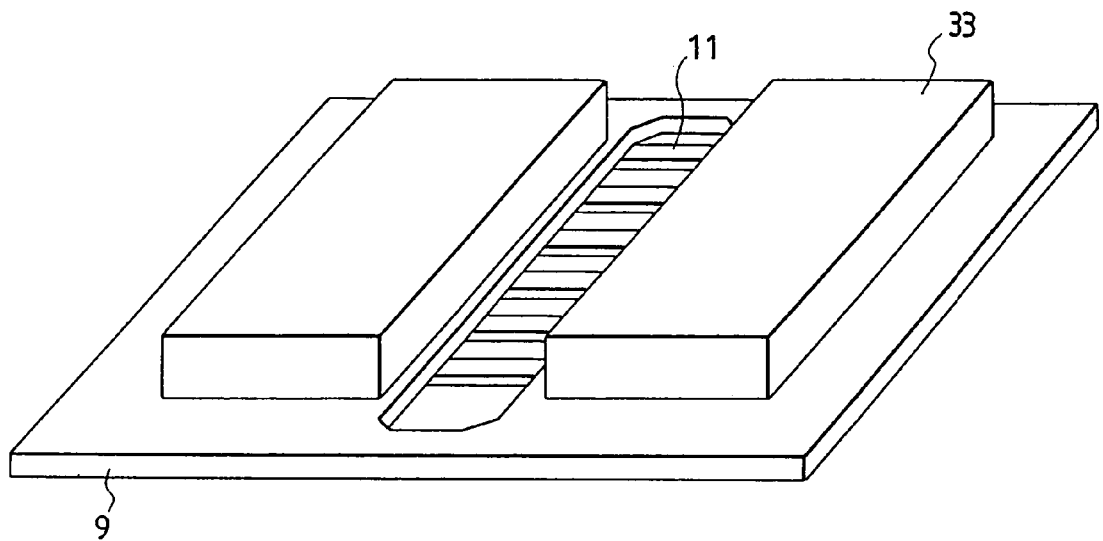
FIG. 29 is a perspective view illustrating a structure of a standard elastomer, of a semiconductor integrated circuit device in the Embodiment 1 according to the present invention.
Figure 30:
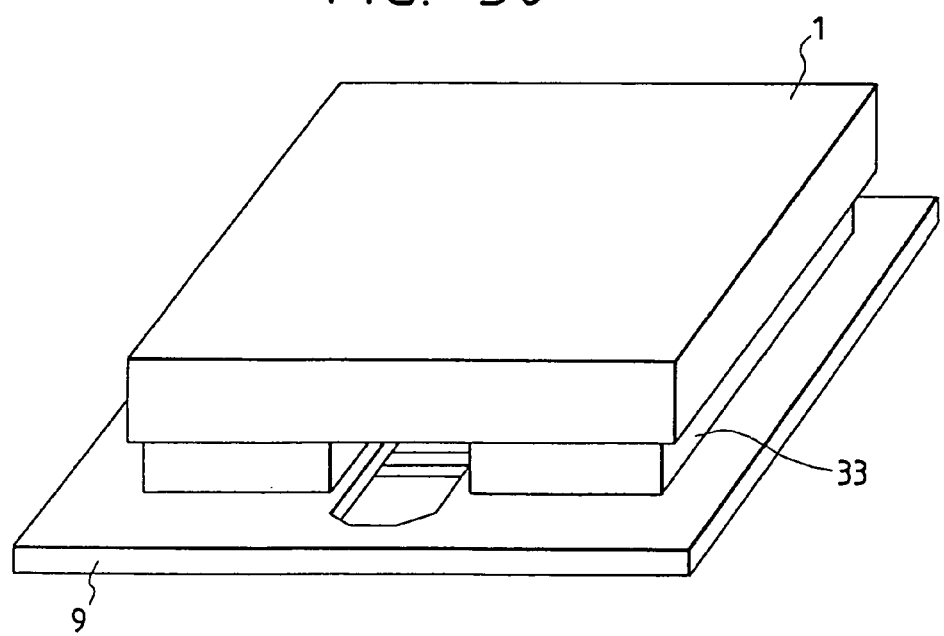
FIG. 30 is a perspective view illustrating a state of appending a semiconductor chip at a standard elastomer, of a semiconductor integrated circuit device in the Embodiment 1 according to the present invention.
Figure 31:
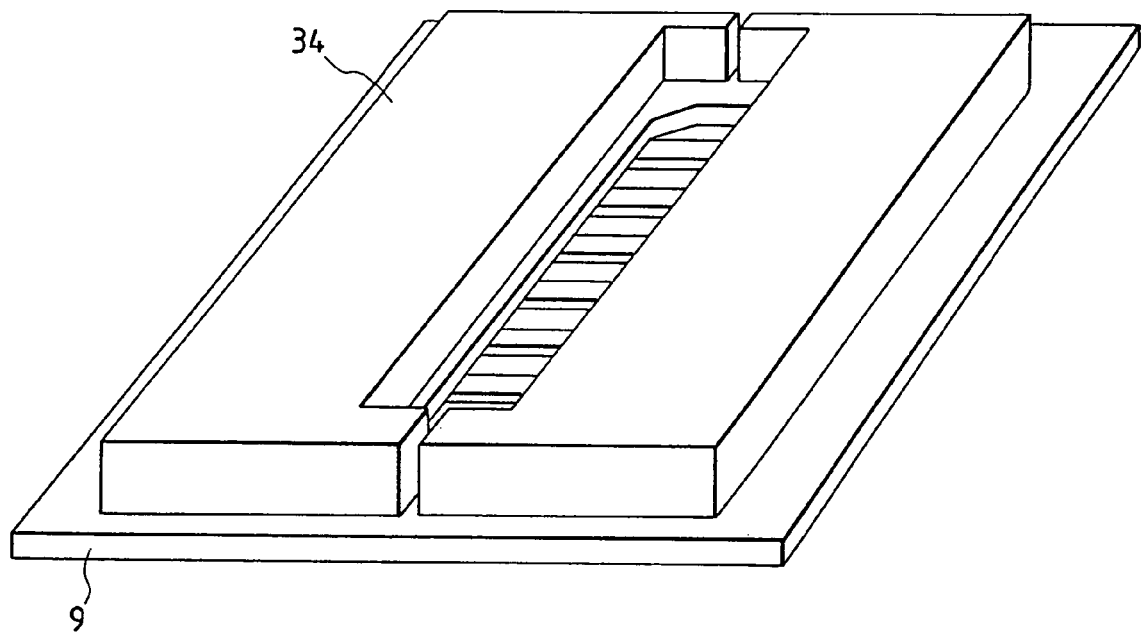
FIG. 31 is a perspective view illustrating a structure of a wide elastomer, of a semiconductor integrated circuit device in the Embodiment 1 according to the present invention.
Figure 32:
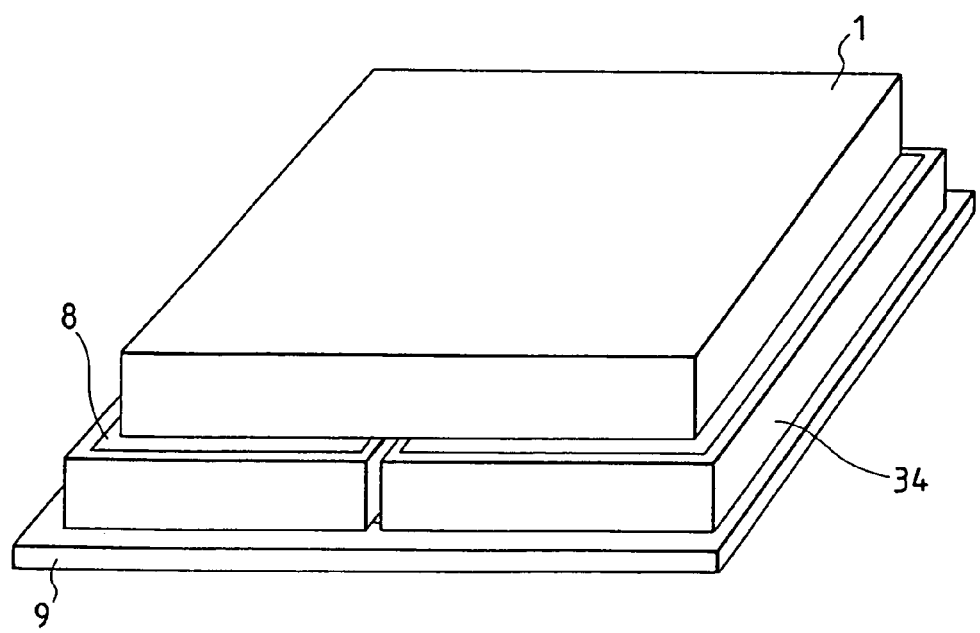
FIG. 32 is a perspective view illustrating a state of appending a semiconductor chip at a wide elastomer, of a semiconductor integrated circuit device in the Embodiment 1 according to the present invention.
Figure 33:
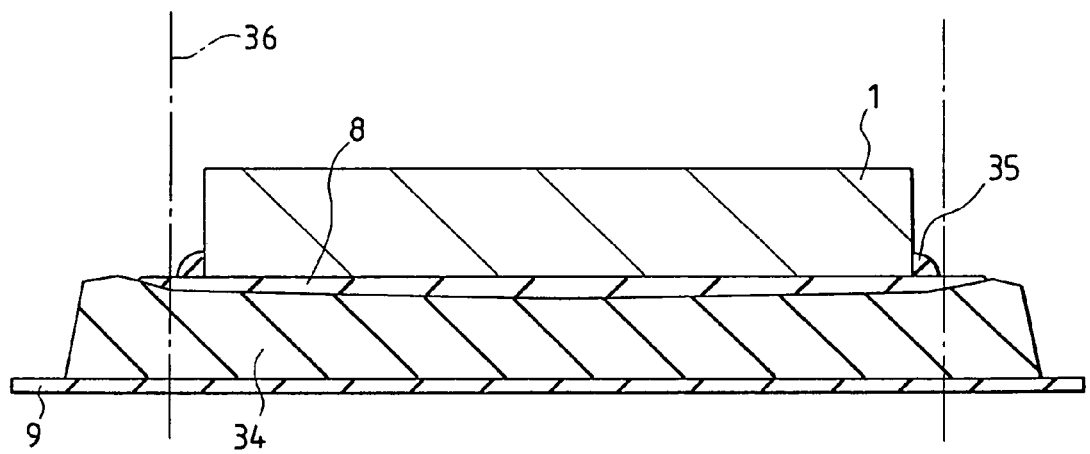
FIG. 33 is a cross sectional view illustrating a state of appending a semiconductor chip at a wide elastomer, of a semiconductor integrated circuit device in the Embodiment 1 according to the present invention.

To assist in providing technical explanation of the wide elastomer structure, FIG. 29 is a perspective view illustrating a structure of a standard elastomer, FIG. 30 is a perspective view illustrating the state of appending a semiconductor chip to a standard elastomer, FIG. 31 is a perspective view illustrating the structure of a wide elastomer, FIG. 32 is a perspective view illustrating the state of appending a semiconductor chip to the wide elastomer and FIG. 33 is a cross sectional view illustrating the state of appending a semiconductor chip to the wide elastomer.

In the technique studied by the present inventors, the elastomer is bonded on both sides of a bonding pad 7 of a semiconductor chip 1 and, in a structure using a standard elastomer 33, as shown in FIG. 29 and FIG. 30, there is a possibility that warping will occur in the flexible wiring substrate due to the effect of peripheral protrusions in a structure in which the surface of the elastomer 2 is smaller than that of the semiconductor chip 1, as shown in FIG. 13, and that the warping brings about a problem, for example, during the forming of the solder bumps 5 and the mounting of the substrate.

On the other hand, in the structure of a wide elastomer 34 which is larger than the outer size of the semiconductor chip 1 in the embodiment as shown in FIG. 31, the peripheral protrusions of the wide elastomer 34 are outside of the edges of the semiconductor chip, as shown in FIG. 32 and FIG. 33, after appending the semiconductor chip 1, and since the semiconductor chip 1 is bonded substantially to a flat portion of the wide elastomer 34, warping of the flexible wiring substrate 3 can be avoided.

Further, as shown in FIG. 33, since a wide coating area of an adhesive 8 can be employed, the portion in which the adhesive 8 is not provided and which is left unbonded is reduced in size, and since the adhesive will extrude uniformly at the periphery of the semiconductor chip 1 to form an adhesive bead 35, it is possible to constitute a package of excellent moisture proofness and reliability without applying peripheral sealing.

More particularly, the width of the protrusions at the periphery of the wide elastomer 34 is, for example, about 200 to 300 μm depending on the physical property of the material and, accordingly, the wide elastomer 34 extends over a larger range at the entire circumference at least by more than the protrusion width afforded by the chip size of the semiconductor chip 1, as shown in FIG. 33 in the Embodiment 1

Further, while the flatness is improved by forming the wide elastomer 34 sufficiently large, if the tape 9 is to be cut just at the outer circumference of the semiconductor chip 1, the tape 9 will be cut together with the wide elastomer 34 along a cutting line 36, which is necessary to define the package outer shape.

As described above, by using the wide elastomer 34 which is larger than the outer size of the semiconductor chip 1, warping of the flexible wiring substrate 3 can be suppressed, and the bondability of the semiconductor chip 1 can be made stable to improve the moisture proofness and the reliability of the package.

9. Groove-Filling Technique of the Elastomer

Figure 34:
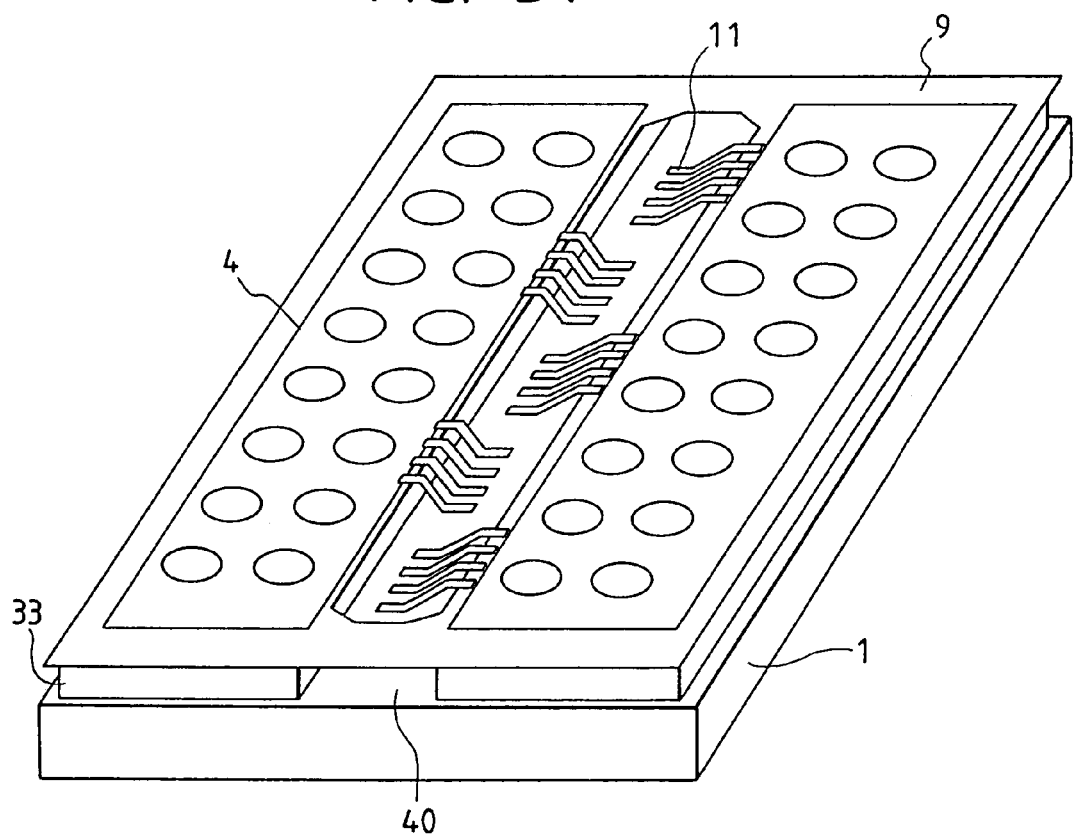
FIG. 34 is a perspective view illustrating a structure of the standard elastomer after appending a semiconductor chip, of a semiconductor integrated circuit device in the Embodiment 1 according to the present invention.
Figure 35:
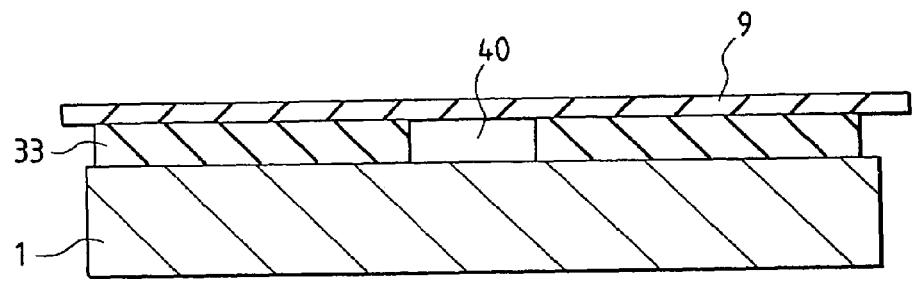
FIG. 35 is a cross sectional view illustrating a structure of a standard elastomer after appending the semiconductor chip, of a semiconductor integrated circuit device in the Embodiment 1 according to the present invention.
Figure 36:
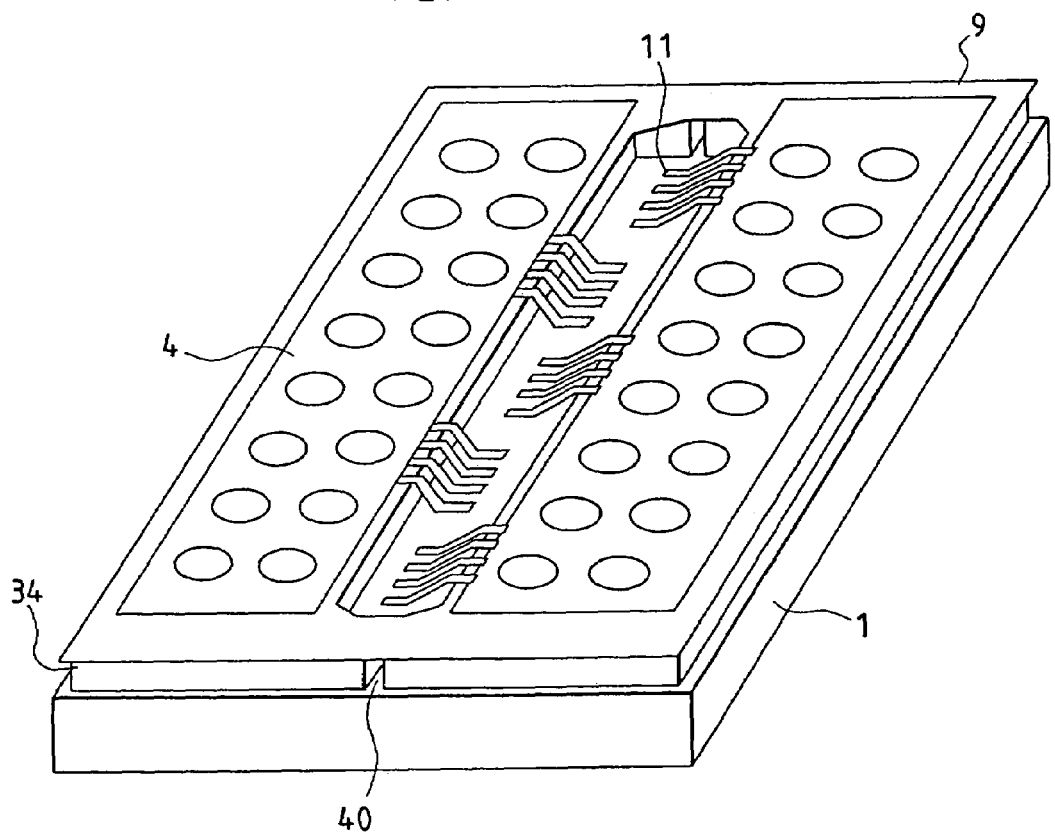
FIG. 36 is a perspective view illustrating a structure of a wide elastomer after appending the semiconductor chip, of a semiconductor integrated circuit device in the Embodiment 1 according to the present invention.
Figure 37:
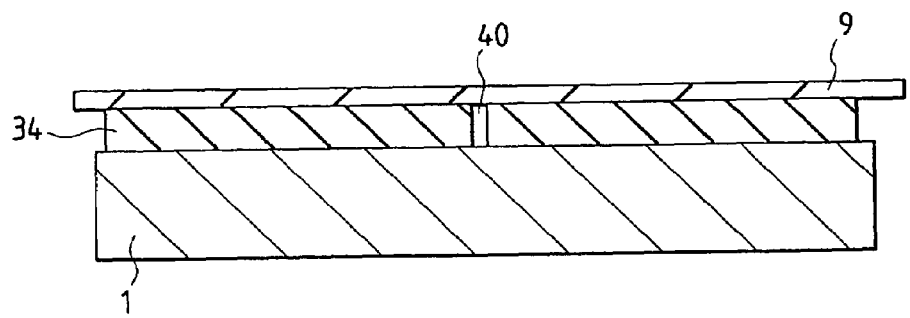
FIG. 37 is a cross sectional view illustrating a structure of a wide elastomer after appending the semiconductor chip, of a semiconductor integrated circuit device in the Embodiment 1 according to the present invention.
Figure 38:
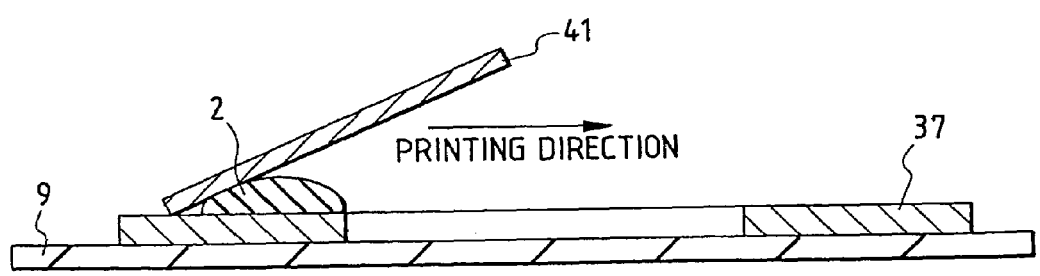
FIG. 38 is a cross sectional view illustrating a concept of metal mask printing, of a semiconductor integrated circuit device in the Embodiment 1 according to the present invention.
Figure 39:
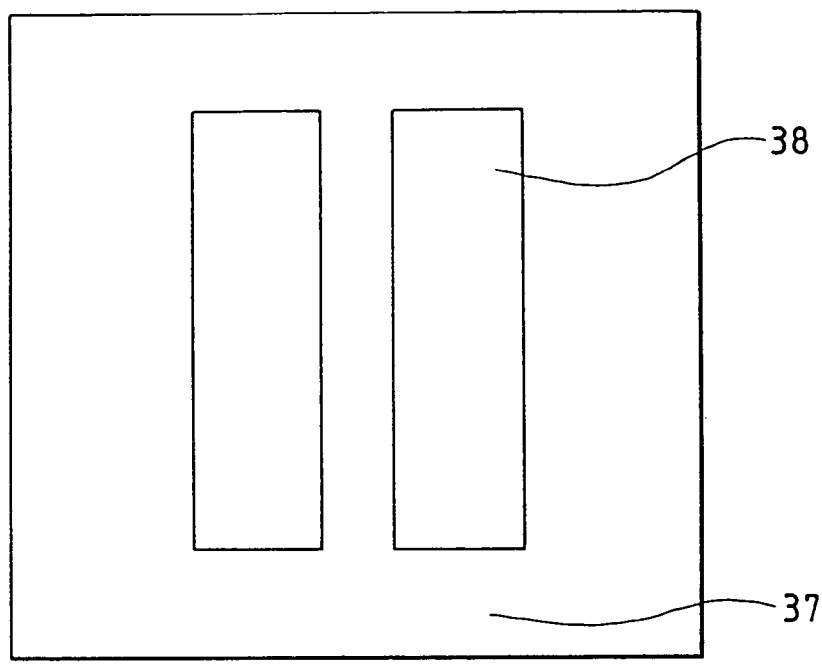
FIG. 39 is a plan view illustrating a metal mask of a standard elastomer, of a semiconductor integrated circuit device in the Embodiment 1 according to the present invention.
Figure 40:
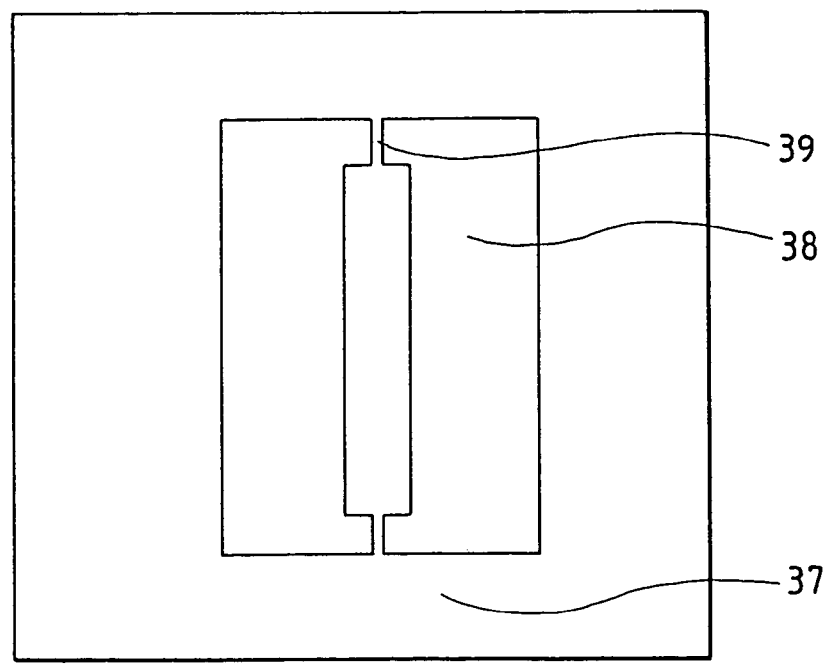
FIG. 40 is a plan view illustrating a metal mask of a wide elastomer, of a semiconductor integrated circuit device in the Embodiment 1 according to the present invention.
Figure 41:
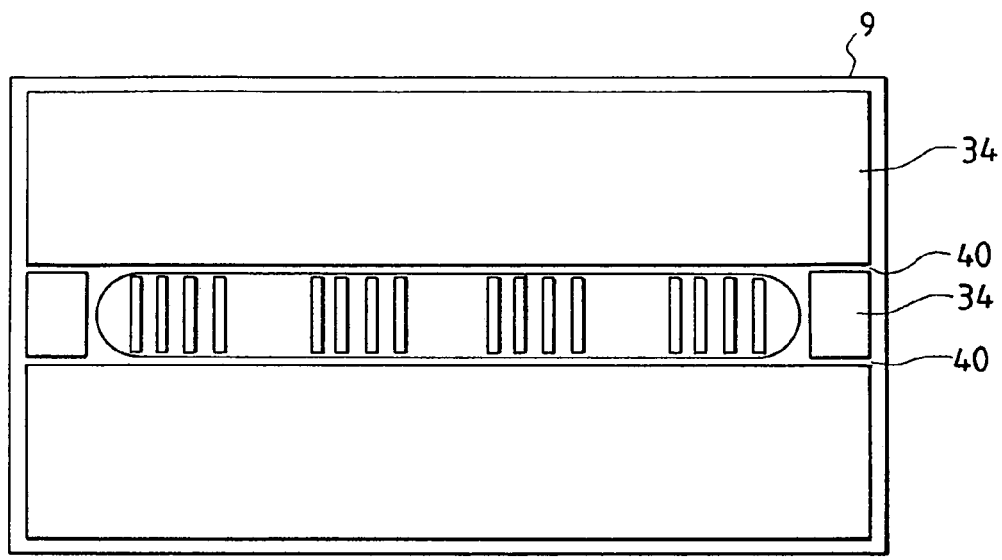
FIG. 41 is a plan view illustrating a printed shape for a plurality of suspended wide elastomers, of a semiconductor integrated circuit device in the Embodiment 1 according to the present invention.
Figure 42:
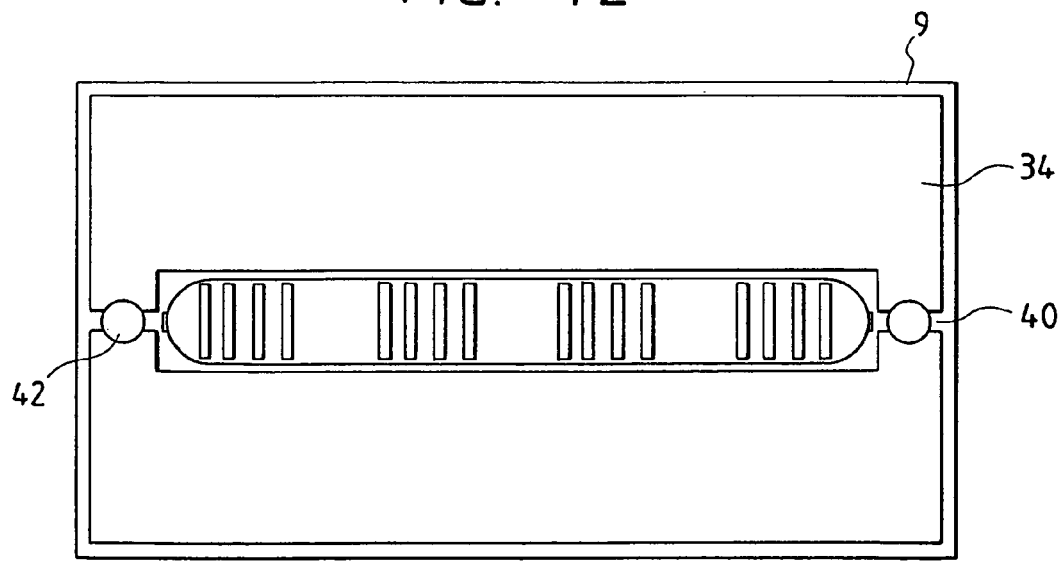
FIG. 42 is a plan view illustrating a potting position for groove-fillage of a wide elastomer, of a semiconductor integrated circuit device in the Embodiment 1 according to the present invention.

To assist in providing a technical explanation of the groove-filling technique of the elastomer, FIG. 31 and FIG. 32 are perspective views illustrating the structure of the wide elastomer and the state of appending the semiconductor chip as described above, FIG. 34 is a perspective view illustrating the structure after appending a semiconductor chip to a standard elastomer, FIG. 35 is a cross sectional view thereof, FIG. 36 is a perspective view illustrating a structure after appending a semiconductor chip to a wide elastomer, FIG. 37 is a cross sectional view thereof, FIG. 38 is a cross sectional view illustrating the concept of metal mask printing, FIG. 39 is a plan view illustrating a metal mask of a standard elastomer, FIG. 40 is a plan view illustrating a metal mask of a wide elastomer, FIG. 41 is a plan view illustrating a printed shape of a wide elastomer having plural bridge portions and FIG. 42 is a plan view illustrating a potting position for groove-filling of the wide elastomer.

For example, in the structure of a standard elastomer 33 as shown in FIG. 34 and FIG. 35, in the technique studied by the present inventor, when an elastomer is formed by printing using a metal mask 37, as shown in FIG. 39, in the structure of the standard elastomer 33 shown in FIG. 34 and FIG. 35, since a bridge portion 39 is always present across the printing area opening 38 of the metal mask 37 shown in FIG. 39, a groove 40 (space) surrounded by walls of the semiconductor chip 1 and the elastomer is present below the tape suspended portion.

Accordingly, when the window opening 23 (FIG. 9) is resin-encapsulated in a structure in which the groove 40 remains at the ends of the space defined by the semiconductor chip 1 and the elastomer, the sealant 6 will leak through the groove 40, and so it is necessary to previously seal the open end portions by a method such as separate potting and then seal the window opening 23.

As described above, the concept of printing by use of a metal mask 37 is designed to form the elastomer for a desired range to a desired thickness, by positioning and disposing a metal mask 37 having a printing area opening 38 at a predetermined position with respect to a flexible wiring substrate 3, only for the printed portion as shown in FIG. 39 in the case of the standard elastomer 33 and as shown in FIG. 40 in the case of the wide elastomer 34.

Accordingly, in the Embodiment 1, the wide elastomer 34 described above and shown in FIG. 31 is printed by a metal mask 37 as shown in FIG. 40, in which a groove 40 surrounded by the walls of the semiconductor chip 1 and the elastomer 2 can be narrowed by printing the elastomer having a restricted bridge portion 39 for the printing area opening 38 of the metal mask 37. For example, the minimum value for the width of the groove 40 determined by the strength of the bridge portion 39 of the metal mask 37 is about 200 μm.

Further, in a case of a structure in which the semiconductor chip is appended to the elastomer by coating the adhesive 8 on the main surface of the elastomer 2, if the adhesive 8 is coated in a sufficient amount, excessive adhesive 8 will fill the groove 40 in response to the pressure created upon appending to make the window opening 23 a closed space, so that the window opening 23 can be sealed without applying sealing.

Further, the groove-fillage can be improved by restricting the bridge portion 39 of the metal mask 37 thereby narrowing the groove 40, but this results in a side effect of lowering the strength of the metal mask 37. However, by providing a plurality of bridge positions on one side to produce the construction as shown in FIG. 41, the strength of the metal mask 37 can be improved without changing the width of the groove 40 although the number of the grooves 40 is increased.

Further, with an aim toward improving the groove-fillage, as shown in FIG. 42, when resin, adhesive or the like is potted, for example, at the potting position 42 of the groove 40 of the elastomer to form a stopping dam for the sealant flow just before appending the semiconductor chip 1, the groove-fillage can be improved still further.

Further, in a case of filling by potting before sealing the window opening 23 after appending and bonding of the semiconductor chip as in the technique studied above, the sealing performance can be improved outstandingly by restricting the width of the groove 40.

As described above, the groove-fillage can be improved, particularly, by restricting the bridge portion 39 of the metal mask 37 thereby narrowing the groove 40 of the elastomer and, further, the groove-fillage can be improved even more by previously forming a stopping dam for the sealant flow to the potting position 42.

10. Inner Lead Bonding Technique

Figure 43:
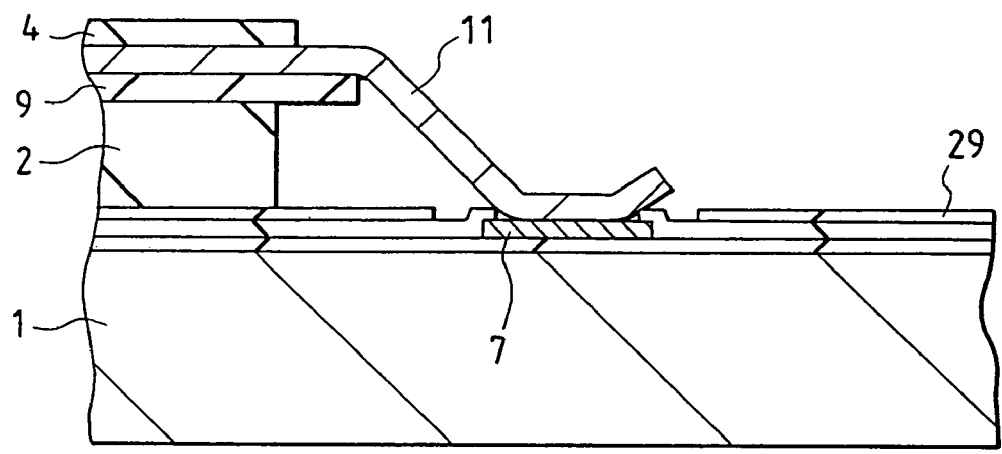
FIG. 43 is a cross sectional view illustrating a bonding portion by a standard lead bonding, of a semiconductor integrated circuit device in the Embodiment 1 according to the present invention.
Figure 44:
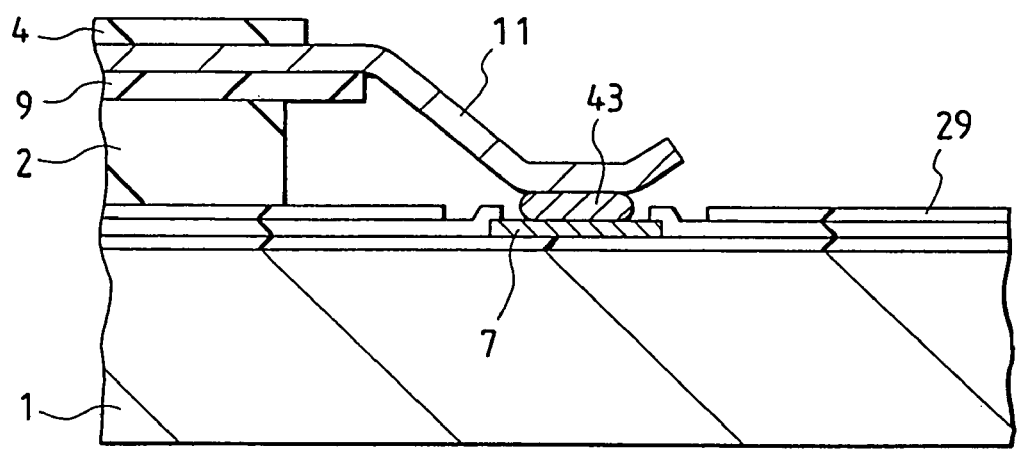
FIG. 44 is a cross sectional view illustrating a bonding portion by using stud bumps, of a semiconductor integrated circuit device in the Embodiment 1 according to the present invention.
Figure 45:
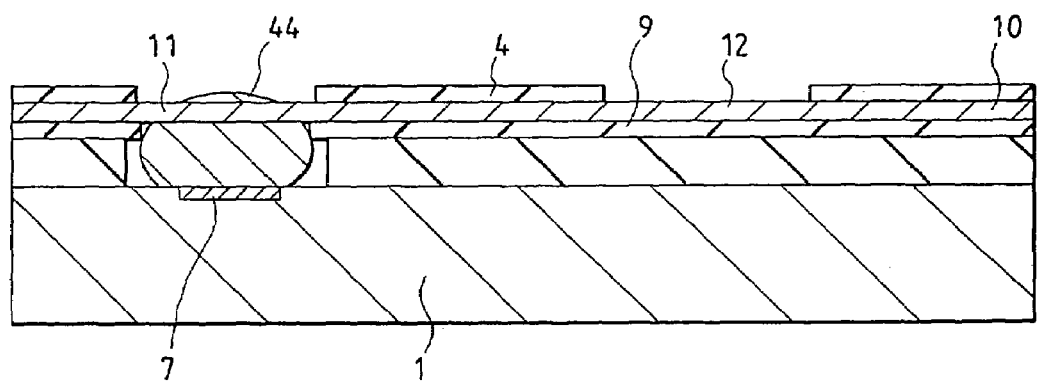
FIG. 45 is a cross sectional view illustrating a lead connection by using solder, of a semiconductor integrated circuit device in the Embodiment 1 according to the present invention.
Figure 46:
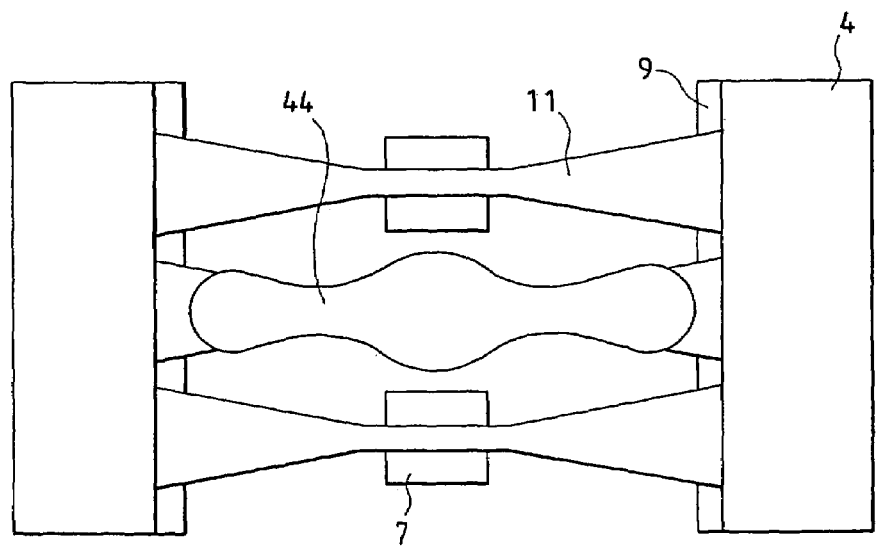
FIG. 46 is a plan view illustrating a lead connection using solder, of a semiconductor integrated circuit device in the Embodiment 1 according to the present invention.
Figure 47:
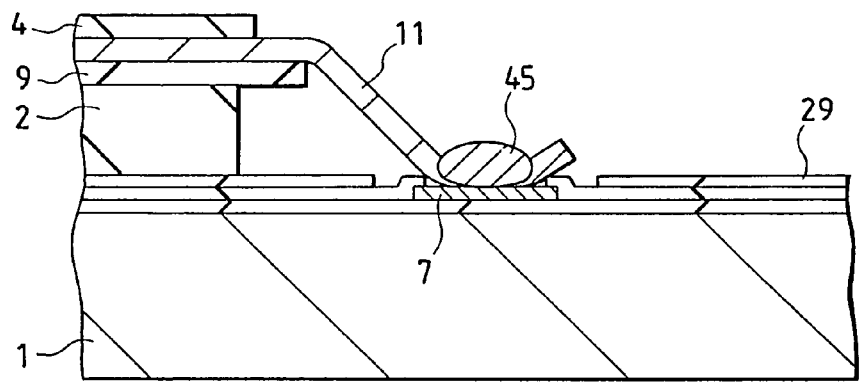
FIG. 47 is a cross sectional view illustrating a lead connection by using solder or Au ball, of a semiconductor integrated circuit device in the Embodiment 1 according to the present invention.
Figure 48:
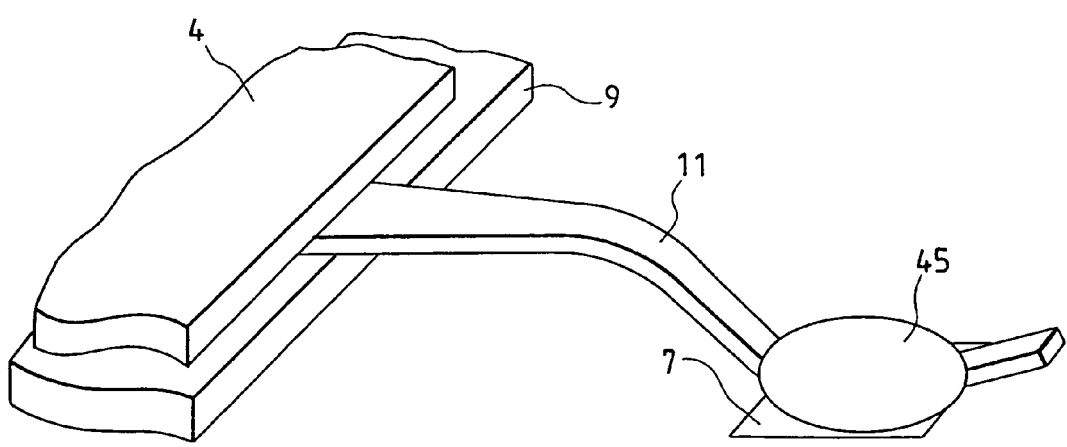
FIG. 48 is a perspective view illustrating a lead connection by using solder or Au ball, of a semiconductor integrated circuit device in the Embodiment 1 according to the present invention.
Figure 49:
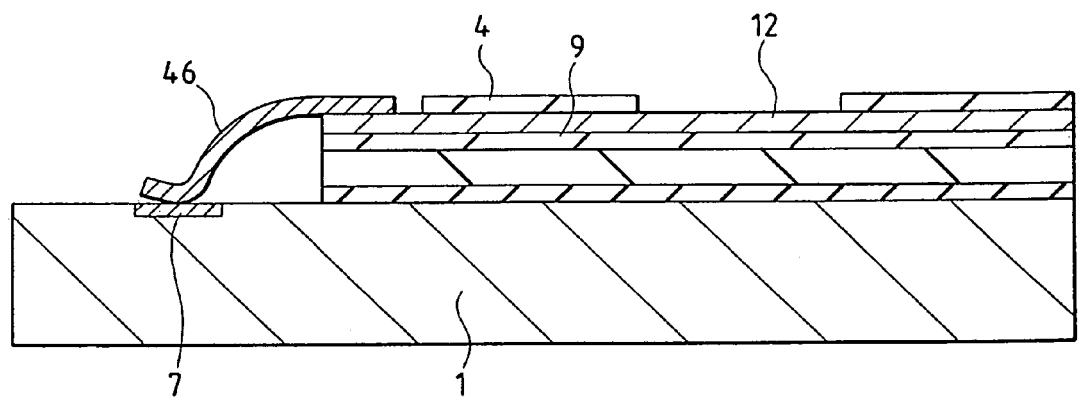
FIG. 49 is a cross sectional view illustrating a lead connection by using Al or soldering wire, of a semiconductor integrated circuit device in the Embodiment 1 according to the present invention.
Figure 50:
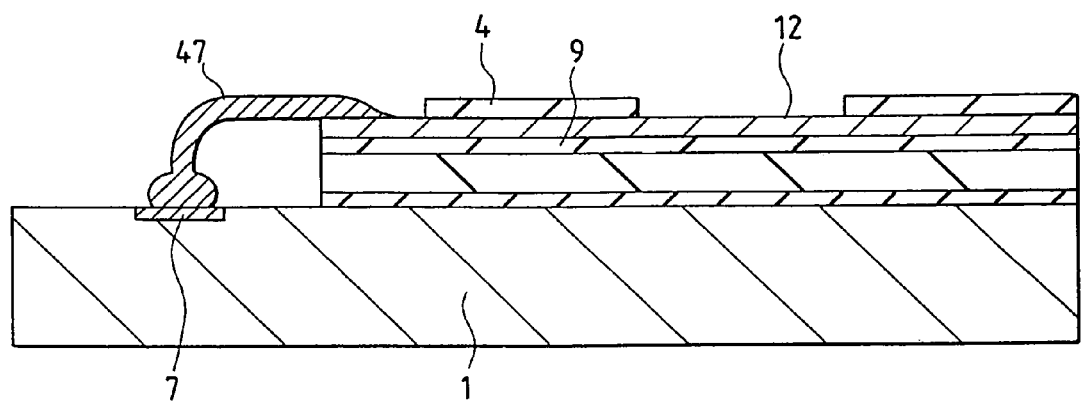
FIG. 50 is a cross sectional view illustrating a lead connection by using an Au wire, of a semiconductor integrated circuit device in the Embodiment 1 according to the present invention.

To assist in providing an explanation of the inner lead bonding technique, FIG. 43 is a cross sectional view illustrating a bonding portion produced by a standard lead bonding, FIG. 44 is a cross sectional view illustrating a bonding portion produced by using a stud bump, FIG. 45 and FIG. 46 are a cross sectional view and a plan view, respectively, illustrating a lead connection using soldering, FIG. 47 and FIG. 48 are a cross sectional view and a perspective view, respectively, illustrating a lead connection using a solder or Au ball, FIG. 49 is a cross sectional view illustrating a connection using an Al or solder wire and FIG. 50 is a cross sectional view illustrating a connection using an Au wire.

For example, in the technique studied by the present inventor, a lead 11 on which Au plating is provided is directly driven onto a bonding pad 7 and thermally press bonded using supersonic waves. In this case, if the bonding condition is poor or the shape of the bonding tool 18 is inadequate, there is the possibility of a problem in that the bonding strength is low or the bonding pad for a portion therebelow is subject to damage.

On the contrary, in the Embodiment 1, the problems, for example, of bondability or damage caused by the bonding condition and the shape of the bonding tool 18 as described above can be overcome by adopting the following feature for the bonding state.

That is, FIG. 44 shows an example of using a stud bump 43. This example has a feature of using a semiconductor chip 1 having the stud bump 43 formed previously by a plating method or a ball bonding method onto a bonding pad 7 of the semiconductor chip 1, causing the bondability to be improved and, further, preventing damage to the bonding pad.

Further, FIG. 45 and FIG. 46 are examples of a connection for the lead 11 using solder and showing a connection state in which the lead 11 is surrounded with solder 44. This example concerns a technique for connecting a bonding pad 7 comprising Al or the like of the semiconductor chip 1 and an electrode of the tape 9 such as TAB as a CSP substrate. A method of feeding the solder in this example includes a method of connecting the solder 44 with the bonding pad 7 of the semiconductor chip 1 using the tape 9 on which the solder 44 is already present so as to surround the lead 11.

For the connection method, it is desirable for the shape of the solder 44 provided on the tape 9, such as a TAB, to be made as flat as possible at the surface in contact with the bonding pad 7 of the semiconductor chip 1 in the connection method by pressurizing and heating using a bonder. Further, in a connection method using a reflow furnace, solder paste or flux is provided at the surface of the bonding pad 7 of the semiconductor chip 1 so as to be in contact with the solder 44 of the tape 9, such as a TAB.

Then, in the case of feeding the solder 44 using solder paste, the solder paste may be provided at the surface of the bonding pad 7 of the semiconductor chip 1 by printing or by using a syringe. In this case, the tape 9, such as a TAB, may be bonded previously or subsequently providing that the lead 11 of the tape 9 is in contact with the solder 44 when the tape 9 is bonded to the semiconductor chip 1.

Further, FIG. 47, FIG. 48 show a connection technique having a feature of connecting a lead 11 of a tape 9, such as a TAB, onto a bonding pad 7 of a semiconductor chip 1 by using a stud bump, such as a solder or Au ball 45.

Further, FIG. 49 shows an example of connecting a wiring 10 of a flexible wiring substrate 3 and a bonding pad 7 of a semiconductor chip 1 by using an Al or solder wire 46. Further, FIG. 50 shows an example of connecting a wiring 10 of a flexible wiring substrate 3 and a bonding pad 7 of a semiconductor chip 1 by using an Au wire 47. In the connection examples, the connection is enabled not by way of the inner lead bonding, such as a TAB, but under the concept of a typical wire bonding.

11. Lead Design Technique Capable of Forming an S-Shape with No Tool Return

Figure 51:
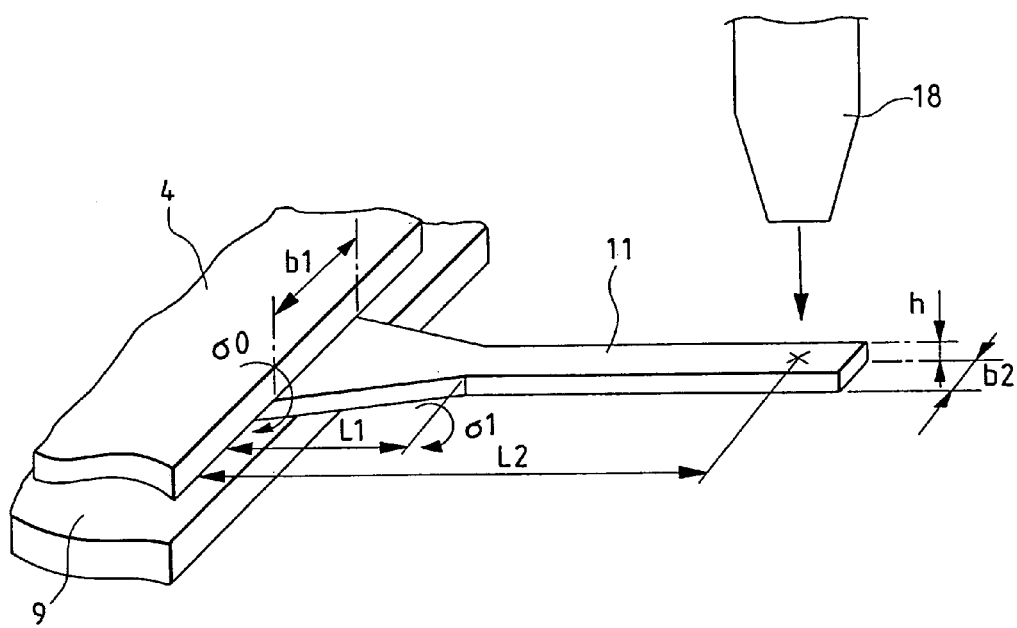
FIG. 51 is a perspective view for explaining a lead design, of a semiconductor integrated circuit device in the Embodiment 1 according to the present invention.
Figure 52:
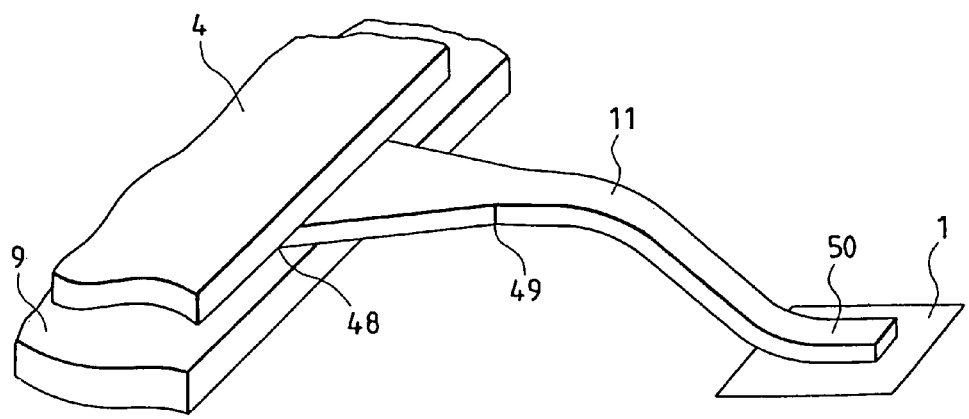
FIG. 52 is a perspective view illustrating modification of a lead after bonding, of a semiconductor integrated circuit device in the Embodiment 1 according to the present invention.

To assist in providing an explanation of the lead design technique capable of forming an S-shape with no tool return, FIG. 17 is a cross sectional view illustrating a trace of a bonding tool upon forming a standard S-shaped lead as explained previously, FIG. 51 is a perspective view for explaining the lead design, FIG. 52 is a perspective view illustrating deformation of a lead after bonding, FIG. 53 is a chart illustrating a relationship between a lead size and a bending stress ratio and FIG. 76 to FIG. 80 are cross sectional views illustrating the deformed shape of a lead in accordance with the bending stress ratio.

More particularly, as explained also in connection with the technique for the planar S-shaped lead 26 in the technique studied by the present inventor, it is necessary for forming the S-shaped configuration of the lead 11 shown in FIG. 17, to laterally displace the bonding tool 18, namely, a special bonding tool trace 25 including a tool return is required.

On the contrary, in the Embodiment 1, if the size of a lead 11 shown in FIG. 51 is defined, for example, as shown in FIG. 53, the bending stress ratio $\alpha$ will fall within a desired range of from 1.2 to 1.5 and a suitable S-shaped configuration for the lead 11 as shown in FIG. 52 can be formed by merely driving down the bonding tool 18 vertically with no tool return. In FIG. 52, there are shown a tape end 48, an end 49 on the side of the tape and an end 50 on the side of the chip.

For example, in the example of embodiment (1), the bending stress ratio $\alpha=1.26$ at the size: taper length $L1=100$ μm, wiring length $L2=380$ μm, taper width $b1=65$ μm, lead width $b2=38$ μm and lead thickness $h=18$ μm. In the same manner, the ratio is 1.25 in the embodiment (2), 1.26 in the embodiment (3), 1.31 in the embodiment (4) and 1.46 in the embodiment (5).

On the contrary, in the studied technique, at the size: taper length $L1=100$ μm, wiring length $L2=280$ μm, taper width $b1=60$ μm, lead width $b2=38$ μm and lead thickness $h=18$ μm, the bending stress ratio $\alpha$ is 1.02, for example, in the example (1) and 1.13 in the example (2) which is out of the range of 1.2 to 1.5.

As described above, since the bending stress is concentrated to an intermediate portion of the lead 11 in the wiring operation within the range of the bending stress ratio α from 1.2 to 1.5, a moderately distorted satisfactory wiring state is attained. On the other hand, if the bending stress ratio α is less than 1.2 as in the studied technique, since the bending stress is concentrated at the tape end 48 of the lead 11, it results in a stiffened state. Further, if the ratio exceeds 1.5, the bending stress is concentrated only at the intermediate portion of the lead 11 resulting in a state of a small radius of curvature which can not be said to be a satisfactory wiring state.

Figure 77:
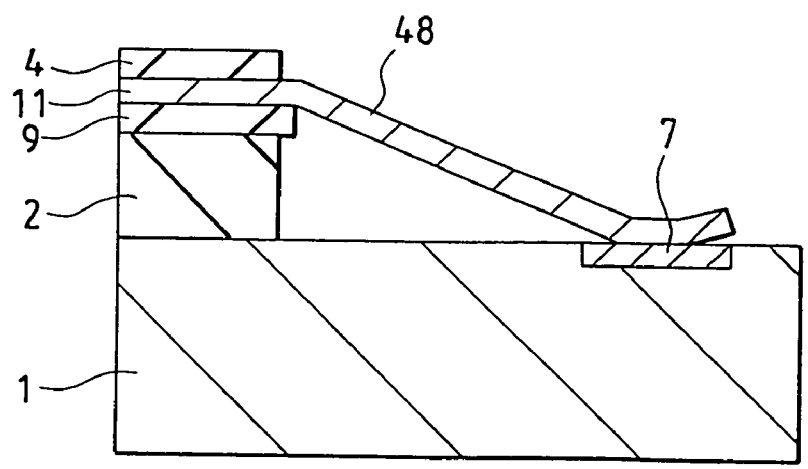
FIG. 77 is a cross sectional view illustrating the modified shape of the lead in accordance with the bending stress ratio, of the semiconductor integrated circuit device in the Embodiment 1 according to the present invention.

FIG. 76 to FIG. 80 show the deformed shape of the lead in accordance with the bending stress ratio α concretely. At first, when the bonding tool 18 is merely driven down vertically to contact the lead of initial shape before wiring shown in FIG. 76, since the bending stress is concentrated on the tape end 48 of the lead 11, for example, in the wiring operation at α<0.9, an extremely stiffened wiring state is formed as shown in FIG. 77. Accordingly, since high repeating stresses are exerted on the lead 11 during the temperature cycle after wiring, the fatigue life is extremely shortened.

Figure 78:
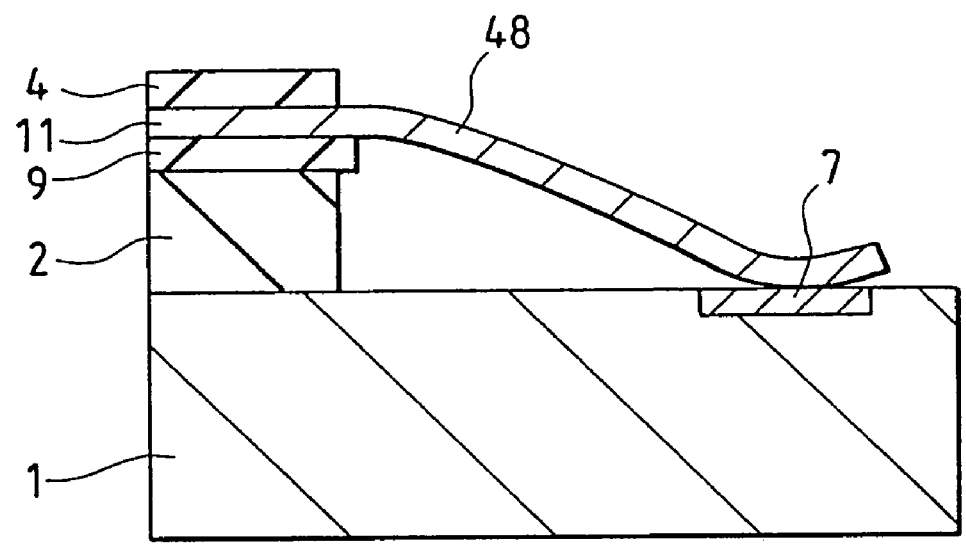
FIG. 78 is a cross sectional view illustrating the modified shape of the lead in accordance with the bending stress ratio, of the semiconductor integrated circuit device in the Embodiment 1 according to the present invention.

Further, since the bending stress is concentrated at the tape end 48 of the lead 11 in the wiring operation at 0.9≦α<1.2 as in the technique studied by the present inventor, a somewhat stiffened wiring state is formed as shown in FIG. 78. Accordingly, since high repeating stresses are exerted on the lead 11 during the temperature cycle after the wiring, fatigue life is shortened.

Figure 79:
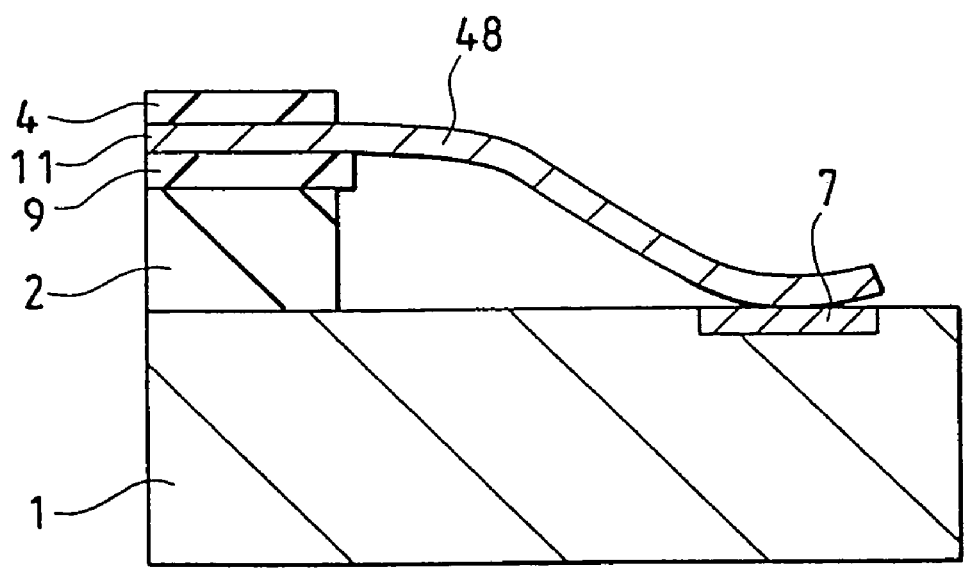
FIG. 79 is a cross sectional view illustrating the modified shape of the lead in accordance with the bending stress ratio, of the semiconductor integrated circuit device in the Embodiment 1 according to the present invention.

On the contrary, since the bending stress is concentrated at an intermediate portion of the lead 11 during the wiring operation at 1.2≦α<1.5 as in the Embodiment 1, a moderately distorted wiring state as shown in FIG. 79 is formed. Accordingly, since no high repeating stresses are exerted on the lead 11 during the temperature cycle after the wiring, the fatigue life is increased.

Figure 80:
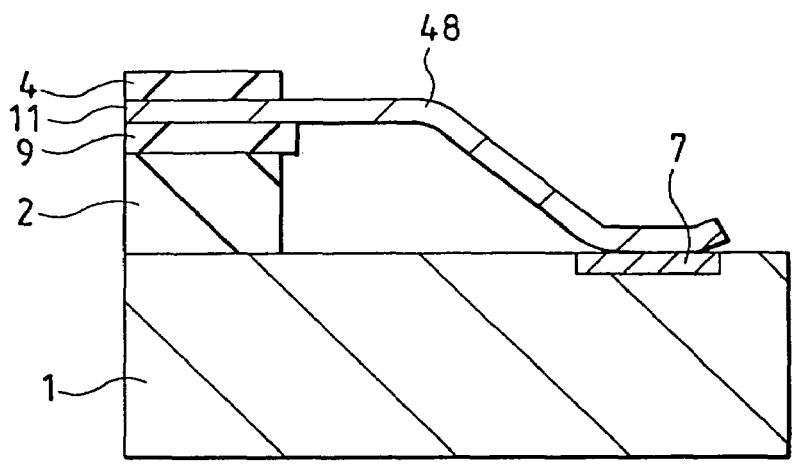
FIG. 80 is a cross sectional view illustrating the modified shape of the lead in accordance with the bending stress ratio, of the semiconductor integrated circuit device in the Embodiment 1 according to the present invention.

Further, during wiring operation at 1.5<α with an increased bending stress ratio, since the bending ratio is concentrated only at the intermediate portion of the lead 11, a wiring state with a small radius of curvature as shown in FIG. 80 is formed. Accordingly, since the initial strength of the bent portion is lowered, the fatigue life during the temperature cycle after wiring is shortened.

As a result, an optimal wiring state with only a moderately distorted wiring shape is formed when the bending stress ratio is set within a range: 1.2≦α≦1.5 as in the Embodiment 1, and the temperature cycle life of the lead 11 can be increased.

The bending stress ratio α is defined as a value formed by dividing the stress σ1 generated at the end 49 of the lead 11 on the side of the tape by a stress σ0 generated at the tape end 48 of the lead 11 upon conducting the operation of raising the lead 11 just above the bonding pad 7 with the bonding tool 18. That is, the bending stress ratio α can be represented by the following formula based on the size of the lead 11 having a feature in the tapered shape:

$$\alpha = \sigma1/\sigma0 = b1 \times (L2-L1)/(b2 \times L2)$$

As described above, when the size and the shape of the lead 11 are designed such that the bending stress ratio α is from 1.2 to 1.5, a stable and suitable S-shaped wiring state can be formed by a simple driving down movement of a wire bonder like that in the technique for the planar S-shaped lead 26 described previously. Accordingly, since no special soft-modified wire bonder is required and the bonding tool trace 25 can also be simplified, an effect of shortening the contact time upon bonding can also be expected.

12. Ni-Platingless Lead

Figure 54:
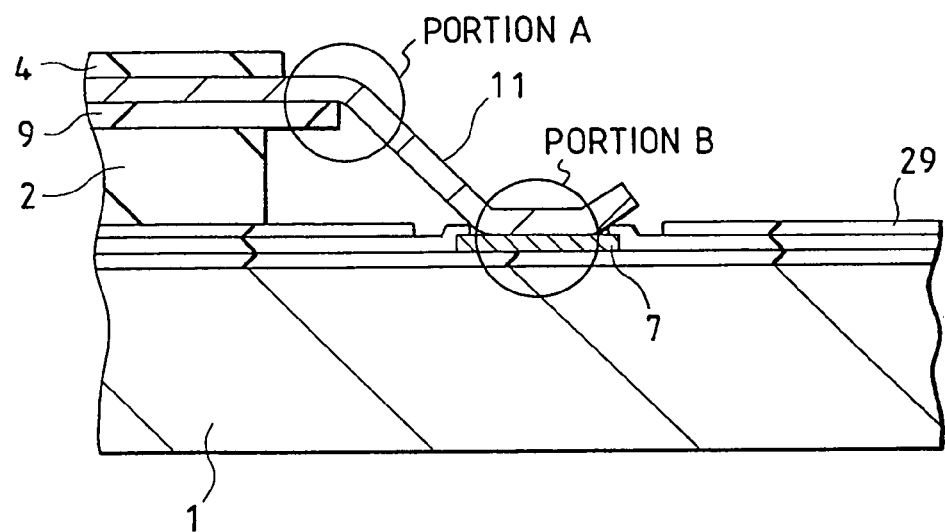
FIG. 54 is a cross sectional view illustrating a connection portion of lead connection, of a semiconductor integrated circuit device in the Embodiment 1 according to the present invention.
Figure 55:
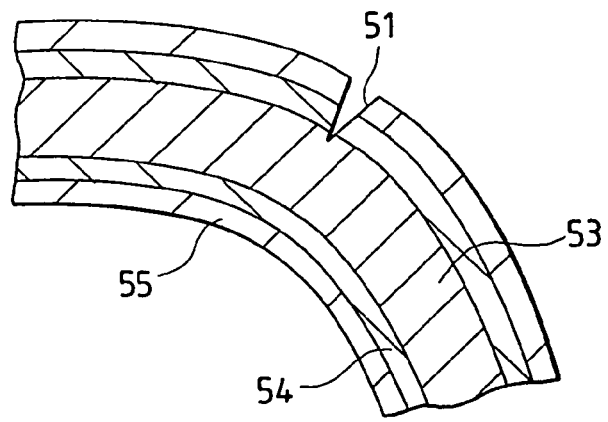
FIG. 55 is an enlarged cross sectional view illustrating a lead bent portion, of a semiconductor integrated circuit device in the Embodiment 1 according to the present invention.
Figure 56:
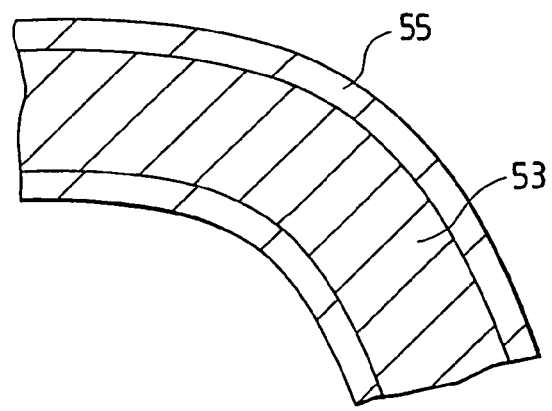
FIG. 56 is an enlarged cross sectional view illustrating a Ni-platingless lead bent portion, of a semiconductor integrated circuit device in the Embodiment 1 according to the present invention.
Figure 57:
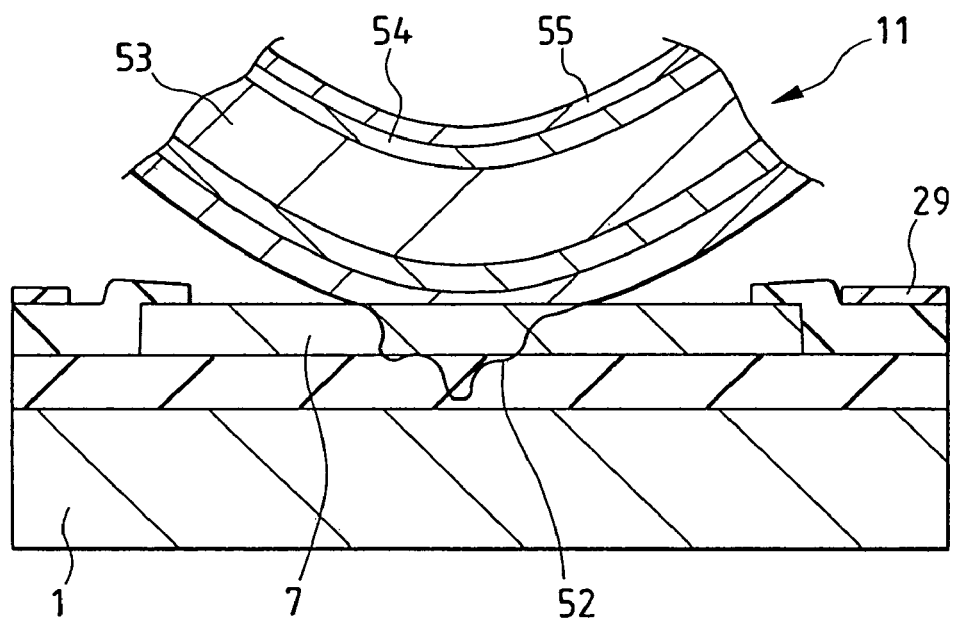
FIG. 57 is an enlarged cross sectional view illustrating a lead press contact portion, of a semiconductor integrated circuit device in the Embodiment 1 according to the present invention.
Figure 58:
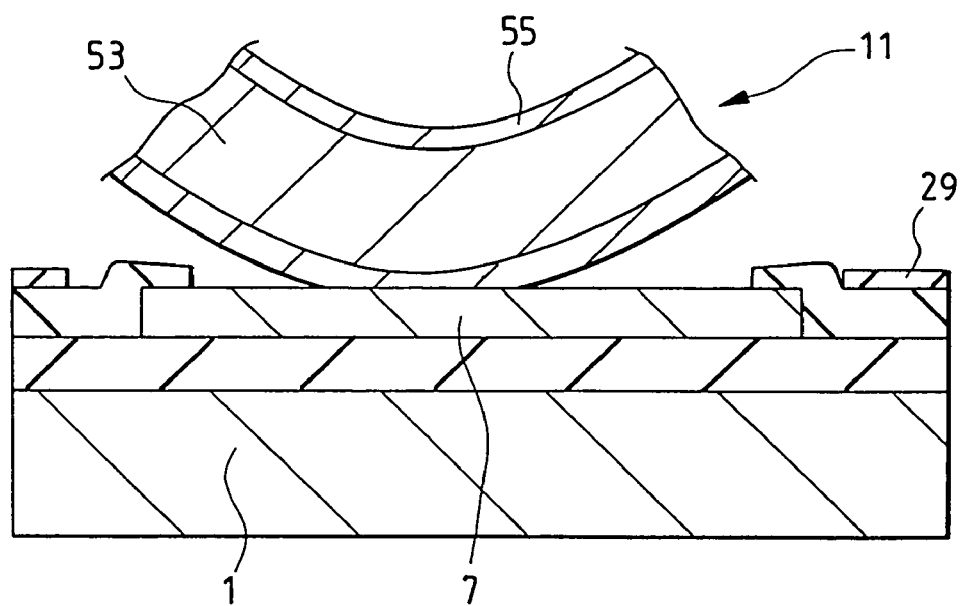
FIG. 58 is an enlarged cross sectional view illustrating a Ni-platingless lead press contact portion, of a semiconductor integrated circuit device in the Embodiment 1 according to the present invention.

To assist in providing a technical explanation of the Ni-platingless lead, FIG. 54 is a cross sectional view illustrating a connection portion of the lead, FIG. 55 is an enlarged cross sectional view illustrating a bent portion of a lead, FIG. 56 is an enlarged cross sectional view illustrating a bent portion of an Ni-platingless lead, FIG. 57 is an enlarged cross sectional view illustrating a press contact portion of a lead and FIG. 58 is an enlarged cross sectional view illustrating a press-contact portion of the Ni-platingless lead.

As an example, in the technique studied by the present inventor, in the case of a cross sectional structure of a lead 11 in which Ni-plating is applied to a surface of a Cu core and an Au plating is applied thereon, wherein a Cu core lead is employed instead of a pure Au lead, since the Ni-plating layer is hard and brittle, if it is intended to produce an S-shaped lead configuration, there is the possibility of causing a crack 51 to occur at the bent portion of the lead 11 as shown in FIG. 55, or the bonding pad 7 or a portion therebelow may be subjected to damage 52 as shown in FIG. 57. The Ni-plating is formed as a barrier layer for preventing Cu atoms from diffusing to the Au plating surface.

On the contrary, in the Embodiment 1, since both the hardness and the brittleness are reduced by using an Ni-platingless lead 11 in order to obtain the S-shaped configuration, the crack 51 is less likely to form the lead per se and, in addition, the damage 52 to the semiconductor chip 1 at the counter-bonding face can also be moderated.

That is, in the connection state of the lead 11 as shown in FIG. 54, in the lead having the constitution of a Cu core 53+Ni plating 54+Au plating 55, as shown in FIG. 55 as an enlargement of the portion A in FIG. 54, the crack 51 is liable to be caused as the radius of curvature in the bent portion is smaller. On the other hand, if the surface of the lead 11 is free from the Ni plating 54 and, for example, is formed only with the Au plating 55 as shown in FIG. 56, the crack 51 is less likely to form at the bent portion of the lead 11 even if the radius of curvature is identical with that in FIG. 55.

Further, also in a press-contact portion of the lead 11 in FIG. 57, illustrating an enlargement of the portion B in FIG. 54, the lead 11 has a constitution comprising: Cu core 53+Ni plating 54+Au plating 55, and so damage 52 is liable to be caused at the periphery of a bonding pad 7. On the other hand, if the surface of the lead 11 is free from the Ni plating 54 and, for example, is formed only with the Au plating 55 as shown in FIG. 58, the damage 52 is less likely even in a case of bonding under the same lead bonding condition.

As described above, it is possible to suppress the occurrence of a crack 51 in the lead 11 and moderate the damage 52 to the semiconductor chip 1 while obtaining the S-shaped configuration, by constituting the lead 11 such that only one plating layer, for example, an Au plating is formed on the core material of the Cu core 53.

Therefore, according to the semiconductor integrated circuit device in the Embodiment 1, excellent effects can be obtained as already explained by comparison with the package structure studied by the present inventor, in the CSP package technique of substantially the identical size with that of the semiconductor chip, in each of the technical items, namely: 1. Surface wiring structure, 2. Optimization of the tape edge position relative to the elastomer, 3. Optimization of outer size of the package, 4. Planar S-shaped lead, 5. Beam lead, 6. Peripheral PIQ size of bonding pad, 7. Improvement of anchor wiring, 8. Wide elastomer structure, 9. Elastomer groove-fillage technique, 10. Inner lead bonding technique, 11. Lead design technique capable of forming S-shaped configuration with no tool return and 12. NI-platingless lead.

In the Embodiment 1, although various explanations have been made with reference to the drawings and the contents of various techniques on the premise of a particular surface wiring structure, the technical items 2 to 12 are not limited to the described surface wiring structure, but the technique of this invention is applicable also to general package structures, such as a rear face wiring structure. Accordingly, it can be expected that the same effect as explained with reference to all of the items can be obtained when the invention is applied to a general package structure.

Figure 81:
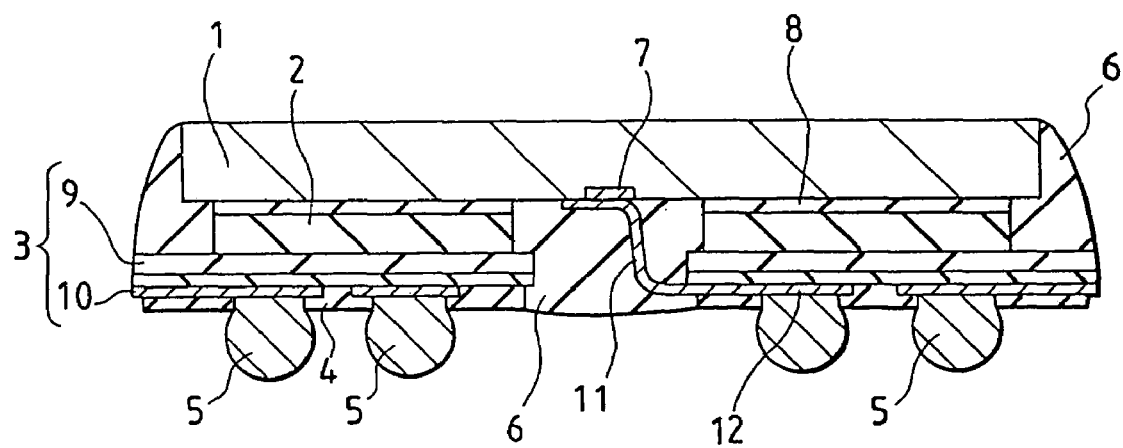
FIG. 81 is a cross sectional view illustrating a modified example of a package structure, of the semiconductor integrated circuit device in the Embodiment 1 according to the present invention.

The package structure of the Embodiment 1 (FIG. 1, FIG. 2) is shown for a case in which the elastomer 2 is larger than the outer shape of the semiconductor chip 1. In a case where the elastomer 2 is smaller than the outer shape of the semiconductor chip 1, as shown in FIG. 81, an improvement of the moisture proofness or the like can be obtained by forming a package structure in which the lateral sides of the semiconductor chip 1 and the elastomer 2 are covered with a sealant 6.

Embodiment 2

Figure 59:
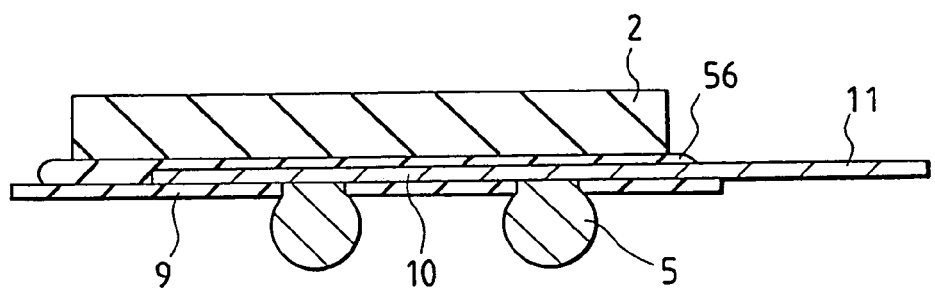
FIG. 59 is a cross sectional view illustrating a structure of a semiconductor integrated circuit device in an Embodiment 2 according to the present invention.
Figure 60:
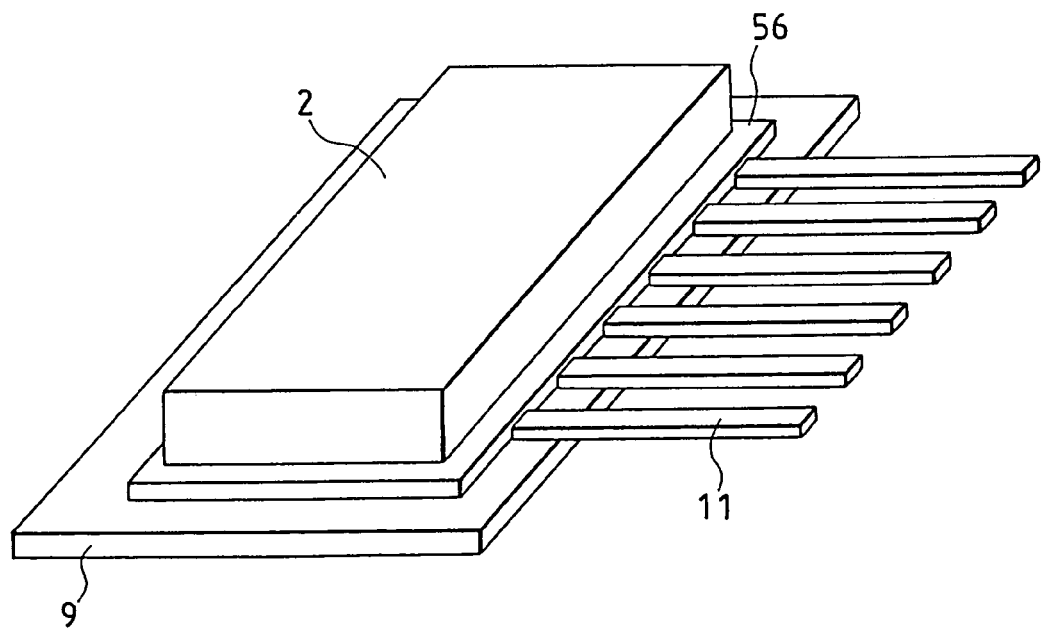
FIG. 60 is a perspective view illustrating a structure of a semiconductor integrated circuit device in the Embodiment 2 according to the present invention.

FIG. 59 and FIG. 60 are a cross sectional view and a perspective view, respectively, illustrating a rear face wiring solder resist structure in the semiconductor integrated circuit device of Embodiment 2 according to the present invention.

The semiconductor integrated circuit device of the Embodiment 2 is a ball grid array type semiconductor package like that of the Embodiment 1, but it is different from the Embodiment 1 in that it is not based on the surface wiring technique, but is based on and provided for improving a rear face wiring structure. For instance, as shown in FIG. 59 and FIG. 60, in a structure comprising an elastomer 2 (elastic structural material) bonded on a main surface of a semiconductor chip (not shown) and a flexible wiring substrate 3 (wiring substrate) bonded to a main surface of the elastomer 2, a solder resist 56 (insulation film) is formed on the rear face of the flexible wiring substrate 3.

That is, the flexible wiring substrate 3 comprises a tape 9 (substrate base material) serving as a base material for the flexible wiring substrate 3 and wirings 10 bonded to the rear face of the tape 9, in which the rear face of the wiring 10 is bonded by way of the solder resist 56 to the elastomer 2. The solder resist 56 is composed of an insulation material, such as a light sensitive epoxy resin like that in the Embodiment 1.

The feature of the package structure of the semiconductor integrated circuit device in the Embodiment 2 will be explained, including the structure and the process of manufacture in comparison with a package structure employing a technique studied by the present inventor.

For instance, in the rear face wiring structure shown in FIG. 7, in the Embodiment 1 as the technique studied by the present inventor, since the elastomer 2 is formed directly on the main surface of the wirings 10 of the flexible wiring substrate 3, low molecular weight ingredients of the elastomer 3 bleed directly to the lead 11 and if they bleed as far as the bonding point of the lead 11, there is a likelihood of extremely deteriorating the bondability (wire bonding stress) due to the contamination.

Further, compared with the direct plating surface of the lead 11, the surface of the tape 9 in which the wirings 10 are etched out between the leads 11 suffers from violent bleeding since the surface of the tape 9 is roughened also with an aim of improving the bondability between the tape 9 and the wirings 10, and bleeding tends to be most violent at the edge portion of the lead 11 together with the effect of the surface tension.

Further, in the rear face wiring structure in which the elastomer 2 is formed on an uneven surface of the wirings 10 caused by different levels between the portions with or without the wirings 10, voids are liable to be left, for example, in the gap between the wirings, which may cause a degrading of the reliability.

On the contrary, in the Embodiment 2, since the solder resist 56 is formed on the wirings 10 after forming the wirings 10 in the manufacturing step for the flexible wiring substrate 3, direct contact of the elastomer 2 with the wirings 10 can be prevented. In the same manner, contact of the elastomer 2 to the roughened surface of the tape 9 can also be prevented. This can suppress bleeding of the low molecular weight ingredients of the elastomer 2.

Further, by coating the solder resist 56 on the uneven surface of the wirings 10 of the flexible wiring substrate, the surface of the wirings 10 is flattened to avoid a disadvantage, such as the creation of voids upon forming the elastomer 2.

Accordingly, in the semiconductor integrated circuit device of the Embodiment 2, since the solder resist 56 is formed on the wirings 10 of the flexible wiring substrate 3 in the CSP semiconductor package technique based on the rear face wiring structure, it is possible to prevent the lowering of the bondability while preventing contamination to the lead 11, thereby providing a package structure of high reliability with no voids.

Embodiment 3

Figure 61:
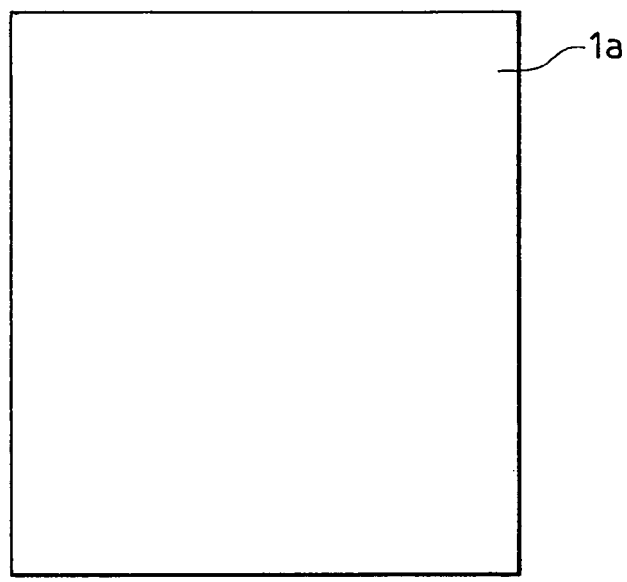
FIG. 61 is a plan view, as viewed from the rear face of a semiconductor chip, of a semiconductor integrated circuit device in the Embodiment 3 according to the present invention.
Figure 62:
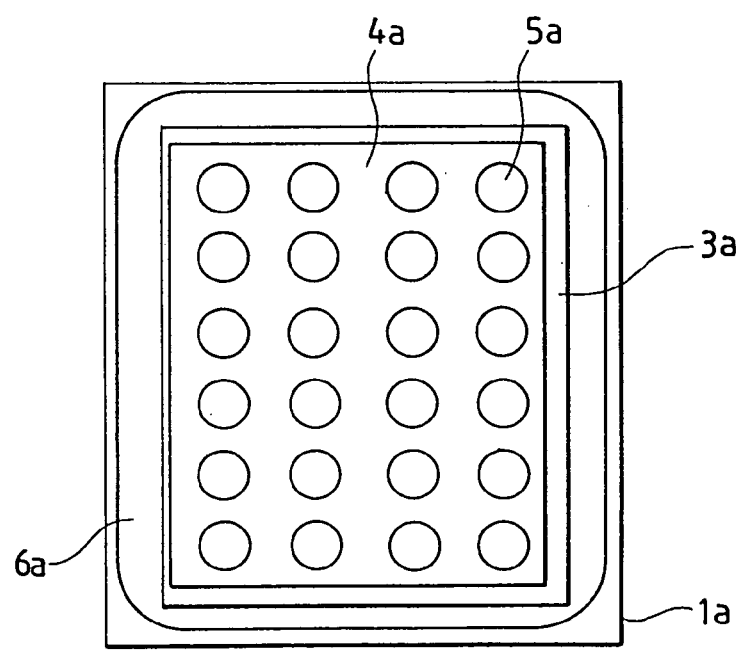
FIG. 62 is a plan view illustrating a semiconductor integrated circuit device in the Embodiment 3 according to the present invention.
Figure 63:
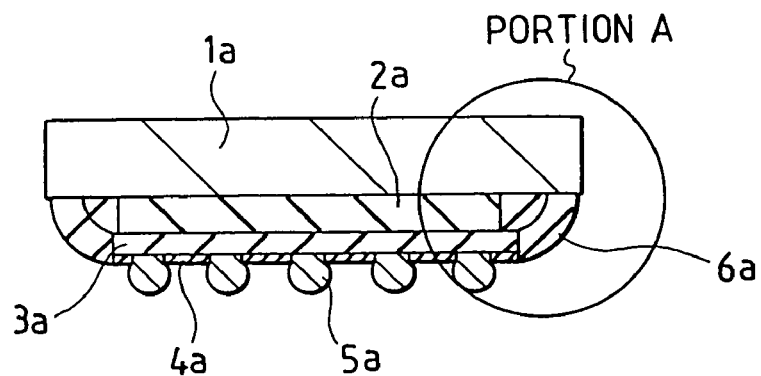
FIG. 63 is a cross sectional view illustrating a semiconductor integrated circuit device in the Embodiment 3 according to the present invention.
Figure 64:
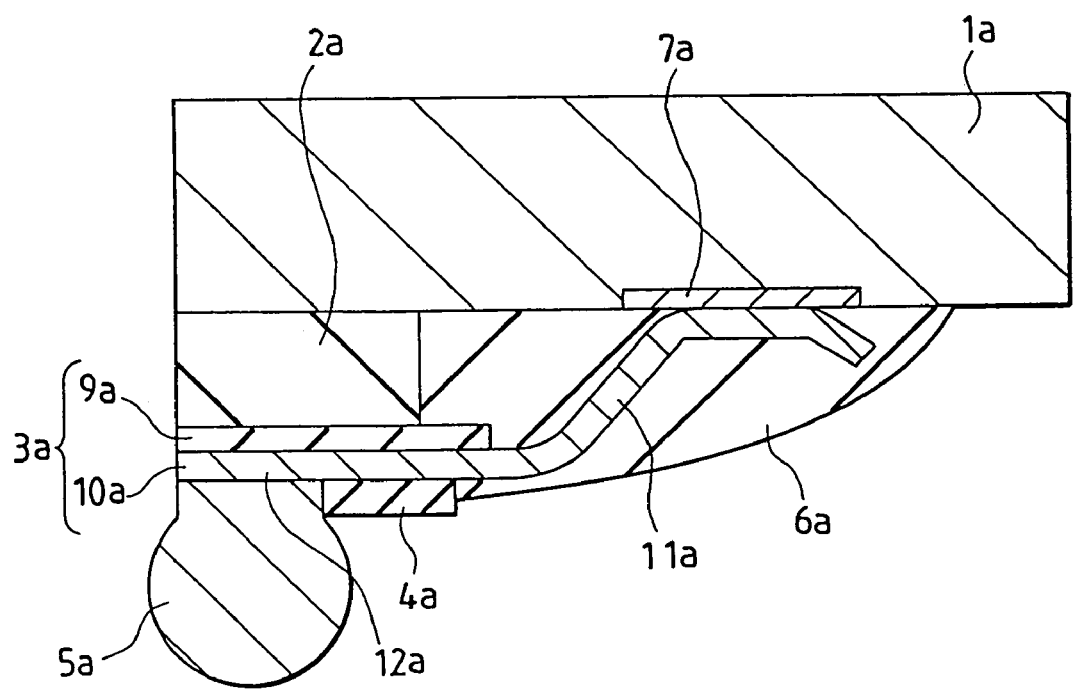
FIG. 64 is an enlarged cross sectional view illustrating a portion A in FIG. 63, of a semiconductor integrated circuit device in the Embodiment 3 according to the present invention.
Figure 65:
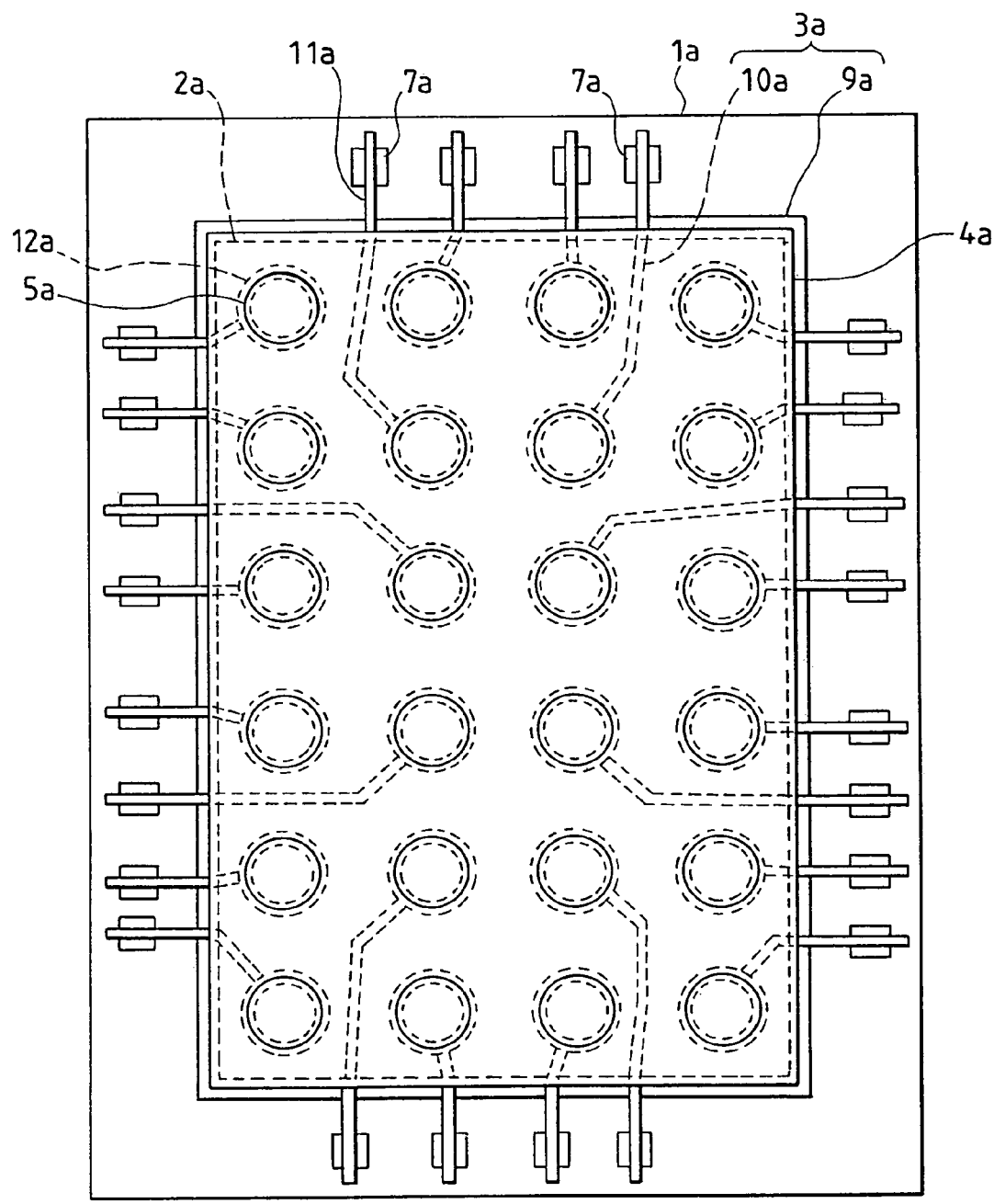
FIG. 65 is a plan view for explaining a wiring structure of a wiring substrate, of a semiconductor integrated circuit device in the Embodiment 3 according to the present invention.

FIG. 61 is a plan view of a semiconductor integrated circuit device forming an Embodiment 3 according to the present invention, as viewed from the rear face of a semiconductor chip, FIG. 62 is a plan view thereof, FIG. 63 is a cross sectional view thereof, FIG. 64 is an enlarged cross sectional view of a portion A in FIG. 63 and FIG. 65 is a plan view for explaining the wiring structure of the wiring substrate.

A semiconductor integrated circuit device in the Embodiment 3 adopts, instead of a semiconductor package having a structure in which the bonding pad is formed approximately at the center of the chip, as in the Embodiments 1 and 2 described above, a packaging structure using a semiconductor chip 1a in which a pad is formed to the periphery of the chip, as shown in FIG. 61 to FIG. 65, and in which bumps 5a connected to the bonding pads to the semiconductor chip 1a are disposed in a region inward of the outer circumference of the semiconductor chip 1a. The Embodiment 3 also has a structure which adopts the techniques from "1. Surface wiring structure" to "12. Ni-platingless lead" of Embodiment 1, as well as the technical features of each of the technical items for the rear face wiring solder resist structure as explained with reference to the Embodiment 2.

That is, the semiconductor integrated circuit device in the Embodiment 3 is, for example, a 24 pin ball grid array type semiconductor package structure, in which an elastomer 2a (elastic structural material), a flexible wiring substrate 3a (wiring substrate) having wirings 10a formed on a tape 9a and a solder resist 4a (insulation film) are disposed on a main surface of a semiconductor chip 1a formed with a plurality of bonding pads 7a (external terminals), solder bumps 5a (bump electrodes) are formed to an opening of the solder resist 4a, and a portion for forming the bonding pads 7a and lateral sides of the elastomer 2a and the flexible wiring substrate 3a are covered with a sealant 6a.

The semiconductor chip 1a has a peripheral pad structure, for example, as shown in FIG. 65, in which a plurality of bonding pads 7a are arranged in a square pattern along the outer circumference of the semiconductor chip 1a. Each bonding pad 7*a* of the semiconductor chip 1*a* is connected electrically with a solder bump 5*a* by way of the wiring 10*a* of the flexible wiring substrate 3*a*, which is connected at one end of the lead 11*a* to the pad 7*a* and joined at the bump land 12*a* at the other end of the wiring 10*a* to the bump 5*a*. The solder bumps 5*a* are arranged as a 6 row×4 column matrix in a region inward of the arrangement for the bonding pads 7*a*.

Accordingly, in the semiconductor integrated circuit device of the Embodiment 3, excellent effects can be obtained for each of the technical items as explained for the Embodiments 1 and 2, although there is a difference in the semiconductor package structure relating to the fan-in peripheral pads. Particularly, in the fan-in package structure, a CSP structure package about the same size as the semiconductor chip 1*a* can be attained similar to that in the Embodiments 1 and 2.

Embodiment 4

Figure 66:
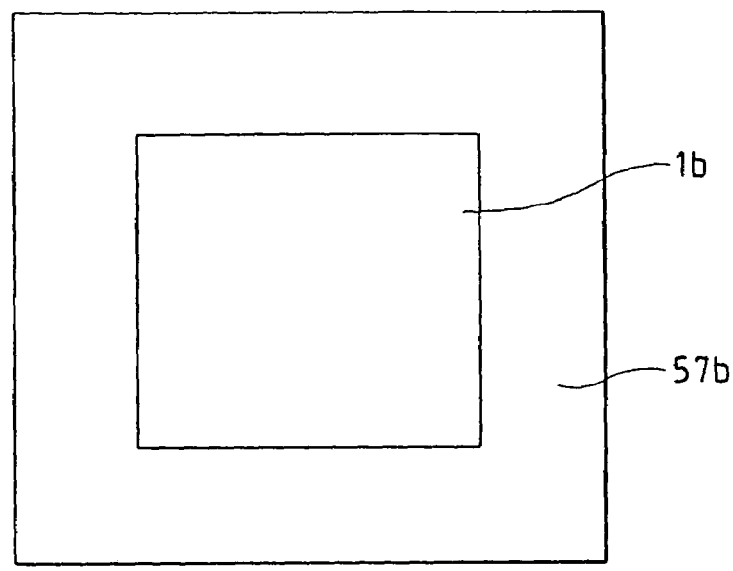
FIG. 66 is a plan view, as viewed from the rear face of a semiconductor chip, of a semiconductor integrated circuit device as an Embodiment 4 according to the present invention.
Figure 67:
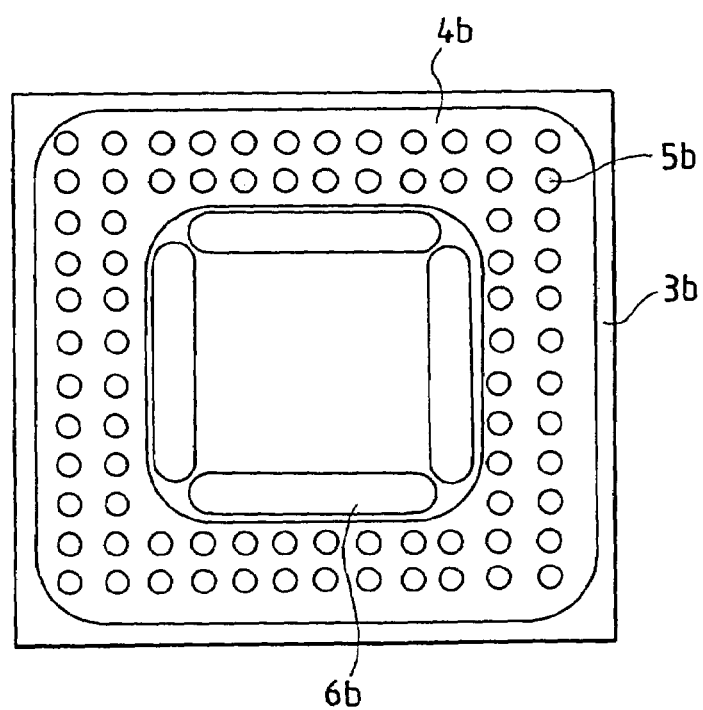
FIG. 67 is a plan view illustrating a semiconductor integrated circuit device in the Embodiment 4 according to the present invention.
Figure 68:
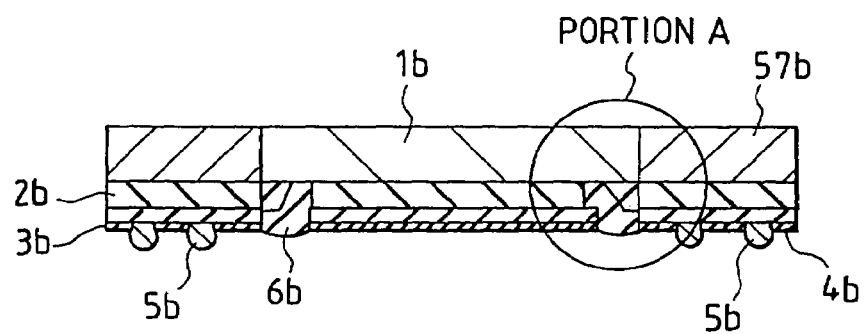
FIG. 68 is a cross sectional view illustrating a semiconductor integrated circuit device in the Embodiment 4 according to the present invention.
Figure 69:
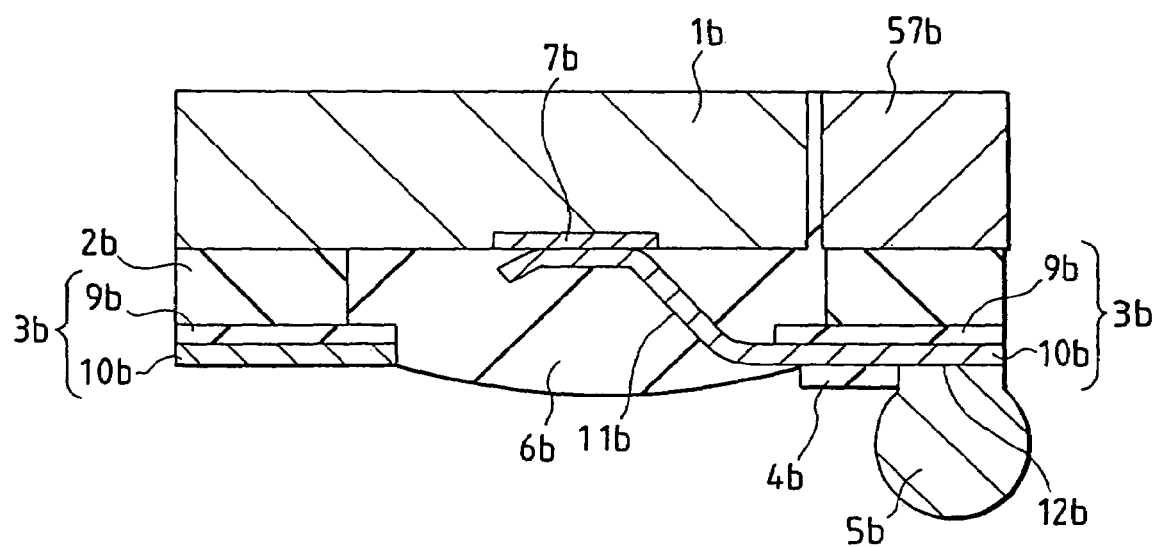
FIG. 69 is an enlarged cross sectional view illustrating a portion A in FIG. 68, of a semiconductor integrated circuit device in the Embodiment 4 according to the present invention.
Figure 70:
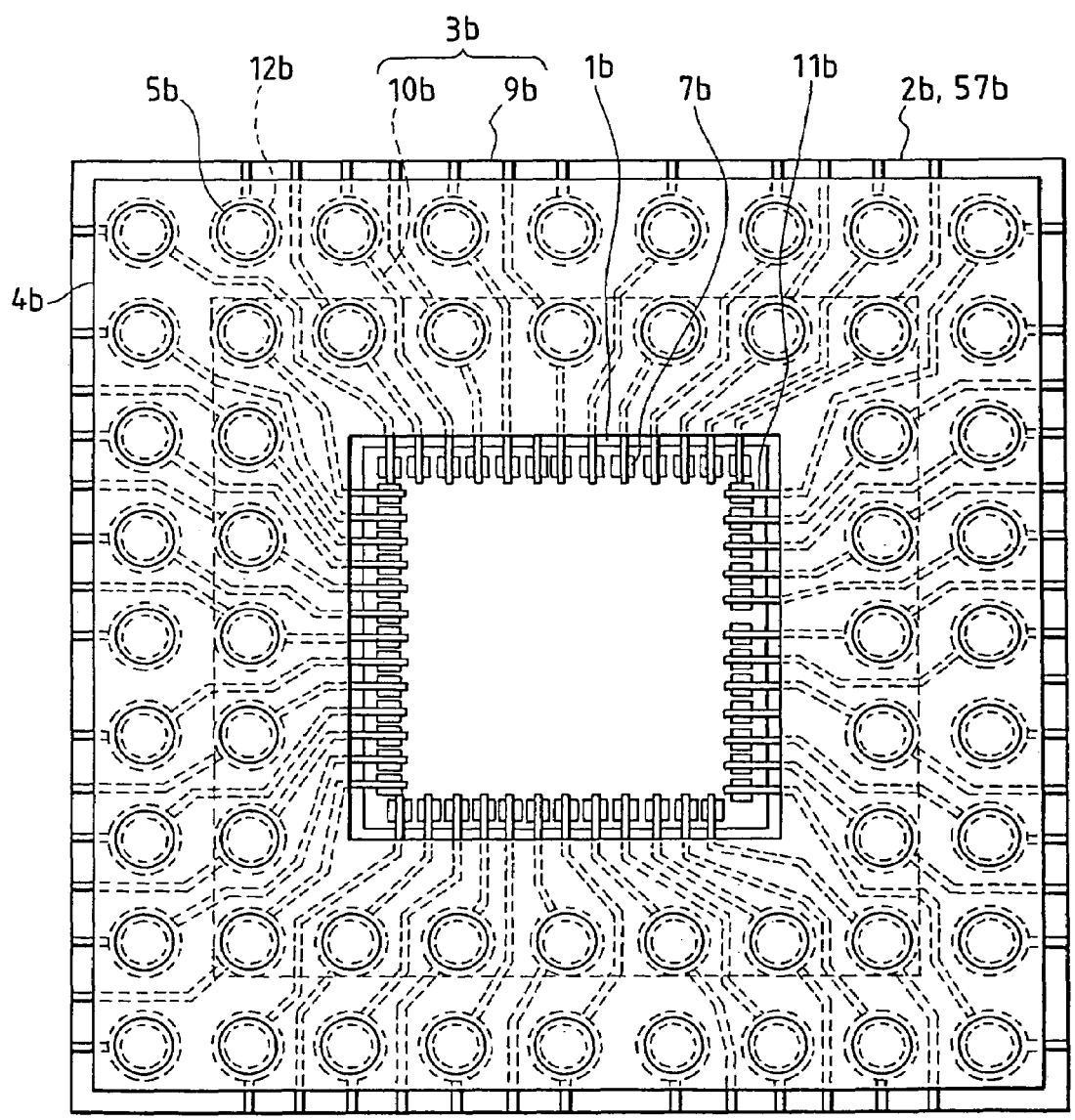
FIG. 70 is a plan view for explaining a wiring structure of a wiring substrate, of a semiconductor integrated circuit device in the Embodiment 4 according to the present invention.

FIG. 66 is a plan view of a semiconductor integrated circuit device forming an Embodiment 4 of the present invention as viewed from the rear face of the semiconductor chip, FIG. 67 is a plan view thereof, FIG. 68 is a cross sectional view thereof, FIG. 69 is an enlarged cross sectional view illustrating a portion A in FIG. 68 and FIG. 70 is a plan view for explaining the wiring structure of a wiring substrate.

The semiconductor integrated circuit device of the Embodiment 4 adopts, instead of a semiconductor package having a structure in which the bump electrodes are disposed in the chip area as in the Embodiments 1 and 2, a package structure using a semiconductor chip 1*b* of a peripheral pad structure as shown in FIG. 66 to FIG. 70, in which bumps 5*b* connected to the bonding pads of the semiconductor chip 1*b* are disposed to a region outward of the outer circumference of the semiconductor chip 1*b*. This Embodiment 4 also has a structure for adopting the technique from "1. Surface wiring structure" to "12. Ni-platingless lead", as explained for the Embodiment 1, as well as the features for each of the technical items of the rear face wiring solder resist structure explained for the Embodiment 2, respectively.

That is, the semiconductor integrated circuit device of the Embodiment 4 has, for example, a 80 pin ball grid array type semiconductor type package structure in which an elastomer 2*b* (elastic structural material), a flexible wiring substrate 3*b* (wiring substrate) having wirings 10*b* formed on a tape 9*b*, and a solder resist 4*b* (insulation film) are disposed on a main surface of a semiconductor chip 1*b* formed with a plurality of bonding pads 7*b* (external terminals), solder bumps 5*b* (bump electrodes) are formed to an opening portion of the solder resist 4*b*, portions for forming bonding pads 7*b* are covered with the sealant 6*b*, and a support ring 57*b* is disposed to the lateral side of the semiconductor chip 1*b* to constitute a package structure.

The semiconductor chip 1*b* has a peripheral pad structure, for example, as shown in FIG. 70, and a plurality of bonding pads 7*b* are arranged in a square pattern along the outer circumference of the semiconductor chip 1*b*. Each bonding pad 7*b* of the semiconductor chip 1*b* is connected electrically with a solder bump 5*b* by way of the wiring 10*b* of the flexible wiring substrate 3*b*, which is connected at one end of the lead 11*b* with the pad 7*b* and joined at the bump land 12*b* at the other end with the bump 5*b*. The solder bumps 5*b* are arranged in two rows in a square pattern concentric to the arrangement of the bonding pads 7*b* of the semiconductor chip 1*b*.

Accordingly, the semiconductor integrated circuit device of the embodiment 4 can also provide excellent effects for each of the technical items as explained for the Embodiments 1 and 2, although having a different semiconductor package structure of fan-out peripheral pad configuration. Particularly, the fan-out package structure can provide a package structure corresponding to multi-pin arrangements, although the size of the semiconductor package is increased compared with the Embodiments 1 and 2.

Embodiment 5

Figure 71:
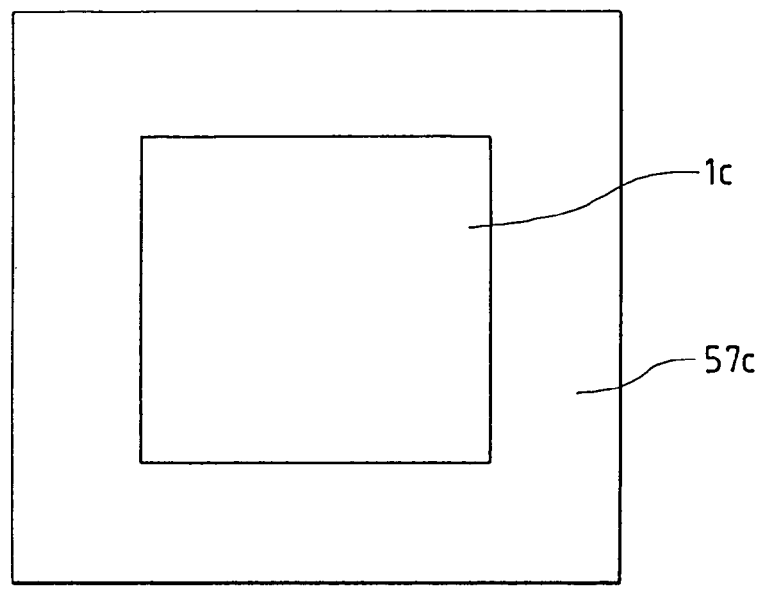
FIG. 71 is a plan view, as viewed from the rear face of a semiconductor chip, of a semiconductor integrated circuit device in the Embodiment 5 according to the present invention.
Figure 72:
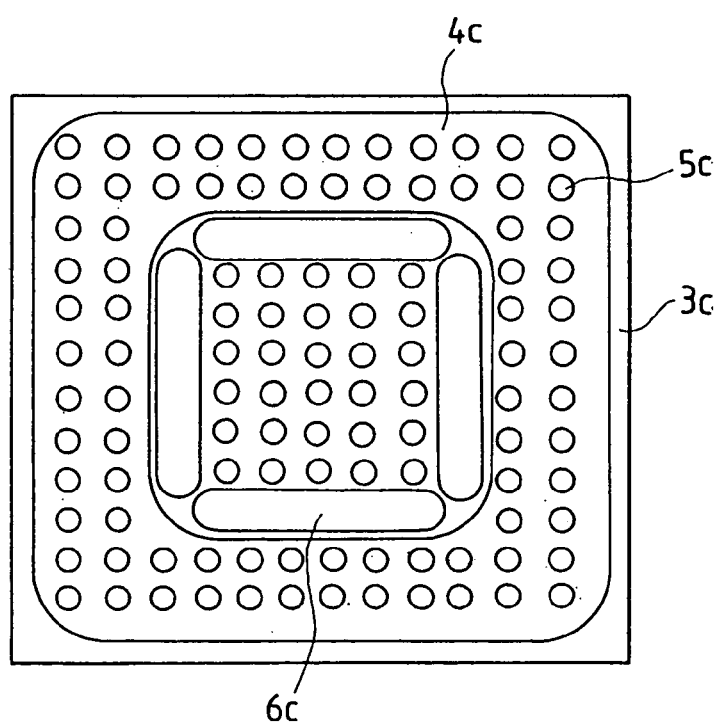
FIG. 72 is a plan view illustrating a semiconductor integrated circuit device in the Embodiment 5 according to the present invention.
Figure 73:
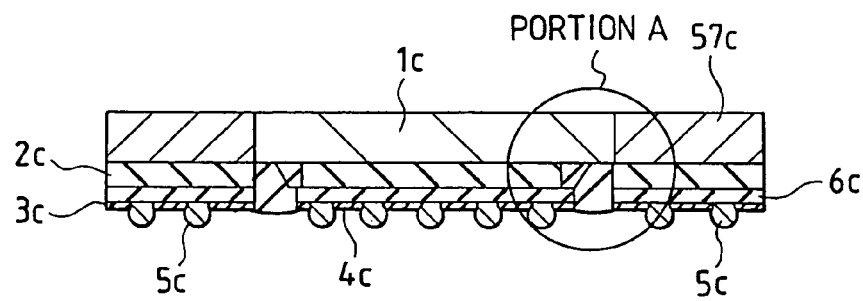
FIG. 73 is a cross sectional view illustrating a semiconductor integrated circuit device in the Embodiment 5 according to the present invention.
Figure 74:
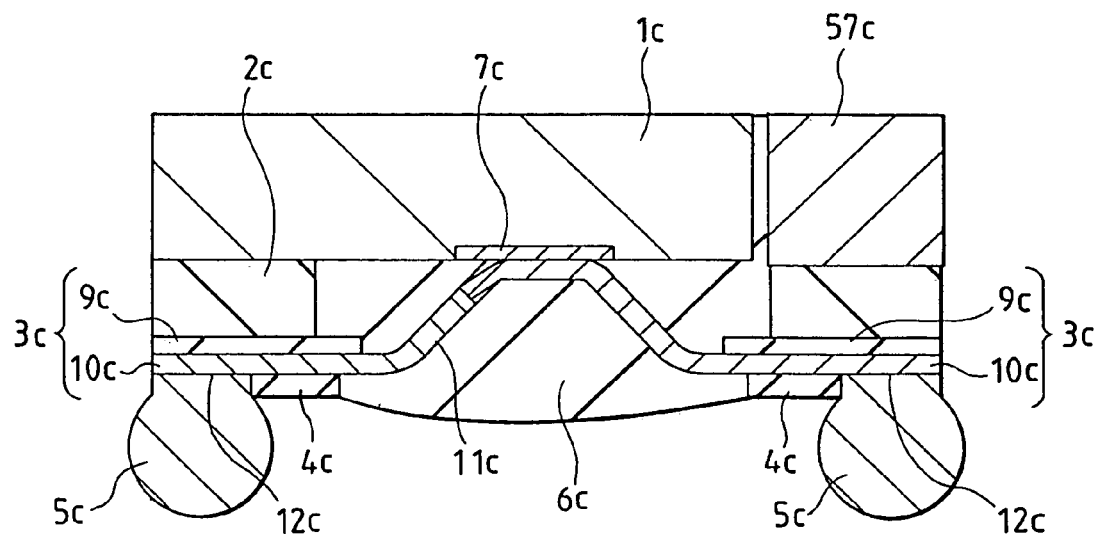
FIG. 74 is an enlarged cross sectional view illustrating a portion A in FIG. 73, of a semiconductor integrated circuit device in the Embodiment 5 according to the present invention.
Figure 75:
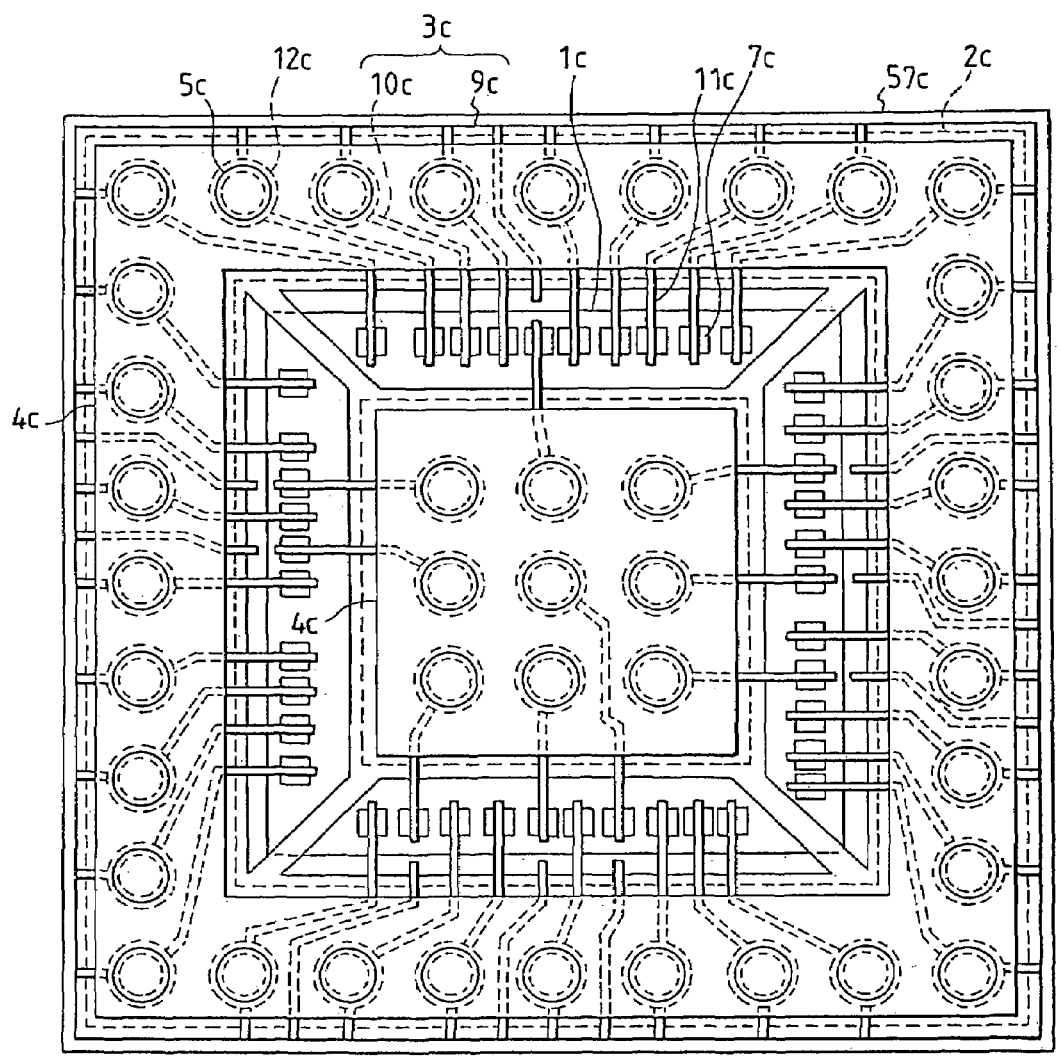
FIG. 75 is a plan view for explaining a wiring structure of a wiring substrate, of a semiconductor integrated circuit device in the Embodiment 5 according to the present invention.
Figure 76:
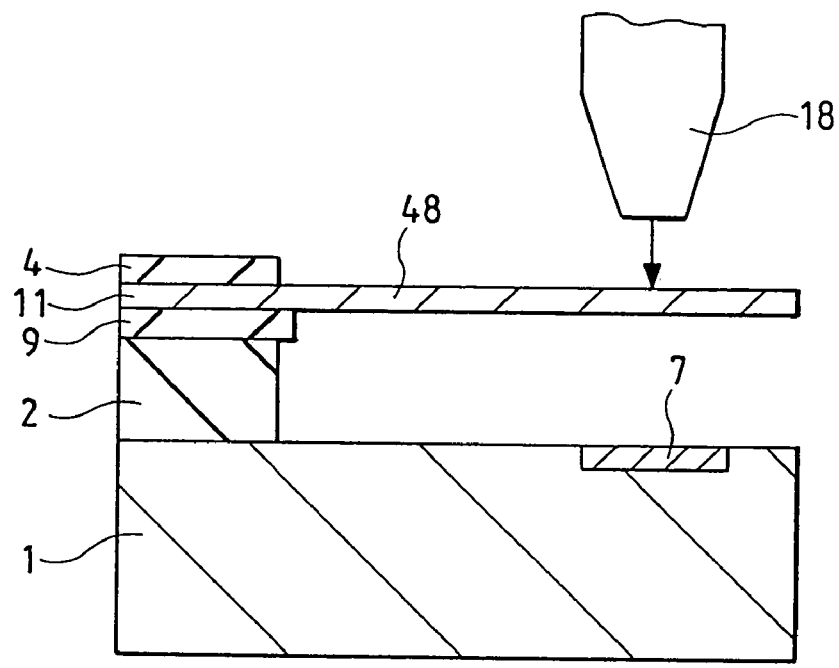
FIG. 76 is a cross sectional view illustrating the modified shape of the lead in accordance with the bending stress ratio in a comparative explanation between the semiconductor integrated circuit device in the Embodiment 1 according to the present invention and the semiconductor circuit device studied by the present inventors.

FIG. 71 is a plan view of a semiconductor integrated circuit device forming an Embodiment 5 of the present invention as viewed from the rear face of the semiconductor chip, FIG. 72 is a plan view thereof, FIG. 73 is a cross sectional view thereof, FIG. 74 is an enlarged cross sectional view illustrating a portion A in FIG. 73 and FIG. 75 is a plan view for explaining the wiring structure of a wiring substrate. In FIG. 75, a portion, such as a number of the bonding pads and solder bumps, is omitted for simplification in order to make the arrangement of the wirings clearer.

The semiconductor integrated circuit device of the Embodiment 5 adopts, instead of a semiconductor package having a structure in which bump electrodes are disposed in the area of the chip as in the Embodiments 1 and 2, a package structure using a peripheral pad structure semiconductor chip 1*c* as shown in FIG. 71 to FIG. 75, in which solder bumps 5*c* connected to the bonding pads of the semiconductor chip 1*c* are disposed both in inner and outer regions of the semiconductor chip 1*c*. This Embodiment 5 also has a structure adopting the technique from "1. Surface wiring structure" to "12. Ni-platingless lead" as explained for the Embodiment 1, as well as features for each of the technical items of the rear face wiring solder resist structure, as explained for the Embodiment 2.

That is, the semiconductor integrated circuit device in the Embodiment 5 is, for example, a 110 pin ball grid array type semiconductor package structure in which an elastomer 2*c* (elastic structural material), a flexible wiring substrate 3*c* (wiring substrate) having wirings 10*c* formed on a tape 9*c*, and a solder resist 4*c* (insulation film) on a main surface of a semiconductor chip 1*c* formed with a plurality of bonding pads 7*c* (external terminals), solder bumps 5*c* (bump electrodes) are formed to an opening portion of the solder resist 4*c*, a portion of forming the bonding pads 7*c* is covered with a sealant 6*c* and a support ring 57*c* is disposed to the lateral sides of the semiconductor chip 1*c*.

The semiconductor chip 1*c* has a peripheral pad structure, for example, as shown in FIG. 75 (actual arrangement in FIG. 72) in which a plurality of bonding pads 7*c* are arranged in a square pattern along the outer circumference of the semiconductor chip 1*c*. Each bonding pad 7*c* of the semiconductor chip 1*c* is electrically connected to a solder bump 5*c* by way of the wiring 10*c* of the flexible wiring substrate 3*c* that is connected by a lead 11*c* at one end to the pad 7*c* and joined to the bump 5*c* at the bump land 12*c* at the other end of the wiring 10*c*. The solder bumps 5*c* are arranged as 6 row×5 column array in a region inward of the arrangement of the bonding pads 7*c* of the semiconductor chip 1*c*, and are arranged in two rows in a square pattern also in the outer region.

Accordingly, the semiconductor integrated circuit device of the Embodiment 5 can also obtain the same excellent effect in each of the technical items as explained for the Embodiments 1 and 2, although there is a difference in the semiconductor package structure. Particularly, in the fan-in/out package structure, a package structure capable of coping with multi-pin arrangements can be adopted, although the size of the semiconductor package is enlarged compared with the Embodiments 1 and 2.

Embodiment 6

Figure 82:
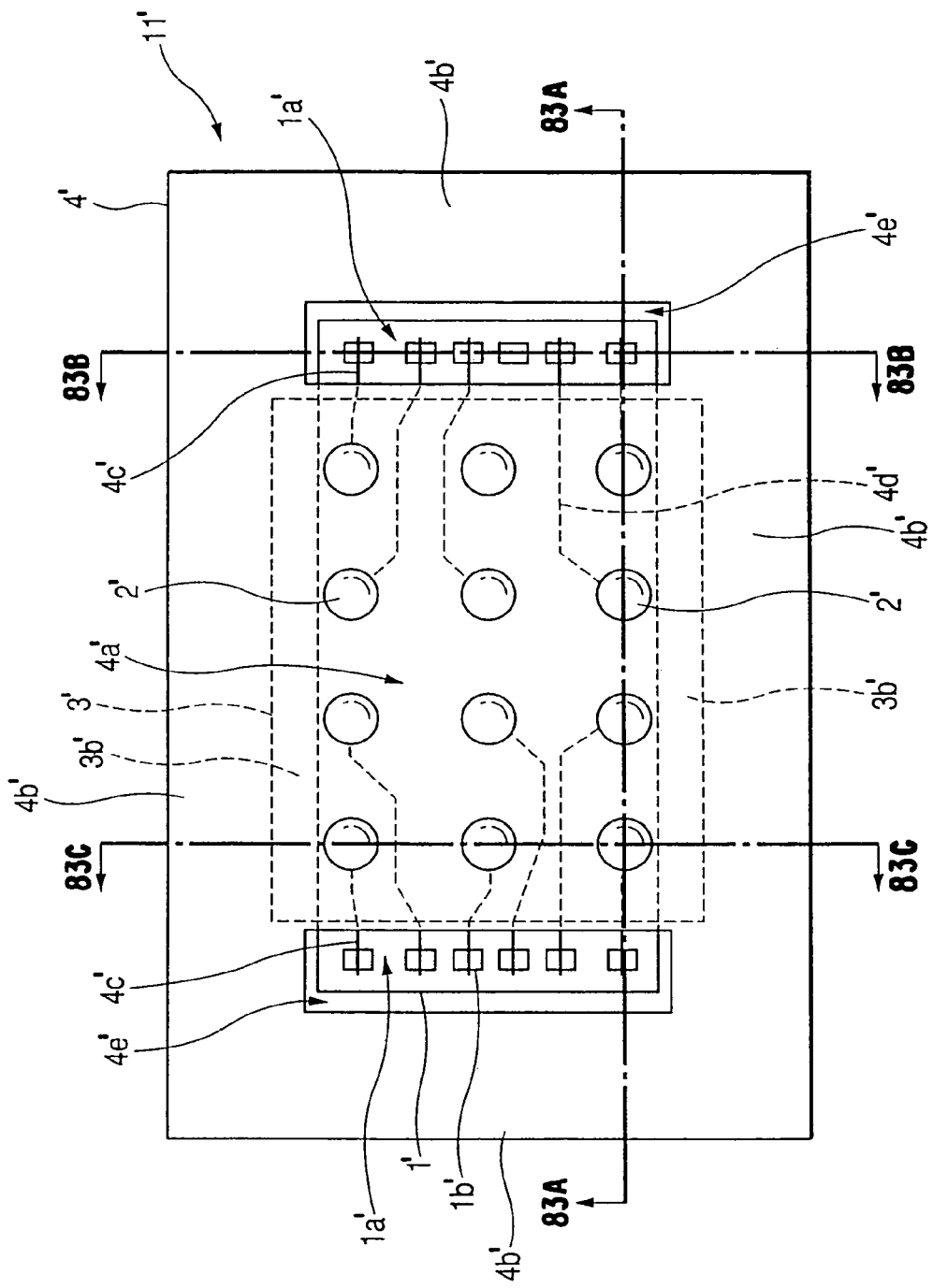
FIG. 82 is a plan view through the sealing parts of a typical structure of a semiconductor device (CSP) according to an Embodiment 6 of the present invention.

This embodiment is described in connection with FIGS. 82-94 and 108 of the drawings. A semiconductor device (CSP11') according to the first embodiment shown by FIG. 82 and FIG. 83 is a small structure whereof the package size is near the chip size. It comprises a semiconductor chip 1' having a main surface 1a' and an electrode pad (connection terminal or bonding pad) 1b' formed on the outer peripheral part of the main surface 1a', and bump electrodes 2' which are external terminals arranged on the inside of the semiconductor chip 1'. This structure, wherein a pad is formed on the periphery of the chip and bump electrodes are arranged inside the chip, will hereafter be referred to as a peripheral pad fan-in CSP.

As the external terminals are bump electrodes, the CSP11 is also a pole grid array.

Describing the structure of this CSP11', it comprises an elastomer 3' (elastic structure) arranged on the main surface 1a' of the semiconductor chip 1' so as to leave electrode pads 1b' exposed, a thin film wiring substrate 4' comprising a substrate main body 4a' provided with wiring 4d' of which one end is electrically connected to the electrode pads 1b' of the semiconductor chip 1' via leads 4c' and the other ends are electrically connected to the bump electrodes 2', openings 4e' for exposing the electrode pads 1b', and substrate protruding parts 4b' which protrude beyond these openings 4e' and the semiconductor chip 1', and sealing parts 5' which seal the electrode pads 1b' of the semiconductor chip 1' and seal the leads 4c' of the thin film wiring substrate 4', the substrate body 4a' and the substrate protruding parts 4b' of the thin film wiring substrate 4' being formed in a one-piece construction. (For the purpose of this invention, "wiring" shall be understood to mean parts formed on the tape, and "leads" shall be understood to mean parts protruding from the tape including the wiring.)

The plan view of the CSP11' shown in FIG. 82 is a view through the seal part 5' shown in FIG. 83 in order to show the electrode pads 1b' of the semiconductor chip 1' and the leads 4c' of the thin film wiring substrate 4'.

Therefore, in the plan view of the CSP11' shown in FIG. 82, the aforesaid sealing parts 5 are omitted, although the sealing parts 5' shown in FIG. 83 are actually formed in the openings 4e' of the thin film wiring substrate 4' of the CSP11' shown in FIG. 82 (this is also the case hereafter for Embodiments 7 to 25).

In this Embodiment 6, plural electrode pads 1b' (herein, six at one side) are disposed on the periphery of each of the two short sides at right angles (hereinafter referred to as the short side direction) to the longitudinal direction of the main surface 1a' of the rectangular semiconductor chip 1', and twelve bump electrodes 2' which are external terminals are therefore disposed in a grid shape covering a plan view area over the main surface of the semiconductor chip 1'.

Therefore, one each of the rectangular openings 4e' is formed at a position corresponding to an outer edge facing the short side direction of the main surface of the semiconductor chip 1' in the thin film wiring substrate 4'.

As a result, the plural electrode pads 1b' facing the short side direction of the semiconductor chip 1' are exposed by the openings 4e' of the thin film wiring substrate 4' which are provided at corresponding positions when the semiconductor chip 1' is attached to the elastomer 3'.

The thin film wiring substrate 4' of the CSP11' according to the first embodiment comprises a substrate body part 4a' comprising wiring 4d', two of the openings 4e', and substrate protruding parts 4b' which protrude beyond the substrate body 4a' and two openings 4e'.

When the semiconductor chip 1' is attached to the elastomer 3', the substrate body 4a', elastomer 3' and semiconductor chip 1' are laminated together, and the substrate protruding parts 4b' of the thin film wiring substrate 4' then protrude in an anvil shape beyond the semiconductor chip 1'.

Figure 89A:
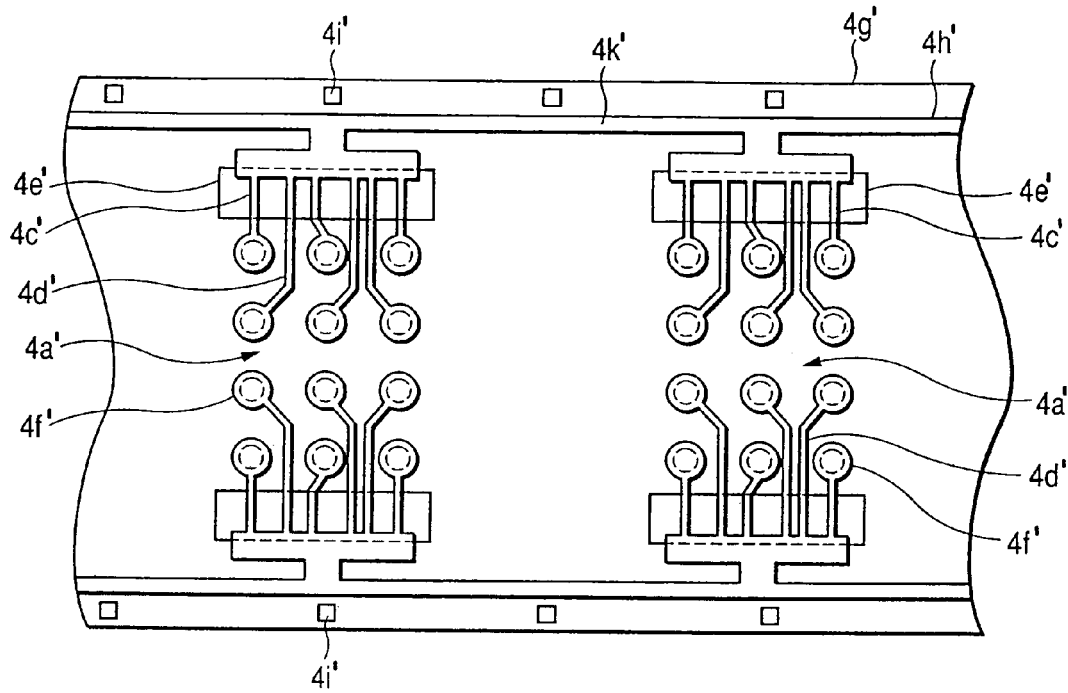
FIGS. 89(a), 89(b) are partial plan views showing a typical method of manufacturing a thin film wiring substrate used for a semiconductor device (CSP) according to Embodiment 6 of the present invention.

Twelve bump lands 4f (FIG. 89(a)) which are electrically connected to the wiring 4d' and on which the bump electrodes 2' are mounted, are provided in the substrate body 4a'.

The elastomer 3' is an insulating elastic material which supports the semiconductor chip 1', and is arranged between the thin film wiring substrate 4' and semiconductor chip 1'. The elastomer 3' according to the first embodiment comprises protruding parts 3b' (elastic protruding parts) which protrude beyond the semiconductor chip 1'. After assembling the CSP11', predetermined side faces 3a' of the elastomer 3' (herein, the two side faces 3a' in the same direction as the longitudinal direction of the semiconductor chip 1') are exposed to the outside.

Figure 83A:
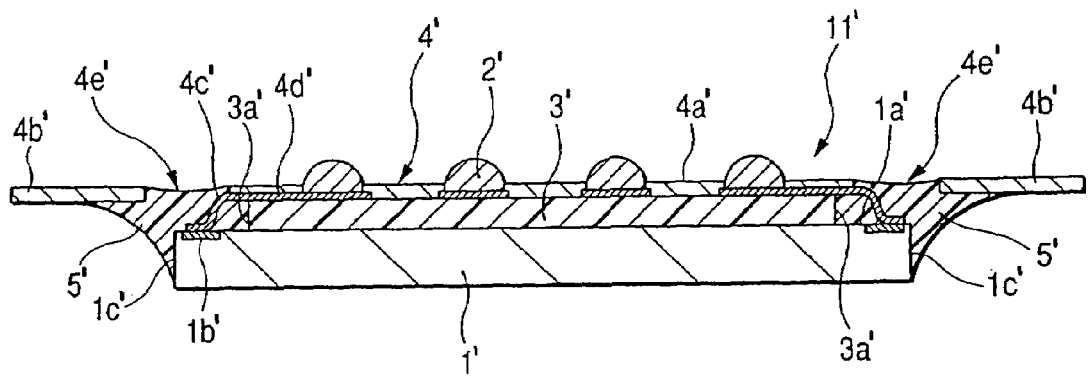
Figure 83B:
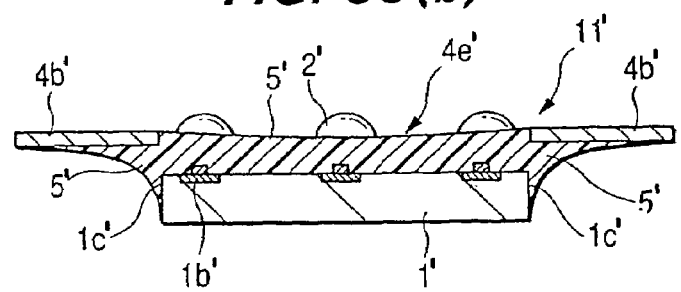
Figure 83C:
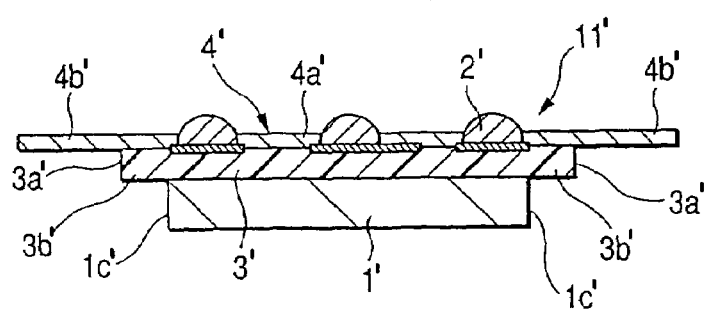

As shown in FIG. 82 or FIG. 83(c), when the elastomer 3' is attached to the thin film wiring substrate 4', the elastomer protruding parts 3b' which protrude beyond the semiconductor chip 1' in the elastomer 3' are laid over the substrate protruding parts 4b' of the thin film wiring substrate 4'.

The sealing parts 5' are formed by sealing the electrode pads 1b' of the semiconductor chip 1' and the leads 4c' connected to them, the whole of the opposite side faces 1c' in the short side direction of the semiconductor chip 1', and the area near both ends of the two opposite side faces 1c' in the longitudinal direction of the semiconductor chip 1' with sealing resin. As the substrate protruding parts 4b' of the thin film wiring substrate 4' are formed in the vicinity of the semiconductor chip 1', the sealing resin forms a bridge between (straddles) the substrate protruding parts 4b' and the semiconductor chip 1' in the sealing parts 5'.

The specification of each part of the CSP11' (materials, dimensions and thickness, etc.) will now be described referring to FIG. 84 (a, b, c, d). It should, however, be understood that these specifications are only given as examples, and the invention is not to be construed as being limited in any way by them.

The tape which is the base material of the thin film wiring substrate 4' is formed of polyimide resin, and its thickness is of the order of 25 to 75 μm. The wiring 4d' (comprising the leads 4c' and bump lands 4f) provided in the thin film wiring substrate 4' is copper foil having a thickness of the order of 18 to 25 μm. The wiring 4d' is plated with Au plating to a thickness of 1.5 μm on both sides, or Au/Ni plating of different thickness on the side of the electrode pad 1b and the side of the bump electrode 2'.

In the thin film wiring substrate 4' used in the sixth embodiment, the wiring 4d' is a single layer structure as shown in FIG. 83(a). It is also "single layer back wiring" wherein the wiring 4D' is formed only on the under surface of the tape base material (tape base material 4g' in FIG. 87(a)).

The elastomer 3' is a three-layer structure (FIG. 128) comprising a base layer (skeleton layer 3d', referred to also as core layer) having adhesive layers 3e' on both sides. Examples of its application are specification (1) and specification (2) shown in FIG. 84 (a, b, c, d). Details of specification (1) are given in Japanese Patent Application No. Hei 9-149106 and details of specification (2) are given in Japanese Patent Application No. Hei 8-136159.

The elastomer 3' used in the first embodiment is also colorless, therefore the elastomer 3' according to the first embodiment is an effectively transparent structure which transmits light.

From the viewpoints of porosity and water repelling properties, it is also desirable that the base layer (skeleton layer 3d') of the elastomer 3' is formed of a porous fluoride resin, i.e. it is desirable to use the elastomer of specification (1).

Herein, the elastomer 3' formed from a porous fluoride resin comprises a skeleton layer 3d' having a 3-dimensional mesh structure.

This 3-dimensional mesh structure is a non-woven fabric formed by 3-dimensional entwining of a fibrous compound.

The sealing resin, which is the sealing material for forming the sealing parts 5, has the specification (1) or the specification (2) shown in FIG. 84 (a, b, c, d).

During cure bake after sealing, voids tend to form in the solvent type liquid resin when the solvent vaporizes, and it is therefore desirable to use the resin of specification (1).

The sealing resin used in the CSP11' of the first embodiment is a material of relatively high volatility. However, it is possible to use sealing resin of high volatility by increasing the displacement time of a potting nozzle, not shown, during the coating step (e.g. approximately 30 seconds for coating the six electrode pads 1b' on one side of the semiconductor chip 1'), or by heating the sealing resin, and it is thus possible to form a bridge of sealing resin between the substrate protruding parts 4b and semiconductor chip 1'.

It is also preferable to use a resin containing silica to reduce residual stress due to contraction during seal cure, and more preferable to use a resin containing at least 50 weight percent silica.

The material of the bump electrode 2' is Sn/Pb eutectic solder or other high melting point solder, or Au-plated Ni or the like, and its diameter is of the order of 0.3-0.6 mm.

The CSP11'(semiconductor device) of the first embodiment offers the following advantages.

The substrate body 4a' and substrate protruding parts 4b' of the thin film wiring substrate 4' are formed in a one-piece construction. As the substrate protruding parts 4b' are not a separate structure from the substrate body 4a', it is not necessary to form the substrate protruding parts 4b' from costly materials.

Therefore, the cost of manufacturing the CSP11' (semiconductor device) is reduced.

As the substrate protruding parts 4b' protrude beyond the openings 4e' in the thin film wiring substrate 4', the sealing parts 5' may be formed as a bridge between the substrate protruding parts 4b' and the semiconductor chip 1' when the sealing resin is applied via the openings 4e'.

As a stable seal is obtained sealing properties are improved and, as a result, humidity resistance is more reliable.

The sealing resin contains at least 50 weight percent silica, so residual stress due to contraction in cure bake can be reduced. Therefore, the reliability of the sealing parts 5 is improved.

The base layer of the elastomer 3' which forms the elastic structure is constructed of a porous fluoride resin, and the two opposite side faces 3a of the elastomer 3' in the same direction as the longitudinal direction of the semiconductor chip 1' are exposed to the outside. Therefore, water vapor due to moisture absorbed during reflow can be released to the outside, reflow properties are improved, and entry of water into the CSP11' can be prevented by the water repelling properties of the fluoride in the porous fluoride resin. As a result, degradation of electrical properties of the CSP11' is reduced.

Next, the method of manufacturing the CSP11' (semiconductor device) of the first embodiment will be described together with the advantages gained therefrom.

The method will be described in the sequence shown in FIG. 104 referring to the process conditions shown in FIG. 5.

The elastomer 3' shown in FIG. 90, FIG. 91, FIG. 93 and FIG. 94 comprises openings 3c. These figures describe the method of manufacturing the CSP16', 17' of the Embodiments 11 or 12 to be described later, but since the Embodiment 6 is the same as regards the basic manufacturing method, FIG. 90, FIG. 91, FIG. 93 and FIG. 94 will be used also in the Embodiment 6.

First, the thin film wiring substrate 4' comprising the substrate body 4a' comprising the wiring 4d', and the substrate protruding parts 4b' which protrude beyond the openings 4e' in which the leads 4c' are connected to the wiring 4d', is provided.

The method of manufacturing the thin film wiring substrate 4' will be described referring to FIG. 87 to FIG. 89.

Figure 87A:
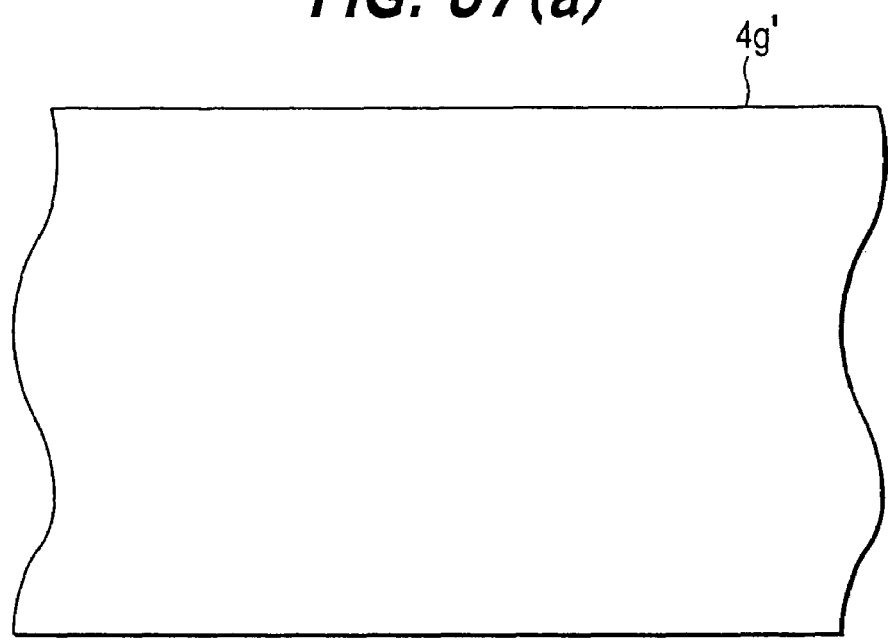
FIGS. 87(a), 87(b) are partial plan views showing a typical method of manufacturing a thin film wiring substrate used for a semiconductor device (CSP) according to Embodiment 6 of the present invention.

First, the tape base material 4g' comprising the polyimide resin shown in FIG. 87(a) is prepared. An adhesive for attaching the copper foil 4h' shown in FIG. 88(b) is coated on the top and under surfaces of this base tape 4g'.

Figure 87B:
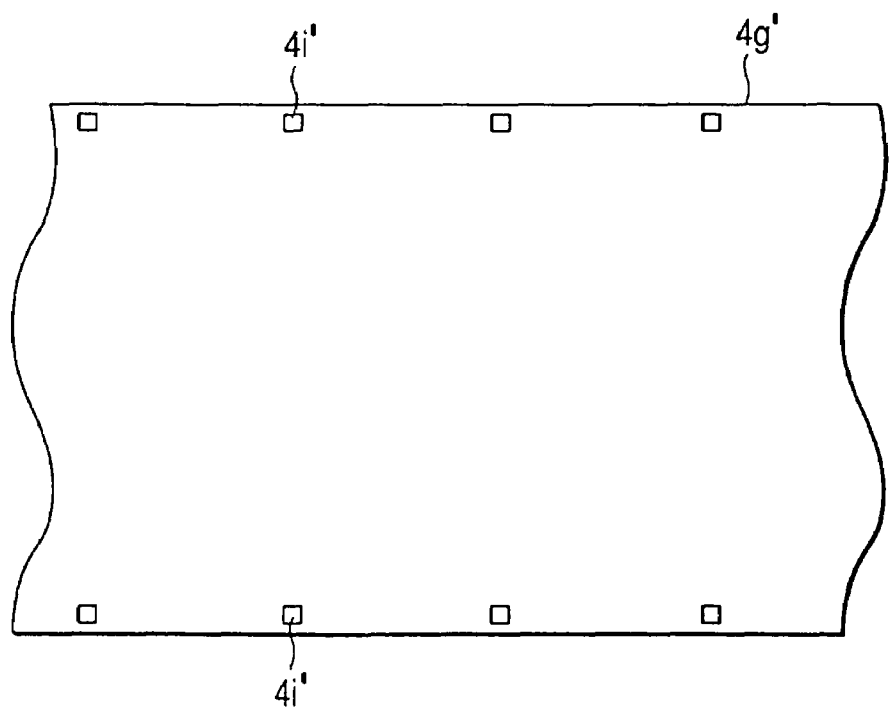

Next, preparing holes 4i' for tape feed are formed at an approximately equal interval on both sides of the tape base material 4g' as shown in FIG. 87(b).

Figure 88A:
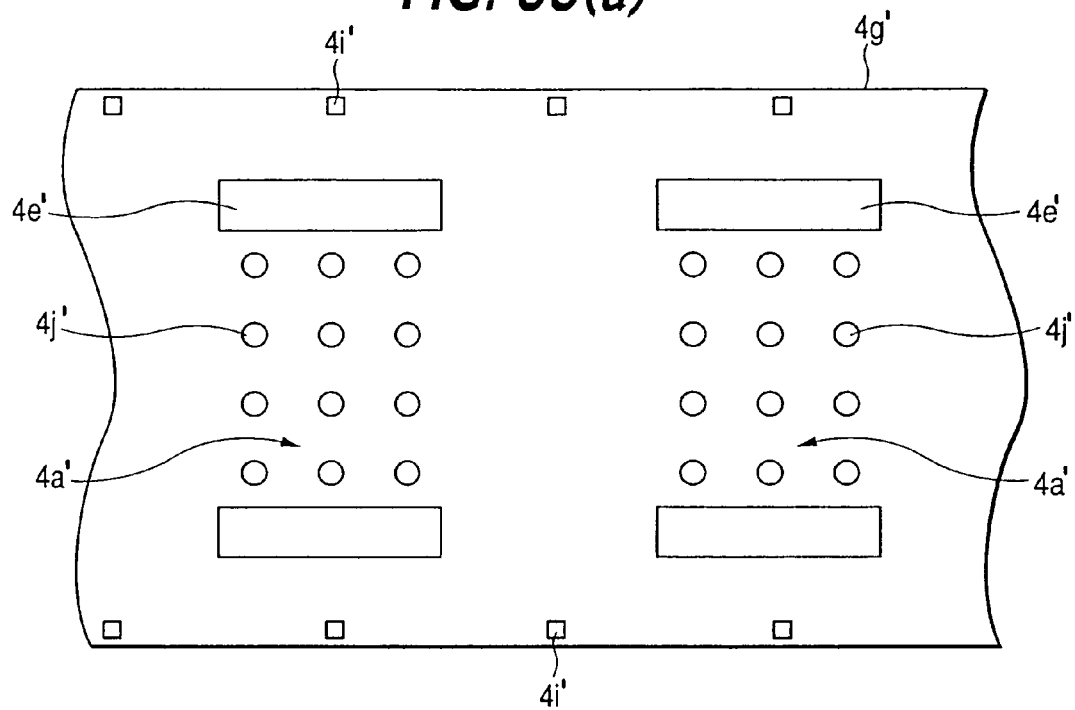
FIGS. 88(a), 88(b) are partial plan views showing a typical method of manufacturing a thin film wiring substrate used for a semiconductor device (CSP) according to Embodiment 6 of the present invention.
Figure 88B:
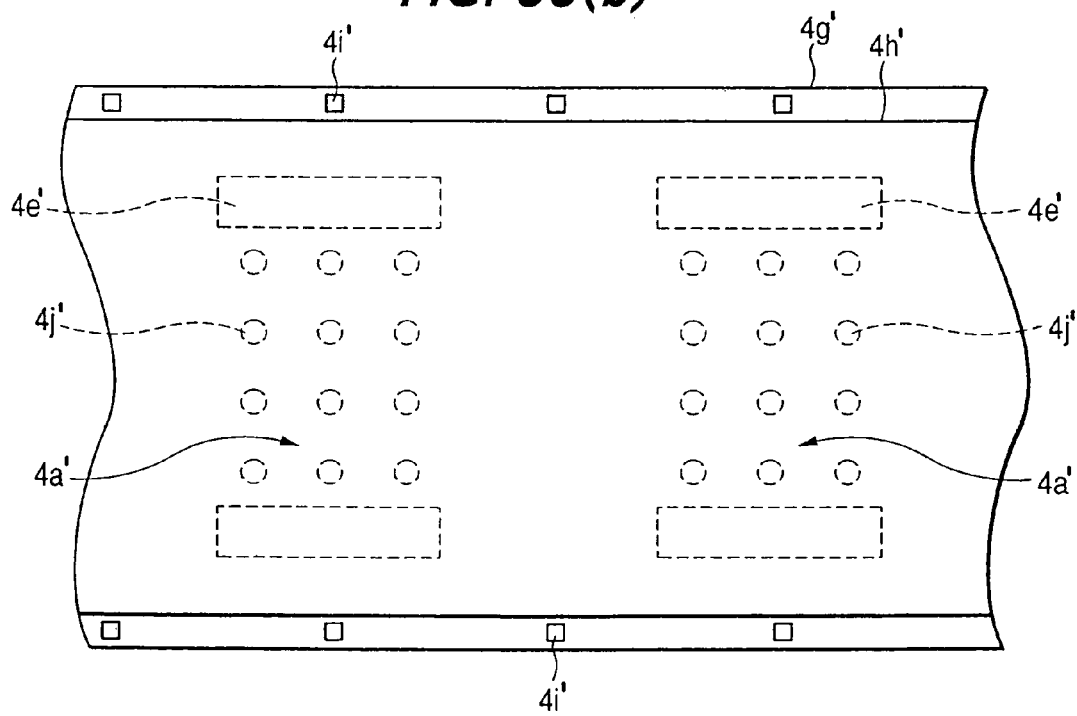

Next, twelve bump openings 4j' and two wiring join holes 4e' on both sides are formed by stamping as shown in FIG. 88(a) and the copper foil 4h' is laminated on the tape base material 4g' as shown in FIG. 88(b).

The copper foil 4h' is then fashioned into a desired pattern by etching as shown in FIG. 89(a) so as to form a wiring pattern.

This forms the bump lands 4f and a power supply line 4k'.

In order to make the aforesaid gold plating electrically react after plating the copper foil 4h', adjacent power supply lines 4k' must be connected together.

After etching the copper foil 4h' to form the wiring pattern, the copper foil 4h' is gold plated. The specification of this gold plating is that of the wiring plating shown in FIG. 84 (a, b, c, d). It may be gold plating having a thickness of 1.5 μm (wiring plating (1) shown in FIG. 84 (a, b, c, d)), gold/nickel differential thickness plating (wiring plating (2) shown in FIG. 84 (a, b, c, d)), or another type of plating.

Figure 89B:
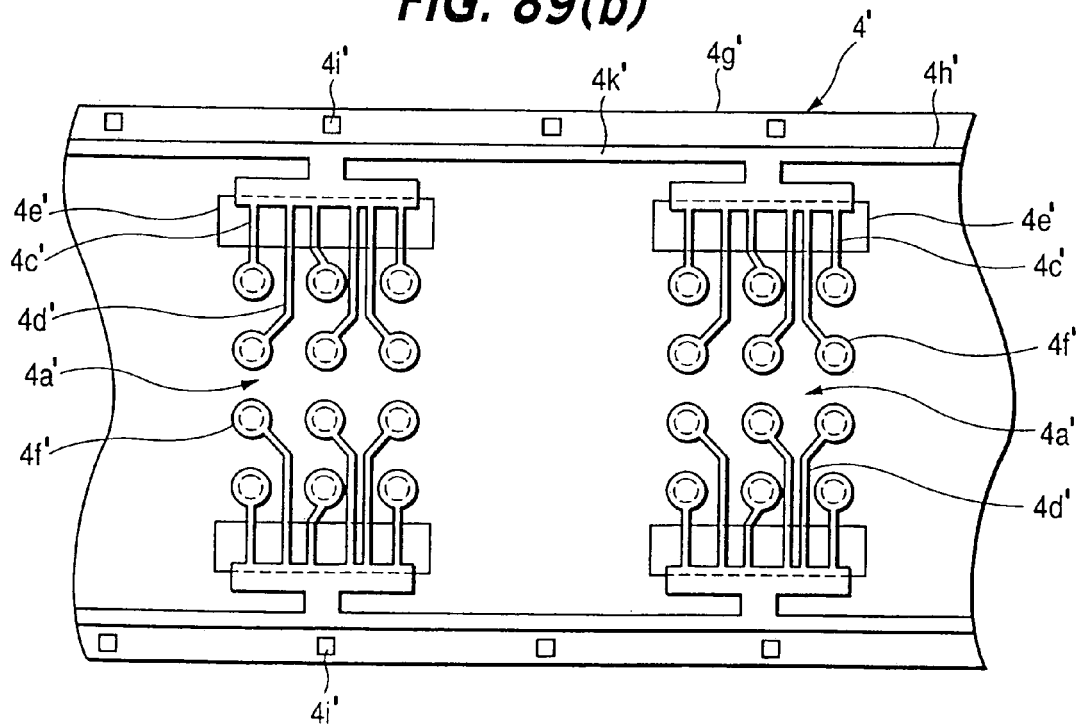
Figure 92A:
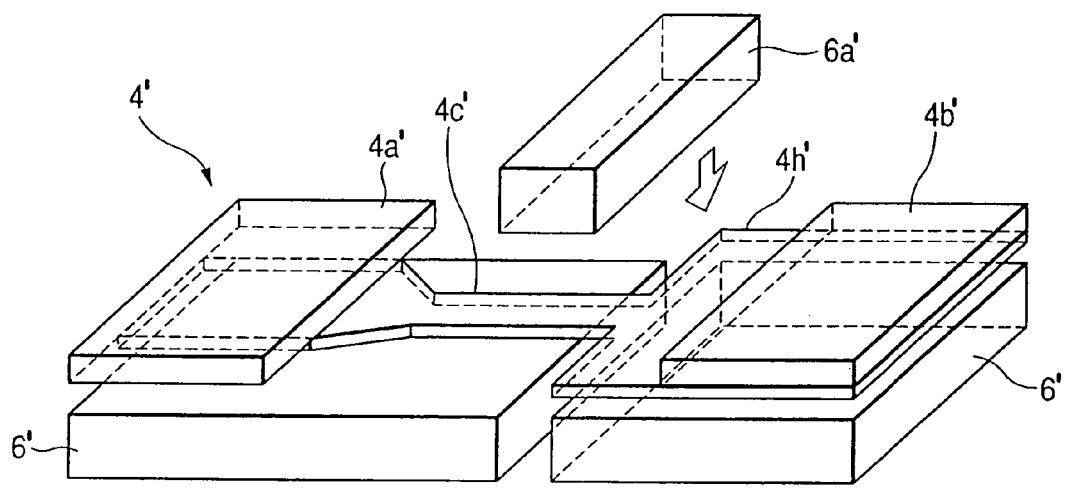
FIGS. 92(a), 92(b) are perspective views showing an example of a lead cutting method in a method of manufacturing the semiconductor device (CSP) according to Embodiment 6 of the present invention.

The wiring leads which are connected together as shown in FIG. 89(a) are then cut by a punch die 6a' of a cutter 6' shown in FIG. 92(a) so as to separate the leads 4c' as shown in FIG. 89(b).

Figure 92B:
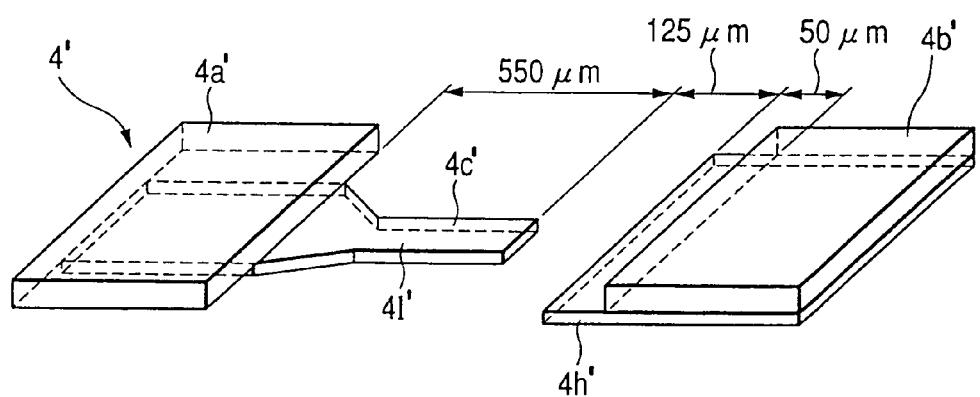

As regards the width of the cutting blade of the punch die 6', it is desirable to use a small cutting blade having a width of the order of 50 to 200 μm and more preferably 100 to 150 μm so that the leads 4c' can be fashioned into a beam shape 41' after cutting as shown in FIG. 92(b).

By using a small cutting blade of the order of 125 μm, the cut parts of the leads 4c' can be formed with a dimension of the order of 125 μm, and as a result, the distance between the semiconductor chip 1' and the substrate protruding parts 4b' can be shortened when the semiconductor chip 1 (FIG. 82) is mounted.

The sealing areas of the sealing parts 105 can therefore be made narrow, so sealing properties are improved.

Also as the distance between the semiconductor chip 1' and the substrate protruding parts 4b' can be made short, the CSP11' can be made compact.

By cutting so as to fashion the leads 4c' into the beam shape 41' shown in FIG. 92(b), the thin film wiring substrate 4' shown in FIG. 89(b) is produced.

The detailed structure of the thin film wiring substrate 4' used in the sixth embodiment will now be described referring to FIG. 89 and FIG. 108.

Figure 108:
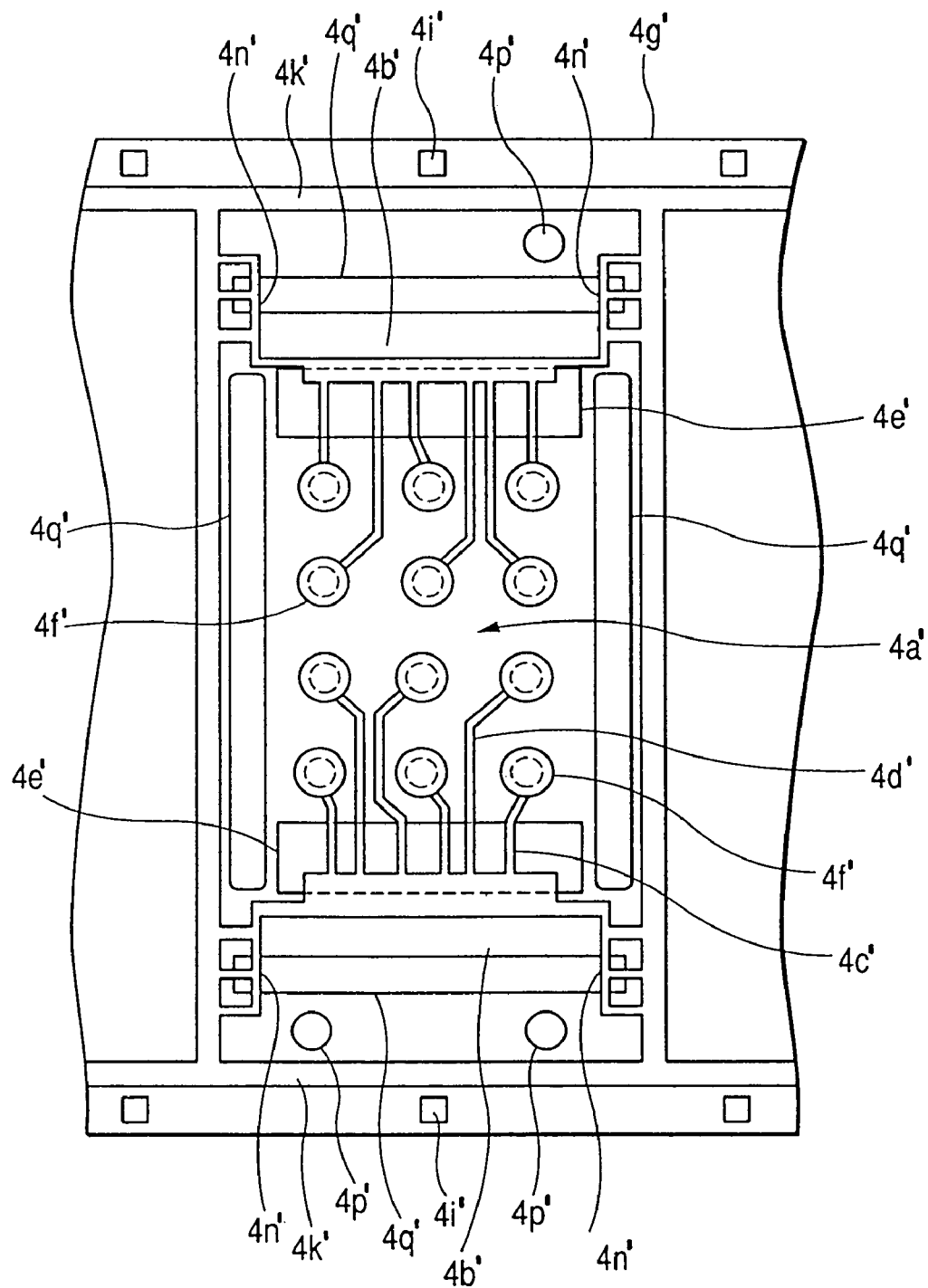
FIG. 108 is an enlarged partial view showing the detailed structure of the thin film wiring substrate shown in FIG. 89.

As shown in FIG. 108, four long holes 4q' effectively corresponding to the four sides of the substrate body 4a' are formed around the substrate body 4a'.

The purpose of these holes 4q' is to reduce the cross-sectional area when the substrate body 4a' is cut off, improve ease of cutting, and to lessen distortion when winding up or cutting the thin film wiring substrate 4' which is in the form of a long thin tape.

Positioning holes 4p' for positioning during cutting are provided outside the upper and lower long holes 4q' of the substrate body 4a' (according to this embodiment a total of three holes is provided, i.e. one upper one and two lower ones), but there is no limit on the number of these positioning holes 4p' if they are provided outside both the upper and lower long holes 4q'.

Recognition patterns 4n' formed of the same copper foil as the wiring pattern are also provided in these upper and lower long holes 4q' of the substrate body 4a'.

These recognition patterns 4n' are used to recognize the position of the thin film wiring substrate 4' during cutting, etc., and are such that they can be recognized also from the reverse side of the thin film wiring substrate 4' (side on which there is no wiring pattern) during bonding. Specifically, they straddle the ends of the long holes 4q' so that they can be recognized from the top surface and under surface of the thin film wiring substrate 4'.

The thin film wiring substrate 4' shown in FIG. 108 comprises plural substrate bodies 4a' arranged horizontally in a row with respect to the feed direction, however plural rows of the substrate bodies 4a' (e.g. two) may be arranged horizontally.

In this case, the efficiency of manufacturing the CPU11 may be improved.

Figure 85:
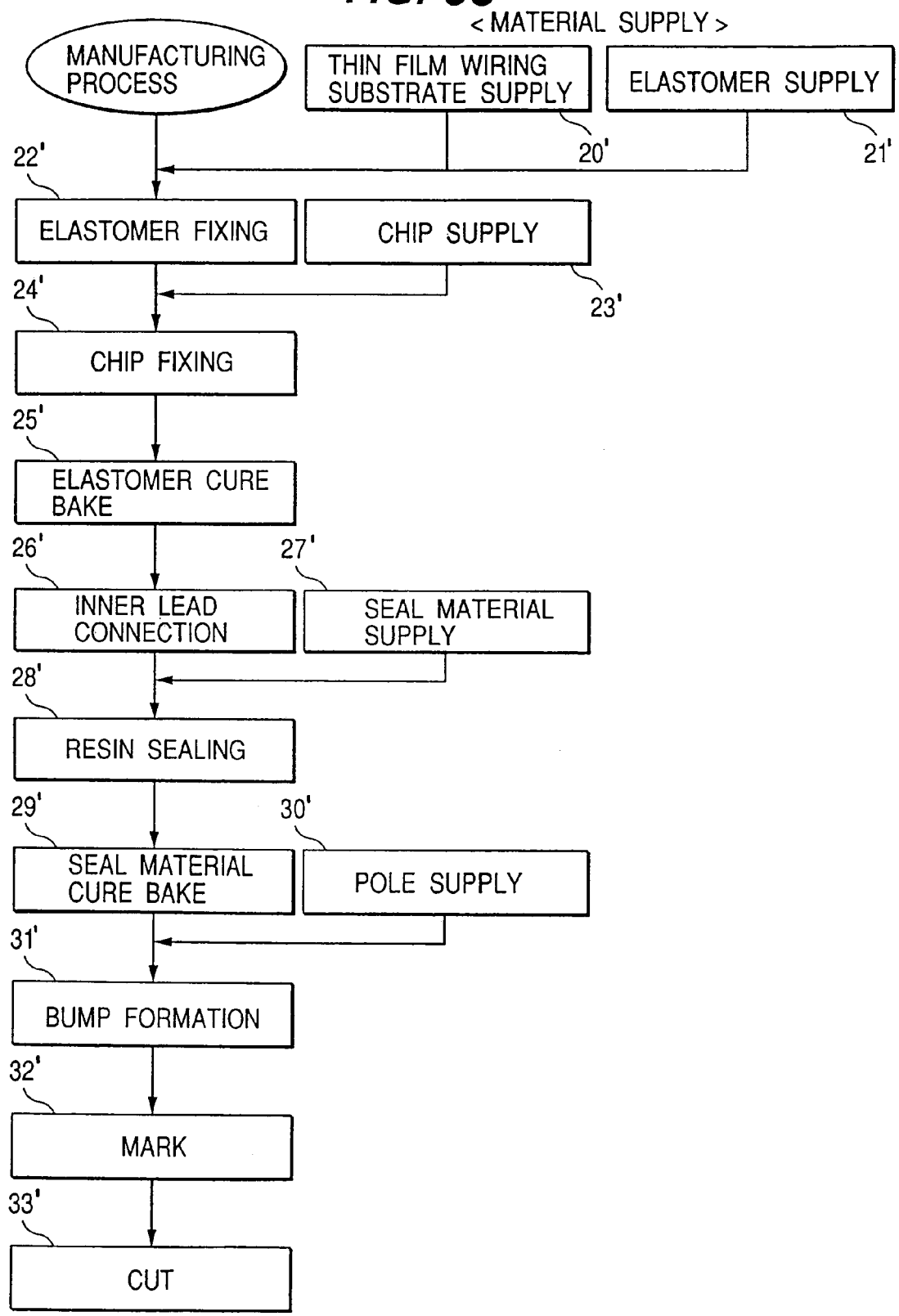
FIG. 85 is a manufacturing sequence showing a typical process for manufacturing the semiconductor device shown in FIG. 82.

Subsequently, thin film wiring substrate supply 20' and elastomer supply 21' shown in FIG. 85 are performed, and elastomer attachment 22' is performed.

Figure 90A:
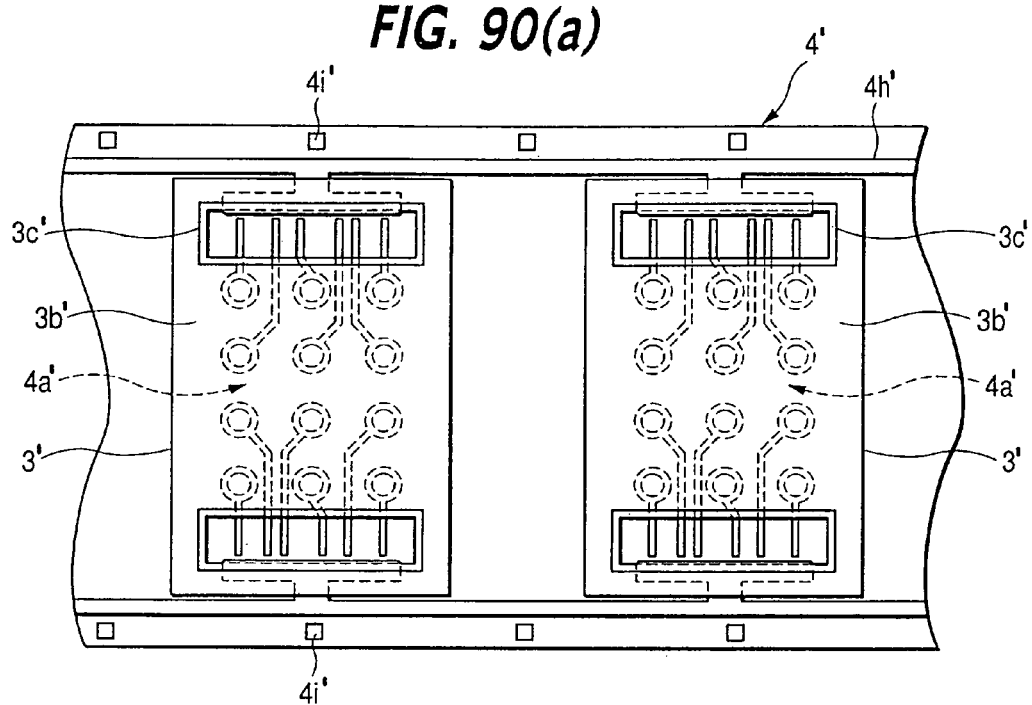
Figure 90B:
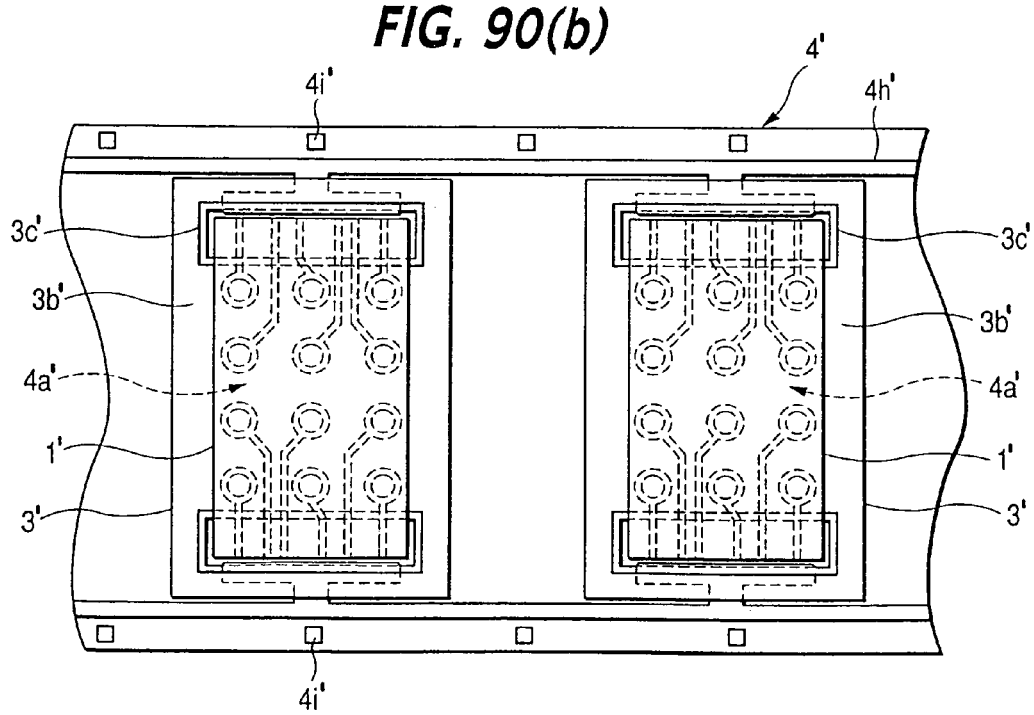

To attach the elastomer 3', the substrate body 4a' of the thin film wiring substrate 4' and elastomer 3' are joined as shown in FIG. 90(*a*) based on elastomer attachment conditions whereof an example is given in FIG. 86. In this way, the thin film wiring substrate 4 is assembled with the elastomer 3'. When the elastomer 3' is attached, there may be three positional relationships of the elastomer 3' and substrate body 4a' as shown in FIGS. 93(*a*), 93(*b*), 93(*c*).

Figure 93A:
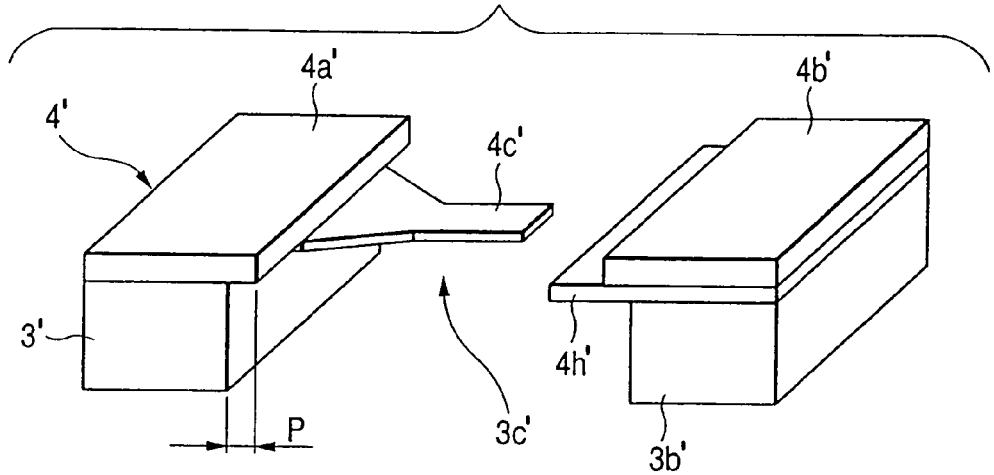
FIGS. 93(a), 93(b), 93(c) are perspective views showing an example of an elastomer attachment state in a method of manufacturing a semiconductor device (CSP) according to Embodiment 6 of the present invention.
Figure 93B:
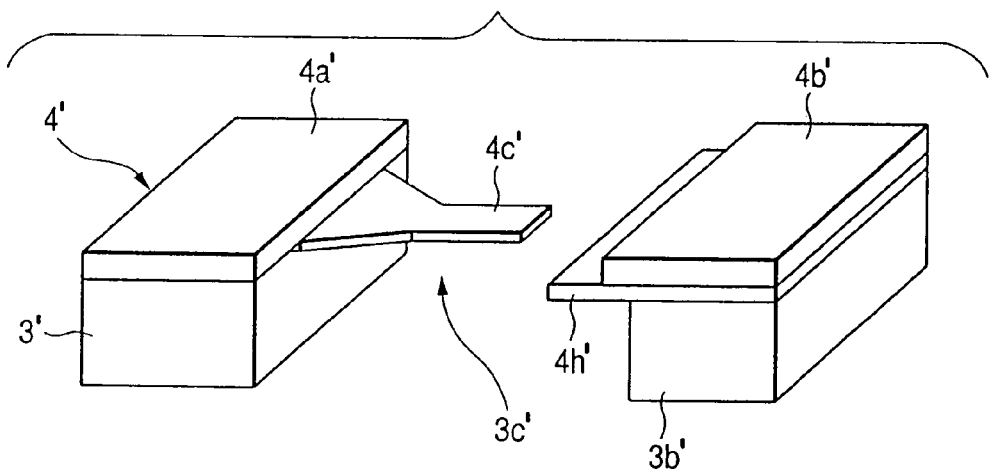
Figure 93C:
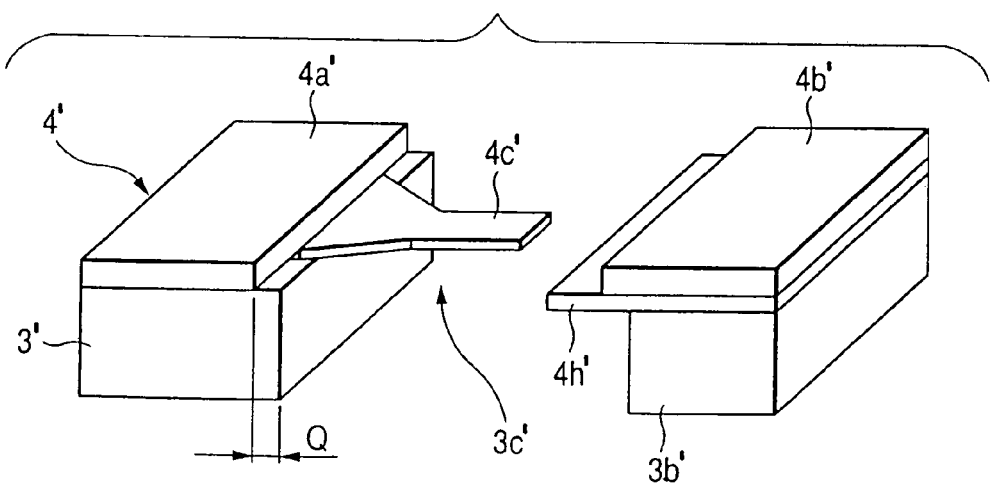

First, FIG. 93(*a*) shows the case where the edge of the substrate body 4a' protrudes beyond the elastomer 3' by an protruding amount P.

FIG. 93(*b*) shows the case where the edge of the substrate body 4a' and the edge of the elastomer are perfectly aligned. FIG. 93(*c*) shows the case where the edge of the substrate body 4a' falls short of the elastomer 3' by an amount Q.

In general, during heat curing after applying a sealing material (herein, a sealing resin), volatile components of the sealing material are produced as volatile gases. As the specific gravity of these volatile gases is less than that of the sealing material, the volatile gases escape to the outside from the upper part of the sealing material.

However, when a P value predetermined range described hereafter is exceeded and the edge of the elastomer 3' does not protrude to the edge of the substrate body 4a' (P>300 μm), volatile gases produced further inside than the edge of the substrate body 4a' cannot escape to the outside of the sealing material as the upper part is obstructed by the edge of the substrate body 4a', so these gases remain as bubbles in the sealing material.

After heat curing of the sealing material, part of the components of the volatile gases in the bubbles gradually escape to the outside through minute (intermolecular) gaps in the sealing material, so the internal pressure of the bubbles is released.

As a result, voids are formed in the sealing material where the bubbles occur.

The voids create unfilled spaces in areas which should be filled by sealing material, and have an adverse effect on the humidity resistance and temperature cycle reliability of the semiconductor device.

It is therefore desirable that the value of P lies within a P value predetermined range of $0 \leq P \leq 300$ μm, and preferably $0 \leq P \leq 100$ μm, so that the escape path of the volatile gases is not obstructed by the substrate body 4a', and so that the volatile gases produced can be released outside the sealing material.

If this is done, voids are not formed in the sealing material.

On the other hand, when a Q value predetermined range described hereafter is exceeded and the edge of the elastomer 3' protrudes beyond the edge of the substrate body 4a' (Q>100 μm), part of the leads 4c' is fixed by the elastomer 3', so a correct wiring configuration cannot be formed when the leads 4c' are bonded.

This has an adverse effect on temperature cycle reliability.

It is therefore desirable that the position of the edge of the elastomer 3' relative to the edge of the substrate body 4a' is within a Q value predetermined range of for example $0 \leq Q \leq 100$ μm, and preferably $0 \leq Q \leq 50$ μm, so that correct bonding of the leads 4c' can be performed.

Hence, by ensuring that P and Q are within the predetermined ranges, a CSP11' of high reliability can be manufactured free of voids in the sealing material and wherein the leads 4c' are correctly bonded.

Subsequently, chip supply 23' (FIG. 85) is performed wherein the semiconductor chip 1' is supplied having the electrode pads 1b' on the outer periphery of the main surface 1a' as shown in FIG. 83(*a*). Chip attachment 24' shown in FIG. 85 is then performed based on the chip attachment conditions shown in FIG. 86.

Herein, in the chip attachment 24', the main surface 1a' of the semiconductor chip 1' is joined to the elastomer 3' as shown in FIG. 83(*a*) leaving the electrode pads 1b' of the semiconductor chip 1' exposed in the openings 4e' of the thin film wiring substrate 4', as shown in FIG. 82.

Specifically, the semiconductor chip 1' is attached to the top of the elastomer 3' as shown in FIG. 90(*b*).

Subsequently, an elastomer cure bake 25' shown in FIG. 85 is performed based on the post-chip attachment cure conditions shown in FIG. 86 so as to raise the joining strength of the elastomer 3' and semiconductor chip 1'.

Next, inner lead connections 26' shown in FIG. 85 is performed based on the inner lead connection conditions shown in FIG. 86. Two sets of inner lead connection conditions (1) and (2) are shown in FIG. 86, however the inner lead connection conditions are not limited to this.

Figure 94A:
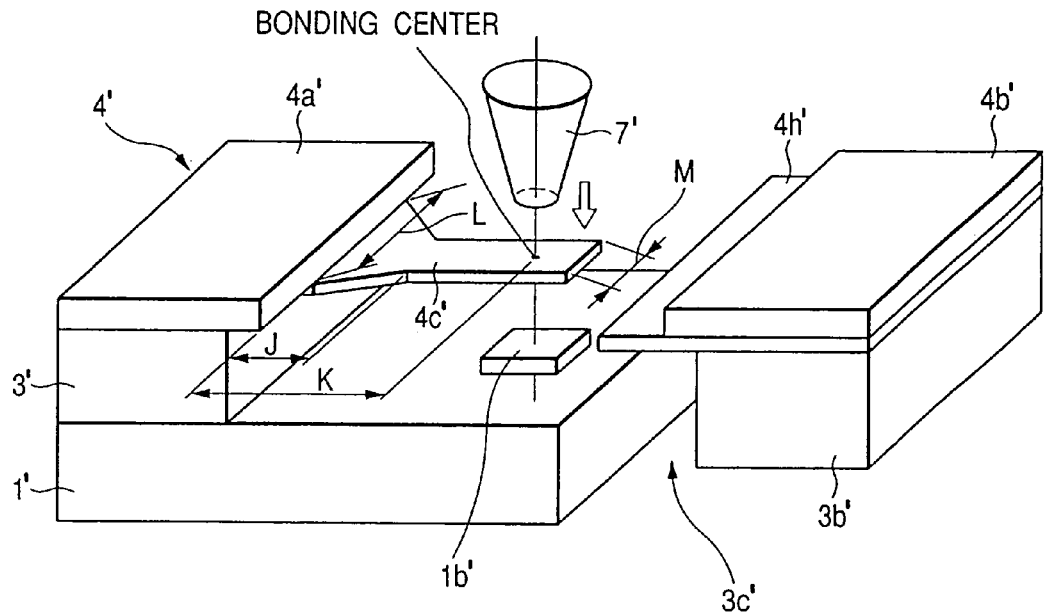
FIGS. 94(a), 94(b) are perspective views showing an example of a lead bonding method in a method of manufacturing a semiconductor device (CSP) according to Embodiment 6 of the present invention.
Figure 94B:
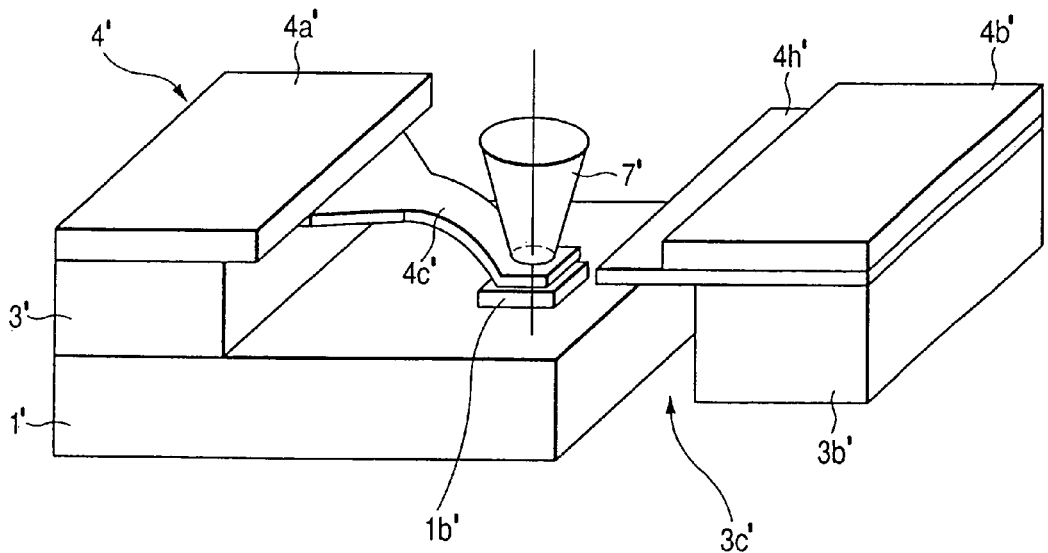

First, a bonding tool 7' is lowered to a predetermined position as shown in FIG. 94(*a*), then one of the leads 4c' of the thin film wiring substrate 4' is pressed onto the corresponding electrode pad 1b' on the semiconductor chip 1' by the bonding tool 7' so that the lead 4c' and the electrode pad 1b' are electrically connected.

The bonding method of the first embodiment is single bonding.

After bonding, the lead 4c' is pushed up by the bonding tool 7' so that it is just above the electrode pad 1b'. If a value obtained by dividing the stress produced in the taper-shaped tip of the lead 4c' by the stress produced at the edge of the substrate body 4a' is defined as a bending stress ratio alpha, this bending stress ratio α is given by the following expression from the dimensions of the taper-shaped lead 4c':

(α=:L×(K−J)/(M×K)(FIG. 94 (a)).

The dimensions and shape of the lead 4c' are therefore designed such that the bending stress ratio α is within the range 1.0 to 1.75.

Subsequently, supply of sealing resin which is the sealing material, i.e. a sealing material supply 27', is performed as shown in FIG. 85.

Specifically, a resin sealing 28 shown in FIG. 85 is performed using a sealing material (sealing resin) shown in the sealing material specifications of FIG. 83(a, b, c, d).

In this step, the sealing resin is allowed to drip from the opening 4e' of the thin film wiring substrate 4' shown in FIG. 82 by a potting method using a potting nozzle, not shown, and the electrode pad 1b' of the semiconductor chip 1' and lead 4c' of the thin film wiring substrate 4 are sealed so as to form the sealing parts 5'. The drip time may be for example 30 seconds for the openings 4e' on one side.

As the space between the substrate protruding parts 4b' and semiconductor chip 1' can be sealed in a bridge-like fashion in the CSP11' of the first embodiment, a stable resin sealing 28' can be performed, and the humidity resistance of the sealing parts 5' can therefore be made more reliable.

Next, a sealing material cure bake step 29' shown in FIG. 85 is performed based on the post-seal curing conditions shown in FIG. 86 so as to harden the sealing parts 5'.

Also, a pole supply 30' (FIG. 85) is performed for supplying a bump pole material shown in the bump pole specifications of FIG. 84 (a, b, c, d) to the bump openings 4j' (FIG. 88(a)).

A bump forming 31' shown in FIG. 85 is then performed based on the reflow conditions for bump forming shown in FIG. 86.

The bump forming 31' is performed by passing the material obtained by supplying the pole material to the openings 4j' of the substrate body 4a' through a reflow furnace, not shown.

This electrically connects the wiring 4d' to the bump electrodes 2' as shown in FIG. 82 and FIG. 83.

When the bump electrodes 2' are formed according to the first embodiment, even if the CSP11' has absorbed moisture and is passed through reflow, the side faces 3a' in a predetermined direction of the elastomer 3' (herein, the two opposite side faces 3a' in the same direction as the longitudinal direction of the semiconductor chip 1') are exposed to the outside, so water vapor produced during reflow can disperse to the outside through the elastomer 3'. Reflow tolerance is therefore improved.

Next, a mark 32' (FIG. 85) for marking a number of the product (CSP11') is performed.

Figure 91:
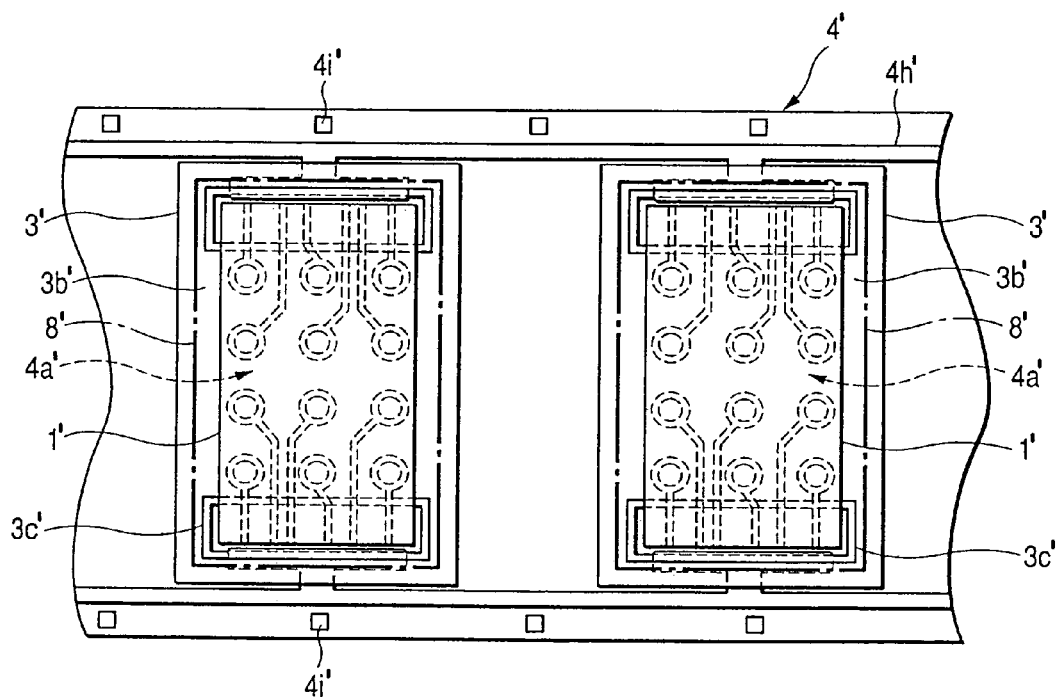
FIG. 91 is a partial plan view showing an example of a cutting position in a method of manufacturing a semiconductor device (CSP) according to Embodiment 6 of the present invention.

Subsequently, a cutting 33' shown in FIG. 85 is performed at a cutting position 8' shown in FIG. 91 so as to obtain different CSP11' of desired sizes.

Embodiment 7

Figure 95:
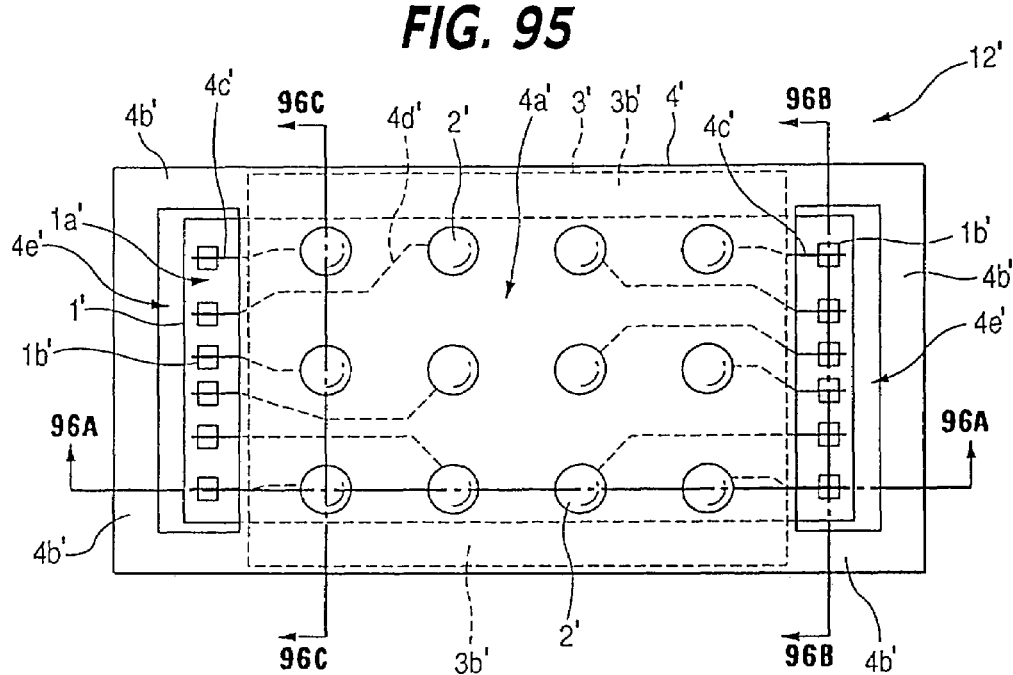
FIG. 95 is a plan view showing an example of a structure of a semiconductor device (CSP) according to an Embodiment 7 of the present invention through the sealing parts.
Figure 96A:
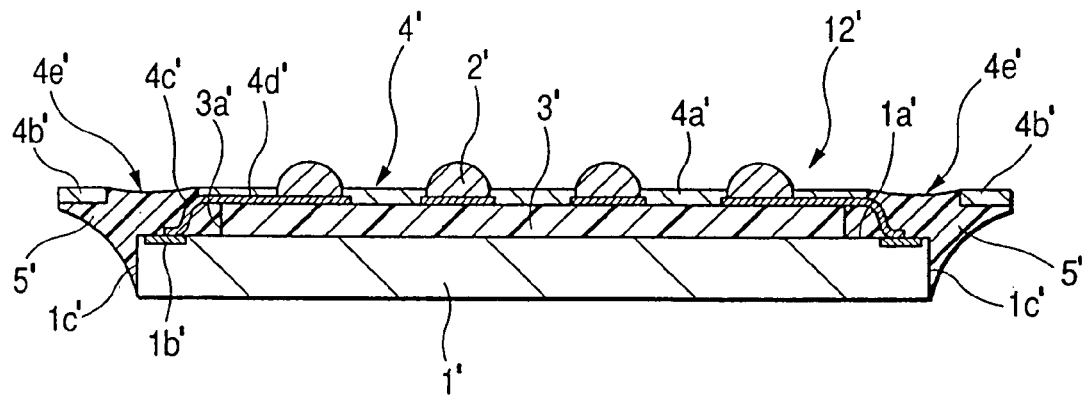
Figure 96B:
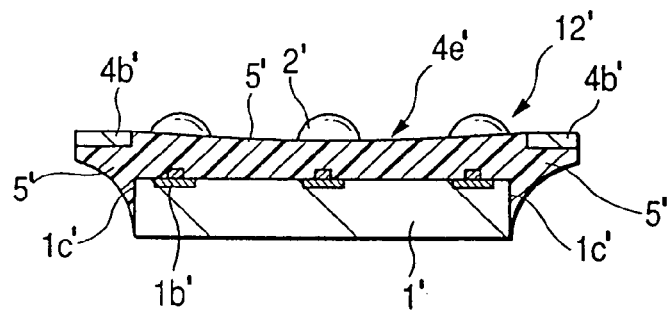
Figure 96C:
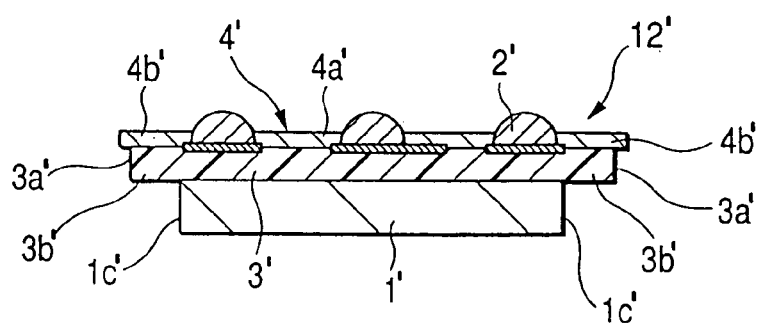

FIG. 95 is a plan view through the sealing parts of a typical structure of a semiconductor device (CSP) according to a seventh embodiment of this invention. FIGS. 96(a) to 96(c) are diagrams showing the structure of the semiconductor device shown in FIG. 95. FIG. 96(a) is a cross-sectional view through a line 96A-96A in FIG. 95, FIG. 96(b) is a cross-sectional view through a line 96B-96B in FIG. 95, FIG. 96(c) is a cross-sectional view through a line 96C-96C in FIG. 95.

A CSP12' (semiconductor device) according to the second embodiment is a peripheral pad fan-in CSP as is the CSP11' of the sixth embodiment shown in FIG. 82. It has a substantially identical structure to that of the CSP11'; however, a difference from the CSP11' of the sixth embodiment is that in the cutting step 33' after the bump forming 31' shown in FIG. 85, in the regions of the sealing parts 5' formed in the protruding part 4b', the substrate protruding parts 4b'and the sealing parts 5' are simultaneously cut to a desired size. In this way, the CSP12' can be made even more compact than the CSP11' shown in FIG. 82.

To implement this, a low silica sealing resin having a low proportion of silica must be used as sealing resin.

Specifically, the proportion of silica (filler) in the sealing resin must lie within the range of 0 to 50 weight percent, and it is preferably 0 weight percent.

The silica mentioned herein is extremely hard, but it lowers the residual stress of the sealing resin in the sealing material cure bake shown in FIG. 85.

The remaining features of the construction of the CSP12' according to the second embodiment and of its method of manufacture are identical to those of the CSP11' of the first embodiment, so their description will not be repeated.

The advantages of the CSP12' of the second embodiment and its method of manufacture are as follows.

First, in the region of the sealing parts 5' formed in the substrate protruding parts 4b', the substrate protruding parts 4b' and sealing parts 5' are simultaneously cut to a desired size. As this cutting is performed regardless of the extent to which sealing resin has spread in the substrate protruding parts 4b' (size of the sealing parts 5' formed in the substrate protruding parts 4b'), the CSP12' can be made compact.

As the proportion of silica in the sealing resin is low, the hardness of the sealing parts 5' after the sealing resin has hardened can be lowered, so the life of the cutting die used to cut the substrate protruding parts 4b' and sealing parts 5' can be lengthened.

The remaining advantages of the CSP12' according to the second embodiment and of its method of manufacture are identical to those of the CSP11' of the first embodiment, so their description will not be repeated.

Embodiment 8

Figure 97:
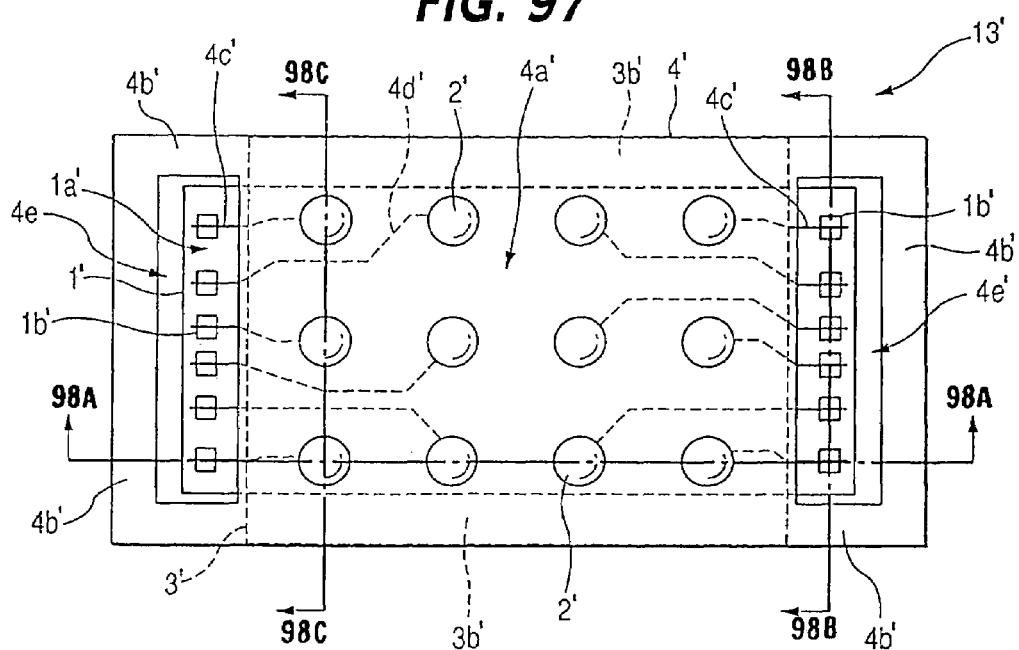
FIG. 97 is a plan view showing an example of a structure of a semiconductor device (CSP) according to Embodiment 8 of the present invention through the sealing parts.
Figure 98A:
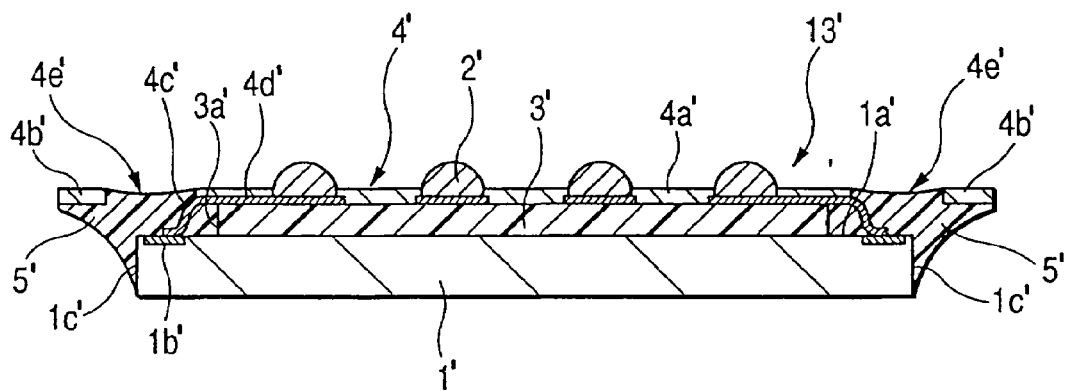
Figure 98B:
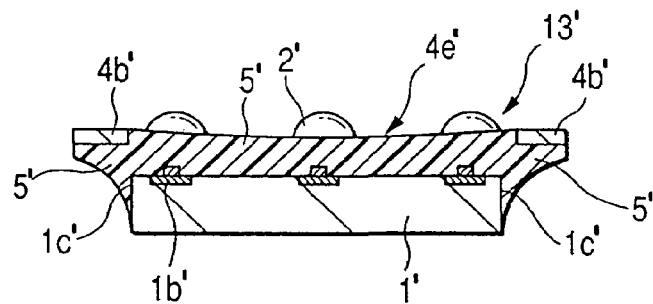
Figure 98C:
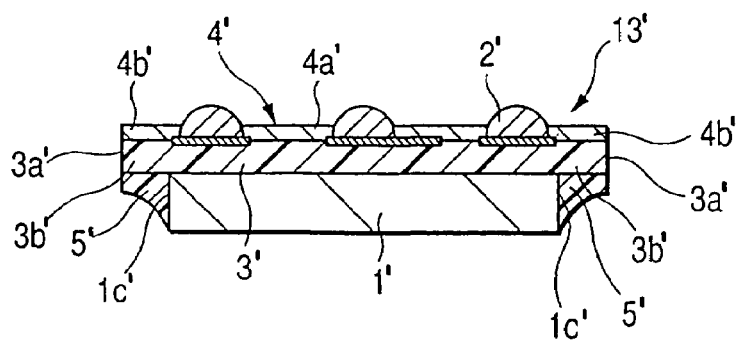

FIG. 97 is a plan view through the sealing parts of a typical structure of a semiconductor device (CSP) according to an eighth embodiment of this invention. FIGS. 98(a) to 98(c) are diagrams showing the structure of the semiconductor device shown in FIG. 97. FIG. 98(a) is a cross-sectional view through a line 98A-98A in FIG. 97, FIG. 98(b) is a cross-sectional view through a line 98B-98B in FIG. 97, FIG. 98(c) is a cross-sectional view through a line 98C-98C in FIG. 97.

A CSP13' (semiconductor device) according to Embodiment 8 is a peripheral pad fan-in CSP as is the CSP12' of the Embodiment 7 shown in FIG. 95 and FIG. 96. It has a substantially identical structure to that of the CSP12'; however, a difference from the CSP12' of the second embodiment is that in the resin sealing step 28' shown in FIG. 85, the resin sealing 28' is performed on the two opposite side faces 1c' in the longitudinal direction of the semiconductor chip 1' as shown in FIG. 98(c) as well as the resin sealing 28' of Embodiment 6.

During the resin sealing 28' performed on the two opposite side faces 1c' in the longitudinal direction of the semiconductor chip 1', after the sealing material cure bake 29' of the sixth embodiment, the CSP13' is temporarily turned over with its top surface and under sides reversed.

Sealing resin is then applied again to the two opposite side faces 1c' in the longitudinal direction of the semiconductor chip 1' and the adjacent substrate protruding parts 4b' from the under surface (reverse side to the main face 1a) of the semiconductor chip 1' so as to repeat the resin sealing 28'.

Subsequently, in the cutting step 33' shown in FIG. 85, the substrate protruding parts 4b', elastomer protruding parts 3b' of the elastomer 3' and the sealing parts 5' formed therein are simultaneously cut to the desired size.

As a result, in the CSP13' of the third embodiment, the resin sealing 28' is performed over all the four side faces 1c of the semiconductor chip 1' as shown in FIG. 98, and the sealing parts 5' are thereby formed on all the four side faces 1c' of the semiconductor chip 1'.

The remaining features of the construction of the CSP13' according to the eighth embodiment and of its method of manufacture are identical to those of the CSP12' of the first embodiment, so their description will not be repeated.

The advantages of the CSP13' of the eighth embodiment and its method of manufacture are as follows.

In the CSP13', all of the four side faces 1c' of the semiconductor chip 1' are covered by sealing resin, so the seal properties (herein, humidity resistance) of the semiconductor chip 1' are improved.

As a result, a compact, highly reliable CSP13' can be obtained.

The remaining advantages of the CSP13' according to the eighth embodiment and of its method of manufacture are identical to those of the CSP12' of the seventh embodiment, so their description will not be repeated.

Embodiment 9

Figure 99:
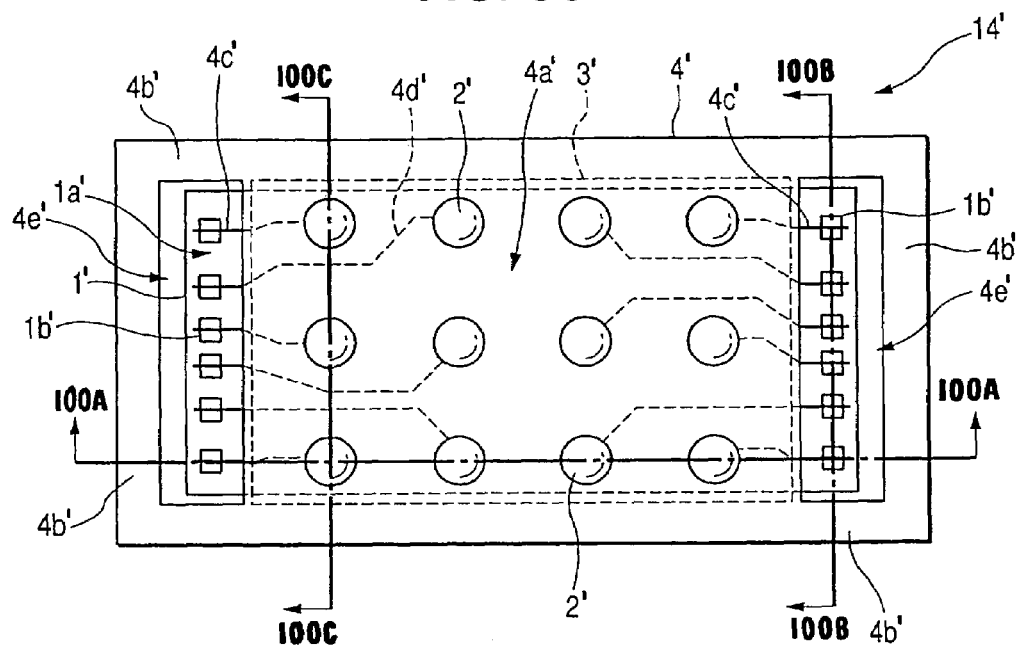
FIG. 99 is a plan view showing an example of a structure of a semiconductor device (CSP) according to an Embodiment 9 of the present invention through the sealing parts.
Figure 100A:
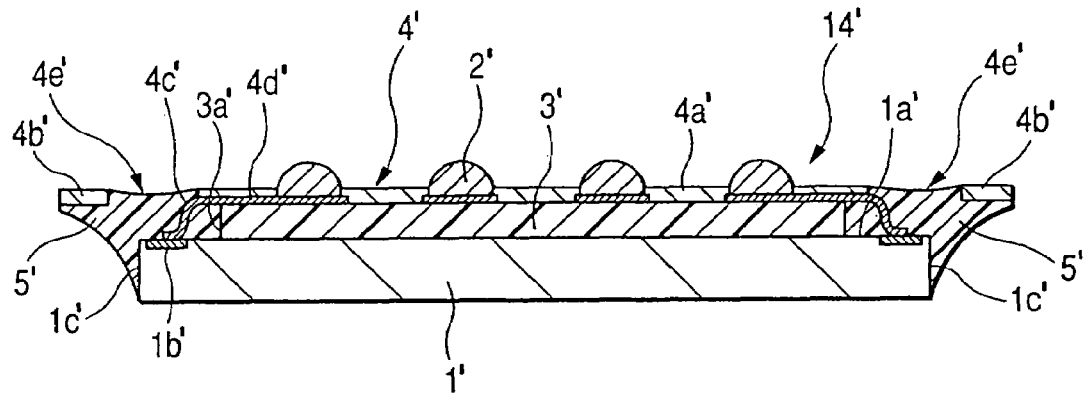
Figure 100B:
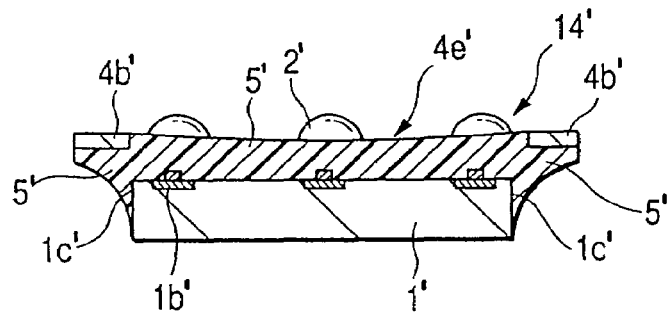
Figure 100C:
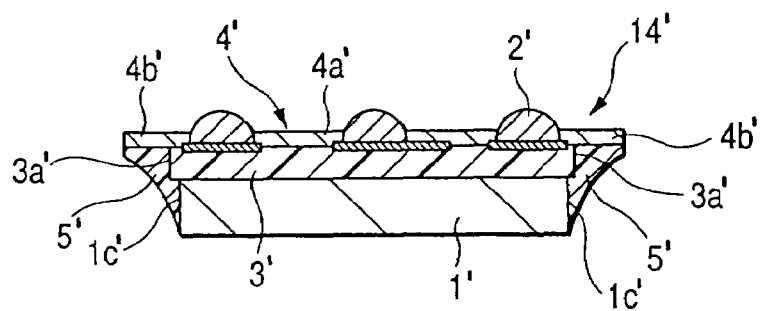

FIG. 99 is a plan view through the sealing parts of a typical structure of a semiconductor device (CSP) according to a third embodiment of this invention. FIGS. 100(a) to 100(c) are diagrams showing the structure of the semiconductor device shown in FIG. 99. FIG. 100(a) is a cross-sectional view through a line 100A-100A in FIG. 99, FIG. 100(b) is a cross-sectional view through a line 10B-10B in FIG. 99, FIG. 100(c) is a cross-sectional view through a line 100C-100C in FIG. 99.

A CSP14' (semiconductor device) according to the ninth embodiment is a peripheral pad fan-in CSP as is the CSP13' of the eighth embodiment shown in FIG. 97 and FIG. 98. It has a substantially identical structure to that of the CSP13', however a difference from the CSP13' of the third embodiment is that the elastomer 3' and the substrate body 4a' of the thin film wiring substrate 4' are formed with substantially the same size, as shown in FIG. 98.

In other words, the elastomer 3' in the CSP14' of the ninth embodiment does not comprise the elastomer protruding parts 3b' shown in the sixth to eighth embodiments.

Therefore, when the resin sealing 28' is performed by the same method as the resin sealing 28' of the eighth embodiment, all of the four side faces 3a' of the elastomer 3' are covered by sealing resin as well as the all of the four side faces 1c' of the semiconductor chip 1'.

Consequently, all of the outer side faces 1c', 3a' of the semiconductor chip 1' and elastomer 3' are covered together to form the sealing parts 5', and the sealing parts 5' covering all of the outer side faces 1c', 3a' are also directly joined to the substrate protruding parts 4b' of the thin film wiring substrate 4'.

Moreover, all of the surfaces of the elastomer 3' are covered by the sealing parts 5', substrate body 4a' and semiconductor chip 1'.

The remaining features of the construction of the CSP14' according to the ninth embodiment and of its method of manufacture are identical to those of the CSP13' of the eighth embodiment, so their description will not be repeated.

The advantages of the CSP14' of the ninth embodiment and its method of manufacture are as follows.

In the CSP14', as all of the surfaces of the elastomer 3' are covered, the same advantages as when the side faces 3a' of the elastomer 3' are exposed cannot be obtained. However as all of the side faces 1c', 3a' of the semiconductor chip 1 and elastomer 3' are covered so as to form the sealing parts 5', and all of the peripheral sealing parts 5' are directly joined to the substrate protruding parts 4b' of the thin film wiring substrate 4', the seal properties (humidity resistance) of the semiconductor chip 1' are further improved.

The remaining advantages of the CSP14' according to the fourth embodiment and of its method of manufacture are identical to those of the CSP13' of the eighth embodiment, so their description will not be repeated.

Embodiment 10

Figure 101:
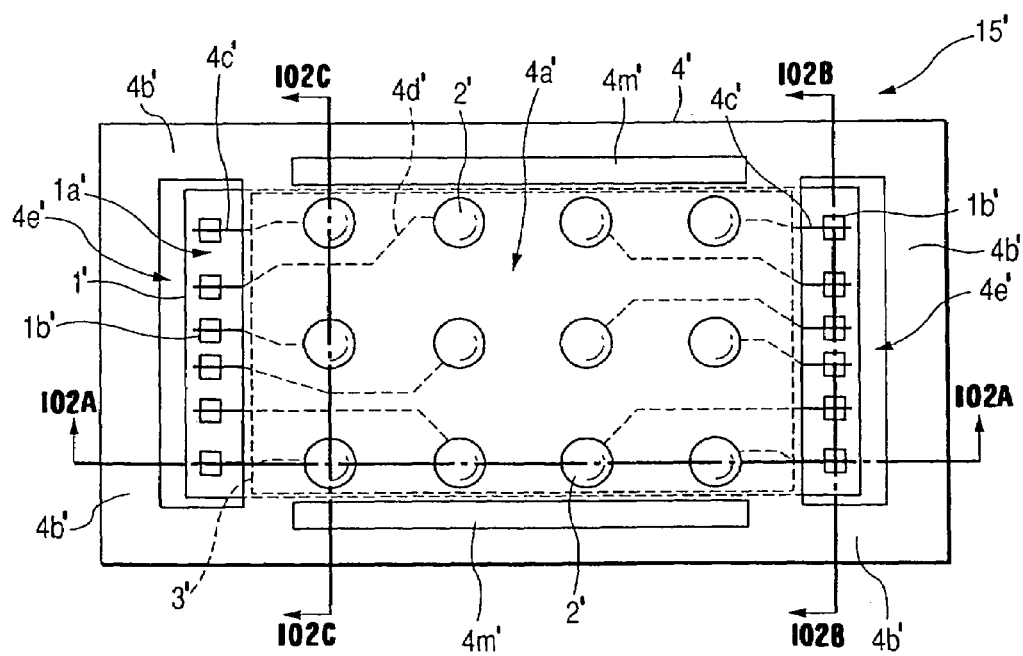
FIG. 101 is a plan view showing an example of a structure of a semiconductor device (CSP) according to an Embodiment 10 of the present invention through the sealing parts.
Figure 102A:
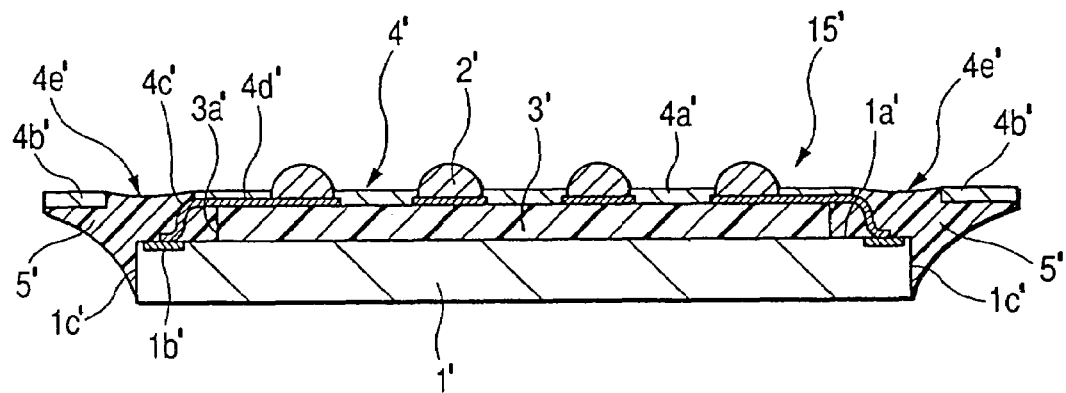
Figure 102B:
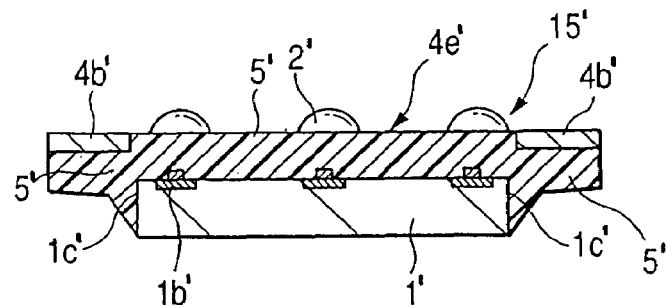
Figure 102C:
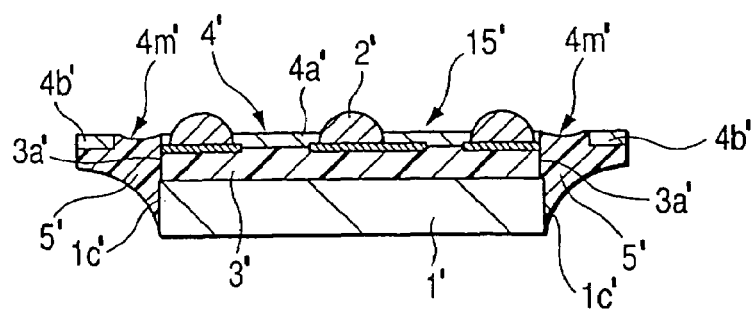

FIG. 101 is a plan view through the sealing parts of a typical structure of a semiconductor device (CSP) according to a tenth embodiment of this invention. FIGS. 102(a) to 102(c) are diagrams showing the structure of the semiconductor device shown in FIG. 101. FIG. 102(a) is a cross-sectional view through a line 102A-102A in FIG. 101, FIG. 102(b) is a cross-sectional view through a line 102B-102B in FIG. 101, FIG. 102(c) is a cross-sectional view through a line 102C-102C in FIG. 101.

A CSP15' (semiconductor device) according to the tenth embodiment is a peripheral pad fan-in CSP as is the CSP14' of the fourth embodiment shown in FIG. 99 and FIG. 100. It has a substantially identical structure to that of the CSP14'; however, a difference from the CSP14' of the fourth embodiment is that seal openings 4m' are provided at positions corresponding to the two opposite side faces 1c' in the longitudinal direction of the semiconductor chip 1' (FIG. 102(c)) in the substrate protruding parts 4b' of the thin film wiring substrate 4' in addition to the openings 4e' exposing the electrode pads 1b', as shown in FIG. 101.

Specifically, the two openings 4e' are provided at positions exposing the electrode pads 1b on both sides of the semiconductor chip 1', and the two opposite seal openings 4m' are provided in a direction at right angles to them, in the thin film wiring substrate 4' of the CSP14' according to the ninth embodiment.

Hence, when the resin sealing 28' shown in FIG. 85 is performed, sealing resin can be applied through the openings 4e' and the seal openings 4m' from the top surface of the thin film wiring substrate 4'.

Therefore, the four side faces 1c' of the semiconductor chip 1' can be covered by sealing resin by this bonding method.

The remaining features of the construction of the CSP15' according to the tenth embodiment and of its method of manufacture are identical to those of the CSP14' of the ninth embodiment, so their description will not be repeated.

The advantages of the CSP15' of the tenth embodiment and of its method of manufacture are as follows.

In the CSP15', as the resin sealing 28' is performed by applying sealing resin through the openings 4e' and the seal openings 4m' from the top surface (one side) of the thin film wiring substrate 4', there is no need to turn the CSP15' over during the resin sealing step, so productivity is improved.

The remaining advantages of the CSP14' according to the tenth embodiment and of its method of manufacture are identical to those of the CSP13' of the ninth embodiment, so their description will not be repeated.

Embodiment 11

Figure 103:
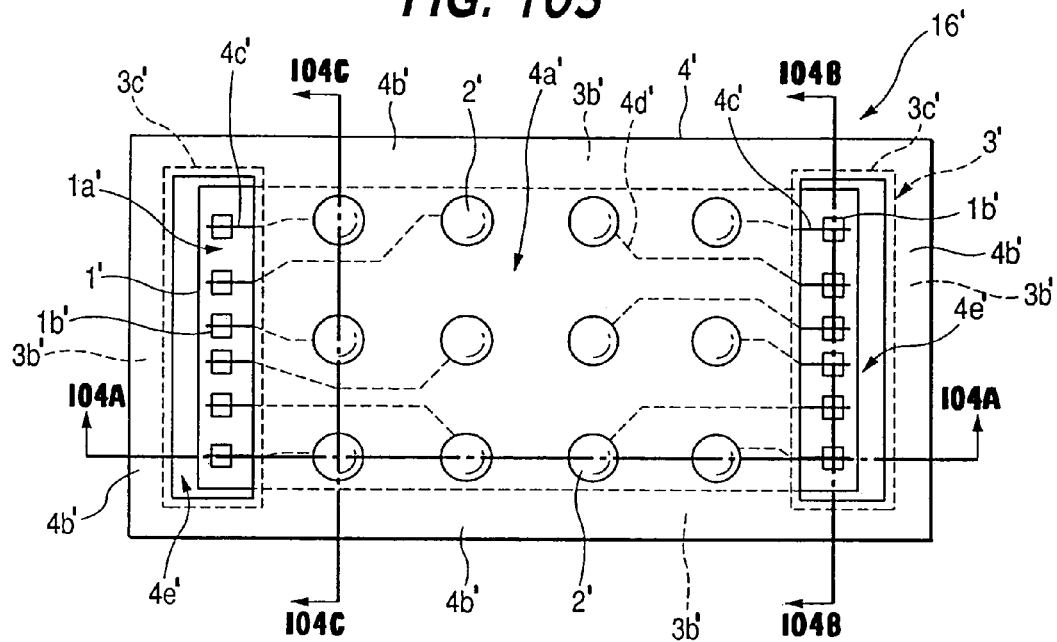
FIG. 103 is a plan view showing an example of a structure of a semiconductor device (CSP) according to an Embodiment 11 of the present invention through the sealing parts.

FIG. 103 is a plan view through the sealing parts of a typical structure of a semiconductor device (CSP) according to an eleventh embodiment of this invention. FIGS. 104(*a*) to 104(*c*) are diagrams showing the structure of the semiconductor device shown in FIG. 103. FIG. 104(*a*) is a cross-sectional view through a line 104A-104A in FIG. 103, FIG. 104(*b*) is a cross-sectional view through a line 104B-104B in FIG. 103, FIG. 104(*c*) is a cross-sectional view through a line 104C-104C in FIG. 103.

A CSP16' (semiconductor device) according to the eleventh embodiment is a peripheral pad fan-in CSP as is the CSP12' of the seventh embodiment shown in FIG. 95 and FIG. 96. It has a substantially identical structure to that of the CSP12', however a difference from the CSP12' of the seventh embodiment is that openings 3*c'* to those in the thin film wiring substrate 4' are provided also in the elastomer 3' to expose the electrode pads 1*b'* of the semiconductor chip 1', as shown in FIG. 103.

Specifically, the elastomer 3' in the CSP16' comprises the two openings 3*c'* exposing the electrode pads 1*b'*, and elastomer protruding parts 3*b'* (elastic structure protruding parts) which protrude beyond these openings 3*c'* and the semiconductor chip 1'.

Hence, when the elastomer 3' is attached to the thin film wiring substrate 4', the positions of the two openings 4*e'* and 3*c'* in these members can be aligned.

The elastomer protruding parts 3*b'* of the eleventh embodiment are provided around the whole periphery of the elastomer 3'.

The resin sealing 28' (FIG. 85) in the CSP16' according to the eleventh embodiment is identical to the resin sealing 28' according to the seventh embodiment.

The elastomer protruding parts 3*b'* which are provided in the elastomer 3' beyond the openings 3*c'* have the additional effect of a dam preventing flow of sealing resin.

Therefore in the CSPI6' according to the eleventh embodiment, the substrate protruding parts 4*b'* of the thin film wiring substrate 4' and the elastomer protruding parts 3*b'* laminated on them may be simultaneously cut in the cutting step 33' shown in FIG. 85, so the chip package may be made compact.

Specifically, the contour of the thin film wiring substrate 4' and elastomer 3' are cut to effectively the same size in the cutting step 33'.

Further in the CSP16', as the sealing parts 5' formed by the resin sealing 28' are not cut in the cutting step 33', a sealing resin comprising 50 weight percent or more of silica may be used.

The remaining features of the construction of the CSP16' according to the eleventh embodiment and of its method of manufacture are identical to those of the CSP12' of the seventh embodiment, so their description will not be repeated.

The advantages of the CSP16' of the eleventh embodiment and its method of manufacture are as follows.

In the CSP16', leakage of sealing resin during the resin sealing step 28' is prevented by the elastomer protruding parts 3*b'* provided in the elastomer 3'.

As the elastomer protruding parts 3*b'* are provided around the whole periphery of the elastomer 3', leakage of sealing resin may be prevented over the whole of the substrate protruding parts 4*b'* of the thin film wiring substrate 4'.

There is therefore no need to cut the sealing resin in the cutting step 33', and the contour of the CSP16' may be made compact.

Further as sealing resin is not cut in the cutting step 33', a sealing resin comprising 50 weight percent or more of silica may be used.

The contraction factor of the sealing resin in the resin material cure bake step 29' shown in FIG. 85 is thereby reduced, and residual stress in the sealing resin is reduced.

The remaining advantages of the CSP16' according to the eleventh embodiment and of its method of manufacture are identical to those of the CSP12' of the seventh embodiment, so their description will not be repeated.

Embodiment 12

Figure 105:
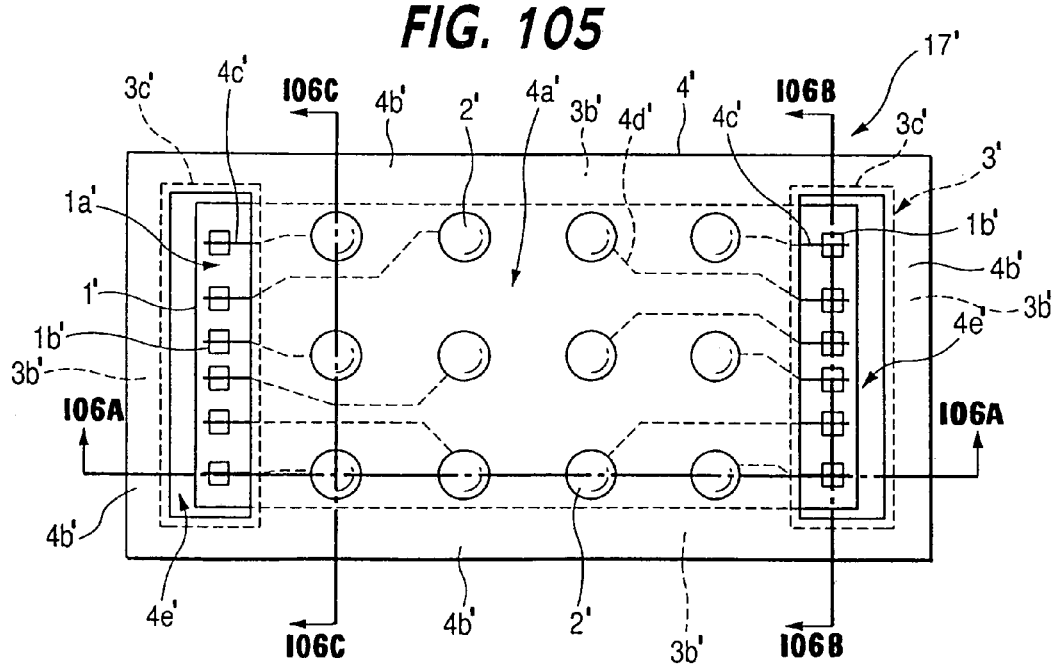
FIG. 105 is a plan view showing an example of a structure of a semiconductor device (CSP) according to an Embodiment 12 of the present invention through the sealing parts.

FIG. 105 is a plan view through the sealing parts of a typical structure of a semiconductor device (CSP) according to a twelfth embodiment of this invention. FIGS. 106(*a*) to 106(*c*) are diagrams showing the structure of the semiconductor device shown in FIG. 105. FIG. 106(*a*) is a cross-sectional view through a line 106A-106A in FIG. 105, FIG. 106(*b*) is a cross-sectional view through a line 106B-106B in FIG. 105, FIG. 106(*c*) is a cross-sectional view through a line 106C-106C in FIG. 105.

Figure 104A:
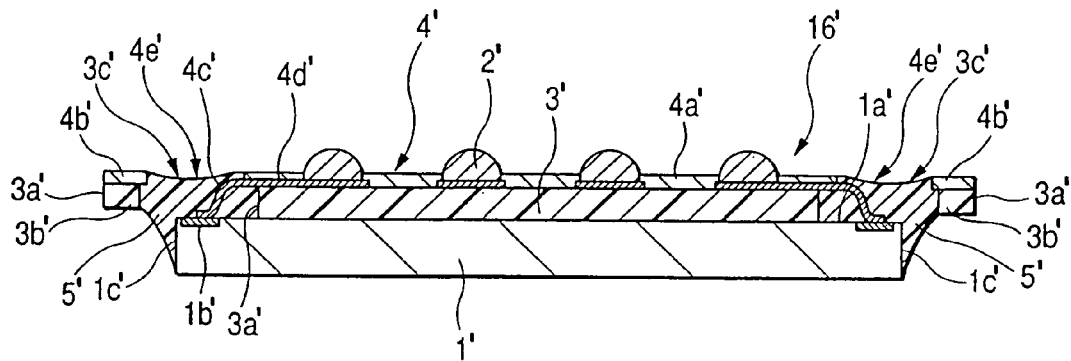
Figure 104B:
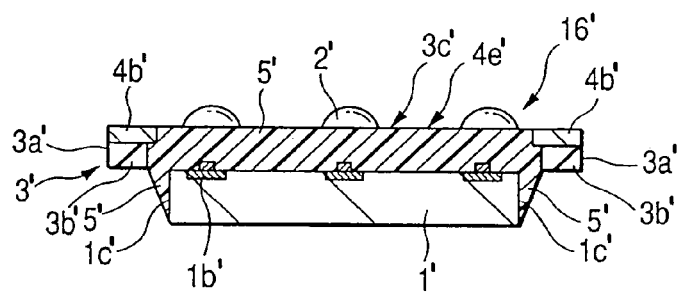
Figure 104C:
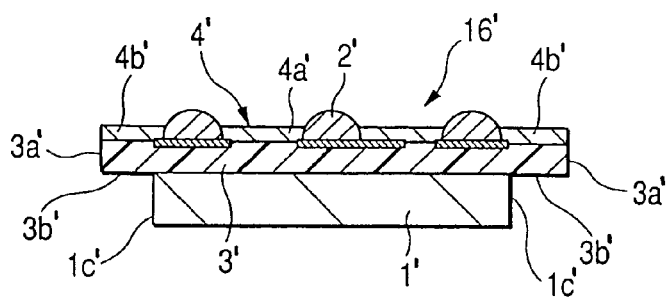

A CSP17' (semiconductor device) according to the twelfth embodiment is a peripheral pad fan-in CSP as is the CSP16' of the eleventh embodiment shown in FIG. 103 and FIG. 104. It has a substantially identical structure to that of the CSP16'; however, a difference from the CSP16' of the eleventh embodiment is that the elastomer 3' is made sufficiently thick when the CSP17' is assembled that the four side walls 1*c'* of the semiconductor chip 1' are surrounded by the elastomer protruding parts 3*c'* of the elastomer 3', as shown in FIGS. 106(*a*), 106(*b*), 106(*c*).

In the CSP17, as the elastomer 3' is made thick, the elastomer 3' can be formed of a porous fluoride resin.

Therefore, in the CSP17' according to the seventh embodiment, the semiconductor chip 1' is attached so that the peripheral side faces 1*c'* are surrounded only by the elastomer protruding parts 3*b'* (elastic structure protruding parts) of the elastomer 3', as shown in FIG. 106(*c*).

Figure 107:
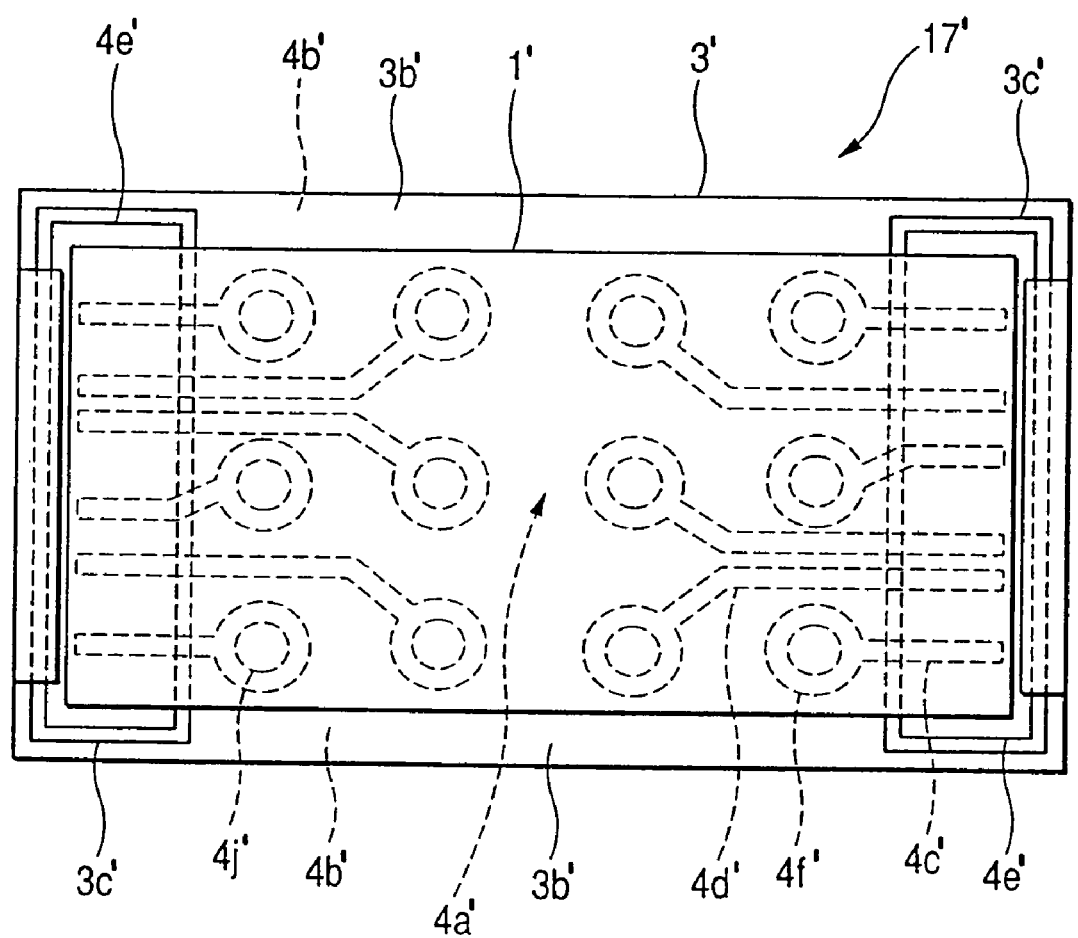
FIG. 107 is a view of a base surface showing the under surface of the semiconductor device (CSP) shown in FIG. 105.

FIG. 107 shows the layout of the wiring 4*d'* in the CSP17'.

The method of attaching (fixing) the semiconductor chip 1' shown in FIG. 106(*c*) will now be described.

To perform the chip attachment 24' shown in FIG. 85, the semiconductor chip 1' is pushed into the elastomer 3' by making use of the fact that the elastomer 3' is a porous fluoride resin.

As the elastomer 3' is a porous fluoride resin, it can be easily depressed under a comparatively small load.

The thickness of the elastomer 3' directly underneath the semiconductor chip 1' can therefore be made much smaller than the thickness of the outer periphery of the semiconductor chip 1'.

As a result, the semiconductor chip 1' can be formed into a structure wherein the side faces 1*c'* on the outer periphery are surrounded by the elastomer protruding parts 3*b'* formed all around the periphery.

Sealing resin is then applied through the openings 4*e'* of the thin film wiring substrate 4' and the openings 3*c'* of the elastomer 3' so as to form the sealing parts 5' at both ends of the semiconductor chip 1'.

Therefore in the CSP17', by pressing the semiconductor chip 1' into the elastomer 3', the region near the center of the opposite side faces 1c' in the longitudinal direction of the semiconductor chip 1' is covered by the elastomer protruding parts 3b' of the elastomer 3' without sealing using sealing resin, as shown in FIG. 106(c).

The remaining features of the construction of the CSP17' according to the twelfth embodiment and of its method of manufacture are identical to those of the CSP16' of the eleventh embodiment, so their description will not be repeated.

The advantages of the CSP17' of the seventh embodiment and its method of manufacture are as follows.

In the CSP17', as the elastomer 3' is a porous fluoride resin, and as the thickness of the elastomer 3' directly underneath the semiconductor chip 1' can be made much smaller than that of the outer periphery of the semiconductor chip 1', the semiconductor chip 1' can be attached so that the side faces 1c' on the outer periphery of the semiconductor chip 1' are surrounded by the elastomer protruding parts 3b'.

Hence, flow of sealing resin to the outside during the resin sealing step 28' of FIG. 85 is prevented by the elastomer protruding parts 3b' and it is unnecessary to cut the sealing resin, so the CSP17' may be made compact.

The remaining advantages of the CSP17' according to the seventh embodiment and its method of manufacture are identical to those of the CSP16' of the eleventh embodiment, so their description will not be repeated.

Embodiment 13

Figure 109:
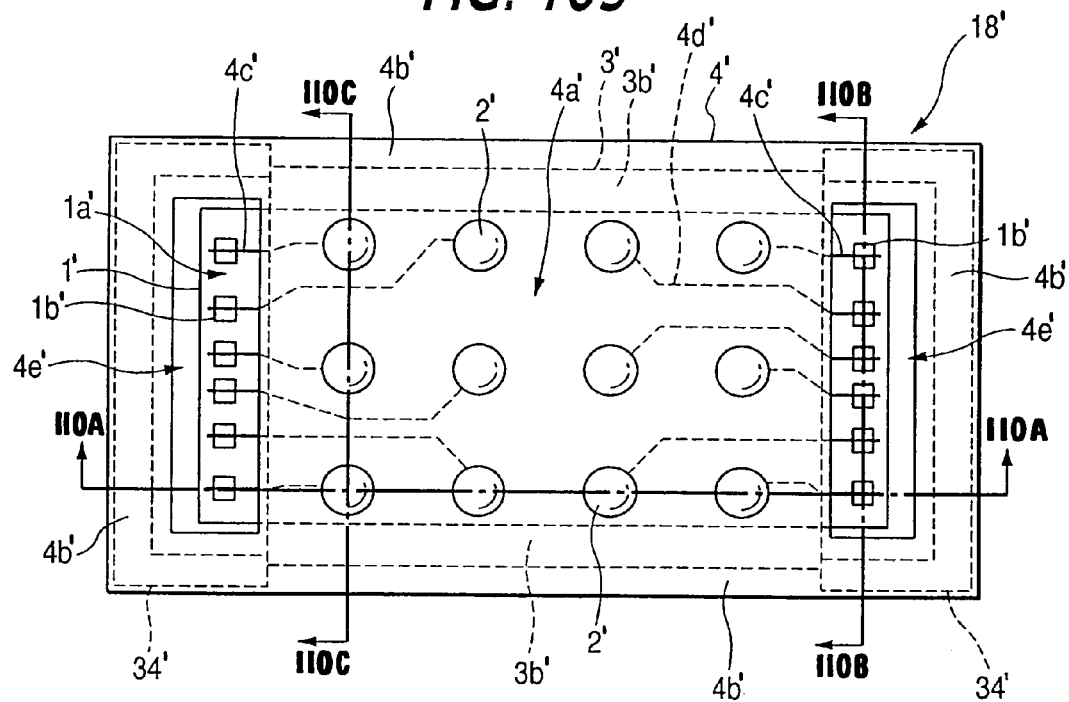
FIG. 109 is a plan view showing an example of a structure of a semiconductor device (CSP) according to an Embodiment 13 of the present invention through the sealing parts.
Figure 110A:
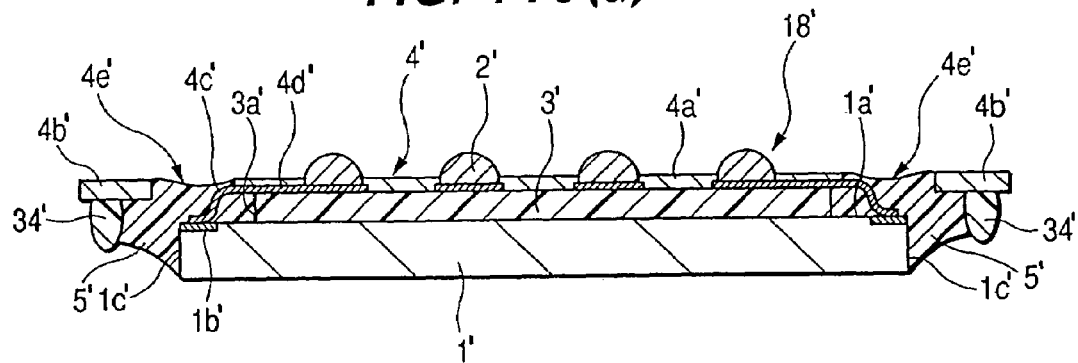
Figure 110B:
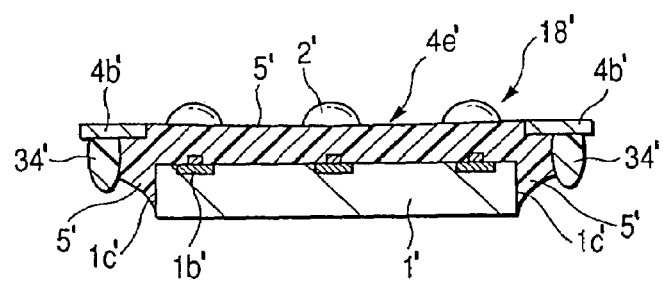
Figure 110C:
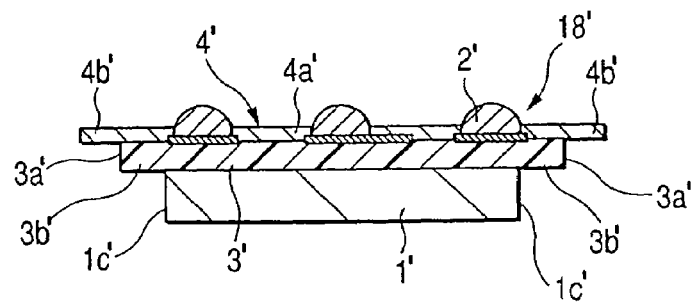

FIG. 109 is a plan view through the sealing parts of a typical structure of a semiconductor device (CSP) according to a thirteenth embodiment of this invention. FIGS. 110(a) to 110(c) are diagrams showing the structure of the semiconductor device shown in FIG. 109. FIG. 110(a) is a cross-sectional view through a line 110A-110A in FIG. 109, FIG. 110(b) is a cross-sectional view through a line 110B-110B in FIG. 109, FIG. 110(c) is a cross sectional view through a line 110C-110C in FIG. 109.

A CSP18' (semiconductor device) according to the thirteenth embodiment is a peripheral pad fan-in CSP as is the CSP12' of the seventh embodiment shown in FIG. 95. It has a substantially identical structure to that of the CSP12'; however, a difference from the CSP12' of the second embodiment is that open rectangular dam pieces 34' are provided around the openings 4e' on the surfaces of the substrate protruding parts 4b' of the thin film wiring substrate 4' on the chip mounting side to prevent leakage of sealing resin in the resin sealing step 28' (FIG. 85).

These dam pieces 34' are formed by hardening an epoxy coating resin or the like.

In the CSP18', as the sealing parts 5' formed in the resin sealing step 28' are not cut during the cutting 33' (FIG. 85), a sealing resin comprising 50 weight percent or more of silica can be used as sealing material.

Also, in the CSP18', the two opposite side faces 1c' parallel to the longitudinal direction of the semiconductor chip 1' are not sealed and are exposed.

The remaining features of the construction of the CSP18' according to the thirteenth embodiment and of its method of manufacture are identical to those of the CSP12' of the seventh embodiment, so their description will not be repeated.

The advantages of the CSP18' of the thirteenth embodiment and its method of manufacture are as follows.

In the CSP18', as the dam pieces 34' are provided in the substrate protruding parts 4b' of the thin film wiring substrate 4' to prevent leakage of sealing resin in the resin sealing step 28', the sealing resin need not be cut, and the contour of the CSP18' can be made compact.

Further, as sealing resin is not cut in the cutting step 33', a sealing resin comprising 50 weight percent or more of silica may be used.

The contraction factor of the sealing resin in the resin material cure bake step 29' shown in FIG. 85 is thereby reduced, and residual stress in the sealing resin is reduced.

The remaining advantages of the CSP18' according to the thirteenth embodiment and its method of manufacture are identical to those of the CSP12' of the seventh embodiment, so their description will not be repeated.

Embodiment 14

Figure 111:
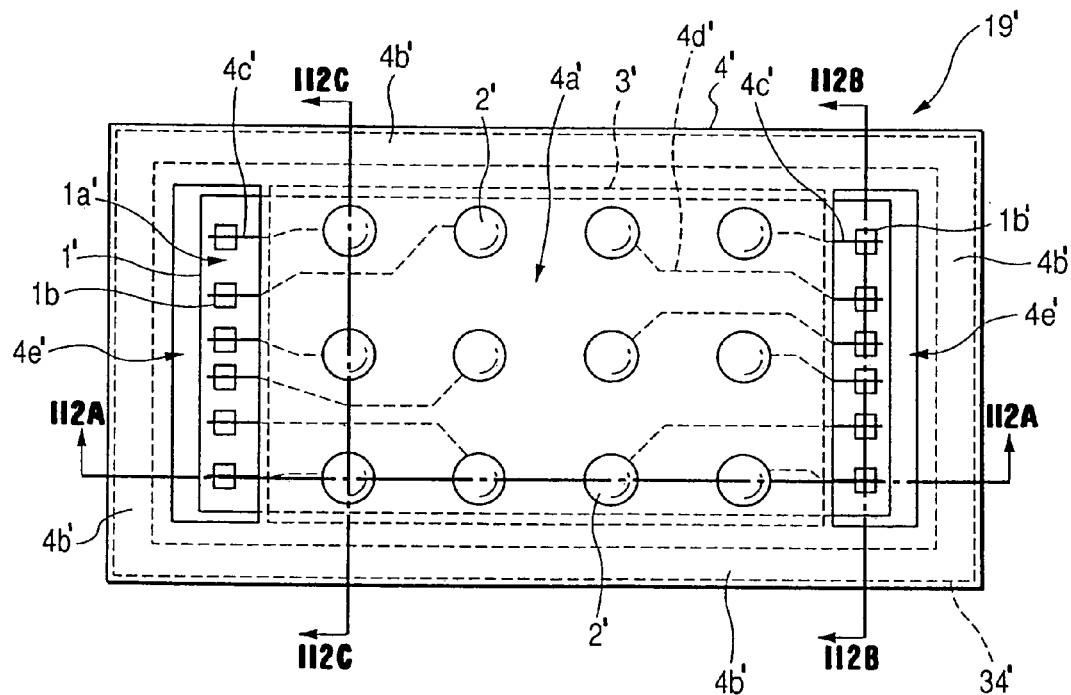
FIG. 111 is a plan view showing an example of a structure of a semiconductor device (CSP) according to an Embodiment 14 of the present invention through the sealing parts.
Figure 112A:
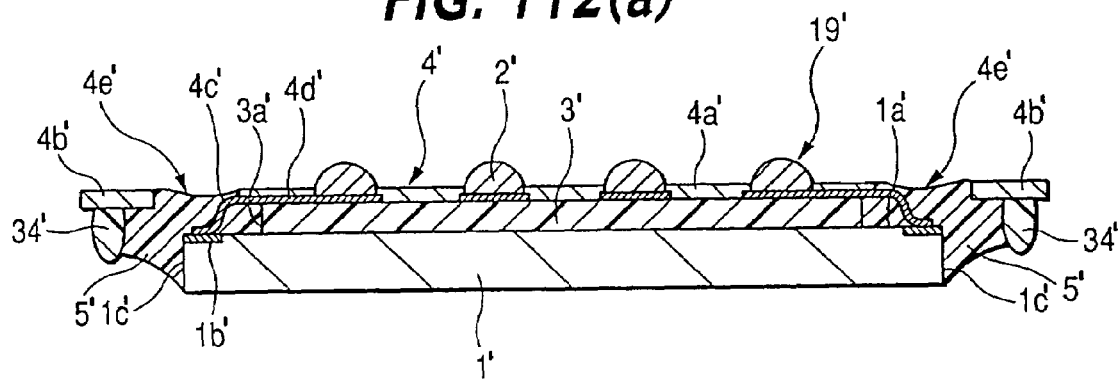
Figure 112B:
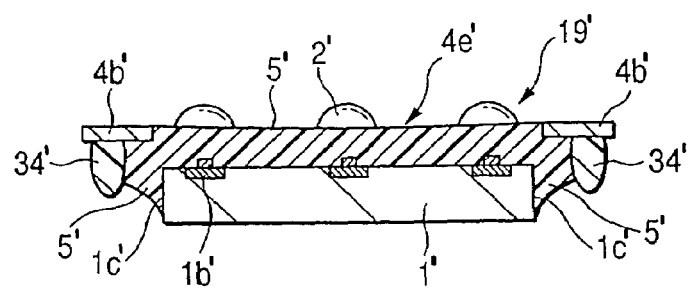
Figure 112C:
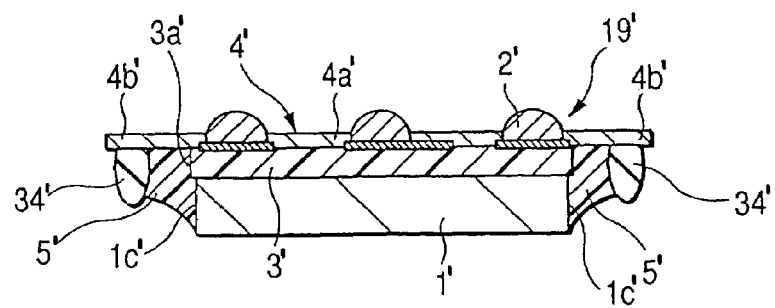

FIG. 111 is a plan view through the sealing parts of a typical structure of a semiconductor device (CSP) according to a fourteenth embodiment of this invention. FIGS. 112(a) to 121(c) are diagrams showing the structure of the semiconductor device shown in FIG. 111. FIG. 112(a) is a cross-sectional view through a line 112A-112A in FIG. 111, FIG. 112(b) is a cross-sectional view through a line 112B-112B in FIG. 111, FIG. 112(c) is a cross-sectional view through a line 112C-112C in FIG. 111.

A CSP19' (semiconductor device) according to the fourteenth embodiment is a peripheral pad fan-in CSP as is the CSP18' of the eighth embodiment shown in FIG. 109. It has a substantially identical structure to that of the CSP18', however a difference from the CSP18' of the thirteenth embodiment is that the dam pieces 34' provided on the surfaces of the substrate protruding parts 4b' of the thin film wiring substrate 4' on the chip mounting side, are formed in the shape of a frame surrounding the entire periphery of the substrate protruding parts 4b'.

The elastomer 3' in the CSP19' according to the fourteenth embodiment does not therefore comprise the elastomer protruding parts 3b' (FIG. 109).

As the dam pieces 34' are formed in the shape of a frame over the whole outer periphery of the substrate protruding parts 4b', in the CSP19' according to the fourteenth embodiment, the resin sealing 28' is performed over all the four side faces 1c' of the semiconductor chip 1'.

The remaining features of the construction of the CSP14' according to the fourteenth embodiment and of its method of manufacture are identical to those of the CSP13' of the eighth embodiment, so their description will not be repeated.

The advantages of the CSP14' of the ninth embodiment and its method of manufacture are as follows.

In the CSP19', as all of the surfaces of the elastomer 3' are covered, the same advantages as when the side faces 3a' of the elastomer 3' are exposed cannot be obtained. However as all of the side faces 1c', 3a' of the semiconductor chip 1' and elastomer 3' are covered so as to form the sealing parts 5', and all of the peripheral sealing parts 5' are directly joined to the substrate protruding parts 4b' of the thin film wiring substrate 4', the seal properties (humidity resistance) of the semiconductor chip 1' are improved.

The remaining advantages of the CSP19' according to the fourteenth embodiment and its method of manufacture are identical to those of the CSP18' of the thirteenth embodiment, so their description will not be repeated.

Embodiment 15

Figure 113:
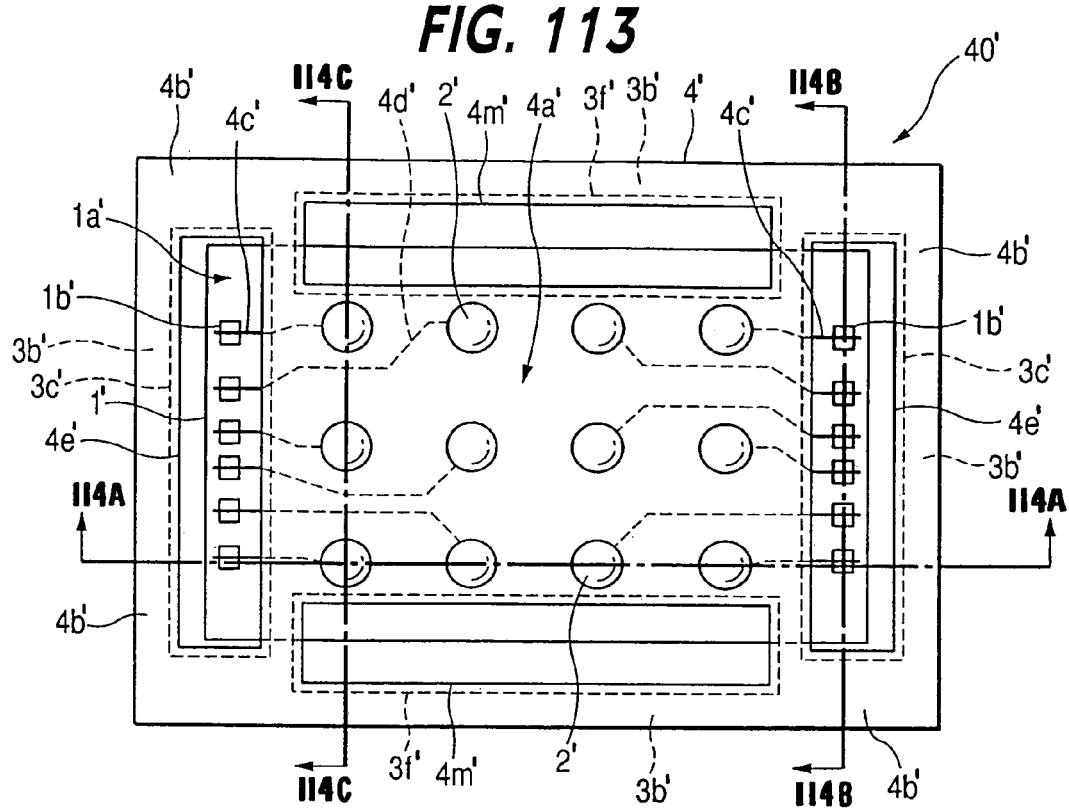
FIG. 113 is a plan view showing an example of a structure of a semiconductor device (CSP) according to an Embodiment 15 of the present invention through the sealing parts.
Figure 114A:
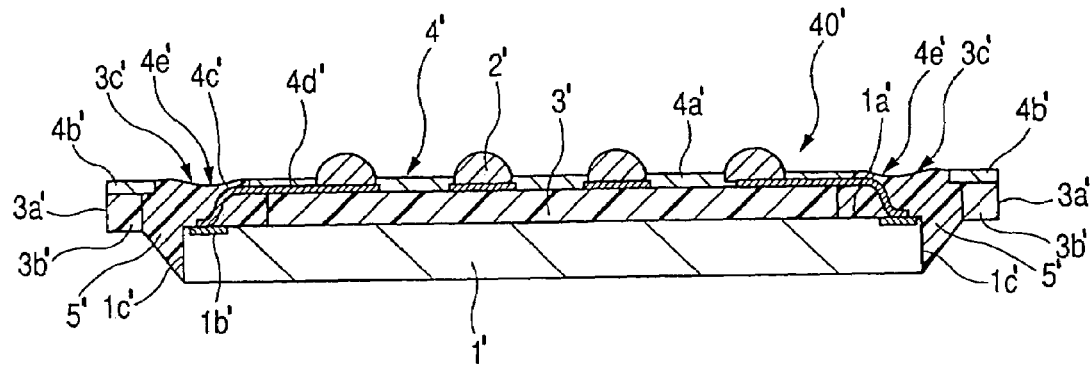
Figure 114B:
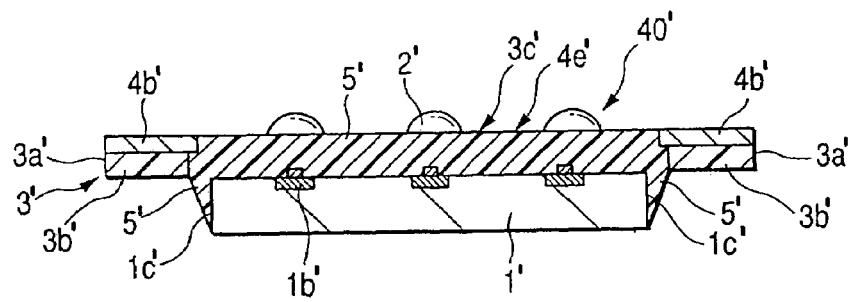
Figure 114C:
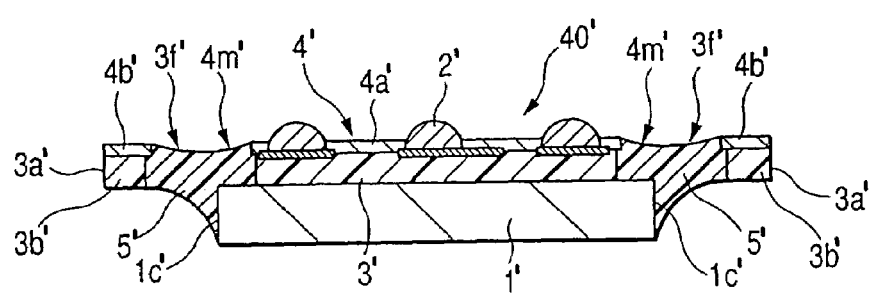

FIG. 113 is a plan view through the sealing parts of a typical structure of a semiconductor device (CSP) according to a fifteenth embodiment of this invention. FIGS. 114(a) to 114(c) are diagrams showing the structure of the semiconductor device shown in FIG. 113. FIG. 114(a) is a cross-sectional view through a line 114A-114A in FIG. 113, FIG. 114(b) is a cross-sectional view through a line 114B-114B in FIG. 113, FIG. 114(c) is a cross-sectional view through a line 114C-114C in FIG. 113.

A CSP40' (semiconductor device) according to the embodiment is a peripheral pad fan-in CSP as is the CSP16' of the eleventh embodiment shown in FIG. 103. It has a substantially identical structure to that of the CSP16', however a difference from the CSP16' of the eleventh embodiment is that seal openings 4m', 3f are provided at positions corresponding to the two opposite side faces 1c' in the longitudinal direction of the semiconductor chip 1' (FIG. 114(c)) in the substrate protruding parts 4b' of the thin film wiring substrate 4' and in the elastomer protruding parts 3b' of the elastomer 3' in addition to the openings 4e' exposing the electrode pads 1b', as shown in FIG. 113.

Specifically, the two opposite openings 4e' and the two opposite openings 3c' are provided at positions exposing the electrode pads 1b' on both sides of the semiconductor chip 1', the two seal openings 4m' and the two seal openings 3f are provided at opposite positions in a direction at right angles to the openings 4e', 3c', and the thin film wiring substrate 4' and elastomer 3' are formed in substantially the same shape.

Hence, when the resin sealing 28' shown in FIG. 85 is performed, sealing resin can be applied through the openings 4e', the openings 3c', the seal openings 4m' and the seal openings 3f from the top surface of the thin film wiring substrate 4'.

Therefore, the four side faces 1c' of the semiconductor chip 1' can be covered by sealing resin by this bonding method.

Further, as the elastomer 3' comprises the elastomer protruding parts 3b' which protrude beyond the four sides of the semiconductor chip 1', the resin sealing 28' can be performed on all the four side faces 1c' of the semiconductor chip 1'.

The remaining features of the construction of the CSP40' according to the fifteenth embodiment and of its method of manufacture are identical to those of the CSP16' of the eleventh embodiment, so their description will not be repeated.

The advantages of the CSP40' of the fifteenth embodiment and of its method of manufacture are as follows.

In the CSP40', as all the four side faces 1c' of the semiconductor chip 1' are sealed, the seal properties (humidity resistance) of the semiconductor chip 1' are improved.

Also, as leakage of sealing resin in the resin sealing step 28' is prevented by the elastomer protruding parts 3b', sealing resin is not cut in the cutting step 33', and the contour of the CSP40' can be made compact.

As sealing resin can be applied to four positions, i.e. one of the openings 3c', one of the openings 4e', the seal opening 3f and the seal opening 4m', from the same direction, the sealing step is made easier and productivity is improved.

The remaining advantages of the CSP40' according to the fifteenth embodiment and of its method of manufacture are identical to those of the CSP16' of the eleventh embodiment, so their description will not be repeated.

Embodiment 16

Figure 115:
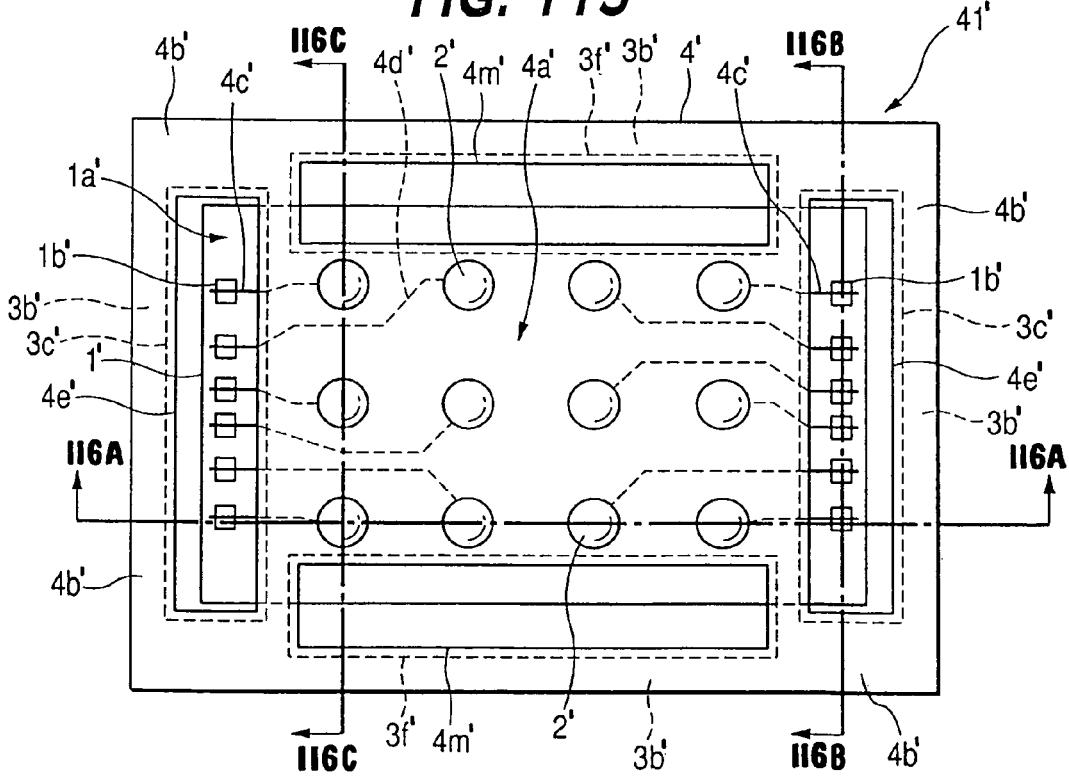
FIG. 115 is a plan view showing an example of a structure of a semiconductor device (CSP) according to an Embodiment 16 of the present invention through the sealing parts.
Figure 116A:
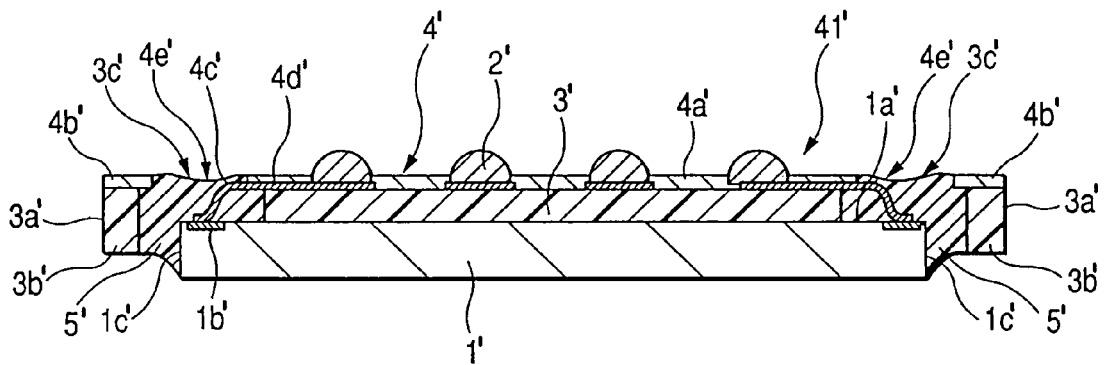
Figure 116B:
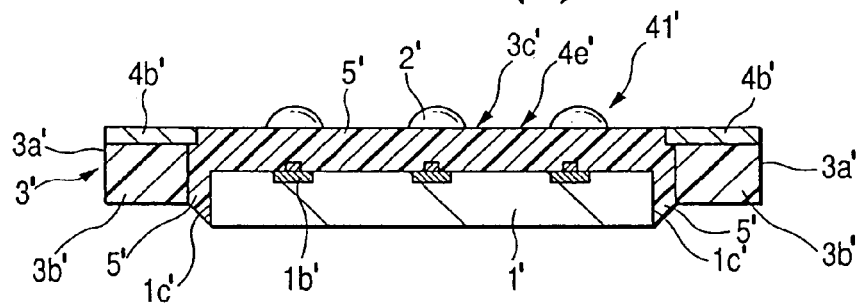
Figure 116C:
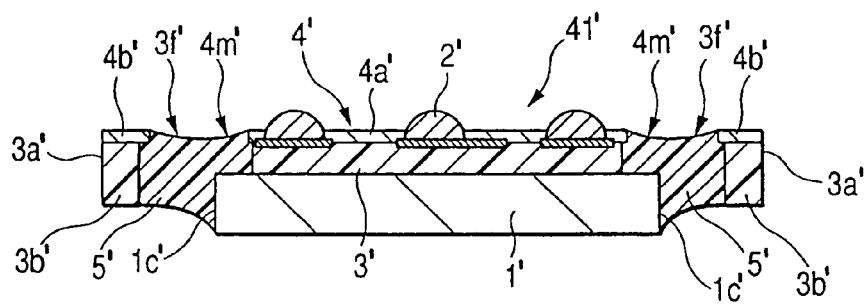

FIG. 115 is a plan view through the sealing parts of a typical structure of a semiconductor device (CSP) according to a sixteenth embodiment of this invention. FIGS. 116(a) to 116(c) are diagrams showing the structure of the semiconductor device shown in FIG. 115. FIG. 116(a) is a cross-sectional view through a line 116A-116A in FIG. 115, FIG. 116(b) is a cross-sectional view through a line 116B-116B in FIG. 115, FIG. 116(c) is a cross-sectional view through a line 116C-116C in FIG. 115.

A CSP41' (semiconductor device) according to the eleventh embodiment is a peripheral pad fan-in CSP as is the CSP40' of the fifteenth embodiment shown in FIG. 113. It has a substantially identical structure to that of the CSP40'; however, a difference from the CSP40' of the fifteenth embodiment is that when the CSP41' is assembled, the elastomer 3' is formed sufficiently thicker than the elastomer 3' of the CSP40' to the extent that the four side faces 1c' of the semiconductor chip 1' are surrounded by the protruding parts 3b' of the elastomer 3' via the sealing parts 5', as shown in FIG. 116.

In the CSP41', the elastomer 3' is formed of a porous fluoride resin so that it can be formed thick.

Hence, in the CSP41' of the sixteenth embodiment, the semiconductor chip 1' is attached so that the outer side faces 1c' on its outer periphery are surrounded by the elastomer protruding parts 3b' of the elastomer 3' via the sealing parts 5', as shown in FIG. 116(c).

Herein, the method of attaching (fixing) the semiconductor chip 1' shown in FIG. 116(c) will be described.

To perform the chip attachment step 24' shown in FIG. 85, the semiconductor chip 1' is pushed into the elastomer 3' by making use of the fact that the elastomer 3' is a porous fluoride resin.

As the elastomer 3' is a porous fluoride resin, it can be easily depressed under a comparatively small load.

The thickness of the elastomer 3' directly underneath the semiconductor chip 1' can, therefore, be made much smaller than the thickness of the outer periphery of the semiconductor chip 1'.

As a result, the semiconductor chip 1' can be formed into a structure wherein the side faces 1c' on the outer periphery are surrounded by the elastomer protruding parts 3b' formed all around the periphery.

Sealing resin is then applied through the openings 4e' of the thin film wiring substrate 4' and the openings 3c' of the elastomer 3', and through the seal openings 4m' of the thin film wiring substrate 4' and the seal openings 3f of the elastomer 3'.

The sealing parts 5' are thereby formed as a bridge between the periphery of the main surface 1a of the semiconductor chip 1' and the four side faces 1c', and between the substrate protruding parts 4b', elastomer protruding parts 3b' and semiconductor chip 1'.

The remaining features of the construction of the CSP41' according to the sixteenth embodiment and of its method of manufacture are identical to those of the CSP40' of the fifteenth embodiment, so their description will not be repeated.

The advantages of the CSP41' of the sixteenth embodiment and its method of manufacture are as follows.

In the CSP41', as the elastomer 3' is a porous fluoride resin, and as the thickness of the elastomer 3' directly underneath the semiconductor chip 1' can be made much smaller than that of the outer periphery of the semiconductor chip 1', the semiconductor chip 1' can be attached so that the side faces 1c' on the outer periphery of the semiconductor chip 1' are surrounded by the elastomer protruding parts 3b'.

Hence, flow of sealing resin to the outside during the resin sealing step 28' of FIG. 85 is prevented by the elastomer protruding parts 3b' and it is unnecessary to cut the sealing resin, so the CSP41' may be made compact.

The remaining advantages of the CSP41' according to the sixteenth embodiment and its method of manufacture are identical to those of the CSP40' of the fifteenth embodiment, so their description will not be repeated.

Embodiment 17

Figure 118A:
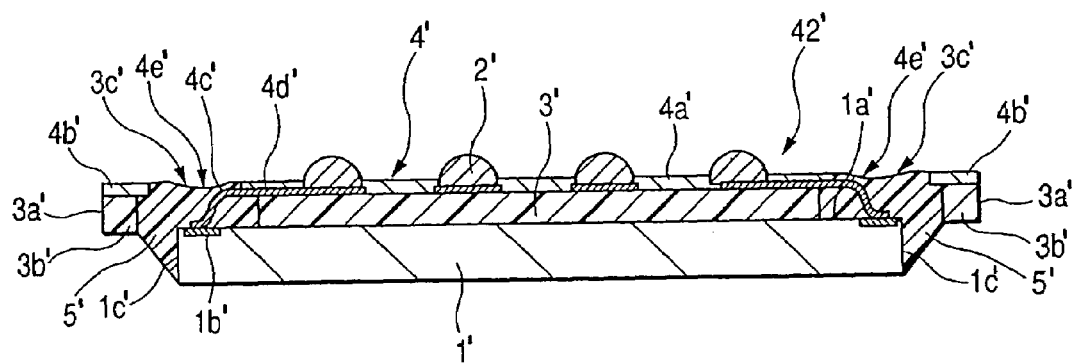
Figure 118B:
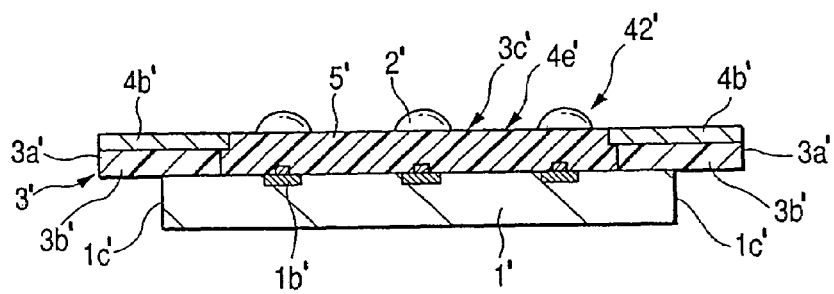
Figure 118C:
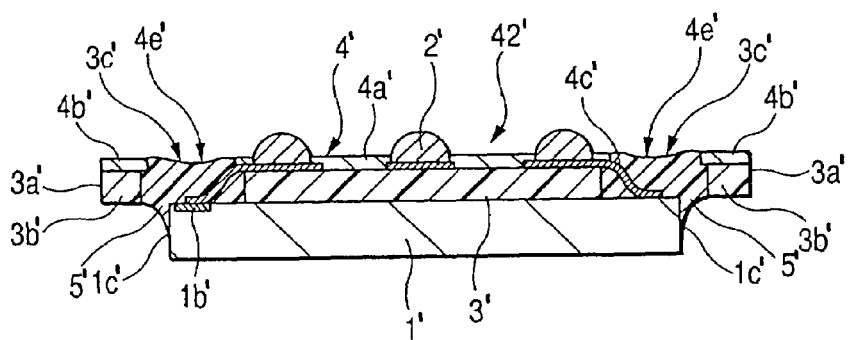

FIG. 117 is a plan view through the sealing parts of a typical structure of a semiconductor device (CSP) according to a seventeenth embodiment of this invention. FIGS. 118(a) to 118(c) are diagrams showing the structure of the semiconductor device shown in FIG. 117. FIG. 118(a) is a cross-sectional view through a line 118A-118A in FIG. 117, FIG. 118(b) is a cross-sectional view through a line 118B-118B in FIG. 117, FIG. 118(c) is a cross-sectional view through a line 118C-118C in FIG. 117.

A CSP42' (semiconductor device) according to the seventeenth embodiment is a peripheral pad fan-in CSP as is the CSP40' of the fifteenth embodiment shown in FIG. 113. It has a substantially identical structure to that of the CSP40'; however, a difference from the CSP40' of the fifteenth embodiment is that the electrode pads 1b' are formed on the periphery of the four sides of the main surface 1a' of the semiconductor chip 1'.

As the four openings 4e' and four openings 3c' are respectively formed in the thin film wiring substrate 4' and elastomer 3' at corresponding identical positions, the electrode pads 1b' on the four sides of the semiconductor chip 1' can be exposed by these openings 4e', 3c'.

Sealing resin is applied through these four holes 4e', 3c' in the resin sealing step 28' so as to form the sealing parts 5' around the four openings 4e', 3c'.

The remaining features of the construction of the CSP42' according to the seventeenth embodiment and of its method of manufacture are identical to those of the CSP40' of the fifteenth embodiment, so their description will not be repeated.

The advantages of the CSP42' of the seventeenth embodiment and its method of manufacture are as follows.

In the CSP42', even when the electrode pads 1b' are provided on the periphery of the four sides of the main surface 1a' of the semiconductor chip 1', the four openings 4e' and the four openings 3c' are respectively formed in the thin film wiring substrate 4' and elastomer 3'. Therefore, by performing the resin sealing 28' through the four openings 4e' and the four openings 3c', the humidity resistance is made more reliable, and a compact CSP42' can be obtained.

The remaining advantages of the CSP42' according to the seventeenth embodiment and its method of manufacture are identical to those of the CSP40' of the fifteenth embodiment, so their description will not be repeated.

Embodiment 18

FIG. 119 is a plan view through the sealing parts of a typical structure of a semiconductor device (CSP) according to an eighteenth embodiment of this invention. FIGS. 120(a) to 120(c) are diagrams showing the structure of the semiconductor device shown in FIG. 119. FIG. 120(a) is a cross-sectional view through a line 120A-120A in FIG. 119, FIG. 120(b) is a cross-sectional view through a line 120B-120B in FIG. 119, FIG. 120(c) is a cross-sectional view through a line 120C-120C in FIG. 119.

A CSP43' (semiconductor device) according to the eighteenth embodiment is a peripheral pad fan-in CSP as is the CSP17' of the twelfth embodiment shown in FIG. 105. It has a substantially identical structure to that of the CSP17'; however, a difference from the CSP17' of the twelfth embodiment is that the electrode pads 1b' are provided on the peripheries of the four sides of the main surface 1a' of the semiconductor chip 1'.

Therefore, the four openings 4e' and the four openings 3c' are formed at corresponding positions in the thin film wiring substrate 4' and the elastomer 3' so that the electrode pads 1b' on the four sides of the semiconductor chip 1' are exposed.

Sealing resin is then applied via the four openings 4e' and the four openings 3c' in the resin sealing step 28' so as to form the sealing parts 5' in the four openings 4e', 3c'.

The remaining features of the construction of the CSP43' according to the eighteenth embodiment and of its method of manufacture are identical to those of the CSP17' of the twelfth embodiment, so their description will not be repeated.

The advantages of the CSP43' of the eighteenth embodiment and of its method of manufacture are as follows.

In the CSP43', by forming the four openings 4e' and the four openings 3c' respectively in the thin film wiring substrate 4' and the elastomer 3', a compact CSP43' having improved humidity resistance can be obtained even if the electrode pads 1b' are provided on the peripheries of the four sides of the main surface 1a' of the semiconductor chip 1'.

As the sealing resin can be applied to all of the four openings 4e', 3c' from the same direction in the resin sealing step 28', the sealing step is made easier and productivity is improved.

Further, as the four side faces 1c' of the semiconductor chip 1' are sealed by the elastomer protruding parts 3b' or the sealing parts 5', the seal properties (humidity resistance) of the semiconductor chip 1' are improved.

The remaining advantages of the CSP43' according to the eighteenth embodiment and of its method of manufacture are identical to those of the CSP17' of the twelfth embodiment, so their description will not be repeated.

Embodiment 19

FIGS. 121(a) to 121(c) are diagrams of a typical structure of the unconnected lead of a semiconductor device according to a nineteenth embodiment of this invention. FIG. 121(a) is a cross-sectional view when the unconnected lead is bent, FIG. 121(b) and FIG. 121(c) are cross-sectional views when the unconnected lead is not bent.

According to the nineteenth embodiment, the semiconductor device (CSP) shown in Embodiments 6 to 18 has an unconnected lead 35' (one of the leads 4c' which is not connected to the electrode pads 1b' of the semiconductor chip 1'). This unconnected lead 35' may or may not be bent.

Due to the unconnected lead 35', the mode of the CSP can be changed over to change over functions, and different wiring configurations 4d' can be set up by selecting either a connection or no connection for each of the leads 4c' for the same wiring pattern.

Therefore, if no connection is selected for the lead 4c', i.e., for the unconnected lead 35', no connection of any kind is performed by the bonding tool (FIG. 94) in the bonding step.

The CSP17' shown in Embodiment 12 will be taken as an example to describe the unconnected lead 35' shown in FIG. 121.

It will, however, be understood that the same features can be applied not only to the twelfth embodiment, but to any of the sixth to eighteenth embodiments.

In the CSP17' shown in FIG. 121(a), the unconnected lead 35' is bent towards the electrode pad 1b' of the semiconductor chip 1'.

In this process, instead of making a connection with the bonding tool 7' in the bonding step, the lead 4c' is pressed down by the bonding tool 7' (i.e. in the direction of the main surface 1a' of the semiconductor chip 1') to the extent that it does not touch the electrode pad 1b'.

In both FIGS. 121(b) and (c), the unconnected lead 35' is not bent.

The CSP17' shown in FIG. 121(b) represents a state where the unconnected lead 35', which is not bent, is enclosed inside the sealing part 5'.

The CSP17 shown in FIG. 121(c) represents a state where the tip of the unconnected lead 35', which is not bent, protrudes beyond the sealing part 5'. As the surface of the sealing part 5' is somewhat depressed when the sealing resin is cured, the unconnected lead 35' is left projecting.

From the viewpoint of sealing properties, when the semiconductor device (CSP) comprises the unconnected lead 35', it is desirable that the unconnected lead 35' is bent in the direction of the main surface of the semiconductor chip 1' as shown in FIG. 121(a), but it is not absolutely necessary to bend it and it may be unbent as shown in FIGS. 121(b), 121(c).

The remaining features of the construction of the semiconductor device (CSP) according to the nineteenth embodiment are identical to those of the sixth to eighteenth embodiments, so their description will not be repeated.

The CSP does not necessarily comprise the unconnected lead 35' described in the nineteenth embodiment, this unconnected lead 35' being used depending on the function of the CSP.

It will be understood that the unconnected lead can also be used not only in the twelfth embodiment, but also in any of the sixth to eighteenth embodiments, although not limited thereto.

Next, the effect obtained by the semiconductor device (CSP) according to the nineteenth embodiment will be described.

In the CSP, a desired circuit can be constructed by selecting the connected/unconnected leads 4c' using a common pattern, so it is unnecessary to provide separate wiring patterns for each product. Hence, common parts may be used for different CSPs, and, as a result, the CSP can be manufactured at lower cost.

When the CSP has the unconnected lead 35', by bending the unconnected lead 35' towards the electrode pad 1b' of the semiconductor chip 1', the unconnected lead 35' is not left exposed outside the sealing part 5' after resin sealing, so humidity resistance is improved. Also, by bending the unconnected lead 35' towards the electrode pad 1b' of the semiconductor chip 1', the unconnected lead 35' can be firmly sealed inside the sealing part 5' even when the surface of the sealing part 5' is depressed.

This reduces the limitations on the sealing resin and increases the number of sealing resins that can be used.

Embodiment 20

FIGS. 122(a), 122(b), 122(c) are cross-sectional views showing a typical structure using a single layer surface wiring thin film wiring substrate in a semiconductor device according to a twentieth embodiment of this invention, and FIGS. 123(a), 123(b), 123(c) are cross-sectional views using a two-layer wiring thin film wiring substrate in a semiconductor device according to the twentieth embodiment of this invention.

First, whereas the wiring 4d' of the thin film wiring substrate 4' in the semiconductor device (CSP) according to the sixth to nineteenth embodiments was single layer wiring formed only on the reverse side of the tape base material (elastomer side), according to the twentieth embodiment, however, the thin film wiring substrate 4' is either single layer surface wiring wherein the wiring is formed only on the surface side of the tape (bump electrode side), or two layer wiring. This will now be described using the sixth embodiment (CSP11'), seventh embodiment (CSP12') and twelfth embodiment (CSP17') as examples.

First, FIG. 122 shows the case where the thin film wiring substrate 4' is a single layer surface wired. FIG. 122(a) shows the case where the external structure of the semiconductor device is that of the tape (e.g. the CSP 11' of the sixth embodiment). FIG. 122(b) shows the case where the external structure of the semiconductor device is that of a sealed contour (e.g. the CSP12' of the seventh embodiment) FIG. 122(c) shows the case where the external structure of the semiconductor device is that of the elastomer (e.g. the CSP17' of the twelfth embodiment).

Herein, the single layer surface wiring is the wiring 4d' formed on the top surface of the tape base material 4g' of the thin film wiring substrate 4', and a solder resist 4r' which is an insulating coating of approximately 10 to 30 μm thickness is formed at points excluding the bump lands 4f' on the tape base material 4g' (FIG. 108).

By using this single layer surface wiring, as the thickness of the solder resist 4r' is only 10 to 30 μm which is relatively thin, solder corrosion in the region of the joins of the bump lands of the bump electrodes 2' is suppressed, and unevenness in the attachment height of the bump electrodes 2' is reduced.

FIG. 123 shows the case where the thin film wiring substrate 4' has two layer wiring. FIG. 122(a) shows the case where the external structure of the semiconductor device is that of the tape (e.g. the CSP11' of the sixth embodiment). FIG. 122(b) shows the case where the external structure of the semiconductor device is that of a sealed contour (e.g. the CSP12' of the second embodiment). FIG. 122(c) shows the case where the external structure of the semiconductor device is that of the elastomer (e.g. the CSP17' of the twelfth embodiment).

In the case of two layer wiring, the wiring 4d' is formed on the top surface and reverse side of the tape base material 4g' of the thin film wiring substrate. The wiring 4d' of the top and reverse sides is electrically connected by through holes 4w', and a solder resist 4r' which is an insulating coating of approximately 10 to 30 μm thickness is formed at points excluding the bump lands 4f on the top surface of the tape base material 4g'.

The remaining features of the construction of the semiconductor device (CSP) according to the twentieth embodiment are identical to those of the sixth to nineteenth embodiments, so their description will not be repeated.

The CSP does not necessarily have both the single layer surface wiring and the two-layer wiring described in the twentieth embodiment, and may have only the single layer surface wiring. Also, it is understood that these features may be applied not only to the sixth, seventh and twelfth embodiments, but to any of the sixth to nineteenth embodiments.

According to the twentieth embodiment, even when the number of bump electrodes 2' increases and complex wiring has to be performed, the wiring 4d' is formed on the both the top and reverse sides of the tape base material 4g' via the through holes 4w' so that the complex wiring is possible. As a result, the CSP can be manufactured even when the number of bump electrodes 2' increases.

Embodiment 21

FIGS. 124(a), 124(b), 124(c), 124(d) are enlarged partial cross-sections showing an example of a lead tip processing sequence in a semiconductor device manufacturing method according to a twenty-first embodiment of this invention, as follows: FIG. 124(a) shows results before bonding, FIG. 124(b) shows results during bonding, FIG. 124(c) shows results after bonding, and FIG. 124(d) shows results after sealing.

FIGS. 125(a) to 125(c) and FIGS. 126(a) to 126(c) are enlarged partial cross-sections showing another example of a lead tip processing sequence in a method of manufacturing a semiconductor device for comparison with the lead tip processing shown in FIG. 124. The lead tip processing sequences thereof are as follows: (i) FIG. 125(a) shows results before bonding, FIG. 125(b) shows results during bonding, and FIG. 125(c) shows results after sealing; and (ii) FIG. 126(a) shows results before bonding, FIG. 126(b) shows results during bonding, and FIG. 126(c) shows results after sealing.

The twenty-first embodiment concerns the tip processing of the leads 4c' during bonding in the semiconductor device (CSP) shown in the sixth to twentieth embodiments. The twenty-first embodiment will be described using the CSP17' described in the twelfth embodiment, as an example.

First, in the comparative example shown in FIG. 125, as a distance P shown in FIG. 125(a) is relatively long, the bonding tool 7' is moved (lowered) to perform bonding as shown in FIG. 125(b), and then the resin sealing step 28' (FIG. 85) is performed to form the sealing part 5' as shown in FIG. 125(c) without tip processing of the leads 4c'. In this case, as the distance P shown in FIG. 125(a) is relatively long, the whole tip of the lead 4c' after bonding is completely enclosed within the sealing part 5', as shown in FIG. 125(c).

In the comparative example shown in FIG. 126, the distance P shown in FIG. 126(a) is relatively short. The bonding tool 7' is moved (lowered) to perform bonding as shown in FIG. 126(b) and the resin sealing step 28' (FIG. 85) is performed to form the sealing part 5' as shown in FIG. 125(c) without tip processing of the lead 4c'. In this case, as the distance P shown in FIG. 126(a) is relatively short, tip processing of the lead 4c' after bonding is not performed as shown in FIG. 126(b), so the tip of the lead 4c' after bonding protrudes beyond the sealing part 5' so that it is exposed as shown in FIG. 126(c).

On the other hand, in the CSP17' of the twenty-first embodiment shown in FIG. 124, the bonding tool 7' is lowered straight down toward the electrode pad 1b' of the semiconductor chip 1', and the electrode pad 1b' and the lead 4c' of the thin film wiring substrate 4' are then electrically connected by the pressing action of the bonding tool 7', as shown in FIG. 124(b). The bonding tool 7' is then moved in the direction of the tip of the lead 4c' (horizontal displacement) effectively parallel to the main surface 1a' of the semiconductor chip 1', as shown in FIG. 124(c). Specifically, after bonding, the pressure of the bonding tool 7' is removed, and the tip of the bonding tool 7' is displaced by a predetermined amount (e.g. 10 to 300 μm, but preferably 30 to 200 μm) in the direction of the tip of the lead 4c', then the resin sealing step 28' is performed so as to form the sealing part 5' as shown in FIG. 124(d). The splash angle near the tip of the lead 4c' can, therefore, be made small.

When the tip processing of the lead 4c' is performed, the bonding tool 7' may first be raised by a predetermined amount (e.g. 5 to 100 μm, but preferably 10 to 60 μm) at the same time as the pressure of the bonding tool 7' is removed, and then displaced horizontally by the predetermined amount (e.g. 10 to 300 μm, but preferably 30 to 200 μm) in the direction of the tip of the lead 4c'.

Regarding the tip processing of the lead 4c', the bonding tool 7' may be moved by the predetermined amount (e.g. 10 to 300 μm, but preferably 30 to 200 μm) in the direction of the tip of the lead 4c' only when at least the distance P is relatively short compared to a length L of the projecting lead 4c' and a thickness E of the elastomer 3' (e.g., $P \leq L-E$, but preferably $P \leq L-E-100$ μm). When the conditions regarding P, L, E shown in FIG. 124(a) are not satisfied, it is not necessary to perform tip processing of the lead 4c'.

It will, moreover, be appreciated that it is not particularly necessary to perform tip processing of the lead 4c' regardless of the distance P, length L and thickness E shown in FIG. 124(a).

The remaining features of the construction of the semiconductor device (CSP) according to the twenty-first embodiment are identical to those of the CSP shown in the sixth to twentieth embodiments, so their description will not be repeated.

The tip processing of the lead 4c' described in the twenty-first embodiment is not indispensable, and may be omitted.

It is understood that these features may be applied not only to the twelfth embodiment, but also to any of the sixth to twentieth embodiments.

According to the sixteenth embodiment, regarding connection of the lead 4c', the tip of the extra length of the lead 4c' is prevented from protruding more than is necessary above the top surface (main surface 1a') of the semiconductor chip 1' regardless of the positions of the electrode pad 1b' on the semiconductor chip 1' even when a lead 4c' that is longer the required length is bonded.

Hence, the tip of the lead 4c' is prevented from being exposed outside the sealing part even after the sealing part 5' has been formed by the resin sealing 28' of the lead 4c' and electrode pad 1b' and, as a result, the humidity resistance of the semiconductor device (CSP17') is more reliable.

Embodiment 22

FIG. 127 shows an elastomer specification showing a typical color specification of the elastomer (elastic structure) used in the semiconductor device (CSP) according to a twenty-second embodiment of this invention.

In this twenty-second embodiment, the case will be described where a colored elastomer is used for the semiconductor device (CSP) shown in the sixth to twenty-first embodiments.

Specifically, the elastomer 3' of the CSP in the sixth to twenty-first embodiments is colorless, and it is an effectively transparent body which transmits light.

On the other hand, the elastomer 3' (elastic structure) of the twenty-second embodiment comprises a coloring agent in the adhesive layer 3e' formed on both sides of the skeleton layer 3d' (FIG. 128 described hereafter).

Specific examples of the specification of the colored elastomer 3' are the specification (1) and specification (2) shown in FIG. 127. The coloring agent used here is carbon.

In the colored elastomer specifications (1) and (2) shown in FIG. 127, the adhesive layer 3e' on both sides of the skeleton layer 3d' contains the coloring agent; however, the invention is not limited to this arrangement and the adhesive layer 3e' on only one side may contain the coloring agent.

In the specifications (1) and (2) shown in FIG. 127 of the twenty-second embodiment, the adhesive layers 3e' contain the coloring agent; however, the intermediate layer which is the skeleton layer 3d' may also contain the coloring agent, or both the adhesive layer 3e' and the skeleton layer 3d' may contain the coloring agent. In other words, it is sufficient if at least one of the parts comprising the etastomer 3' contains the coloring agent.

In the specifications (1) and (2) shown in FIG. 127, the coloring agent is composed of carbon particles; however, the coloring material is not limited to this and may be another inorganic pigment or organic dye.

In the specification (1) and (2) shown in FIG. 127, the coloring agent is black carbon, but the coloring agent may be red, blue, green, pink, yellow or another color, or an intermediate color.

The remaining features of the construction of the semiconductor device (CSP) according to Embodiment 17 are identical to those of the CSP shown in Embodiments 6 to 16, so their description will not be repeated.

It should be noted that it is not absolutely necessary for the elastomer 3' in the CSP of the twenty-second embodiment to contain a coloring agent. However, by arranging for the elastomer 3' to contain a predetermined amount of coloring agent according to the twenty-second embodiment, the transmittance of the elastomer 3' can be lowered without affecting basic properties of the elastomer 3' such as elastic modulus, thermal expansion coefficient, flame-retarding properties and humidity absorption. In this way, the circuit of the semiconductor chip 1' may be obscured from light. As a result, ultraviolet radiation, etc. which may cause incorrect operation of the semiconductor chip 1' can be blocked, and stability of the electrical circuit of the CSP is enhanced.

By using carbon as coloring agent, a predetermined light obscuring effect may be obtained by a small addition amount, so deterioration of the basic characteristics of the elastomer 3' may be suppressed to the minimum. Also, by incorporating the coloring agent in at least one of the adhesive layers 3e' rather than the skeleton layer 3d' of the elastomer 3', the elastomer 3' can be colored at low cost.

Embodiment 23

FIGS. 128(*a*) to 128(*h*) are component charts showing examples of the detailed composition of an elastomer in a semiconductor device according to a twenty-third embodiment of this invention. FIGS. 129(*a*) to 129(*e*) are component charts showing examples of the detailed composition of an elastomer in a semiconductor device according to the twenty-third embodiment of this invention. FIGS. 129(*a*) to 129(*d*) show 3-layer structures, and FIG. 129(*e*) shows a 5-layer structure.

Embodiment 23 concerns specific materials of each component of the elastomer 3' in the semiconductor device (CSP) of the sixth to twenty-second embodiments. Herein, FIGS. 128 and 129(*a*) to 129(*d*) show the case where the elastomer 3' comprises three layers, and FIG. 129(*e*) shows the case where the elastomer 3' comprises five layers.

In the five layer structure, other thin adhesive layers 3e' are formed between the skeleton layer 3d' and the two (outermost) adhesive layers 3e'. According to Embodiment 23, a specific example of this five layer structure is shown in FIG. 129(*e*), but in FIG. 128 and FIG. 129, it is particularly effective to use this five layer structure when film layers are formed on both sides of the skeleton layer 3d' instead of coating layers in the elastomer 3'.

In an elastomer 3' wherein the outer upper and lower layers are film layers, the use of this five layer structure further reduces the rigidity of the film layers (adhesive layers 3e'). As a result, the rigidity of the elastomer 3' is also reduced, so the elastomer easily molds to the contour of the leads 4c' and the contact of the elastomer 3' is improved.

Herein, the materials of each component of the elastomer 3' are not limited to those of the twenty-third embodiment shown in FIG. 128 and FIG. 129, and the elastomer may also be a multi-layer structure wherein the number of layers is not limited to three or five. It is preferable that a porous material (for detailed structure of this porous material, refer to the sixth embodiment) comprising a 3-dimensional mesh structure is used for the skeleton layer 3d'.

The remaining features of the construction of the semiconductor device (CSP) according to Embodiment 23 are identical to those of the CSP shown in Embodiments 6 to 22, so their description will not be repeated.

Embodiment 24

FIG. 130(*a*), 130(*b*) are diagrams showing typical thicknesses of the skeleton layer and adhesive layers in an elastomer of a semiconductor device according to a twenty-fourth embodiment of this invention.

The twenty-fourth embodiment concerns the thicknesses of the adhesive layers 3e' (FIG. 128 and FIG. 129) and the skeleton layer 3d' in the elastomer (elastic structure) of the semiconductor device (CSP) shown in the sixth to twenty-third embodiments.

FIG. 130 shows the case where the elastomer 3' comprises three layers.

First, in the elastomer 3', the thickness of the tape side adhesive layer 3g' is made thicker than the wiring 4d' of the tape base material 4g' (e.g., at least 1.2 times or at least 1.5 times).

Specifically, when for example the thickness of the wiring 4d' is 18 μm, the thickness of the tape side adhesive layer 3g' is at least 21.6 μm or, preferably, at least 27 μm.

Further, when for example the thickness of the wiring 4d' is 25 μm, the thickness of the tape side adhesive layer 3g' is at least 30 μm or, preferably, at least 37.5 μm.

FIG. 130(*a*) shows the case where the tape side adhesive layer 3g' (adhesive layer adjacent to thin film wiring substrate) and the chip side adhesive layer 3h' have the same thickness. As an example, the thickness of these two layers is 30 μm and the thickness of the skeleton layer 3d' which is the intermediate layer is 100 μm. If, for example, the thickness of the wiring 4d' is 18 μm, as the thickness of the upper and lower adhesive layers 3e' (herein, the tape side adhesive layer 3g' and chip side adhesive layer 3h') is 30 μm, and the thickness of the skeleton layer 3d' is 100 μm, the total thickness of the elastomer 3' is 160 μm.

FIG. 130(*b*) shows the case where the tape side adhesive layer 3g' (adhesive layer adjacent to thin film wiring substrate) is thicker than the chip side adhesive layer 3h'. As an example, the thickness of the tape side adhesive layer 3g' is 75 μm, the thickness of the chip side adhesive layer 3h' is 50 μm, and the thickness of the skeleton layer which is the intermediate layer is 25 μm. If, for example, the thickness of the wiring 4d' is 18 μm, as the thickness of the tape side adhesive layer 3g' is 75 μm, the thickness of the chip side adhesive layer 3h' is 50 μm and the thickness of the skeleton layer 3d' is 25 μm, the total thickness of the elastomer 3' is 150 μm.

It should be noted that the thicknesses given in FIG. 130 are only examples, and the invention is not limited to them. Moreover, the thickness of the tape side adhesive layer 3g' and the chip side adhesive layer 3h' may be identical or different.

According to Embodiment 24, by arranging the thickness of the tape side adhesive layer 3g' to be greater (e.g. at least 1.2 times or at least 1.5 times) than the thickness of the wiring 4d', undulations due to the wiring 4d' on the adhesive surface of the tape side base material 4g' can be covered and, as a result, the contact of the tape side adhesive layer 3g' is improved. This gives a CSP of high reliability. Also, by arranging the tape side adhesive layer 3g' and chip side adhesive layer 3h' to have the same thickness, contact between the tape base material 4g' and semiconductor chip 1' is improved, and a high efficiency, low cost elastomer 3' can be manufactured. Finally, by arranging the thickness of the tape side adhesive layer 3g' to be greater than the thickness of the chip side adhesive layer 3h', even better contact can be obtained with the undulations of the tape side adhesive layer 3g' due to the wiring 4d' within the thickness conditions determined for the elastomer overall. As a result, good adhesion is obtained and a CSP of high reliability can be manufactured.

The remaining features of the construction of the semiconductor device (CSP) according to Embodiment 24 are identical to those of the CSP shown in the Embodiments 6 to 23, so their description will not be repeated.

Embodiment 25

FIG. 131 is a base plane diagram showing the structure of the under surface of a semiconductor device according to a twenty-fifth embodiment of this invention.

The twenty-fifth embodiment concerns the width of the wiring 4d' in the thin film wiring substrate 4' in the semiconductor device (CSP) shown in the sixth to twenty-fourth embodiments.

The twenty-fourth embodiment will be described taking the CSP17' of the twelfth embodiment as an example.

In the CSP17' shown in FIG. 131, the wiring width of connecting parts 4s' which connect with the bump lands 4f of the wiring 4d' formed in the thin film wiring substrate 4', is formed wider than the wiring width of the wiring 4d' at points remote from the connecting parts 4s', and the wiring width of the connecting parts 4s' progressively becomes narrower with increasing distance from the bump lands 4f. Specifically, in the wiring 4d' reaching the leads 4c' from the bump land 4f formed in the tape base material 4g' (FIG. 108), the wiring width of the connecting parts 4s' which connect with the bump lands 4f is wider than the wiring width of the wiring 4d' at points distant from these connecting parts 4s', these parts tapering off so that the wiring width of the connecting part 4s' gradually becomes narrower with increasing distance from the bump lands 4f. In the CSP17' shown in FIG. 131, the wiring width of all twelve of the connecting parts 4s' is formed wide, and these wide connecting parts 4s' progressively become narrower with increasing distance from the bump lands 4f.

The remaining features of the construction of the semiconductor device (CSP) according to Embodiment 25 are identical to those of the CSP of the Embodiments 6 to 24, so their description will not be repeated.

However, it is not absolutely necessary to form the connecting parts 4s', such as described in the twenty-fifth embodiment, and they may be omitted.

Of the wiring formed on the tape base material 4g', the wiring 4d' protruding from the connecting parts 4s' which are connected to the bump lands 4f immediately adjacent to the leads 4c', is a relatively short distance away from the leads 4c'. Therefore when a load acts on the leads 4c' and wiring 4d', stress tends to concentrate in the connecting parts 4s' which are connected to the bump lands 4f immediately adjacent to the leads. It is therefore desirable that when the connecting parts 4s' are formed, these connecting parts 4s' which are connected to the bump lands 4f immediately adjacent to the leads 4c' are formed wider than other parts.

According to Embodiment 25, the connecting parts 4s' between the wiring 4d' and bump lands 4f are formed wide, so stress does not easily concentrate in these connecting parts 4s'. Hence during a temperature cycle, even if the tape base material 4g' and wiring 4d' deform due to thermal contraction and expansion, the connecting parts 4s' between the wiring 4d' and bump lands 4f do not break.

It is of course understood that the features of this invention may be applied not only to Embodiment 12, but also to Embodiments 6 to 24.

Embodiment 26

FIGS. 132(*a*) to 132(*d*) are figures each showing a typical structure of a semiconductor device according to a twenty-sixth embodiment of this invention. FIG. 132(*a*) is a base plan view, FIG. 132(*b*) is a side view, FIG. 132(*c*) is a plan view of which part has been cut away, and FIG. 132(*d*) shows a front view. FIGS. 133(*a*) to 133(*c*) are diagrams of the construction of the semiconductor device shown in FIG. 132. FIG. 133(*a*) is a cross-sectional view through a line 133A-133A in FIG. 132. FIG. 133(*b*) is a cross-sectional view through a line 133B-133B in FIG. 132. FIG. 133(*c*) is a cross-sectional view through a line 133C-133C in FIG. 132. FIGS. 134(*a*) and 134(*b*) are enlarged partial cross-sections of the structure of the semiconductor device shown in FIG. 133. FIG. 134(*a*) is a view of a part D in FIG. 133(*b*), FIG. 134(*b*) is a view of a part E in FIG. 133(*c*), and FIGS. 135(*a*) to 135(*f*) are diagrams each showing an example of a method of manufacturing a thin film wiring substrate used in the semiconductor device according to the twenty-sixth embodiment of this invention. FIGS. 135(*a*), 135(*c*), 135(*e*) are partial plan views, and FIG. 135(*b*), 135(*d*), 135(*f*) are, respectively, cross-sectional views showing a section through lines 135A-135A, 135D-135D and 135F-135F. FIGS. 136(*a*) to 136(*d*) are diagrams each showing an example of a method of manufacturing a thin film wiring substrate used in the semiconductor device according to the twenty-sixth embodiment of this invention. FIGS. 136(*a*), 136(*c*) are partial plan views, and FIGS. 136(*b*), 136(*d*) are respectively cross-sectional views showing a section through lines 136B-136B, 136D-136D. FIGS. 137(*a*) to 137(*f*) are diagrams each showing an example of a method of manufacturing a thin film wiring substrate used in the semiconductor device according to the twenty-sixth embodiment of this invention. FIGS. 137(*a*), 137(*d*) are partial plan views, FIGS. 137(*b*), 137(*e*) are, respectively, cross-sectional views showing a section through lines 137B-137B, 137E-137E, and FIGS. 137(*c*), 137(*f*) are, respectively, cross-sectional views showing a section through lines 137C-137C, 137F-137F. FIGS. 138(*a*) to 138(*f*) are diagrams each showing an example of a method of manufacturing a thin film wiring substrate used in the semiconductor device according to the twenty-sixth embodiment of this invention. FIGS. 138(*a*), 138(*d*) are partial plan views, FIGS. 138(*b*), 138(*e*) are, respectively, cross-sectional views showing a section through lines 138B-138B, 138E-138E, and FIGS. 138(*c*), 138(*f*) are respectively cross-sectional views showing a section through lines 138C-138C, 138F-138F. FIGS. 139(*a*) to 139(*f*) are diagrams each showing an example of a method of manufacturing a thin film wiring substrate used in the semiconductor device according to the twenty-sixth embodiment of this invention. FIGS. 139(*a*), 139(*d*) are partial plan views, FIGS. 139(*b*), 139(*e*) are respectively cross-sectional views showing a section through lines 139B-139B, 139E-139E, and FIGS. 139(*c*), 139(*f*) are, respectively, cross-sectional views showing a section through lines 139C-139C, 139F-139F.

A semiconductor device (CSP51') according to the twenty-sixth embodiment is a peripheral pad type fan-in CSP identical to the CSP17' of the twelfth embodiment shown in FIG. 105. It has a substantially identical structure to that of the CSP17'; however, differences from the CSP17' of the twelfth embodiment are that the thin film wiring substrate 4' does not comprise the base protruding parts 4b' shown in FIG. 105, and the elastomer 3' (FIG. 132(a)) which is an elastic structure comprises exposed parts 3i' which are exposed to the outside, as shown in FIG. 132(b).

Specifically, whereas the CSP of Embodiments 6 to 25 is a structure wherein at least the thin film wiring substrate 4' comprises substrate protruding parts 4b' which protrude beyond the periphery of the semiconductor chip 1', the CSP51' according to Embodiment 26 is a structure wherein the thin film wiring substrate 4' does not comprise the substrate protruding parts 4b'.

The CSP51', therefore, does not comprise the elastomer protruding parts 3b' provided in the elastomer of the CSP17' shown in FIG. 105.

Herein, the detailed structure of the CSP51' according to the twenty-sixth embodiment will be described.

The CSP51 comprises the elastomer 3' (elastic structure) provided with the exposed parts 3i' arranged on the main surface 1a' of the semiconductor chip 1' for exposing the electrode pads 1b' (connection terminals), a substrate body 4a' provided with the wiring 4d' whereof one end is electrically connected to the electrode pads 1b' via the leads 4c' and the other ends are electrically connected to the bump electrodes 2' (external terminals), the thin film wiring substrate 4' comprising the openings 4e' for exposing the electrode pads 1b', and a sealing part 5' for sealing the electrode pads 1b' of the semiconductor chip 1' and the thin film wiring substrate 4'.

In the CSP51' shown in FIG. 132, 20 of the bump electrodes 2' are provided.

The CSP51' comprises the exposed parts 3i' of the elastomer 3' (FIG. 132(a)) on the two long side faces 51a' as shown in FIG. 132(b), there being four of the exposed parts 51a' on each of the two sides 51a' of the CSP51'.

The remaining features of the construction of the semiconductor device (CSP) according to Embodiment 26 are identical to those of the CSP17' of Embodiment 12, so their description will not be repeated.

The method of manufacturing the CSP51' according to the twenty-sixth embodiment will now be described.

First, as shown in FIG. 135 and FIG. 136, the elastomer 3' joined to the substrate body 4a' comprising the wiring 4d' is manufactured, the openings 4e' comprising the leads 4c' connected to the wiring 4d' are formed, and the thin film wiring substrate 4' (FIG. 136(c)) wherein the substrate body 4a' is supported in a substrate frame 4t' by supporters 3j' of the elastomer 3' is prepared.

The method of manufacturing the thin film wiring substrate 4' will be described referring to FIG. 135 and FIG. 136.

The tape base material 4g' comprising a polyimide resin shown in FIG. 135(a) is prepared. An adhesive is coated on the top surface, under surface or both the top surface and under surface of the tape base material 4g' in order to attach the copper foil 4h' shown in FIG. 135(c).

Next, reference holes 4i' for tape feed are formed at an approximately equal interval on both sides of the tape base material 4g'.

Next, 20 of the bump openings 4j' are formed. Two of the wiring join openings 4e' and two of the long cutting holes 4q' are formed on both sides by a punch die as shown in FIG. 135(a), and the copper foil 4h' is laminated on the tape base material 4g' as shown in FIGS. 135(c), 135(d).

The copper foil 4h' is formed into a desired shape by etching as shown in FIG. 135(e) so as to form the wiring pattern.

Next, the tape base material 4g' is attached to the elastomer 3' as shown in FIGS. 136(a), 136(b).

The elastomer 3' used in the twenty-sixth embodiment comprises four long supporting members 3j' on each side (a total of eight on both sides) as shown in FIG. 136(a). These supporting members 3j' straddle the four long holes 4q'of the thin film wiring substrate 4' and are sufficiently long to reach the substrate frame 4t'. However, the number of the supporting members 3j' is not limited to eight, and any number is permitted. The number of these supporting members 3j'corresponds to the number of exposed parts 3i' of the CSP51'. Hence, the elastomer 3' is attached to the thin film wiring substrate 4', the body of the elastomer 3' is attached to the substrate body 4a' of the thin film wiring substrate 4', and the eight supporting members 3j' of the elastomer 3' are arranged to straddle the long holes 4q' of the thin film wiring substrate 4' so as to attach them to the substrate frame 4t'.

Next, four suspension members 4u' supporting the substrate body 4a' shown in FIG. 136(a) are cut so that the substrate body 4a' is supported in the substrate frame 4t' by the supporting members 3j' of the elastomer 3'.

In other words, the substrate body 4a' of the thin film wiring substrate 4' shown in FIG. 136(c) is supported by the elastomer attached to it.

As a result, the thin film wiring substrate 4' to which the elastomer 3' is attached is formed as shown in FIGS. 136(c), 136(d) and FIGS. 137(a) to 137(c).

Next, the electrode pads 1b' (FIG. 132) of the semiconductor chip 1' are exposed by the openings 4e' of the thin film wiring substrate 4', and the main surface 1a' of the semiconductor chip 1' and the elastomer 3' are joined.

In other words, the semiconductor chip 1' is attached to the elastomer 3' as shown in FIGS. 137(d) to 137(f).

Next, the electrode pads 1b' of the semiconductor chip 1' (FIG. 132) and the corresponding leads 4c' of the thin film wiring substrate 4' are electrically connected, as shown in FIG. 138(a).

Next, the resin sealing 28' (FIG. 85) of the electrode pads 1b' of the semiconductor chip 1' and the leads 4c' of the thin film wiring substrate 4' is performed by a potting method using sealing resin as shown in FIGS. 138(d) to 138(f) so as to form the sealing parts 5'.

The resin sealing 28' may be performed also by the transfer mold method.

Next, a bump pole material is supplied to the bump openings 4j' of the substrate body 4a', and the bump electrodes 2' are formed as shown in FIG. 139(a)-139(c) by passing the assembly through a reflow furnace, not shown.

In this way, the wiring 4d' of the substrate body 4a' (FIG. 132 or FIG. 133) is electrically connected to the bump electrodes 2'.

Next, the supporting members 3j' of the elastomer 3' are cut so as to separate them from the substrate frame 4t' of the substrate body 4a', and the exposed parts 3i' (FIG. 139(e)) of the elastomer 3' formed by the cut supporting members 3j', are thereby exposed.

Therefore, the CPS51' as shown in FIGS. 139(d) to 139(f) or FIG. 132 can be produced.

The remaining features of the method of manufacture of the CSP51' are identical to those of the CSP17' of the twelfth embodiment, so their description will not be repeated.

It will be understood that the techniques of the aforesaid Embodiments 19 to 25 may be applied also to the CSP51' of Embodiment 26.

The advantages of the CSP51' of the twenty-sixth embodiment and of its method of manufacture are as follows.

If the internal pressure of the elastomer rises due to expansion of water vapor and gas during solder reflow when the bump electrodes are formed, this gas (vapor) can escape from the exposed parts 3*i*' of the elastomer 3' to the outside via a gas escape path 36' as shown in FIG. 132(*a*) (gas can escape from any of the eight exposed parts 3*i*').

In other words, gas can be released by the exposed parts 3*i*' of the elastomer 3'.

The occurrence of the popcorn phenomenon wherein the sealing part 5' is ruptured, is thereby prevented.

As a result, reliability of the CSP51' is improved.

The remaining advantages of the method of manufacture of the CSP51' according to the twenty-sixth embodiment are identical to those of the CSP17' of the twelfth embodiment, so their description will not be repeated.

Embodiment 27

FIGS. 140(*a*) to 140(*c*) show examples of the structure of a semiconductor device according to a twenty-seventh embodiment. FIG. 140(*a*) is a side view, FIG. 140(*b*) is a plan view, FIG. 140(*c*) is a front view.

A CSP52' (semiconductor device) according to the twenty-seventh embodiment is a peripheral pad type fan-in CSP as is the CSP51' of the twenty-sixth embodiment shown in FIG. 132. It has a substantially identical structure to that of the CSP51'; however, differences from the CSP51' of the twenty-sixth embodiment are that all of the side faces of the elastomer 3' (FIG. 132) are exposed in the side faces 52*a*' of the CSP52', as shown in FIG. 140. In other words, in the CSP52', all the side faces of the elastomer 3' are exposed as the exposed parts 3*i*' after manufacture is complete, as shown in FIG. 140(*a*).

The remaining features of the construction of the CSP52' according to the twenty-seventh embodiment are identical to those of the CSP51' of the twenty-sixth embodiment, so their description will not be repeated.

It will be understood that the techniques of the aforesaid Embodiments 19 to 25 may be applied also to the CSP52' of Embodiment 27.

The advantages of the CSP52' of the twenty-seventh embodiment and of its method of manufacture are as follows.

In the CSP52', as the entire side faces of the elastomer 3' form the exposed parts 3*i*', the exposed surface area of the elastomer 3' is increased. Hence, the gas release effect due to the exposed areas 3*i*' of the elastomer 3' is enhanced. As a result, the reliability of the CSP52' is further improved.

The remaining features of the CSP52' according to the twenty-seventh embodiment and of its method of manufacture are identical to those of the CSP51' of the twenty-sixth embodiment, so their description will not be repeated.

Embodiment 28

FIGS. 141(*a*) to 141(*d*) are plan views each showing a typical structure of a semiconductor device according to a twenty-eighth embodiment of this invention. FIG. 141(*a*) is a plan view, FIG. 141(*b*) is a side view, FIG. 141(*c*) is a plan view, and FIG. 141(*d*) is a front view. FIGS. 142(*a*) to 142(*b*) are diagrams each showing an example of a state when sealing is complete in a method of manufacturing the semiconductor device according to the twenty-eighth embodiment of this invention. FIG. 142(*a*) is a plan view, FIG. 142(*b*) is a base plan view. FIGS. 143(*a*) to 143(*c*) show cross-sections of the plan view shown in FIG. 142(*a*). FIGS. 143(*a*) is a cross-sectional view through a line 143A-143A, FIG. 143(*b*) is a cross-sectional view through a line 143B-143B, FIG. 143(*c*) is a cross-sectional view through a line 143C-143C. FIGS. 144(*a*) to 144(*c*) are diagrams each showing an example of a state when sealing is complete in a method of manufacturing the semiconductor device according to the twenty-eighth embodiment of this invention. FIG. 144(*a*) is a plan view, FIG. 144(*b*) is a side view, FIG. 144(*c*) is a base plan view. FIG. 145 is a schematic diagram showing an example of a gas release state in the semiconductor device according to the twenty-eighth embodiment.

A CSP53' (semiconductor device) according to the twenty-eighth embodiment is a peripheral pad type fan-in CSP as is the CSP51' of the twenty-sixth embodiment shown in FIG. 132. It has a substantially identical structure to that of the CSP51'; however, differences from the CSP51' of the twenty-sixth embodiment are that the sealing parts 5' are formed only in the vicinity of the two ends of the semiconductor chip 1' as shown in FIG. 141(*a*). Hence, the device comprises the exposed parts 3*i*' corresponding to the entire side faces of the elastomer 3', and the exposed parts 3*i*' formed by exposing the area in the vicinity of the center on the left and right of the peripheral part on the top surface and under surface of the device, as shown in FIGS. 141(*b*), 141(*c*).

In other words, in the CSP53', the resin sealing 28' is not performed over all the side faces 1*c*' of the semiconductor chip 1', but only in the vicinity of the electrode pads 1*b*' (FIG. 132).

Herein, FIG. 142 and FIG. 143 show the structure obtained when the resin sealing 28' is complete in the process of manufacturing the CSP53'. FIG. 142(*a*) shows a plan view, and FIG. 142(*b*) is a base view seen from the under surface.

The sealing parts 5' are formed on the short side faces 1*c*' of the semiconductor chip 1' and at both ends of the long side faces 1*c*', as shown in FIG. 142(*b*). As they are not formed in the vicinity of the center of the side faces 1*c*', the areas in the vicinity of the center on the left and right of the peripheral part of the top surface and under surface of the elastomer 3' are exposed.

In the CSP53' according to the twenty-eighth embodiment, the shape of the elastomer 3' is substantially identical to that of the tape base material 4*g*', as shown in FIG. 142. In other words, the shape of the elastomer 3' is made to effectively fit that of the thin film wiring substrate 4' including the openings 4*e*', long holes 4*q*' and suspension members 4*u*' of the thin film wiring substrate 4'.

FIG. 144 shows the situation after resin sealing when the suspension members 4*u*' of the thin film wiring substrate 4' and suspension pieces 3*k*' of the elastomer 3' shown in FIG. 142 are cut so as to separate the substrate body 4*a*' from the substrate frame 4*t*'.

The remaining features of the CSP53' according to the twenty-eighth embodiment and of its method of manufacture are identical to those of the CSP51' of the twenty-sixth embodiment, so their description will not be repeated.

It will be understood that the techniques of the aforesaid Embodiments 19 to 25 may be applied also to the CSP53' of Embodiment 28.

The advantages of the CSP53' of the twenty-eighth embodiment and of its method of manufacture are as follows.

In the CSP53', the areas in the vicinity of the center on the left and right of the peripheral part of the top surface and under surface of the elastomer 3' are exposed, and as the exposed surface area of the elastomer 3' is increased with the addition of the exposed parts 3*i*' at the cut positions. Therefore, the gas release effect is further enhanced when gas escapes via the gas escape path 36' shown in FIG. 145.

Also, by forming the shape of the elastomer 3' substantially the same as that of the tape base material 4*g*', the strength of the thin film wiring substrate 4' in the CSP53' is increased. As a result, defects in the CSP53' are reduced, and the yield is increased.

The remaining features of the CSP53' according to the twenty-eighth embodiment and of its method of manufacture are identical to those of the CSP51' of the twenty-sixth embodiment so their description will not be repeated.

Embodiment 29

FIGS. 146(a) to 146(e) is a diagram of a typical structure of a semiconductor device according to a twenty-ninth embodiment of this invention. FIG. 146(a) is a base plan view, FIG. 146(b) is a side view, FIG. 146(c) is a plan view, FIG. 146(d) is a front view, FIG. 146(e) is a section through a line 146E-146E in FIG. 146(c).

A CSP54' (semiconductor device) according to the twenty-ninth embodiment is a peripheral pad type fan-in CSP as is the CSP51' of the twenty-sixth embodiment shown in FIG. 132. It has a substantially identical structure to that of the CSP51'; however, differences from the CSP51' of the twenty-sixth embodiment are that openings 4v' for exposing the elastomer 3' are provided in the thin film wiring substrate 4' as shown in FIGS. 146(c), 1465(e), and that there are no positions exposing the elastomer 3' other than the openings 4v' as shown in FIG. 146.

In the CSP54' according to the twenty-ninth embodiment, the two openings 4v' are provided inside the substrate body 4a' of the thin film wiring substrate 4'. As a result, when the CSP54' is assembled, the elastomer 3' is exposed via these openings 4v'. Therefore, the exposed parts 3i' of the elastomer 3' are formed by the openings 4v'. In the CSP54', there are no positions exposing the elastomer 3' other than the openings 4v'. In other words, the resin sealing 28' is performed over all the side faces 1c' without exposing the side faces 1c' of the semiconductor chip 1' as shown in FIG. 146(a) to 146(d).

In the CSP54' according to the twenty-ninth embodiment, the openings 4v' are formed in the substrate body 4a' of the thin film wiring substrate 4', and they may be formed at any position provided that the elastomer 3' is exposed after the CSP54' is assembled. Moreover, there is no particular limitation on the number of the openings 4v'.

The remaining features of the construction of the CSP54' according to the twenty-ninth embodiment and of its method of manufacture are identical to those of the CSP51' of the twenty-sixth embodiment, so their description will not be repeated.

It will be understood that the techniques of the aforesaid Embodiments 19 to 25 may be applied also to the CSP54' of Embodiment 29.

The advantages of the CSP54' of the twenty-ninth embodiment and of its method of manufacture are as follows.

In the CSP54', the resin sealing 28' is performed over all the side faces 1c' of the semiconductor chip 1', so the sealing properties of the semiconductor chip 1' are improved. As a result, defects in the semiconductor chip 1' are reduced, and the reliability of the CSP54' is improved.

Also, as the openings 4v' are provided in the thin film wiring substrate 4', gas can be released via these openings 4v' even when the resin sealing 28' is performed over all the side faces 1c' of the semiconductor chip 1'. Therefore, gas release from the elastomer 3' is enhanced while the sealing properties of the semiconductor chip 1' are improved.

The remaining advantages of the method of manufacture of the CSP54' according to the twenty-ninth embodiment are identical to those of the CSP51 of the twenty-sixth embodiment, so their description will not be repeated.

Embodiment 30

FIGS. 147(a) to 147(c) are diagrams of a typical structure of a semiconductor device according to a thirtieth embodiment of this invention. FIG. 147(a) is a plan view, FIG. 147(b) is a side view, and FIG. 147(c) is a base plan view. FIG. 148 is a partial plan view showing an example of a sealing completion state in a method of manufacturing the semiconductor device according to the twenty-fifth embodiment of this invention. FIGS. 149(a) and 149(b) are views showing cross-sections through the partial plan view shown in FIG. 148. FIG. 149(a) is a cross-section through the line 149A-149A, and FIG. 149(b) is a cross-section through the line 149B-149B in FIG. 148. FIGS. 150(a) and 150(b) are partial plan views each showing an example of a sealing completion state in a method of manufacturing the semiconductor device according to the thirtieth embodiment of this invention. FIG. 150(a) is a base plan view, and FIG. 150(b) is a base plan view of a state with the semiconductor chip removed. FIG. 151 is a schematic diagram showing an example of a gas release state in a semiconductor device according to the thirtieth embodiment of this invention.

A CSP55' (semiconductor device) according to the thirtieth embodiment is a structure wherein pads are formed on the chip periphery, and the pad electrodes 1b' are formed both inside and outside the chip 1' as shown in FIG. 147. Hereafter, this type of CSP will be referred to as a fan-in/fan-out CSP. Differences from the CSP51' of the twenty-sixth embodiment are that electrode pads 1b' are provided on the periphery of the four sides of the main surface 1a' of the semiconductor chip 1', and the bump electrodes 2' which are external terminals are arranged inside (substrate body 4a') and outside (substrate protruding parts 4b') the semiconductor chip 1'.

The CSP55' comprises an elastomer 3' comprising the exposed parts 3i' for exposing the electrode pads 1b' (connection terminals) arranged on the main surface 1a' of the semiconductor chip 1', and the elastomer protruding parts 3b' (elastic structure protruding parts) which protrude beyond the periphery of the semiconductor chip 1', the thin film wiring substrate 4' comprising the substrate body 4a' provided with the wiring 4d' whereof one end is electrically connected to the electrode pads 1b' via the leads 4c' (FIG. 132) and the other end is electrically connected to the bump electrodes 2', and the substrate protruding parts 4b' provided with the openings 4e' for exposing the electrode pads 1b' (FIG. 132), these protruding parts protruding beyond the openings 4e' and the semiconductor chip 1', and the sealing parts 5' for sealing the electrode pads 1b of the semiconductor chip 1' and the leads 4c' of the thin film wiring substrate 4'. The thin film wiring substrate 4' and the elastomer 3' are formed in approximately the same size, and the bump electrodes 2' are provided in the substrate body 4a'

Therefore, in the CSP55' the thin film wiring substrate 4' comprises the substrate protruding parts 4b'formed in a one-piece construction with the substrate body 4a'and its outer periphery, the bump electrodes 2' being provided in these substrate protruding parts 4b' outside the semiconductor chip 1'.

FIG. 148 to FIG. 150 show the structure of the CSP55' when the resin sealing 28' is complete. FIG. 148 is a plan view, FIG. 148 is a cross-sectional view, FIG. 150(a) is a base plan view seen from the under surface, and FIG. 150(b) is a view of the tape base material 4g' seen from the under surface through the semiconductor chip 1'.

The substrate body 4a' and substrate protruding parts 4b' are connected and supported by the suspension members 4u' of the four angle pieces of the substrate body 4a', via the four openings 4e' (FIG. 149(a)) formed in the outer periphery of the substrate body 4a'.

In the outer periphery of the substrate protruding parts 4b', the four long holes 4q' used for cutting are formed, and the substrate protruding parts 4b' are supported in the substrate frame 4t' by the suspension members 4u' of the four angle pieces.

The elastomer 3' of the thirtieth embodiment is formed with a shape substantially fitting that of the substrate body 4a' and substrate protruding parts 4b' in the thin film wiring substrate 4' shown in FIG. 148, as shown in FIG. 150(a).

Therefore, the elastomer protruding parts 3b' are provided which are supported by the suspension pieces 3k' (FIG. 150 (b)) and formed with essentially the same shape as that of the substrate protruding parts 4b', and the four openings 3c' are formed with effectively the same size as that of the four openings 4e' of the thin film wiring substrate.

The sealing parts 5' are formed only in the four openings 4e' of the thin film wiring substrate 4', i.e. in the vicinity of the electrode pads 1b' of the semiconductor chip 1', as shown in FIG. 149(a).

Therefore when assembly is complete, in the CSP55' which is a fan-in/fan-out structure, all points on the under surface of the elastomer 3' excluding those covered by the semiconductor chip 1' (elastomer protruding parts 3b') and all of the side faces 1a' are exposed to form the exposed parts 3i', as shown in FIGS. 147(b), 147(c).

FIG. 147 shows the state where, after resin sealing, the semiconductor device is cut in the suspension members 4u' of the angle pieces of the substrate protruding parts 4b' of the thin film wiring substrate 4' shown in FIG. 148 so as to separate the substrate body 4a' and substrate protruding parts 4b' from the substrate frame 4t'.

The remaining features of the construction of the CSP55' according to the thirtieth embodiment are identical to those of the CSP51' of the twenty-sixth embodiment, so their description will not be repeated.

The method of manufacturing the CSP55' according to the thirtieth embodiment will now be described.

First, the substrate body 4a' comprising the wiring 4d' and the substrate protruding parts 4b' on its outer periphery are formed, the elastomer 3' which has effectively the same shape as that of the substrate protruding parts 4b' and substrate body 4a' is joined to it, and the thin film wiring substrate 4' comprising the openings 4e' comprising the leads 4c' joined to the wiring 4d' is prepared.

Next, the main surface 1a' of the semiconductor chip 1' and the elastomer 3' are joined so as to expose the electrode pads 1b' (FIG. 132) of the semiconductor chip 1' in the openings 4e' of the thin film wiring substrate 4'.

The electrode pads 1b' of the semiconductor chip 1' are electrically connected to the corresponding leads 4c' of the thin film wiring substrate 4'.

Next, the resin sealing 28' is applied to the electrode pads 1b' of the semiconductor chip 1' and the leads 4c' of the thin film wiring substrate 4' to form the sealing parts 5'.

The state of the device when sealing is complete is shown in FIG. 148, FIG. 149 and FIG. 150.

Next, the bump electrodes 2' are formed in the substrate body 4a' and substrate protruding parts 4b' so that they are electrically connected to the wiring 4d'.

The four suspension members 4u' in the outer angle pieces of the substrate protruding parts 4b' shown in FIG. 148 are cut so that the substrate body 4a' and substrate protruding parts 4b' are separated from the substrate frame 4t'.

The state of the device when cutting is complete is shown in FIGS. 147(a), 147(b), 147(c).

The remaining features of the method of manufacturing the CSP55' according to the thirtieth embodiment are identical to those of the CSP51' of the twenty-sixth embodiment, so their description will not be repeated.

It will be understood that the techniques of the aforesaid Embodiments 19 to 25 may be applied also to the CSP55' of Embodiment 30.

The advantages of the CSP55' of the thirtieth embodiment and of its method of manufacture are as follows.

In the CSP55', even in a fan-in/fan-out structure, gas (vapor) can be released via the gas escape path 36' through the suspension members 3k' (FIG. 150(b))-provided in the elastomer 3' as shown in FIG. 151.

The occurrence of the popcorn phenomenon which damages the sealing part 5' is thereby prevented, and as a result the reliability of the CSP55' is improved.

The remaining features of the CSP55' according to the thirtieth embodiment and of its method of manufacture are identical to those of the CSP51 of the twenty-sixth embodiment, so their description will not be repeated.

This invention has been described in detail based on the first to thirtieth embodiments; however, the invention is not limited to these thirty embodiments and various modifications are possible within the scope and spirit of the invention.

For example, the specifications of the components shown in FIG. 84(a, b, c, d) and the process conditions shown in FIG. 85 are only examples of optimum conditions, and the invention is not necessarily limited to the examples shown in FIG. 84 (a, b, c, d) and FIG. 85.

Further, in the aforesaid embodiments, although not limited thereto, although the case was primarily described where the semiconductor chip 1' is longitudinal (elongated rectangle) in shape, the semiconductor chip 1' may also have a different plan view shape such as a square.

The electrode pads 1b' provided in the semiconductor chip 1' are not necessarily located at the two ends of the semiconductor chip 1', and may be provided in any other position provided that this position is situated on the outer periphery of the main surface 1a' of the semiconductor chip 1'. They may for example be provided over the whole of the outer periphery.

The number of the electrode pads 1b' and the number of bump electrodes 2' provided in the semiconductor chip 1' is not limited to 12 or 20, and may be a number less than 12, 13-19 or more than 20.

The shape of the openings 4e' of the thin film wiring substrate 4' and the openings 3c' of the elastomer 3' is not limited to rectangular, and may be another shape provided that the electrode pads 1b' of the semiconductor chip 1' can be exposed.

The semiconductor device described in the aforesaid embodiments may be used for example in a DRAM (Dynamic Random Access Memory), SDRAM (Synchronous DRAM) SRAM (Static RAM), RAMBUS, flash memory, ASIC (Application Specific IC), CPU (Central Processing Unit) or gate array, although not limited thereto. Typical applications of these devices are modules and cards, but it will be understood that they may be applied to products other than modules and cards.

The techniques in the Embodiments 1-30, also, can be combined as required.

The number of the solder bumps serving as external connection terminals of the semiconductor package and the bonding pads serving as external terminals of the semiconductor chip electrically connected with the solder bumps are not restricted only to those described in connection with the embodiments, but they may be properly modified depending on or in accordance with the specification of the packages, such as the integrated circuits formed on the semiconductor chip.

Further, regarding the materials, for example, for the elastomer forming the elastic structural material, the tape for the flexible wiring substrate, the wiring and lead plating, the solder resist serving as the insulation film and the solder bump serving as a bump electrode, the invention is also applicable in a case of using other materials having respective properties.

For example, as the solder resist, there can be mentioned a resin mixture comprising an acrylic resin and an epoxy resin, the resin mixture described above with addition of a filler, melamine, acryl, polystyrol and polyimide, as well as polyurethane and silicone; although, it is necessary that they have a property of withstanding the soldering temperature and have a resistance to the exposure of a flux and a cleaning solvent.

Advantageous effects obtained by typical examples among those disclosed, although not limited thereto, in accordance with the present invention are briefly explained below.

(1) Since the elastic structural material is disposed on the flat surface on the rear face of the substrate base material by adopting a surface wiring structure in which the elastic structural material is disposed on the rear face of the substrate base material of the wiring substrate, and the insulation film is formed on the main surface of the wirings formed on the main surface of the substrate base material, the elastic structural material can be mounted with a higher accuracy and stably to the substrate base material in a voidless manner and, since the size and the shape of the elastic structural material are made stable, the bonding step for the semiconductor chip is also stable, thereby enabling assembling at a higher yield.

(2) Since the signal wiring layer and the power source ground wiring layer can be separated into different layers by making the wirings of the wiring substrate into a multi-wiring layer structure, an excellent electric characteristic in view of noise resistance can be attained.

(3) Since external terminals of the semiconductor chip can be disposed at the central portion or the peripheral portion, and the bump electrodes connected to the external terminals can be disposed to the inside, outside or both of the regions outward of the outer circumference of the semiconductor chip, the invention is applicable to package structures of various types and variations.

(4) Since the edge position of the substrate base material can be optimized relative to the elastic structural material by setting the distance between the end of the elastic structural material of the semiconductor chip on the side of the external terminals and the end of the substrate base material of the wirings substrate based on the ingredients of the elastic structural material, a variation in the height of the bump electrodes is not caused, thereby avoiding any difficulty in filling the sealant caused by an enlarged sealing region for the opening of the elastic structural material and it is possible to prevent contamination of wirings caused by the bleeding of ingredients or evaporative ingredients of the elastic structural material.

(5) Since the outer size of the package can be optimized by setting the relation for the distance M2 between the end of the substrate base material of the wiring substrate and the end of the elastic structural material and for the distance M1 between the end of the semiconductor chip and the end of the substrate base material at the outer circumference of the semiconductor integrated circuit device within a range: M1>M2>0, the outermost circumference of the package is not formed by the semiconductor chip, so that a possibility of inducing chip cracks is reduced during the assembling step, as well as during withdrawal and insertion of receptacles and tray transportation, and the circuit surface of the semiconductor chip is not exposed to the outside, thereby making it possible to improve the reliability. Further, since the peripheral protrusions of the elastic structural material after printing do not interfere with the bonding portion of the semiconductor chip, it is possible to prevent bonding failure upon appending the chip, worsening of the flatness of the wiring substrate and lowering of the reliability.

(6) Since the planar S-shaped wiring can be obtained by forming the wiring of the wiring substrate such that the fixed portion with the substrate base material and top end portion connected to the external terminal of the semiconductor chip are displaced at least by more than the width of the wiring, a stable and suitable S-shaped lead can be formed because a sag due to the original planar S-shaped configuration can be obtained by a simple driving down movement of a typical wire bonder, so that a stable S-shaped configuration can be formed for the lead with no requirement of a soft-modified special wire bonder, and further, the contact time upon bonding can also be shortened since the bonding tool trace can also be simplified.

(7) Since the beam wiring can be attained by forming the wiring of the wiring substrate as a cantilever structure which is fixed at one end to the substrate base material, it is possible to overcome such problems as occur in notched wirings wherein cutting is often impossible during bonding due to the variation of the size of the notches and, even if the wiring can be cut, it may be cut at a portion different from the desired notch, or it may be cut before the plating step for the wiring substrate because of the excessively narrowed portion, thereby failing to deposit plating.

(8) Since the end of the opening of the surface protection film on the semiconductor chip is set to a size within a range wherein the wiring does not interfere with the surface protection film when the bonding tool is driven down, it is possible to overcome the problem that the surface protection film or the semiconductor chip suffers from damages (on the semiconductor chip) by the driving down pressure of the tool, and the ingredients of the surface protection film are prevented from being deposited on the bonding portion at the lower surface of the lead to cause contamination and to worsen the bondability.

(9) Since the effective area of the wired portion can be enlarged by connecting the wiring on the notch terminal end of the wiring substrate to an opposing land portion of the wiring, longitudinally or laterally extending the wiring in the vacant regions of the wirings or connecting the adjacent wirings to each other, it is possible to increase the bonding strength between the wiring and the substrate base material and obtain a stable notch cutting performance.

(10) Since a wide elastic material structure can be attained by forming the elastic structural material in a larger range over the entire circumference at least by more than the width of the protrusions on the outer circumference formed in the elastic structural material as compared with the outer size of the semiconductor chip, protrusions on the periphery of the elastic structural member are located outside of the semiconductor chip after the appending of the semiconductor chip, and it can be bonded substantially on the flat portion of the elastic structural material, whereby the warping of the wiring substrate is suppressed. Further, since a large coating area of adhesive can be provided, a not bonded portion caused by insufficient adhesive is less likely to occur, and the adhesive tends to extrude out uniformly around the periphery of the semiconductor chip, so that a package of excellent moisture proofness and reliability can be constituted with out applying an additional peripheral sealing.

(11) In a case of forming the elastic structural material as divided portions which are spaced so as to be not bonded on the external terminals of the semiconductor chip, when each end of the spaces at which the divided elastic structural materials are opposed is formed as a grooved shape, the metal mask bridge portion can be restricted to narrow the groove of the elastic structural material in the groove-fillage technique of the elastic structural material, so that the groove-fillage of the elastic structural material can be improved.

(12) If a plurality of grooves are formed at each of the ends of the elastic structural material, the strength of the groove-forming metal mask can be improved.

(13) When a stopping dam for sealant flow is previously formed at the grooves at each of the ends of the spaces at which the divided structural materials are opposed, the groove-fillage in the sealing step can further be improved.

(14) By pre-forming stud bumps on the external terminals of the semiconductor chip and connecting the external terminals of the semiconductor chip and the wirings of the wiring substrate by way of the stud bumps, problems in the bondability and the possibility of damage can be solved in the inner lead bonding technique, whereby the bondability is improved by the stud bumps and, further, the possibility of damage can be prevented.

(15) By supplying the solder so as to previously surround the wirings of the wiring substrate and connecting the external terminals of the semiconductor chip and the external terminals of the wiring substrate by way of the solder, bondability can be improved and damage can be suppressed in the bonding technique.

(16) By using the stud bumps, for example, made of solder or Au so as to surround the wirings of the wiring substrate, and by connecting the wirings of the wiring substrate and the external terminals of the semiconductor chip by way of the stud bumps, the bondability can be improved and the possibility of damage can be suppressed in the bonding technique.

(17) By connecting the wirings of the wiring substrate and the external terminals of the semiconductor chip by using an Al, solder or Au wire, the problem, for example, of bondability or damage can be solved, and it is possible to attain connection by the concept of a typical wire bonding, not by the inner lead bonding, such as a TAB.

(18) By forming the lateral size of the wiring of the wiring substrate such that the size is gradually narrowed from the end of the substrate base material of the wiring substrate to the top end of the wiring and the lateral size is made constant from a predetermined position, and setting the size and the shape of the wiring such that the bending stress ratio $\alpha$ is from 1.2 to 1.5, since a suitable S-shaped configuration can be formed by merely driving down the bonding tool vertically with no return of the bonding tool, a lead of a stably shaped configuration can be formed without requiring a special soft-modified wire bonder; and, further, the contact time upon bonding can also be shortened since the trace of the bonding tool can be simplified.

(19) By using the electroconductive material as a core material for the wiring structure of the wiring substrate and applying only Au plating to the surface, since both the hardness and the brittleness of the lead are lowered as compared with a case of applying Ni-plating between the core material of the conductive material, such as Cu, and Au plating, cracks are less likely in the lead itself, and damage to the semiconductor chip at the counter bonding face can also be moderated.

(20) By forming the wirings on the rear face of the substrate base material of the wiring substrate, forming the insulation film on the rear face of the wirings and disposing the elastic structure material on the rear face of the insulation film, since a rear face wiring insulation film structure can be obtained, direct contact of the elastic structural material with the wiring can be prevented and contact of the elastic structural material to the roughened surface of the substrate base material can also be prevented, so that bleeding of the low molecular weight ingredients of the elastic structure material can be suppressed and, further, the uneven wiring surface can be flattened by coating the insulation film making it possible to avoid disadvantages, such as the creation of voids upon forming the elastic structural material.

(21) In the surface wiring structure, since the opening of the insulation film is formed by defining the coating range of the insulation film material, the fabrication accuracy for the hole diameter can further be improved as compared with a case of forming the opening by machining the substrate base material of the wiring substrate of the rear face wiring structure.

(22) By setting the thickness of the insulation film by determining the coating condition for the insulation film material in the surface wiring structure, since the film can be coated stably at a further reduced thickness and the bump land disposed at a higher density with a small diameter can be formed as compared with the substrate base material, a smaller bump electrode can be joined more satisfactorily.

(23) In the surface wiring structure, since the pitch for the arrangement of the bump electrodes can be reduced as compared with the rear face wiring structure, it is possible to constitute a semiconductor package having output terminals at higher density.

(24) As the substrate body and substrate protruding parts of the thin film wiring substrate in the semiconductor device (CSP) are formed in a one-piece construction, the substrate protruding-parts are not formed independently and, therefore, do not have to be formed of costly materials. This lowers the cost of manufacturing the semiconductor device.

(25) By providing the substrate protruding parts outside the openings in the thin film wiring substrate, when a sealing resin is applied via the openings, the sealing parts are formed as a bridge between the substrate protruding parts and the semiconductor chip. In this way, a stable seal can be obtained, sealing properties are improved, and consequently humidity resistance is improved.

(26). When the bump electrodes are formed, even if the semiconductor device is subjected to reflow after it absorbs moisture, water vapor produced during reflow can be released to the outside via the elastic structure as the side faces in a predetermined direction of the elastic structure are exposed to the outside, and reflow tolerance is thereby improved.

(27) By forming the elastic structure of a porous fluoride resin, the water vapor produced during reflow can be released to the outside and at the same time, penetration of moisture into the semiconductor device is prevented by the water repelling properties of the fluoride resin. As a result, deterioration of the electrical characteristics of the semiconductor device is reduced.

(28) By incorporating a coloring agent in the elastic structure, transmittance of light in the elastic structure can be reduced without affecting the basic physical properties of the elastic structure. In this way, the circuit of the semiconductor chip can be shielded from light, ultraviolet light which would cause incorrect operation of the semiconductor chip is blocked, and operational stability of the electrical circuit of the semiconductor device is improved.

(29) In the thin film wiring substrate, by making the connections between the wiring and bump lands wide, concentration of stress in the connections is prevented. Hence, even if the wiring deforms due to thermal contraction and expansion together with the tape base material during temperature cycles, rupture of leads is prevented in the connecting parts 4s between the wiring and bump lands.

(30) By forming the exposed parts in the elastic structure, even when the internal pressure of the elastic structure rises as during reflow for example, gas can be released to the outside from the exposed parts of the elastic structure. In this way, occurrence of the popcorn phenomenon which damages the sealing parts, etc., is prevented, and as a result the reliability of the semiconductor device is improved.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed:

1. A semiconductor device comprising:
    a semiconductor chip having a plurality of semiconductor elements and a plurality of external terminals formed in a main surface thereof;
    an elastic layer provided on the main surface of the semiconductor chip in a manner to expose the plurality of external terminals, the elastic layer having a first edge and a second edge opposing to the first edge, the first edge being closer to the plurality of external terminals than the second edge, the elastic layer containing a volatile ingredient thereof;
    an insulating tape provided on the elastic layer and having an opening to expose the plurality of external terminals, the opening being defined by an edge of the insulating tape;
    a plurality of leads provided on a surface of the insulating tape,
    wherein each of the plurality of leads has a first portion disposed on the insulating tape and a second portion which extends across the edge of the insulating tape and is in the opening of the insulating tape, each of the second portions being electrically connected with a corresponding one of the external terminals, a bump land being comprise of a part of the first portion of each of the plurality of leads; and
    a plurality of bump electrodes formed on the bump land of each of the plurality of leads and being electrically connected to the plurality of leads, respectively,
    wherein each of the plurality of leads includes a copper lead as core material thereof,
    wherein the copper lead of each of the plurality of leads has gold-plating applied on its surface,
    wherein a length of the second portion of each of the plurality of leads is longer than a straight line distance from the edge of the insulating tape to the corresponding one of the external terminals, and
    wherein the elastic layer is recessed from the edge of the insulating tape in a plane view such that the first edge of the elastic layer is arranged between the edge of the insulating tape and the bump land in a plane view.

2. A semiconductor device according to claim 1, wherein no other metallic material exists between the copper lead and the gold-plating.

3. A semiconductor device according to claim 1,
    wherein the plurality of leads are disposed between the elastic layer and the insulating tape, and
    wherein the plurality of bump electrodes are contacting the corresponding ones of the plurality of leads via through holes formed in the insulating tape, respectively.

4. A semiconductor device according to claim 1, wherein the second portion of each of the plurality of leads is disposed to form a substantially straight line pattern in a plane view and to form a bended pattern in a sectional view.

5. A semiconductor device according to claim 1, wherein the plurality of leads are disposed between the elastic layer and the insulating tape.

6. A semiconductor device according to claim 5,
    wherein the second portion of each of the plurality of leads is disposed to form a substantially straight line pattern in a plane view and to form a bended pattern in a sectional view.

7. A semiconductor device according to claim 6, wherein the plurality of bump electrodes are contacting the corresponding ones of the plurality of leads via through holes formed in the insulating tape, respectively.

8. A semiconductor device according to claim 7, wherein no other metallic material exists between the copper lead and the gold-plating.

9. A semiconductor device according to claim 5, wherein no other metallic material exists between the copper lead and the gold-plating.

* * * * *